US010352523B2

(12) United States Patent
Nishimura et al.

(10) Patent No.: US 10,352,523 B2
(45) Date of Patent: Jul. 16, 2019

(54) VEHICLE LAMP LENS BODY, COMBINED LENS BODY WITH SEMICIRCULAR CYLINDRICAL OUTPUT SURFACES

(71) Applicant: Stanley Electric Co., Ltd., Tokyo (JP)

(72) Inventors: Shota Nishimura, Tokyo (JP); Kiichi Matsuno, Tokyo (JP); Keisuke Kunori, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 102 days.

(21) Appl. No.: 15/357,643

(22) Filed: Nov. 21, 2016

(65) Prior Publication Data

US 2017/0211771 A1 Jul. 27, 2017

Related U.S. Application Data

(63) Continuation of application No. PCT/JP2015/062374, filed on Apr. 23, 2015.

(30) Foreign Application Priority Data

May 23, 2014 (JP) ................................ 2014-107521
May 23, 2014 (JP) ................................ 2014-107522
(Continued)

(51) Int. Cl.
*F21S 41/43* (2018.01)
*F21S 41/32* (2018.01)
(Continued)

(52) U.S. Cl.
CPC ................ *F21S 41/43* (2018.01); *B60Q 1/04* (2013.01); *F21S 41/147* (2018.01); *F21S 41/25* (2018.01);
(Continued)

(58) Field of Classification Search
CPC ............................ F21S 41/25–43; B60Q 1/04
See application file for complete search history.

(56) References Cited

U.S. PATENT DOCUMENTS 7,261,449 B2 8/2007 Albou
2003/0214815 A1 11/2003 Ishida et al.
(Continued)

FOREIGN PATENT DOCUMENTS

DE 10 2011 118 456 A1 6/2012
DE 102013006707 A1 11/2013
(Continued)

OTHER PUBLICATIONS

Hoshi, Light-beam projecting optical system, Jan. 19, 1996, Patent Pub JPH0815412A; Google Patents, https://patents.google.com/patent/JPH0815412A/en.*
(Continued)

*Primary Examiner* — Anh T Mai
*Assistant Examiner* — Michael Chiang
(74) *Attorney, Agent, or Firm* — Kenealy Vaidya LLP

(57) ABSTRACT

A lens body includes a first lens portion and a second lens portion and is configured such that light from a light source exits through a first exit surface of the first lens portion after being partially blocked by a shade of the first lens portion, further exits through a second exit surface of the second lens portion, thereby forming a predetermined light distribution pattern by the shade, wherein the first exit surface is a surface for condensing the light from the light source that exits through the first exit surface with respect to a first direction and is configured as a semicircular cylinder surface, and the second exit surface is a surface for condensing the light from the light source that exits through the second
(Continued)

exit surface with respect to a second direction orthogonal to the first direction and is also configured as a semicircular cylinder surface.

18 Claims, 63 Drawing Sheets

(30) Foreign Application Priority Data

May 23, 2014 (JP) ................................ 2014-107523
Jun. 13, 2014 (JP) ................................ 2014-122058
Sep. 25, 2014 (JP) ................................ 2014-195033

(51) Int. Cl.
*F21S 41/147* (2018.01)
*F21S 41/27* (2018.01)
*F21S 41/26* (2018.01)
*H01L 33/58* (2010.01)
*F21S 41/25* (2018.01)
*F21S 41/40* (2018.01)
*B60Q 1/04* (2006.01)

(52) U.S. Cl.
CPC ............... *F21S 41/26* (2018.01); *F21S 41/27* (2018.01); *F21S 41/32* (2018.01); *F21S 41/322* (2018.01); *F21S 41/40* (2018.01); *H01L 33/58* (2013.01)

(56) References Cited

U.S. PATENT DOCUMENTS

2005/0018443 A1 1/2005 Tsukamoto
2005/0180158 A1 8/2005 Komatsu
2006/0002130 A1 1/2006 Albou
2007/0236950 A1* 10/2007 Stefanov .............. F21S 41/265 362/496
2008/0151567 A1 6/2008 Albou
2009/0027911 A1 1/2009 Misawa et al.
2011/0122637 A1 5/2011 Futami
2012/0106187 A1 5/2012 Uchida
2012/0176809 A1 7/2012 Ohno
2013/0250596 A1 9/2013 Fedosik et al.
2014/0347876 A1 11/2014 Fedosik et al.
2015/0124472 A1 5/2015 Wintzer et al.
2015/0270682 A1* 9/2015 Daniels ............. G03B 21/2066 353/99
2016/0102831 A1* 4/2016 Okubo ................... F21S 41/19 362/512
2016/0146417 A1* 5/2016 Ohsawa ............. F21S 48/1258 362/521

FOREIGN PATENT DOCUMENTS

EP 1 610 057 A1 12/2005
EP 2 818 792 A2 12/2014
JP H02-024902 A 1/1990
JP 8-15412 A * 1/1996
JP 8-15412 A 1/1996
JP 9-102203 A 4/1997
JP 2005-228502 A 8/2005
JP 2006-302902 A 11/2006
JP 2007-317596 A 12/2007
JP 4037337 B2 1/2008
JP 2009-26462 A 2/2009
JP 2009-266710 A 11/2009
JP 2010-108639 A 5/2010
JP 2011-029183 A 2/2011
JP 2011-054527 A 3/2011
JP 2011-108413 A 6/2011
JP 2011-171083 A 9/2011
JP 2012-94418 A 5/2012
JP 2014-75271 A 4/2014
WO 2013/068053 A1 5/2013

OTHER PUBLICATIONS

The extended European search report for the related European Patent Application No. 15796951.0 dated May 19, 2017.
International Preliminary Report on Patentability of the International Search Report for PCT/JP2015/062374 dated Apr. 15, 2016.
International Search Report for PCT/JP2015/062374 dated Aug. 4, 2015.
The extended European search report for the related European Patent Application No. 18150378.0 dated May 14, 2018.
Japanese Office Action for the related Japanese Patent Application No. 2017-234839 dated Nov. 13, 2018.
Japanese Office Action for the related Japanese Patent Application No. 2017-234873 dated Nov. 20, 2018.
Japanese Office Action for the related Japanese Patent Application No. 2018-119439 dated Apr. 23, 2019.

* cited by examiner

FIG. 8
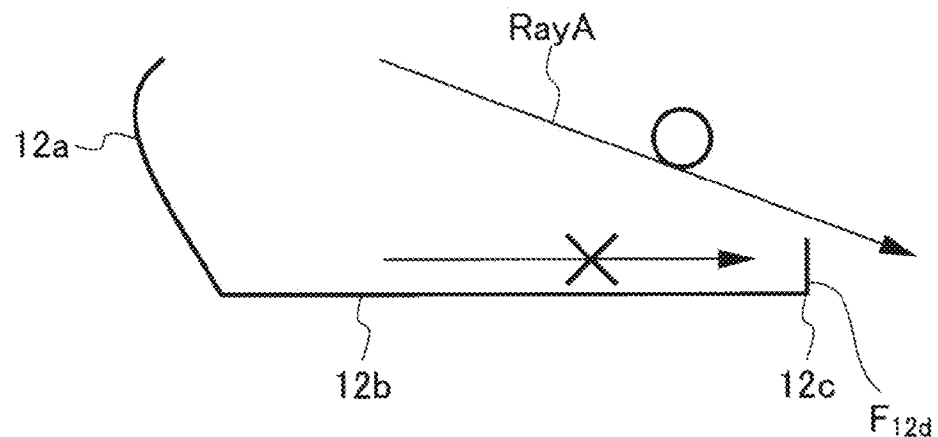
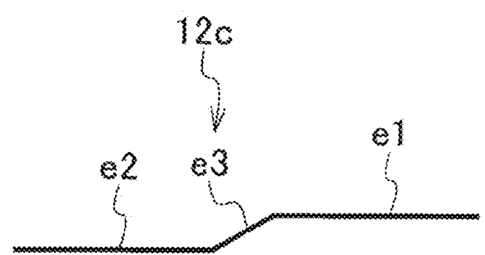
FIG. 9A
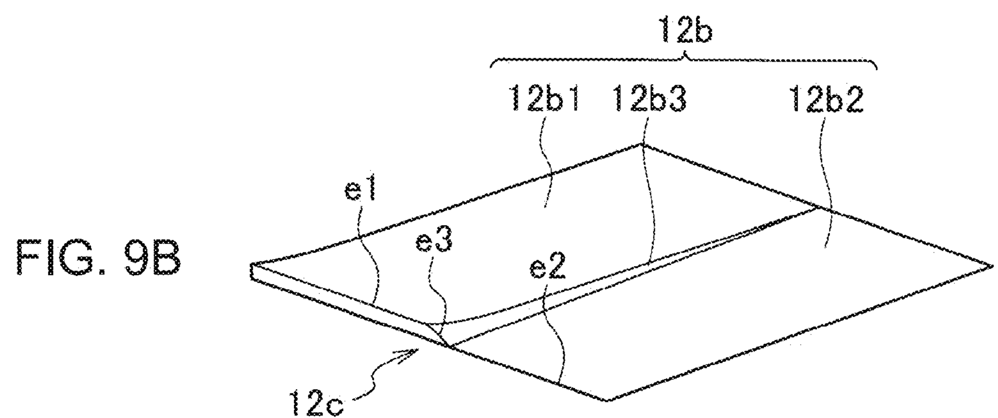
FIG. 9B

FIG. 9C
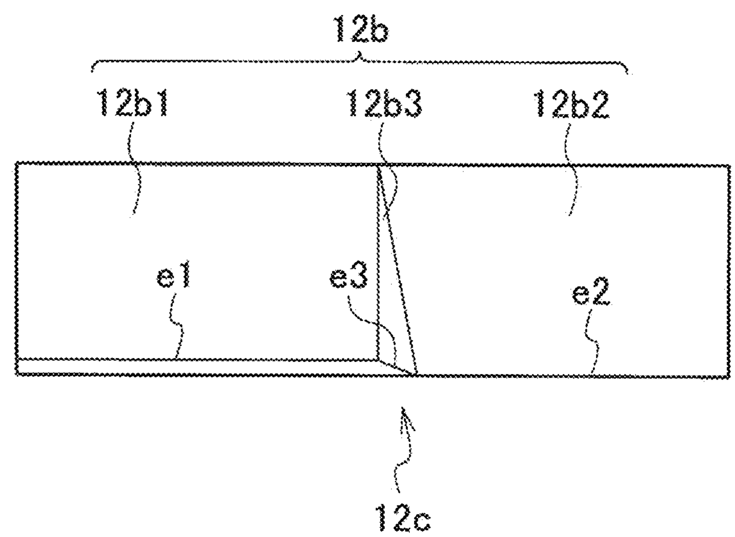
FIG. 10A
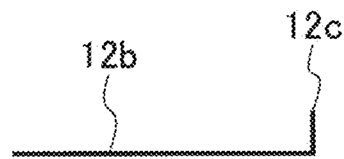
FIG. 10B
12b
12c
FIG. 10C
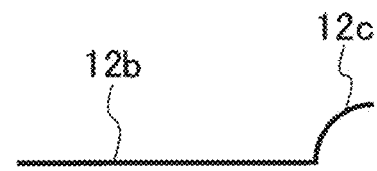

FIG. 42A
FIG. 42B
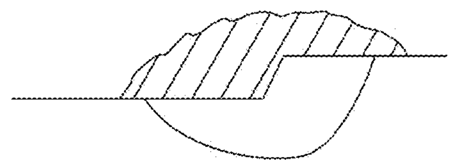
FIG. 43
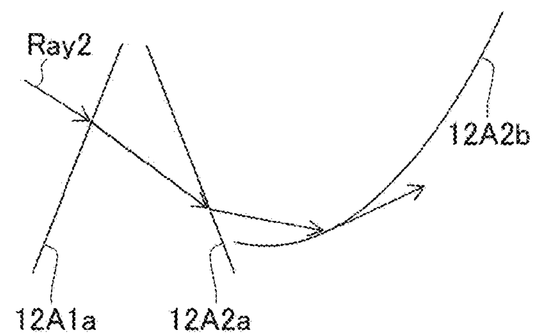
FIG. 44A
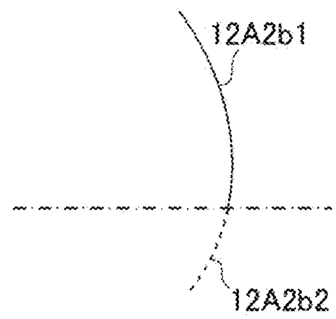

FIG. 47A
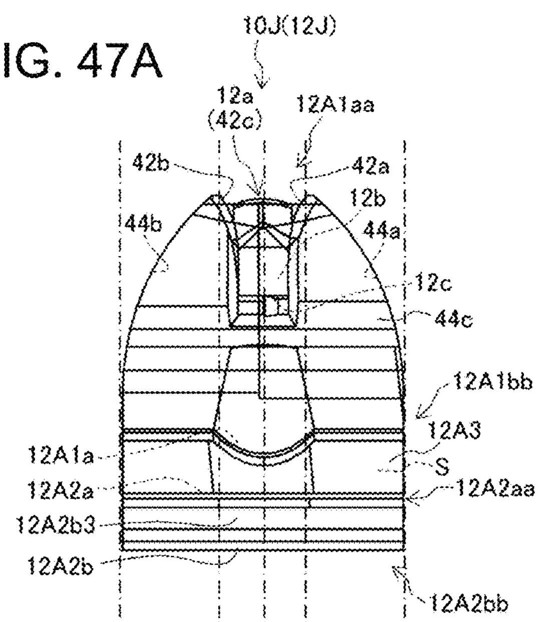
FIG. 47B
A4
44c
12A2b4
44b
12A2b3
12A2b
A3
12A1a
A1
A2
FIG. 47C
10J(12J)
44c
12A3
12A2b4
14
(F)
44b
12A2bb
S
44a
AX1
12A2aa
12A1aa
12a
(42a.42b,42c)
12A2b3
12A2a
AX2
12A1a
12A1bb
FIG. 48A
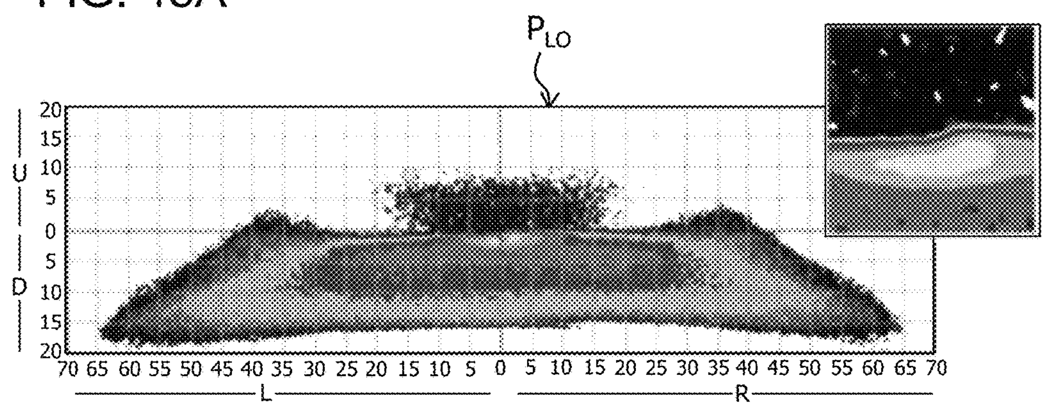

FIG. 57A
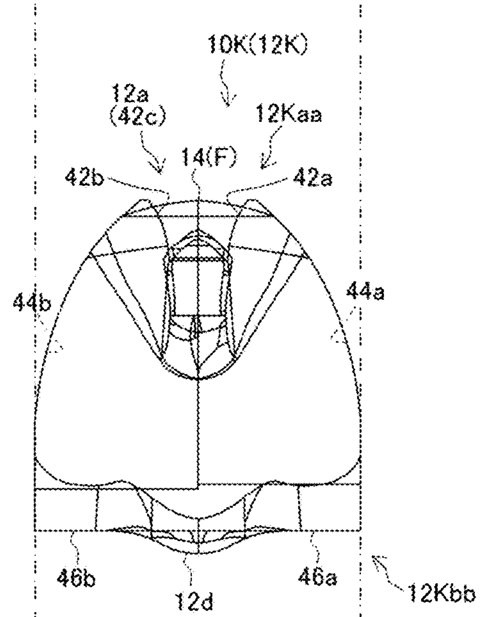
FIG. 57C
FIG. 57B
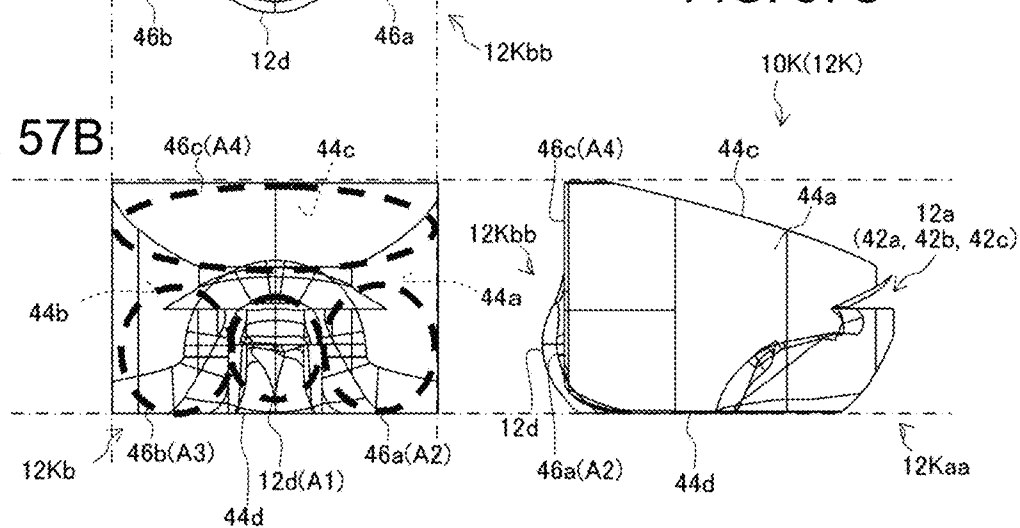
FIG. 58A
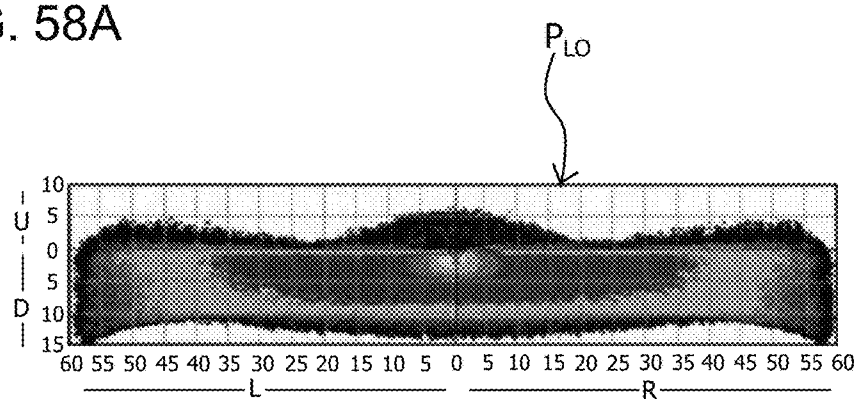

LEFT AND RIGHT 0°
UPPER AND LOWER 0°

LEFT AND RIGHT 0°
UPPER 25°

RIGHT 15°
UPPER 25°

LEFT AND RIGHT 0°
UPPER AND LOWER 0°

LEFT AND RIGHT 0°
UPPER 25°

RIGHT 15°
UPPER 25°

VEHICLE LAMP LENS BODY, COMBINED LENS BODY WITH SEMICIRCULAR CYLINDRICAL OUTPUT SURFACES

CROSS-REFERENCE TO RELATED APPLICATIONS

This application is a continuation of International Application No. PCT/JP2015/062374, filed on Apr. 23, 2015, now pending, herein incorporated by reference. Further, this application is based upon and claims the benefit of priority from the prior Japanese Patent Application No. 2014-107521, filed on May 23, 2014, the prior Japanese Patent Application No. 2014-107522, filed on May 23, 2014, the prior Japanese Patent Application No. 2014-107523, filed on May 23, 2014, the prior Japanese Patent Application No. 2014-122058, filed on Jun. 13, 2014 and the prior Japanese Patent Application No. 2014-195033, filed on Sep. 25, 2014, entire contents of which are incorporated herein by reference.

TECHNICAL FIELD

The present invention relates to a lens body, a combined lens body, and a vehicular lamp fitting, and more particularly to a lens body (combined lens body) used in combination with a light source, and a vehicular lamp fitting equipped therewith.

BACKGROUND ART

A vehicular lamp fitting having a structure of combining a light source and a lens body has been proposed (e.g. Patent Literature 1).

FIG. 77 is a longitudinal sectional view of a vehicular lamp fitting 200 according to Patent Literature 1, and FIG. 78 is a top view depicting a state of disposing a plurality of vehicular lamp fittings 200 (a plurality of lens bodies 220) on a line.

As illustrated in FIG. 77, the vehicular lamp fitting 200 according to Patent Literature 1 is equipped with a light source 210 which includes a semiconductor light emitting element, and a lens body 220, and on the surface of the lens body 220: a hemispherical entry surface 221, which covers, from the top, the light source 210 disposed with the light emitting surface side up; a first reflection surface 222 (reflection surface formed by metal deposition) disposed in the traveling direction of the light from the light source 210, which enters the lens body 220 through the entry surface 221; a second reflection surface 223 (reflection surface formed by metal deposition) which extends forward from a bottom edge of the first reflection surface 222; a convex lens surface 224; and the like, are disposed.

Another vehicular fitting having a structure of combining a light source and a lens body has been proposed (e.g. Patent Literature 2).

FIG. 79 is a top view of a vehicular lamp fitting 200 according to Patent Literature 2, and FIG. 80A is an example of a low beam light distribution pattern (composite light distribution pattern), which is formed by the vehicular lamp fitting 20, and is formed by each partial light distribution pattern A, B and C, illustrated in FIG. 80B to FIG. 80D, that is superimposed onto each other.

In the vehicular lamp fitting 200 according to Patent Literature 2, a plurality of lamp units, including a light source, such as an LED, and a lens body disposed in front of the light source (the so called "direct projection type vehicular lamp fitting"), is configured respectively as a lamp unit 9A which forms a spot light distribution pattern A (see FIG. 80B), a lamp unit 9B which forms a mid-light distribution pattern B which is more diffused than the spot light distribution pattern A (see FIG. 80C), and a lamp unit 9C which forms a wide light distribution pattern C which is more diffused than the mid-light distribution pattern B (see FIG. 80D), and are disposed in a row (linearly), as illustrated in FIG. 79.

Another vehicular lamp fitting having a structure of combining a light source and a lens body has also been proposed (e.g. Patent Literature 3).

FIG. 81 is a side view of a vehicular lamp fitting 200 according to Patent Literature 3.

As illustrated in FIG. 81, the vehicular lamp fitting 200 according to Patent Literature 3 is configured as a vehicular lamp fitting, including: a projection lens 210 (plano-convex lens) of which front surface is a convex surface and rear surface is a plane; a light-shielding member 220 which is disposed in a rear side focal position of the projection lens 210; and a light source 230 (light emitting diode) disposed in the rear vicinity of the light-shielding member 220.

CITATION LIST

Patent Literature

Patent Literature 1: Japanese Patent Application Laid-Open No. 2005-228502

Patent Literature 2: Japanese Patent Application Laid-Open No. 2012-094418

Patent Literature 3: Japanese Patent No. 4037337

SUMMARY OF INVENTION

Problems to be Solved by the Invention

In the vehicular lamp fitting 200 according to Patent Literature 1, the convex lens surface 224, which is the final exit surface of the lens body 220, is configured as a hemispherical lens surface, hence when a plurality of vehicular lamp fittings 200 (plurality of lens bodies 220) are disposed on a line, dots appear as if lining up, and a vehicular lamp fitting (combined lens body) having an integral appearance linearly extending in a predetermined direction cannot be implemented (design flexibility is poor).

With the foregoing in view, it is a first object of the present invention to provide a lens body (combined lens body) having an integral appearance linearly extending in a predetermined direction, and a vehicular lamp fitting equipped therewith.

Further, the present inventors, in fact, the lamp unit SPOT forming a light distribution pattern for a spot lamp unit MID forming the mid-beam light distribution pattern that has diffused from the light distribution pattern for a spot, diffused from the light distribution pattern for mid was to prepare a lamp unit WIDE1, WIDE2 for forming a light distribution pattern for wide, as shown in FIG. 82, in a line (linearly) was placed and found the following problems.

FIG. 82 in a row (linearly) each lamp unit SPOT arranged, MID, WIDE1, WIDE2 view showing a state occurring with a bright portion and dark portion in the (each lens body) (photograph), FIG. 83 is a front view of the lamp unit SPOT (lens body) showing a state that one point light emission (light point) (photograph).

First, it does not become the viewpoint position is changed and the line-shaped light emitting appearance. For example, if you place the viewpoint position in front, but a line-shaped light emitting appearance when placed viewpoint position laterally, as shown in FIG. 82, it rises to the dark and bright portions, linear luminous appearance that that do not. Referring to FIG. 82, the lamp unit SPOT (lens body), the lamp unit MID (lens body) and a lamp unit WIDE1 (lens body) to form a relatively dark dark, lamp unit HIGH (lens body) and the lamp unit WIDE2 it can be seen that There has been forming a relatively bright bright part. Thus from occurring between dark and bright portions is due to a light distribution pattern for a spot, a light distribution pattern for mid and a light distribution pattern for wide, is formed on another optical system, respectively, physically separated is there.

Second, each of the lamp units (lens body), for example, as shown in FIG. 83, the lamp unit SPOT is, be the appearance of a point light emitting (light points). In other words, that do not look good in the uniform light emission (or substantially uniform light emission).

The present invention has been made in view of these circumstances, the first, providing a lens body and a vehicle lamp having the same can be changed viewpoint position to maintain the luminous appearance of the line-shaped and a second object of the present invention is to. Secondly, to provide a uniform light emission (or substantially uniform light emission) lens body appearance can be realized and of the vehicle lamp having the same third object of.

Further, in the vehicle lamp 200 described in Patent Document 3, as a result of general plano-convex lens is used as a projection lens 210, the appearance (in particular, the appearance of the light source 230 non-lighting state) problem becomes monotonous there is.

The present invention has been made in view of such circumstances, a lens thereof appearance does not become monotonous and vehicle lamp having the same, in particular, in the light source non-lighting time, when viewed from multiple directions, and a fourth object of providing though lens body inside the appearance as if it were emitting lens body and a vehicle lamp having the same.

Means for Solving the Problems

To achieve the first object, a first aspect of the invention is a lens body which includes a first lens unit and a second lens unit, and is configured such that light from a light source enters the first lens unit through a first entry surface of the first lens unit, exits through a first exit surface of the first lens unit after being partially shielded by a shade of the first lens unit, further enters the second lens unit through a second entry surface of the second lens unit, then exits through a second exit surface of the second lens unit, and is irradiated forward, so as to form a predetermined light distribution pattern which includes a cut-off line defined on an upper edge by the shade. The first exit surface is a surface configured to condense the light from the light source, which exits through the first exist surface, in a first direction, and is configured as a semicircular cylindrical surface, and the second exit surface is a surface configured to condense the light from the light source, which exits through the second exit surface, in a second direction which is orthogonal to the first direction, and is configured as a semicircular cylindrical surface.

According to the first aspect of the invention, a lens body, having an integral appearance linearly extending in a predetermined direction, can be provided. Secondly, a lens body that can form a predetermined light distribution pattern condensed in the horizontal direction and vertical direction (e.g. low beam light distribution pattern which includes a cut-off line defined on an upper edge by the shade), can be provided, even though the second exit surface, which is the final exit surface, is a semicircular cylindrical surface (semicircular cylindrical refractive surface).

The integral appearance linearly extending in a predetermined direction can be implemented because the second exit surface, which is the final exit surface, is configured as a semicircular cylindrical surface (semicircular cylindrical refractive surface).

The predetermined light distribution pattern condensed in the horizontal direction and vertical direction (e.g. low beam light distribution pattern which includes a cut-off line defined on an upper edge by the shade), can be formed even though the second exit surface, which is the final exit surface, is the semicircular cylindrical surface (semicircular cylindrical refractive surface), because condensing light in a first direction (e.g. horizontal direction or vertical direction), is mainly performed by the first exit surface (semicircular cylindrical refractive surface) of the first lens unit, and condensing light in a second direction (e.g. vertical direction or horizontal direction) orthogonal to the first direction is mainly performed by the second exit surface (semicircular cylindrical refractive surface) of the second lens unit, which is the final exit surface of the lens body. In other words, the condensing functions are separated.

A second aspect of the invention is the first aspect of the invention, wherein the lens body is a lens body which has a shape along a first reference axis extending in the horizontal direction, the first lens unit includes the first entry surface, the reflection surface, the shade and the first exit surface, the second lens unit includes the second entry surface and the second exit surface, and the first entry surface, a reflection surface, the shade, the first exit surface, the second entry surface and the second exit surface are displayed in this order along the first reference axis, the first entry surface is a surface through which the light from the light source, disposed in the vicinity of the first entry surface is refracted and enters the first lens unit, and which is configured such that the light from the light source, which entered the first lens unit, is condensed in a direction closer to a second reference axis at least in the vertical direction, the second reference axis passing through the center of the light source and a point in the vicinity of the shade and inclined forward and diagonally downward with respect to the first reference axis, the reflection surface extends forward from the lower edge of the first entry surface, and the shade is formed in the front end of the reflection surface.

According to the second aspect of the invention, a lens body, without including a reflection surface formed by metal deposition, which is a factor that increases cost, can be provided. Secondly, a lens body that can suppress the melting of the lens body or a drop in the output of the light source, caused by heat generated in the light source, can be provided.

The reflection surface formed by metal deposition, which is a factor that increases cost, can be omitted, because the light from the light source is controlled not by the reflection surface formed by metal deposition but by refraction on the entry surface and internal reflection on the reflection surface.

Melting of the lens body or a drop in the output of light source, caused by heat generated in the light source, can be suppressed, because the entry surface is formed on the rear end of the lens body, and the light source is disposed outside the lens body (that is, in a position distant from the entry surface of the lens body).

A third aspect of the invention is the second aspect of the invention, wherein the lens body includes a first lens unit, a second lens unit, and a connecting unit which connects the first lens unit and the second lens unit, and the connecting unit connects the first lens unit and the second lens unit in a state of forming a space surrounded by the first exit surface, the second entry surface and the connecting unit.

According to the third aspect of the invention, a lens body, in which the first lens unit and the second lens unit are connected, can be provided.

A fourth aspect of the invention is the third aspect of the invention, wherein the lens body is a lens body integrally molded by injection molding using a die, the space is formed by a die of which the extracting direction is opposite from the connecting unit, an extracting angle is set for the first exit surface and the second entry surface respectively so as to extract the die smoothly, and the surface shape of the second exit surface is adjusted such that the light from the light source, which exits from the second exit surface, becomes light in parallel with the first reference axis.

According to the fourth aspect of the invention, a lens body suitable for a vehicular lamp fitting is provided, wherein the light from the light source, which exits the second exit surface, which is the final exit surface, becomes light in parallel with the first reference axis, even though the extracting angle is set for the first exit surface and the second entry surface respectively.

A fifth aspect of the invention is any one of the first to fourth aspects of the invention, wherein the first direction is the horizontal direction, the first exit surface is configured as a semicircular cylindrical surface extending in the vertical direction, the second direction is the vertical direction, and the second exit surface is configured as a semicircular cylindrical surface extending in the horizontal direction.

According to the fifth aspect of the invention, the final exit surface is the second exit surface (semicircular cylindrical surface extending in the horizontal direction), therefore a lens body having an integral appearance linearly extending in the horizontal direction can be provided.

A sixth aspect of the invention is any one of the first to fourth aspects of the invention, wherein the first direction is the vertical direction, the first exit surface is configured as a semicircular cylindrical surface extending in the horizontal direction, the second direction is the horizontal direction, and the second exit surface is configured as a semicircular cylindrical surface extending in the vertical direction.

According to the sixth aspect of the invention, the final exit surface is the second exit surface (semicircular cylindrical surface extending in the vertical direction), therefore a lens body having an integral appearance linearly extending in the vertical direction can be provided.

A seventh aspect of the invention is a combined lens body which includes a plurality of lens bodies according to any one of the first to sixth aspects, and is integrally molded, whereby the second exit surface of each of the plurality of lens bodies is arranged on a line in a state of being adjacent to each other so as to constitute a semicircular cylindrical exit surface group, linearly extending in a predetermined direction.

According to the seventh aspect of the invention, a combined lens body, having an integral appearance linearly extending in a predetermined direction (e.g. horizontal direction or vertical direction), can be provided.

An eighth aspect of the invention is a vehicular lamp fitting equipped with a lens body which includes: a light source, a first lens unit, and a second lens unit, and is configured such that light from the light source enters the first lens unit through a first entry surface of the first lens unit, exits through a first exit surface of the first lens unit after being partially shielded by the shade of the first lens unit, further enters the second lens unit through a second entry surface of the second lens unit, then exits through a second exit surface of the second lens unit, and is irradiated forward, so as to form a predetermined light distribution pattern which includes a cut-off line defined on an upper edge by the shade. The first exit surface is a surface configured to condense the light which from the light source, which exits through the first exit surface in a first direction, and is configured as a semicircular cylindrical surface, and the second exit surface is a surface configured to condense the light from the light source, which exits through the second exit surface in a second direction which is orthogonal to the first direction, and is configured as a semicircular cylindrical surface.

According to the eighth aspect of the invention, a vehicular lamp fitting equipped with a lens body, having an integral appearance linearly extending in a predetermined direction, can be provided. Secondly, a vehicular lamp fitting, equipped with a lens body that can form a predetermined light distribution pattern condensed in the horizontal direction and vertical direction (e.g. low beam light distribution pattern which includes a cut-off line defined on the upper edge by the shade), can be provided, even though the second exit surface, which is the final exit surface, is a semicircular cylindrical surface (semicircular cylindrical refractive surface).

The integral appearance linearly extending in a predetermined direction can be implemented because the second surface, which is the final exit surface, is configured as a semicircular cylindrical surface (semicircular cylindrical refractive surface).

The predetermined light distribution pattern condensed in the horizontal direction and vertical direction (e.g. low beam light distribution pattern which includes a cut-off line defined on an upper edge by the shade), can be formed even though the second exit surface, which is the final exit surface, is a semicircular cylindrical surface (semicircular cylindrical refractive surface), because condensing light in a first direction (e.g. horizontal direction or vertical direction) is mainly performed by the first exit surface (semicircular cylindrical refractive surface) of the first lens unit, and condensing light in a second direction (e.g. vertical direction or horizontal direction), which is orthogonal to the first direction, is mainly performed by the second exit surface (semicircular cylindrical refractive surface) of the second lens unit, which is the final exit surface of the lens body. In other words, the condensing functions are separated.

A ninth aspect of the invention is the eighth aspect of the invention, wherein the lens body is a lens body which has a shape along a first reference axis extending in the horizontal direction, the first lens unit includes: the first entry surface, a reflection surface, the shade and the first exit surface, the second lens unit includes the second entry surface and the second exit surface, the first entry surface, the reflection surface, the shade, the first exit surface, the second entry surface and the second exit surface are disposed in this order along the first reference axis, the first entry surface is a surface through which the light, from the light source disposed in the vicinity of the first entry surface, is refracted and enters the first lens unit, and which is configured such that the light from the light source, which entered the first lens unit, is condensed in a direction closer to a second reference axis at least in the vertical direction, the second reference axis passing through the center of the light source and a point in the vicinity of the shade and inclined forward and diagonally downward with respect to the first reference axis, the reflection surface extends forward from the lower edge of the first entry surface, and the shade is formed in the front end of the reflection surface.

According to the ninth aspect of the invention, a vehicular lamp fitting equipped with a lens body, without including a reflection surface formed by metal deposition, which is a factor that increases cost, can be provided. Secondly, a vehicular lamp fitting equipped with a lens body, that can suppress melting of the lens body or a drop in the output of the light source, caused by the heat generated by the light source, can be provided.

The reflection surface formed by metal deposition, which is a factor that increases cost, can be omitted, because the light from the light source is controlled not by the reflection surface formed by metal deposition but by refraction on the entry surface and internal reflection on the reflection surface.

Melting of the lens body or a drop in the output of the light source, caused by heat generated in the light source, can be suppressed, because the entry surface is formed on the rear end of the lens body, and the light source is disposed outside the lens body (that is, in a position distant from the entry surface of the lens body).

A tenth aspect of the invention is a vehicular lamp fitting equipped with a lens body which includes a light source, a shade, a first lens unit and a second lens unit, and is configured such that light from the light source enters the first lens unit through a first entry surface of the first lens unit after being partially shielded by the shade, exits through the first exit surface of the first lens unit, further enters the second lens unit through a second entry surface of the second lens unit, then exits through a second exit surface of the second lens unit, and is irradiated forward, so as to form a predetermined light distribution pattern which includes a cut-off line defined on an upper edge by the shade. The first exit surface is a surface configured to condense the light from the light source, which exits through the first exit surface, in a first direction, and is configured as a semicircular cylindrical surface, and the second exit surface is a surface configured to condense the light from the light source, which exits through the second exit surface, in a second direction which is orthogonal to the first direction, and is configured as a semicircular cylindrical surface.

According to the tenth aspect of the invention, a vehicular lamp fitting equipped with a lens body, having an integral appearance linearly extending in a predetermined direction (e.g. direct projection type or projector type vehicular lamp fitting), can be provided. Secondly, a vehicular lamp fitting equipped with a lens body that can form a predetermined light distribution pattern (e.g. low beam light distribution pattern which includes a cut-off line defined on the upper edge by the shade) condensed in the horizontal direction and vertical direction (e.g. direct projection type or projector type vehicular lamp fitting), can be provided, even though the second exit surface, which is the final exit surface, is a semicircular cylindrical surface (semicircular cylindrical refractive surface).

The integral appearance linearly extending in a predetermined direction can be implemented because the second exit surface, which is the final exit surface, is configured as a semicircular cylindrical surface (semicircular cylindrical refractive surface).

The predetermined light distribution pattern condensed in the horizontal direction and vertical direction (e.g. low beam light distribution pattern which includes a cut-off line defined on the upper edge by the shade), can be formed even though the second exit surface, which is the final exit surface, is a semicircular cylindrical surface (semicircular cylindrical refractive surface), because condensing light in a first direction (e.g. horizontal direction or vertical direction) is mainly performed by the first exit surface (semicircular cylindrical refractive surface) of the first lens unit, and condensing light in a second direction (e.g. vertical direction or horizontal direction), which is orthogonal to the first direction, is mainly performed by the second exit surface (semicircular cylindrical refractive surface) of the second lens unit, which is the final exit surface of the lens body. In other words, the condensing functions are separated.

An eleventh aspect of the invention is a vehicular lamp fitting equipped with a lens body which includes a light source, a first lens unit and a second lens unit, and is configured such that light from the light source enters the first lens unit through a first entry surface of the first lens unit, exits through a first exit surface of the first lens unit, further enters the second lens unit through a second entry surface of the second lens unit, then exits through a second exit surface of the second lens unit, and is irradiated forward, so as to form a predetermined light distribution pattern. The first exit surface is a surface configured to condense the light from the light source, which exits through the first exit surface, in a first direction, and is configured as a semicircular cylindrical surface, and the second exit surface is a surface configured to condense the light from the light source, which exits through the second exit surface, in a second direction which is orthogonal to the first direction, and is configured as a semicircular cylindrical surface.

According to the eleventh aspect of the invention, a vehicular lamp fitting equipped with a lens body, having an integral appearance linearly extending in a predetermined direction (e.g. direct projection type or projector type vehicular lamp fitting), can be provided. Secondly, a vehicular lamp fitting equipped with a lens body, which can form a predetermined light distribution pattern (e.g. high beam light distribution pattern) condensed in the horizontal direction and vertical direction (e.g. direct projection type or projector type vehicular lamp fitting), can be provided, even though the second exit surface, which is the final exit surface, is a semicircular cylindrical surface (semicircular cylindrical refractive surface).

The integral appearance linearly extending in a predetermined direction can be implemented because the second exit surface, which is the final exit surface, is configured as a semicircular cylindrical surface (semicircular cylindrical refractive surface).

The predetermined light distribution pattern condensed in the horizontal direction and vertical direction (e.g. high beam light distribution pattern), can be formed even though the second exit surface, which is the final exit surface, is a semicircular cylindrical surface (semicircular cylindrical refractive surface), because condensing light in a first direction (e.g. horizontal direction or vertical direction) is mainly performed by the first exit surface (semicircular cylindrical refractive surface) of the first lens unit, and condensing light in a second direction (e.g. vertical direction or horizontal direction), which is orthogonal to the first direction, is mainly performed by the second exit surface (semicircular cylindrical refractive surface) of the second lens unit, which is the final exit surface or the lens body. In other words, the condensing functions are separated.

To achieve the first object, a twelfth aspect of the invention is a lens body which includes a first lens unit and a second lens unit disposed along a first reference axis extending in the horizontal direction, and is configured such that light from a light source enters the first lens unit through a first entry surface of the first lens unit, exits through a first exit surface of the first lens unit after being partially shielded by a shade of the first lens unit, further enters the second lens unit through a second entry surface of the second lens unit, then exits through a second exit surface of the second lens unit, and is irradiated forward, so as to form a predetermined light distribution pattern which includes a cut-off line defined on an upper edge by the shade. The second exit surface is a semicircular cylindrical surface extending in a direction inclined with respect to the first reference axis, and the first exit surface is a semicircular cylindrical surface extending in the vertical direction when viewed from the top, and the surface shapes thereof are adjusted such that the predetermined light distribution patterns are generally condensed.

According to the twelfth aspect of the invention, a lens body having a new appearance in which a camber angle is added can be provided. In other words, a lens body, having an integral appearance linearly extending in a direction inclined with respect to the first reference axis by a predetermined angle when viewed from the top, can be provided. Secondly, a lens body, that can form a predetermined light distribution pattern condensed in the horizontal direction and vertical direction (e.g. low beam light distribution pattern which includes a cut-off line defined on the upper edge by the shade), can be provided, even though the second exit surface, which is the final exit surface, is a semicircular cylindrical surface (semicircular cylindrical refractive surface). Thirdly, a lens body that can form a predetermined light distribution pattern, which is generally condensed, can be provided, even though the camber angle is added.

The integral appearance linearly extending in a direction inclined with respect to the first reference axis by a predetermined angle can be implemented, because the second exit surface, which is the final exit surface, is configured as a semicircular cylindrical surface (semicircular cylindrical refractive surface), and this second exit surface extends in a direction inclined with respect to the first reference axis when viewed from the top.

The predetermined light distribution pattern condensed into the horizontal direction and the vertical direction (e.g. low beam light distribution pattern which includes a cut-off line defined on the upper edge by the shade) can be formed even though the second exit surface, which is the final exit surface, is the semicircular cylindrical surface (semicircular cylindrical refractive surface), because condensing light in the horizontal direction is mainly performed by the first exit surface (semicircular cylindrical refractive surface) of the first lens unit, and condensing light in the vertical direction is mainly performed by the second exit surface (semicircular cylindrical refractive surface) of the second lens unit, which is the final exit surface of the lens body. In other words, the condensing functions are separated.

The predetermined light distribution pattern is generally condensed even though the camber angle is added, because the first exit surface is a semicircular cylindrical surface extending in the vertical direction, and the surface shape is adjusted such that the predetermined light distribution pattern is generally condensed.

A thirteenth aspect of the invention is the twelfth aspect of the invention, wherein the lens body is a lens body which has a shape along a first reference axis extending in the horizontal direction, the first lens unit includes the first entry surface, a reflection surface, the shade and the first exit surface, the second lens unit includes the second entry surface and the second exit surface, the first entry surface, the reflection surface, the shade, the first exit surface, the second entry surface and the second exit surface are disposed in this order along the first reference axis, the first entry surface is a surface through which the light from the light source disposed in the vicinity of the first entry surface is refracted and enters the first lens unit, and which is configured such that the light from the light source, which entered the first lens unit, is condensed in a direction closer to a second reference axis at least in the vertical direction, the second reference axis passing through the center of the light source and a point in the vicinity of the shade and inclined forward and diagonally downward with respect to the first reference axis, and the reflection surface extends forward from the lower edge of the first entry surface, and the shade is formed in the front end of the reflection surface.

According to the thirteenth aspect of the invention, a lens body, without including a reflection surface formed by metal deposition, which is a factor that increases cost, can be provided. Secondly, a lens body that can suppress the melting of the lens body or a drop in the output of the light source, caused by heat generated in the light source, can be provided.

The reflection surface formed by metal deposition, which is a factor that increases cost, can be omitted, because the light from the light source is controlled not by the reflection surface formed by metal deposition but by refraction on the entry surface and internal reflection on the reflection surface.

Melting of the lens body or a drop in the output of the light source, caused by heat generated in the light source, can be suppressed, because the entry surface is formed on the rear end of the lens body, and the light source is disposed outside the lens body (that is, in a position distant from the entry surface of the lens body).

A fourteenth aspect of the invention is a lens body which includes a first lens unit and a second lens unit, disposed along a first reference axis extending in the horizontal direction, and is configured such that light from a light source enters the first lens unit through a first entry surface of the first lens unit, exits through a first exit surface of the first lens unit after being partially shielded by a shade of the first lens unit, further enters the second lens unit through a second entry surface of the second lens unit, then exits through a second exit surface of the second lens unit, and is irradiated forward, so as to form a predetermined light distribution pattern which includes a cut-off line defined on an upper edge by the shade. The second exit surface is a semicircular cylindrical surface extending in a direction inclined with respect to the horizontal direction by a predetermined angle when viewed from the front, the first exit surface is a semicircular cylindrical surface extending in a direction inclined from the vertical direction by the predetermined angle when viewed from the front, and the shade is disposed in an attitude inclined with respect to horizontal direction by the predetermined angle in the opposite direction of the second exit surface and the first exit surface when viewed from the front.

According to the fourteenth aspect of the invention, a lens body having a new appearance, in which a slant angle is added, can be provided. In other words, a lens body, having an integral appearance linearly extending in a direction inclined with respect to the horizontal direction by a predetermined angel when viewed from the front, can be provided. Secondly, a lens body that can form a predetermined light distribution pattern condensed in the horizontal direction and vertical direction (e.g. low beam light distribution pattern which includes a cut-off line defined on the upper edge by the shade), can be provided, even though the second exit surface, which is the final exit surface, is a semicircular cylindrical surface (semicircular cylindrical refractive surface). Thirdly, a lens body that can suppress rotation of the predetermined light distribution pattern can be provided, even though a slant angle is added.

The integral appearance linearly extending in a direction inclined with respect to the horizontal direction by a predetermined angle can be implemented, because the second exit surface, which is the final exit surface, is configured as a semicircular cylindrical surface (semicircular cylindrical refractive surface), and this second exit surface extends in a direction inclined with respect to the horizontal direction when viewed from the front.

The predetermined light distribution pattern condensed in the horizontal direction and vertical direction (e.g. low beam light distribution pattern which includes a cut-off line defined on the upper edge by the shade) can be formed even though the second exit surface, which is the final exit surface, is the semicircular cylindrical surface (semicircular cylindrical refractive surface), because condensing light in the horizontal direction is mainly performed by the first exit surface (semicircular cylindrical refractive surface) of the first lens unit, and condensing light in the vertical direction is mainly performed by the second exit surface (semicircular cylindrical refractive surface) of the second lens unit, which is the final exit surface of the lens body. In other words, the condensing functions are separated.

The rotation of the predetermined light distribution pattern is suppressed even though the slant angle is added, because the first exit surface is the semicircular cylindrical surface extending in a direction inclined with respect to the vertical direction by a predetermined angle when viewed from the front, and the shade is disposed in an attitude inclined with respect to the horizontal direction by a predetermined angle in the opposite direction of the second exit surface and the first exit surface when viewed from the front.

A fifteenth aspect of the invention is the fourteenth aspect of the invention, wherein the second exit surface extends in a direction inclined with respect to the first reference axis when viewed from the top, and the surface shape of the first exit surface is adjusted such that the predetermined light distribution pattern is generally condensed.

According to the fifteenth aspect of the invention, a lens body having a new appearance, in which a camber angle and a slant angle are added, can be provided.

A sixteenth aspect of the invention is the fourteenth or fifteenth aspect of the invention, wherein the lens body is a lens body which has a shape extending along the first reference axis, the first lens unit includes: the first entry surface, a reflection surface, the shade and the first exit surface, the second lens unit includes the second entry surface and the second exit surface, the first entry surface, the reflection surface, the shade, the first exit surface, the second entry surface and the second exit surface are disposed in this order along the first reference axis, the first entry surface is a surface through which the light from the light source, disposed in the vicinity of the first entry surface, is refracted and enters the first lens unit, and which is configured such that the light from the light source, which entered the first lens unit, is condensed in a direction closer to a second reference axis at least in the vertical direction, the second reference axis passing through the center of the light source and a point in the vicinity of the shade and inclined forward and diagonally downward with respect to the first reference axis, the reflection surface extends forward from the lower edge of the first entry surface, and is disposed in an attitude inclined with respect to the horizontal direction by the predetermined angle in the opposite direction of the second exit surface and the first exit surface when viewed from the front, and the shade is formed in the front end of the reflection surface.

According to the sixteenth aspect of the invention, a lens body, without including a reflection surface formed by metal deposition, which is a factor that increases cost, can be provided. Secondly, a lens body that can suppress the melting of the lens body or a drop in the output of the light source, caused by heat generated in the light source, can be provided.

The reflection surface formed by metal deposition, which is a factor that increases cost, can be omitted, because the light from the light source is controlled not by the reflection surface formed by metal deposition but by refraction on the entry surface and internal reflection on the reflection surface.

Melting of the lens body or a drop in the output of the light source, caused by heat generated in the light source, can be suppressed, because the entry surface is formed on the rear end of the lens body, and the light source is disposed outside the lens body (that is, in a position distant from the entry surface of the lens body).

A seventeenth aspect of the invention is the thirteenth or sixteenth aspect of the invention, wherein the lens body includes a first lens unit, a second lens unit, and a connecting unit which connects the first lens unit and the second lens unit, and the connecting unit connects the first lens unit and the second lens unit in a state of forming a space surrounded by the first exit surface, the second entry surface and the connecting unit.

According to the seventeenth aspect of the invention, a lens body, in which the first lens unit and the second lens unit are connected, can be provided.

An eighteenth aspect of the invention is the seventeenth aspect of the invention, wherein the lens body is a lens body integrally molded by injection molding using a die, and the space is formed by a die of which the extracting direction is opposite from the connecting unit, an extracting angle is set for the first exit surface and the second entry surface respectively so as to extract the die smoothly, and the surface shape of the second exit surface is adjusted such that the light from the light source, which exited from the second exit surface, becomes light in parallel with the first reference axis.

According to the eighteenth aspect of the invention, a lens body suitable for a vehicular lamp fitting is provided, wherein the light from the light source, which exits from the second exit surface, which is the final exit surface, becomes light in parallel with the first reference axis, even though the extracting angle is set for the first exit surface and the second entry surface respectively.

The nineteenth aspect of the invention is any one of the twelfth to eighteenth aspects of the invention, wherein a part of a lower region of the second exit surface is cut off.

According to the nineteenth aspect of the invention, the light travelling diagonally upward can be suppressed by cutting off a part of the region through which light, travelling diagonally upward with respect to the horizontal direction, exits. As a result, the generation of glare can be suppressed, and the cut-off line can be clearer.

The twentieth aspect of the invention is any one of the first to seventh aspects of the invention, wherein the surface shape of a part of a lower region of the second exit surface is adjusted such that the light emitting from this part of the region becomes a light that is parallel or downward with respect to the first reference axis.

According to the twentieth aspect of the invention, the light travelling diagonally upward can be suppressed by adjusting the part of the region through which the light travelling upward, with respect to the horizontal direction, exits, in the way described in the twentieth aspect of the invention. As a result, the generation of glare can be suppressed, and the cut-off line can be clearer.

The twenty-first aspect of the invention is any one of the thirteenth and the sixteenth to eighteenth aspects of the invention, wherein the second reference axis is inclined with respect to the first reference axis when viewed from the top.

According to the twenty-first aspect of the invention, the Fresnel reflection loss (particularly the Fresnel reflection loss with respect to the second exit surface to which a camber angle is added), is suppressed, and as a result, light utilization efficiency improves.

The twenty-second aspect of the invention is a combined lens body which includes a plurality of lens bodies according to any one of the twelfth to twenty-first aspects of the invention, and is integrally molded, wherein the second exit surface of each one of the plurality of lens bodies is disposed on a line in a state of being adjacent to each other, so as to constitute a semicircular cylindrical exit surface group, linearly extending in a predetermined direction.

According to the twenty-second aspect of the invention, a combined lens body, having an integral appearance linearly extending in a predetermined direction, can be provided.

A twenty-third aspect of the invention is a vehicular lamp fitting equipped with a lens body which includes a light source, and a first lens unit and a second lens unit disposed along a first reference axis extending in the horizontal direction, and is configured such that light from the light source enters the first lens unit through a first entry surface of the first lens unit, exits through a first exit surface of the first lens unit after being partially shielded by a shade of the first lens unit, further enters the second lens unit through a second entry surface of the second lens unit, then exits through a second exit surface of the second lens unit, and is irradiated forward, so as to form a predetermined light distribution pattern which includes a cut-off line defined on an upper edge by the shade. The second exit surface is a semicircular cylindrical surface extending in a direction inclined with respect to the first reference axis, and the first exit surface is a semicircular cylindrical surface extending in the vertical direction when viewed from the top, and the surface shapes thereof are adjusted such that the predetermined light distribution patterns are generally condensed.

According to the twenty-third aspect of the invention, a vehicular lamp fitting equipped with a lens body having a new appearance, in which a camber angle is added, can be provided. In other words, a vehicular lamp fitting, equipped with a lens body, having an integral appearance linearly extending in a direction inclined with respect to the first reference axis by a predetermined angle when viewed from the top, can be provided. Secondly, a vehicular lamp fitting, equipped with a lens body that can form a predetermined light distribution pattern condensed in the horizontal direction and vertical direction (e.g. low beam light distribution pattern which includes a cut-off line defined on an upper edge by the shade), can be provided, even though the second exit surface, which is the final exit surface, is a semicircular cylindrical surface (semicircular cylindrical refractive surface). Thirdly, a vehicular lamp fitting equipped with a lens body that can form a predetermined light distribution pattern, which is generally condensed, can be provided, even though the camber angle is added.

The integral appearance linearly extending in a direction inclined with respect to the first reference axis by a predetermined angle can be implemented because the second exit surface, which is the final exit surface, is configured as a semicircular cylindrical surface (semicircular cylindrical refractive surface), and this second exit surface extends in a direction inclined with respect to the first reference axis when viewed from the top.

The predetermined light distribution pattern condensed into the horizontal direction and vertical direction (e.g. low beam light distribution pattern which includes a cut-off line defined on the upper edge by the shade) can be formed even though the second exit surface, which is the final exit surface, is the semicircular cylindrical surface (semicircular cylindrical refractive surface), because condensing light in the horizontal direction is mainly performed by the first exit surface (semicircular cylindrical refractive surface) of the first lens unit, and condensing light in the vertical direction is mainly performed by the second exit surface (semicircular cylindrical refractive surface) of the second lens unit, which is the final exit surface of the lens body. In other words, the condensing functions are separated.

The predetermined light distribution pattern is generally condensed even though the camber angle is added, because the first exit surface is a semicircular cylindrical surface extending in the vertical direction, and the shape of the surface is adjusted such that the predetermined light distribution pattern is generally condensed.

A twenty-fourth aspect of the invention is the twenty-third aspect of the invention, wherein the lens body is a lens body which has a shape extending along the first reference axis, the first lens unit includes the first entry surface, a reflection surface, the shade, and the first exit surface, the second lens unit includes the second entry surface and the second exit surface, the first entry surface, the reflection surface, the shade, the first exit surface, the second entry surface and the second exit surface are disposed in this order along the first reference axis, the first entry surface is a surface through which the light from the light source disposed in the vicinity of the first entry surface is refracted and enters the first lens unit, and which is configured such that the light from the light source, which entered the first lens unit, is condensed in a direction closer to a second reference axis at least in the vertical direction, the second reference axis passing through the center of the light source and a point in the vicinity of the shade and inclined forward and diagonally downward with respect to the first reference axis, the reflection surface extends forward from the lower edge of the first entry surface, and the shade is formed in the front end of the reflection surface.

According to the twenty-fourth aspect of the invention, a vehicular lamp fitting equipped with a lens body, without including a reflection surface formed by metal deposition, which is a factor that increases cost, can be provided. Secondly, a vehicular lamp fitting equipped with a lens body, that can suppress melting of the lens body or a drop in the output of the light source, caused by the heat generated by the light source, can be provided.

The reflection surface formed by metal deposition, which is a factor that increases cost, can be omitted, because the light from the light source is controlled not by the reflection surface formed by metal deposition but by refraction on the entry surface and internal reflection on the reflection surface.

Melting of the lens body or a drop in the output of the light source, caused by heat generated in the light source, can be suppressed, because the entry surface is formed on the rear end of the lens body, and the light source is disposed outside the lens body (that is, in a position distant from the entry surface of the lens body).

A twenty-fifth aspect of the invention is a vehicular lamp fitting equipped with a lens body which includes a light source, and a first lens unit and a second lens unit disposed along a first reference axis extending in the horizontal direction, and is configured such that light from the light source enters the first lens unit through a first entry surface of the first lens unit, exits through a first exit surface of the first lens unit after being partially shielded by a shade of the first lens unit, further enters the second lens unit through a second entry surface of the second lens unit, then exits through a second exit surface of the second lens unit, and is irradiated forward, so as to form a predetermined light distribution pattern which includes a cut-off line defined on an upper edge by the shade. The second exit surface is a semicircular cylindrical surface extending in a direction inclined with respect to the horizontal direction by a predetermined angle when viewed from the front, the first exit surface is a semicircular cylindrical surface extending in a direction inclined with respect to the vertical direction by the predetermined angle when viewed from the front, and the shade is disposed in an attitude inclined with respect to the horizontal direction by the predetermined angel in the opposite direction of the second exit surface and the first exit surface when viewed from the front.

According to the twenty-fifth aspect of the invention, a vehicular lamp fitting equipped with a lens body having a new appearance, in which a slant angle is added, can be provided. In other words, a vehicular lamp fitting equipped with a lens body having an integral appearance linearly extending in a direction, inclined with respect to the horizontal direction by a predetermined angel when viewed from the front, can be provided. Secondly, a vehicular lamp fitting equipped with a lens body that can form a predetermined light distribution pattern condensed in the horizontal direction and vertical direction (e.g. low beam light distribution pattern which includes a cut-off line defined on an upper edge by the shade), can be provided, even though the second exit surface, which is the final exit surface, is a semicircular cylindrical surface (semicircular cylindrical refractive surface). Thirdly, a vehicular lamp fitting equipped with a lens body that can suppress the rotation of the predetermined light distribution pattern can be provided, even though a slant angle is added.

The integral appearance linearly extending in a direction inclined with respect to the horizontal direction by a predetermined angle can be implemented, because the second exit surface, which is the final exit surface, is configured as a semicircular cylindrical surface (semicircular cylindrical refractive surface), and this second exit surface extends in a direction inclined with respect to the horizontal direction when viewed from the front.

The predetermined light distribution pattern condensed into the horizontal direction and vertical direction (e.g. low beam light distribution pattern which includes a cut-off line defined on an upper edge by the shade) can be formed even though the second exit surface, which is the final exit surface, is the semicircular cylindrical surface (semicircular cylindrical refractive surface), because condensing light in the horizontal direction is mainly performed by the first exit surface (semicircular cylindrical refractive surface) of the first lens unit, and condensing light in the vertical direction is mainly performed by the second exit surface (semicircular cylindrical refractive surface) of the second lens unit, which is the final exit surface of the lens body. In other words, the condensing functions are separated.

The rotation of the predetermined light distribution pattern is suppressed even though the slant angle is added, because the first exit surface is the semicircular cylindrical surface extending in a direction inclined with respect to the vertical direction by a predetermined angle when viewed from the front, and the shade is disposed in an attitude inclined with respect to the horizontal direction by a predetermined angle in the opposite direction of the second exit surface and the first exit surface.

A twenty-sixth aspect of the invention is the twenty-fifth aspect of the invention, wherein the second exit surface extends in a direction inclined with respect to the first reference axis when viewed from the top, and the surface shape of the first exit surface is adjusted such that the predetermined light distribution pattern is generally condensed.

According to the twenty-sixth aspect of the invention, a vehicular lamp fitting equipped with a lens body having a new appearance, in which a camber angle and a slant angle are added, can be provided.

A twenty-seventh aspect of the invention is the twenty-fifth or twenty-sixth aspect of the invention, wherein the lens body is a lens body which has a shape extending along the first reference axis, the first lens unit includes the first entry surface, a reflection surface, the shade and the first exit surface, the second lens unit includes the second entry surface and the second exit surface, the first entry surface, the reflection surface, the shade, the first exit surface, the second entry surface and the second exit surface are disposed in this order along the first reference axis, the first entry surface is a surface through which the light from the light source, disposed in the vicinity of the first entry surface, is refracted and enters the first lens unit, and which is configured such that the light from the light source, which entered the first lens unit, is condensed in a direction closer to a second reference axis at least in the vertical direction, the second reference axis passing through the center of the light source and a point in the vicinity of the shade and inclined forward and diagonally downward with respect to the first reference axis, the reflection surface extends forward from the lower edge of the first entry surface, and is disposed in an attitude inclined with respect to the horizontal direction by the predetermined angle in the opposite direction of the second exit surface and the first exit surface when viewed from the front, and the shade is formed in the front end of the reflection surface.

According to the twenty-seventh aspect of the invention, a vehicular lamp fitting equipped with a lens body, without including a reflection surface formed by metal deposition, which is a factor that increases cost, can be provided. Secondly, a vehicular lamp fitting equipped with a lens body that can suppress the melting of the lens body or a drop in the output of the light source, caused by heat generated in the light source, can be provided.

The reflection surface formed by metal deposition, which is a factor that increases cost, can be omitted, because the light from the light source is controlled not by the reflection surface formed by metal deposition but by refraction on the entry surface and internal reflection on the reflection surface.

Melting of the lens body or a drop in the output of the light source, caused by heat generated in the light source, can be suppressed, because the entry surface is formed on the rear end of the lens body, and the light source is disposed outside the lens body (that is, in a position distant from the entry surface of the lens body).

A twenty-eighth aspect of the invention is a vehicular lamp fitting equipped with a lens body which includes a light source, a shade, and a first lens unit and a second lens unit disposed along a first reference axis extending in the horizontal direction, and is configured such that light from the light source enters the first lens unit through a first entry surface of the first lens unit after being partially shielded by the shade, exits through a first exit surface of the first lens unit, further enters the second lens unit through a second entry surface of the second lens unit, then exits through a second exit surface of the second lens unit, and is irradiated forward, so as to form a predetermined light distribution pattern which includes a cut-off line defined on an upper edge by the shade. The second exit surface is a semicircular cylindrical surface extending in a direction inclined with respect to the first reference axis, and the first exit surface is a semicircular cylindrical surface extending in the vertical direction when viewed from the top, and the surface shapes thereof are adjusted so that the predetermined light distribution pattern is generally condensed.

According to the twenty-eighth aspect of the invention, a vehicular lamp fitting, equipped with a lens body having a new appearance in which a camber angle is added, can be provided. In other words, a vehicular lamp fitting, equipped with a lens body having an integral appearance linearly extending in a direction inclined with respect to the first reference axis by a predetermined angle when viewed from the top, can be provided (e.g. direct projection type or projector type vehicular lamp fitting). Secondly, a vehicular lamp fitting, equipped with a lens body that can form a predetermined light distribution pattern (e.g. low beam light distribution pattern which includes a cut-off line defined on the upper edge by the shade) condensed in the horizontal direction and vertical direction (e.g. direct projection type or projector type vehicular lamp fitting), can be provided, even though the second exit surface, which is the final exit surface, is a semicircular cylindrical surface (semicircular cylindrical refractive surface). Thirdly, a vehicular lamp fitting, equipped with a lens body that can form a predetermined light distribution pattern which is generally condensed, can be provided (e.g. direct projection type or projector type vehicular lamp fitting), even though the camber angle is added.

The integral appearance linearly extending in a direction inclined with respect to the first reference axis by a predetermined angle can be implemented because the second exit surface, which is the final exit surface, is configured as a semicircular cylindrical surface (semicircular cylindrical refractive surface), and this second exit surface extends in a direction inclined with respect to the first reference axis when viewed from the top.

The predetermined light distribution pattern condensed into the horizontal direction and vertical direction (e.g. low beam light distribution pattern which includes a cut-off line defined on an upper edge by the shade) can be formed even though the second exit surface, which is the final exit surface, is the semicircular cylindrical surface (semicircular cylindrical refractive surface), because condensing light in the horizontal direction is mainly performed by the first exit surface (semicircular cylindrical refractive surface) of the first lens unit, and condensing light in the vertical direction is mainly performed by the second exit surface (semicircular cylindrical refractive surface) of the second lens unit, which is the final exit surface of the lens body. In other words, the condensing functions are separated.

The predetermined light distribution pattern is generally condensed even though the camber angle is added, because the first exit surface is a semicircular cylindrical surface extending in the vertical direction, and the surface shape is adjusted such that the predetermined light distribution pattern is generally condensed.

A twenty-ninth aspect of the invention is a vehicular lamp fitting equipped with a lens body, which includes a light source, a shade, and a first lens unit and a second lens unit disposed along a first reference axis extending in the horizontal direction, and is configured such that light from the light source enters the first lens unit through a first entry surface of the first lens unit after being partially shielded by a shade, exits through a first exit surface of the first lens unit, further enters the second lens unit through a second entry surface of the second lens unit, then exits through a second exit surface of the second lens unit, and is irradiated forward, so as to form a predetermined light distribution pattern which includes a cut-off line defined on an upper edge by the shade. The second exit surface is a semicircular cylindrical surface extending in a direction inclined with respect to the horizontal direction by a predetermined angle when viewed from the front, the first exit surface is a semicircular cylindrical surface extending in a direction inclined with respect to the vertical direction by the predetermined angle when viewed from the front, and the shade is disposed in the attitude inclined with respect to the horizontal direction by the predetermined angle in the opposite direction of the second exit surface and the first exit surface when viewed from the front.

According to the twenty-ninth aspect of the invention, a vehicular lamp fitting equipped with a lens body having a new appearance, in which a slant angle is added, can be provided (e.g. direct projection type or projector type vehicular lamp fitting). In other words, a vehicular lamp fitting equipped with a lens body, having an integral appearance linearly extending in a direction inclined with respect to the horizontal direction by a predetermined angle when viewed from the front, can be provided (e.g. direct projection type or projector type vehicular lamp fitting). Secondly, a vehicular lamp fitting equipped with a lens body that can form a predetermined light distribution pattern condensed in the horizontal direction and vertical direction (e.g. low beam light distribution pattern which includes a cut-off line defined on an upper edge by the shade), can be provided (e.g. direct projection type or projector type vehicular lamp fitting), even though the second exit surface, which is the final exit surface, is a semicircular cylindrical surface (semicircular cylindrical refractive surface). Thirdly, a vehicular lamp fitting equipped with a lens body that can suppress rotation of the predetermined light distribution pattern can be provided (e.g. direct projection type or projector type vehicular lamp fitting), even though a slant angle is added.

The integral appearance linearly extending in a direction inclined with respect to the horizontal direction by a predetermined angle can be implemented, because the second exit surface, which is the final exit surface, is configured as a semicircular cylindrical surface (semicircular cylindrical refractive surface), and this second exit surface extends in a direction inclined with respect to the horizontal direction when viewed from the front.

The predetermined light distribution pattern condensed in the horizontal direction and vertical direction (e.g. low beam light distribution pattern which includes a cut-off line defined on an upper edge by the shade) can be formed even though the second exit surface, which is the final exit surface, is the semicircular cylindrical surface (semicircular cylindrical refractive surface), because condensing light in the horizontal direction is mainly performed by the first exit surface (semicircular cylindrical refractive surface) of the first lens unit, and condensing light in the vertical direction is mainly performed by the second exit surface (semicircular cylindrical refractive surface) of the second lens unit, which is the final exit surface of the lens body. In other words, the condensing functions are separated.

The rotation of the predetermined light distribution pattern is suppressed even though the slant angle is added, because the first exit surface is the semicircular cylindrical surface extending in a direction inclined with respect to the vertical direction by a predetermined angle when viewed from the front, and the shade is disposed in an attitude inclined with respect to the horizontal direction by a predetermined angle in the opposite direction of the second exit surface and the first exit surface when viewed from the front.

A thirtieth aspect of the invention is the twenty-ninth aspect of the invention, wherein the second exit surface extends in a direction inclined with respect to the first reference axis when viewed from the top, and the surface shape of the first exit surface is adjusted such that the predetermined light distribution pattern is generally condensed.

According to the thirtieth aspect of the invention, a vehicular lamp fitting, equipped with a lens body having a new appearance in which a camber angle and a slant angle are added, can be provided (e.g. direct projection type or projector type vehicular lamp fitting).

In order to achieve the second and third object, the invention according to the 31 embodiment of the rear end, a front end, arranged a pair of left and right sides between the rear end and the front end portion and, in the lens body including a lower reflective surface disposed between the rear end and the front end, the rear end portion has a first incident surface, and, on the left and right sides of said first entrance surface, the first 1 includes a pair of left and right entrance face the space disposed so as to surround the left and right sides between the entrance surface light source and the first entrance surface disposed in the vicinity of, the front end includes an exit surface, the lower tip of the reflecting surface includes a shade, the first incident surface, the lower reflection surface, and said exit surface, said one of said first incident surface of light from the light source incident on the interior of the lens body and light, protected from light in part by the shade, the light internally reflected by the lower reflection surface, by being irradiated forward emitted from a partial area of the emitting surface, defined by the shade to the upper edge that constitute a first optical system for forming a first light distribution pattern including a cutoff line, the pair of left and right entrance surface, said pair of right and left side faces, and said exit surface, from the pair of left and right entrance surface light from the pair of the light source is internally reflected by the side surface is incident on the interior of the lens body is emitted forward mainly the emission from both left and right sides of a region of the partial region of the exit plane it allows the being superposed on the first light distribution pattern, characterized in that it constitutes a second optical system for forming a second light distribution pattern that has diffused from the first light distribution pattern.

According to the invention of the 31 aspect, to the first, it is possible to provide a lens body can be maintained even linear luminous appearance changes viewpoint position. Second, it is possible to provide a lens body which can realize the appearance of uniform light emission (or substantially uniform light emission). Third, the efficiency of capturing the light from the light source inside the lens body is dramatically improved.

Can be the viewpoint position is maintained also linear luminous appearance change is one lens body, a plurality of light distribution patterns that degree of diffusion are different, i.e., the first light distribution pattern and the second light distribution pattern a plurality of optical systems that form a, i.e., is by and a first optical system and second optical system.

Uniform light emission (or substantially uniform light emission) can be realized the appearance of each of the incident surface, i.e., light from a light source incident on the inner lens body from the first incident surface and a pair of left and right incident surface of each reflecting surfaces, i.e., results that are reflected under the reflection surface and a pair of left and right side, in addition to multi-point emission inside the lens body, each of the reflecting surfaces, i.e., light reflected from the lower reflective surface and the right and left pair of side but be uniformly emitted from almost the entire emission surface, i.e., a partial region of the reflected light from the lower reflecting surface emitting surface (e.g., the lateral middle region) is emitted from the pair of left and right side surfaces It reflected light, a part region of the mainly emitting surface (e.g., a central region of the left-right direction) is by exiting from the left and right sides of a region of.

The efficiency of capturing light from the light source inside the lens body is dramatically improved, each of the incident surface, i.e., due to the first incident surface and a pair of left and right entrance surface are arranged so as to surround the light source it is.

The invention according to a 32 aspect is the invention according to the thirty-first aspect, the lens member further includes a disposed upper surface between the front end and the rear end, the rear end, further, the above the first incident surface, wherein the upper incident surface which space is arranged to surround the upper between the light source and the first entrance surface, the upper incident surface, said top surface, and the emitting surface, the light from the light source which is internally reflected by the upper surface of the upper incident surface enters the interior of the lens body, primarily the left and right sides of the partial region and the partial region of said emitting surface by being irradiated with a region emitted from each of the upper area in front, the being superposed on the first light distribution pattern and the second light distribution pattern, a third light distribution diffused from the first light distribution pattern characterized in that it constitutes a third optical system for forming a pattern.

According to the invention of the 32 aspect, to the first, it is possible to provide a lens body can be maintained even linear luminous appearance changes viewpoint position. Second, it is possible to provide a lens body which can realize the appearance of uniform light emission (or substantially uniform light emission). Third, the efficiency of capturing the light from the light source inside the lens body is dramatically improved.

Can be the viewpoint position is maintained also linear luminous appearance change is one lens body, a plurality of light distribution patterns different degrees of diffusion, i.e., a first light distribution pattern, the second light distribution pattern and a plurality of optical systems for forming the third light distribution pattern, i.e., a first optical system, is by and a second optical system and the third optical system.

Uniform light emission (or substantially uniform light emission) can be realized the appearance of each of the incident surface, i.e., a first entrance surface, from the incident light source from the pair of left and right entrance surface and the upper incident surface inside the lens body a light reflection surface are each, i.e., the lower reflecting surface, the result is reflected by the pair of left and right side surfaces and upper surface, in addition to multi-point emission inside the lens body, each of the reflecting surfaces, i.e., the lower reflecting surface, left and right of the reflected light from the side surface and upper surface, to be uniformly emitted from almost the entire emission surface, i.e., emitted from the partial area of the reflected light exit surface from below the reflection surface (e.g., a central region of the left-right direction) and the reflected light from the pair of left and right side surfaces, some areas of the mainly emitting surface (e.g., a central region of the left-right direction) is emitted from the left and right sides of the region of, the reflected light from the upper surface, mainly emitting surface some of the regions (e.g., a central region of the left-right direction) and a partial region (for example, a central region of the left-right direction) is by exiting from the left and right sides of a region each of the upper regions of.

The invention according to aspect of the 33 is the invention according to the 32 embodiment of the pair of left and right side, when viewed, the spacing between the pair of left and right side toward the free rear end from the front end portion There is configured as a surface of a curved surface narrows in a tapered shape, the upper surface, in side view, is formed as a surface of a curved surface which is inclined obliquely downward toward the rear end side from the front end portion it features a.

According to the invention of aspect of the 33, it is possible to achieve the same effect as the invention according to the 32 aspect.

The invention according to the 34th aspect is the invention according to the aspect of the 33, wherein the top surface includes a left upper surface and a right upper surface, the upper left side and the right upper surface respective slopes are characterized by mutually different.

According to the invention of the 34th aspect, a third light distribution pattern can be made, including the cutoff line of the right and left stepped upper edge.

The invention according to the 35th aspect is the invention according to the 33rd or the 34th aspect, the upper surface comprises a reflecting surface for overhead sign, the reflecting surface for overhead sign is inside the lens body from the upper incident surface incident on the light from the light source reflected by said for overhead sign reflecting surface, by being irradiated forward emitted from the exit surface to form an overhead sign light distribution pattern on the cutoff line above characterized in that the surface shape is configured.

According to the invention of the 35th aspect, it is possible to form a light distribution pattern for overhead sign irradiating the cutoff line above the road signs or the like.

The invention according to 36th aspect of the first rear end portion, a first front end, arranged a pair of left and right sides between the first rear end portion of the first forward portion, and said first rear a first lens unit including the lower reflective surface disposed between the end portion and the first forward portion, is disposed in front of said first lens unit, the second includes a second rear end portion, a second front end portion a second lens unit, the lens body comprising the connecting portion which connects the second lens unit and the first lens portion, said first rear end, a first entrance surface, and left and right of the first incident surface on both sides, comprise disposed pair of the entrance surface so as to surround the space from the left and right sides between the light source and the first incident surface disposed on said first entrance surface near the tip end portion of the lower reflective surface It includes a shade, the first front end is, the first emission surface, and includes a pair of left and right exit surface which is disposed on the left and right sides of the first output surface, the first emission surface, the first the light from the light source emitting from the emitting surface is constructed as a surface of a semi-cylindrical for converging respect to the first direction, the second rear end portion includes a second entrance surface, the second front end portion includes a second output surface, said second output surface includes the semicylindrical area for converging relates a second direction perpendicular to the light in the first direction from the light source emitted from the second output surface the connection portion, and said second lens unit and the first lens unit, in each of the upper, said first forward end, said second rear end portion and a space surrounded by the connecting portion is formed state are connected by said first entrance surface, the lower reflection surface, the first emission surface, the second incident surface, and the second output surface, said first lens unit from said first entrance surface light was shielded in part by the shade of the light from the light source incident on the inside, and, the light is internally reflected by the lower reflecting surface, and emitted from the first emission surface, and further, the second entrance by being irradiated forward from the surface enters the inside of the second lens unit and emitted from a part region of the semi-cylindrical region of the second output surface, defined by the shade to the upper edge constitute a first optical system for forming a first light distribution pattern including a cutoff line, the pair of left and right entrance surface, said pair of right and left sides, the pair of left and right exit surface, said second entrance surface, and, the second output surface, the light from the light source which is internally reflected by the pair of right and left side enters the inside of the first lens unit from the pair of left and right entrance surface, and emitted from the right and left of the emission surface further forward emitted from lateral sides of a region of the partial region of the second from the incident surface of the semicylindrical mainly the second emission surface incident on the interior of the second lens unit area by being irradiated, it said is superimposed on the first light distribution pattern, characterized in that it constitutes a second optical system for forming a second light distribution pattern that has diffused from the first light distribution pattern.

According to the invention of the 36 aspect, to the first, it is possible to provide a lens body can be maintained even linear luminous appearance changes viewpoint position. Second, it is possible to provide a lens body which can realize the appearance of uniform light emission (or substantially uniform light emission). Third, the efficiency of capturing the light from the light source inside the lens body is dramatically improved. Fourth, it is possible to provide a lens body appearance with a sense of unity, which extends linearly in a predetermined direction. Fifth, the final despite second output surface is the emission surface is semicylindrical surface (refracting surface of the semi-cylindrical), the horizontal and vertical directions in the focused predetermined light distribution pattern (for example, it is possible to provide a lens body which can form a light distribution pattern for low beam) including a cutoff line that is defined by the shade the upper edge.

Can be the viewpoint position is maintained also linear luminous appearance change is one lens body, a plurality of light distribution patterns that degree of diffusion are different, i.e., the first light distribution pattern and the second light distribution pattern a plurality of optical systems that form a, i.e., is by and a first optical system and second optical system.

Can be achieved the appearance of uniform light emission (or substantially uniform light emission), each of the incident surface, i.e., the light from the light source incident on the inside the first lens unit from the first incident surface and a pair of left and right entrance surface each of the reflecting surfaces, i.e., results that are reflected under the reflection surface and a pair of left and right side, in addition to multi-point emission inside the lens body, each of the reflecting surfaces, i.e., from the lower reflecting surface and left and right pair of side It reflected light, the final be uniformly emitted from almost the entire second output surface is emission surface, i.e., second output surface reflected light from the lower reflecting surface is the final output surface (semicircular columnar region) of the partial region (for example, emitted from the central region) of the lateral direction, the reflected light from the pair of left and right side surfaces, primarily second output surface is the final output surface (semicylindrical region some regions (e.g. of) is by exiting from the left and right sides of a region of the central region) in the lateral direction.

The efficiency of capturing light from the light source inside the lens body is dramatically improved, each of the incident surface, i.e., due to the first incident surface and a pair of left and right entrance surface are arranged so as to surround the light source it is.

It can be an appearance with a sense of unity, which extends linearly in a predetermined direction, second output surface is the final exit surface is formed as a semicylindrical surface (refracting surface of the semi-cylindrical) it is due.

Final despite second output surface is the emission surface is semicylindrical surface (refracting surface of the semi-cylindrical), a predetermined light distribution pattern focused in the horizontal direction and the vertical direction (e.g., the upper edge the can be formed a light distribution pattern) for a low beam including a cutoff line that is defined by the shade, a first direction (e.g., first mainly the first lens unit converging the light in the horizontal direction or vertical direction) exit surface (refracting surface of the semi-cylindrical) is in charge, a second direction perpendicular to the first direction (e.g., vertical or horizontal direction) is the final output surface mainly lens body condensing of the second second output surface of the lens portion (refracting surface of the semi-cylindrical) is due to charge. That is due to decomposed the light collecting function.

The invention according to the 37th aspect is the invention according to the 36th aspect, the first lens unit further comprises a disposed upper surface between said first rear end portion of the first front end, the first rear end, further, on the upper side of the first incident surface, wherein the upper incident surface which space is arranged to surround the upper side between the light source and the first entrance surface, the second emitting surface further includes an extension region which extends upward obliquely rearward from the upper edge of the semi-cylindrical region of the second output surface, wherein the incident surface, said top surface, said coupling portion, and the second the extension region of the second output surface is incident from the upper incident surface inside the first lens unit is internally reflected by the top surface, the light from the light source travels through the inside of the connecting part, the second output surface the by being irradiated forward emitted from the extension region, forming the is superimposed on the first light distribution pattern and the second light distribution pattern, the third light distribution pattern that has diffused from the first light distribution pattern characterized in that the third constituting an optical system for.

According to the invention of the 37th aspect, in the first, it is possible to provide a lens body can be maintained even linear luminous appearance changes viewpoint position. Second, it is possible to provide a lens body which can realize the appearance of uniform light emission (or substantially uniform light emission). Third, the efficiency of capturing the light from the light source inside the lens body is dramatically improved.

Can be the viewpoint position is maintained also linear luminous appearance change is one lens body, a plurality of light distribution patterns different degrees of diffusion, i.e., a first light distribution pattern, the second light distribution pattern and a plurality of optical systems for forming the third light distribution pattern, i.e., a first optical system, is by and a second optical system and the third optical system.

Uniform light emission (or substantially uniform light emission) can be realized the appearance of each of the incident surface, i.e., a first entrance surface, is incident from the left and right pair of the incident surface and the upper incident surface inside the first lens unit light source a light reflection surface are each from, i.e., below the reflecting surface, the result is reflected by the pair of left and right side surfaces and upper surface, in addition to multi-point emission inside the lens body, each of the reflecting surfaces, i.e., the lower reflecting surface, reflected light from the pair of left and right side surfaces and upper surface, final be uniformly emitted from the substantially entire area of the second output surface is emission surface, i.e., light reflected from the lower reflective surface in the final emitting surface there a partial region of the second output surface (semicylindrical region) (e.g., a central region of the left-right direction) is emitted from the light reflected from the pair of left and right side surfaces, primarily the second is the final output surface some region of the exit face (region of semicylindrical) (e.g., a central region of the left-right direction) is emitted from the left and right sides of the region of the second reflected light from the upper surface, is predominantly final exit surface it is by exiting from the extension area of the exit plane.

The efficiency of capturing light from the light source inside the lens body is dramatically improved, each of the incident surface, i.e., a first entrance surface, a pair of left and right entrance surface and the upper incident surface is disposed so as to surround the light source it is due to the fact that there.

The invention according to the 38th aspect is the invention according to the 37th aspect, the pair of left and right side, when viewed, the pair of left and right toward from the first front end portion to the first rear end portion the spacing between the side surface is configured as a surface of a curved surface narrows in a tapered shape, the upper surface, as viewed in a side view, a curved surface which is inclined obliquely downward toward said first rear end from the first front end portion characterized in that it is configured as a surface shape.

According to the invention of the 38th aspect, it is possible to achieve the same effect as the invention according to the 37th aspect.

The invention according to the 39th aspect is the invention according to the 38th aspect, the upper surface comprises an upper left side and a right upper surface, the upper left side and the right upper surface respective slopes are characterized by mutually different.

According to the invention according to the 39 embodiment of the third light distribution pattern can be made, including the cutoff line of the right and left stepped upper edge.

The invention according to a 40 aspect, in the invention according to the 38th or 39th aspect, wherein the top surface includes a reflecting surface for overhead sign, the reflecting surface for overhead sign, the first lens from the upper incident surface part incident on the inside, is reflected by the for overhead sign reflecting surface, light from the light source travels through the inside of the connecting portion, by being irradiated forward emitted from the extension area, the cutoff line above characterized in that the surface shape so as to form an overhead sign light distribution pattern is formed.

According to the invention of the 40th aspect, it is possible to form a light distribution pattern for overhead sign irradiating the cutoff line above the road signs or the like.

The invention according to a 41 aspect of the rear end, a front end, arranged a pair of left and right sides between the rear end and the front end portion, and, between said front end and said rear end portion a lens body comprising a disposed below the reflecting surface, in the vehicle lamp and a light source disposed in the vicinity of the rear end, the rear end portion has a first incident surface, and the first incident surface the right and left sides of, wherein the disposed pair of the entrance surface so as to surround the space from the left and right sides between the first entrance surface light source and the first entrance surface disposed in the vicinity of, the front end portion, wherein the emission surface, the distal end portion of the lower reflection surface includes a shade, the first incident surface, the lower reflection surface, and said exit surface, said incident on inside of the lens body from the first incident surface light was shielded in part by the shade of the light from the light source, and the light that is internally reflected by the lower reflection surface, by being irradiated forward emitted from a partial area of the emission surface, an upper end constitute a first optical system for forming a first light distribution pattern including a cutoff line that is defined by the shade edge, the pair of left and right entrance surface, said pair of right and left side faces, and said exit surface, the light from the pair of left and right entrance surface from the light source which is internally reflected by the pair of right and left side enters the interior of the lens body is mainly emitted from the left and right sides of a region of the partial region of said emitting surface by being irradiated forward, and characterized by constituting the second optical system for forming the first is superimposed on the light distribution pattern, the second light distribution pattern that has diffused from the first light distribution pattern to.

According to the invention of the 41 aspect, to the first, it is possible to provide a vehicle lamp having a lens body which can be maintained even linear luminous appearance changes viewpoint position. Second, it is possible to provide a uniform light emission (or substantially uniform light emission) vehicle lamp having a lens body which appearance can be realized in. Third, the efficiency of capturing the light from the light source inside the lens body is dramatically improved.

Can be the viewpoint position is maintained also linear luminous appearance change is one lens body, a plurality of light distribution patterns that degree of diffusion are different, i.e., the first light distribution pattern and the second light distribution pattern a plurality of optical systems that form a, i.e., is by and a first optical system and second optical system.

Uniform light emission (or substantially uniform light emission) can be realized the appearance of each of the incident surface, i.e., light from a light source incident on the inner lens body from the first incident surface and a pair of left and right incident surface of each reflecting surfaces, i.e., results that are reflected under the reflection surface and a pair of left and right side, in addition to multi-point emission inside the lens body, each of the reflecting surfaces, i.e., light reflected from the lower reflective surface and the right and left pair of side but be uniformly emitted from almost the entire emission surface, i.e., a partial region of the reflected light from the lower reflecting surface emitting surface (e.g., the lateral middle region) is emitted from the pair of left and right side surfaces It reflected light, a part region of the mainly emitting surface (e.g., a central region of the left-right direction) is by exiting from the left and right sides of a region of.

The efficiency of capturing light from the light source inside the lens body is dramatically improved, each of the incident surface, i.e., due to the first incident surface and a pair of left and right entrance surface are arranged so as to surround the light source it is.

The invention according to a 42 aspect is the invention according to the 41 embodiment of the lens body further includes a disposed upper surface between the front end and the rear end, the rear end, further, the above the first incident surface, wherein the upper incident surface which space is arranged to surround the upper between the light source and the first entrance surface, the upper incident surface, said top surface, and the emitting surface, the light from the light source which is internally reflected by the upper surface of the upper incident surface enters the interior of the lens body, primarily the left and right sides of the partial region and the partial region of said emitting surface by being irradiated with a region emitted from each of the upper area in front, the being superposed on the first light distribution pattern and the second light distribution pattern, a third light distribution diffused from the first light distribution pattern characterized in that it constitutes a third optical system for forming a pattern.

According to the invention of the 42 aspect, to the first, it is possible to provide a vehicle lamp having a lens body which can be maintained even linear luminous appearance changes viewpoint position. Second, it is possible to provide a uniform light emission (or substantially uniform light emission) vehicle lamp having a lens body which appearance can be realized in. Third, the efficiency of capturing the light from the light source inside the lens body is dramatically improved.

Can be the viewpoint position is maintained also linear luminous appearance change is one lens body, a plurality of light distribution patterns different degrees of diffusion, i.e., a first light distribution pattern, the second light distribution pattern and a plurality of optical systems for forming the third light distribution pattern, i.e., a first optical system, is by and a second optical system and the third optical system.

Uniform light emission (or substantially uniform light emission) can be realized the appearance of each of the incident surface, i.e., a first entrance surface, from the incident light source from the pair of left and right entrance surface and the upper incident surface inside the lens body a light reflection surface are each, i.e., the lower reflecting surface, the result is reflected by the pair of left and right side surfaces and upper surface, in addition to multi-point emission inside the lens body, each of the reflecting surfaces, i.e., the lower reflecting surface, left and right of the reflected light from the side surface and upper surface, to be uniformly emitted from almost the entire emission surface, i.e., emitted from the partial area of the reflected light exit surface from below the reflection surface (e.g., a central region of the left-right direction) and the reflected light from the pair of left and right side surfaces, some areas of the mainly emitting surface (e.g., a central region of the left-right direction) is emitted from the left and right sides of the region of, the reflected light from the upper surface, mainly emitting surface some of the regions (e.g., a central region of the left-right direction) and a partial region (for example, a central region of the left-right direction) is by exiting from the left and right sides of a region each of the upper regions of.

The invention according to a 43 aspect of the first rear end portion, a first front end, arranged a pair of left and right sides between the first rear end portion of the first forward portion, and said first rear a first lens unit including the lower reflective surface disposed between the end portion and the first forward portion, is disposed in front of said first lens unit, the second includes a second rear end portion, a second front end portion a second lens unit, wherein the first lens unit and the lens including the connecting portion which connects the second lens unit body, the vehicle lamp and a light source disposed on the first rear end vicinity, the first rear end, a first entrance surface, and the both left and right sides of the first entrance surface, the space left and right sides between the light source and the first incident surface disposed on the first entrance surface vicinity They comprise disposed pair of the entrance surface so as to surround the distal end portion of the lower reflection surface includes a shade, the first front end is, the first emission surface, and left and right sides of the first output surface comprise disposed pair of the exit surface, said first output surface is configured as a surface of a semi-cylindrical focusing the light respect to the first direction from the light source emitted from the first emission surface the second rear end portion includes a second entrance surface, the second front end includes a second output surface, the second emission surface, light from the light source emitted from the second output surface the comprises a region of semicylindrical that focuses relates a second direction perpendicular to said first direction, said coupling portion, and said second lens unit and the first lens unit, in each of the upper, said first front end, it said have been linked in a state enclosed space is formed in the second rear end portion and said connecting portion, said first entrance surface, the lower reflection surface, the first emission surface, the second incidence plane, and the second output surface, the light was shielded in part by the shade of the light from the first light source incident on the inside of the first lens unit from the incident surface, and, in the lower reflecting surface internally reflected light is emitted from the first emission surface, and further, a part of said semi-cylindrical region of the second emission surface incident on the interior of the second lens unit from the second incident surface by being irradiated forward emitted from the region, constitutes a first optical system for forming a first light distribution pattern including a cutoff line that is defined by the shade to the upper edge, the pair of left and right entrance surface said pair of right and left sides, the pair of left and right exit surface, said second entrance surface, and the second output surface, said pair of right and left is incident on the inside of the first lens unit from the pair of left and right entrance surface light from the light source which is internally reflected by the side surface, and emitted from the pair of left and right exit face, further wherein mainly the second emission surface incident on the interior of the second lens portion from the second incident surface by being emitted forward of the semi-cylindrical region emitted from the left and right sides of a region of the partial region, the being superposed on the first light distribution pattern, the diffused than the first light distribution pattern 2 characterized in that it constitutes a second optical system for forming a light distribution pattern.

According to the invention of the 43 aspect, to the first, it is possible to provide a vehicle lamp having a lens body which can be maintained even linear luminous appearance changes viewpoint position. Second, it is possible to provide a uniform light emission (or substantially uniform light emission) vehicle lamp having a lens body which appearance can be realized in. Third, the efficiency of capturing the light from the light source inside the lens body is dramatically improved. Fourth, it is possible to provide a vehicle lamp having a lens body appearance with a sense of unity, which extends linearly in a predetermined direction. Fifth, the final despite second output surface is the emission surface is semicylindrical surface (refracting surface of the semi-cylindrical), the horizontal and vertical directions in the focused predetermined light distribution pattern (for example, it is possible to provide a vehicle lamp having a lens body which can form a light distribution pattern) low beam including a cutoff line that is defined by the shade the upper edge.

Can be the viewpoint position is maintained also linear luminous appearance change is one lens body, a plurality of light distribution patterns that degree of diffusion are different, i.e., the first light distribution pattern and the second light distribution pattern a plurality of optical systems that form a, i.e., is by and a first optical system and second optical system.

Can be achieved the appearance of uniform light emission (or substantially uniform light emission), each of the incident surface, i.e., the light from the light source incident on the inside the first lens unit from the first incident surface and a pair of left and right entrance surface each of the reflecting surfaces, i.e., results that are reflected under the reflection surface and a pair of left and right side, in addition to multi-point emission inside the lens body, each of the reflecting surfaces, i.e., from the lower reflecting surface and left and right pair of side It reflected light, the final be uniformly emitted from almost the entire second output surface is emission surface, i.e., second output surface reflected light from the lower reflecting surface is the final output surface (semicircular columnar region) of the partial region (for example, emitted from the central region) of the lateral direction, the reflected light from the pair of left and right side surfaces, primarily second output surface is the final output surface (semicylindrical region some regions (e.g. of) is by exiting from the left and right sides of a region of the central region) in the lateral direction.

The efficiency of capturing light from the light source inside the lens body is dramatically improved, each of the incident surface, i.e., due to the first incident surface and a pair of left and right entrance surface are arranged so as to surround the light source it is.

It can be an appearance with a sense of unity, which extends linearly in a predetermined direction, second output surface is the final exit surface is formed as a semicylindrical surface (refracting surface of the semi-cylindrical) it is due.

Final despite second output surface is the emission surface is semicylindrical surface (refracting surface of the semi-cylindrical), a predetermined light distribution pattern focused in the horizontal direction and the vertical direction (e.g., the upper edge the can be formed a light distribution pattern) for a low beam including a cutoff line that is defined by the shade, a first direction (e.g., first mainly the first lens unit converging the light in the horizontal direction or vertical direction) exit surface (refracting surface of the semi-cylindrical) is in charge, a second direction perpendicular to the first direction (e.g., vertical or horizontal direction) is the final output surface mainly lens body condensing of the second output surface of the lens portion (refracting surface of the semi-cylindrical) is due to charge. That is due to the decomposed light collecting function.

The invention according to 44th aspect is the invention according to the 43 embodiment of the first lens unit further comprises a disposed upper surface between said first rear end portion of the first front end, the first rear end, further, on the upper side of the first incident surface, wherein the upper incident surface which space is arranged to surround the upper side between the light source and the first entrance surface, the second emitting surface further includes an extension region which extends upward obliquely rearward from the upper edge of the semi-cylindrical region of the second output surface, wherein the incident surface, said top surface, said coupling portion, and the second the extension region of the second output surface is incident from the upper incident surface inside the first lens unit is internally reflected by the top surface, the light from the light source travels through the inside of the connecting part, the second output surface the by being irradiated forward emitted from the extension region, forming the is superimposed on the first light distribution pattern and the second light distribution pattern, the third light distribution pattern that has diffused from the first light distribution pattern characterized in that the third constituting an optical system for.

According to the invention of the 44 aspect, to the first, it is possible to provide a vehicle lamp having a lens body which can be maintained even linear luminous appearance changes viewpoint position. Second, it is possible to provide a uniform light emission (or substantially uniform light emission) vehicle lamp having a lens body which appearance can be realized in. Third, the efficiency of capturing the light from the light source inside the lens body is dramatically improved.

Can be the viewpoint position is maintained also linear luminous appearance change is one lens body, a plurality of light distribution patterns different degrees of diffusion, i.e., a first light distribution pattern, the second light distribution pattern and a plurality of optical systems for forming the third light distribution pattern, i.e., a first optical system, is by and a second optical system and the third optical system.

Uniform light emission (or substantially uniform light emission) can be realized the appearance of each of the incident surface, i.e., a first entrance surface, is incident from the left and right pair of the incident surface and the upper incident surface inside the first lens unit light source a light reflection surface are each from, i.e., below the reflecting surface, the result is reflected by the pair of left and right side surfaces and upper surface, in addition to multi-point emission inside the lens body, each of the reflecting surfaces, i.e., the lower reflecting surface, reflected light from the pair of left and right side surfaces and upper surface, final be uniformly emitted from the substantially entire area of the second output surface is emission surface, i.e., light reflected from the lower reflective surface in the final emitting surface there a partial region of the second output surface (e.g., a central region of the left-right direction) is emitted from the light reflected from the pair of left and right side surfaces, mainly partial region of the second output surface is the final output surface (e.g., a central region of the left-right direction) is emitted from the right and left regions on both sides of the reflected light from the upper surface is by exiting the extension region of the second output surface is mainly a final output surface.

The efficiency of capturing light from the light source inside the lens body is dramatically improved, each of the incident surface, i.e., a first entrance surface, a pair of left and right entrance surface and the upper incident surface is disposed so as to surround the light source it is due to the fact that there.

To achieve the above fourth object of the invention according to the 45th aspect is a lens body disposed in front of the light source, between the rear end portion, a front end, the rear end and the front end portion They comprise disposed a pair of left and right sides, upper surface and lower surface, light from the light source incident on the interior of the lens body, by being irradiated forward emitted from the front end, forming a predetermined light distribution pattern in the fabricated lens body to the lens body is characterized by being configured to narrow the cone-shaped toward from the front end side to the rear end.

According to the invention of the 45th aspect, the lens member whose appearance does not become monotonous, in particular, in the light source non-lighting time, when viewed from multiple directions, though, as if the lens body interior is emitting light "twinkle it is possible to provide a lens body to be a sensitive "appearance. As a result, the visibility of the light source non-lighting time (the lens body, thus, this is the visibility of the vehicle mounted) can be increased.

Its appearance that does not become monotonous, the lens body is not a conventional simple plano-convex lens, disposed right and left pair of side between the rear end and the front end portion, the cross section surrounded by top and bottom surfaces rectangle it is by being configured as a lens body shape.

Further, the light source non-lighting time, when viewed from multiple directions, as if the lens body interior is looking with a "sparkling feeling" as if it emits light, the rear end lens body from the front end portion results towards the side is configured to narrow the cone-shaped, external light incident on the inner lens body from the emission surface (for example, sunlight) is repeatedly internally reflected (total reflection) in the lens body portion, most of which is by emitted in various directions from the output surface again.

The invention according to 46th aspect is the invention according to the 45th aspect, the rear end portion includes at least one entrance surface, at least one of said entrance surface, when viewed and/or side view, characterized in that it constitutes a part of a V-shaped or V-shaped opening toward the front end side.

According to the invention of the 46th aspect, provided in the light source non-lighting time, the when viewed from multiple directions, the lens body inside though lens body becomes appearance with "sparkling feeling" as if it were emitting can do. As a result, the visibility of the light source non-lighting time (the lens body, thus, this is the visibility of the vehicle mounted) can be increased.

This is at least one of the incident surface, when viewed and/or in side view, the results that are part of a V-shaped or V-shape open towards the front end side, a lens body from the emission surface external light incident on the inside (e.g., sunlight) is internal reflection inside the lens body (the V-shaped portion) repeatedly (total reflection), the majority thereof is emitted in various directions from the output surface again it is due.

The invention according to 47th aspect is the invention according to the 46th aspect, further comprising a lower reflection surface disposed between said rear end and said front end, said rear end, said at least one as an entrance surface, the first incidence surface, and, on the left and right sides of said first entrance surface, the placed a pair of left and right entrance surface so as to surround the space from the left and right sides between said light source and said first entrance surface wherein the front end includes an emission face, the distal end portion of the lower reflection surface includes a shade, the first incident surface, the lower reflection surface, and said exit surface, said from the first incident surface light was blocked in part by the shade of the light from the light source incident on the inner lens member, and the light that is internally reflected by the lower reflecting surface, and emitted from the partial area of the exit plane by being emitted forward on, forming the predetermined light distribution pattern, constitute a first optical system for forming a first light distribution pattern including a cutoff line that is defined by the shade the upper edge, the a pair of left and right entrance surface, said pair of right and left side faces, and said exit surface, the light from the light source is internally reflected by the pair of right and left side enters the inside of the lens body from the pair of left and right entrance surface, by being emitted forward mainly emitted from the left and right sides of a region of the partial region of said exit surface, forming the predetermined light distribution pattern, a second distribution that has diffused from the first light distribution pattern characterized in that it constitutes a second optical system for forming an optical pattern.

According to the invention of the 47th aspect, in the first, it is possible to provide a lens body can be maintained even linear luminous appearance changes viewpoint position. Second, it is possible to provide a lens body which can realize the appearance of uniform light emission (or substantially uniform light emission). Third, the efficiency of capturing the light from the light source inside the lens body is dramatically improved.

Can be the viewpoint position is maintained also linear luminous appearance change is one lens body, a plurality of light distribution patterns that degree of diffusion are different, i.e., the first light distribution pattern and the second light distribution pattern a plurality of optical systems that form a, i.e., is by and a first optical system and second optical system.

Uniform light emission (or substantially uniform light emission) can be realized the appearance of each of the incident surface, i.e., light from a light source incident on the inner lens body from the first incident surface and a pair of left and right incident surface of each reflecting surfaces, i.e., results that are reflected under the reflection surface and a pair of left and right side, in addition to multi-point emission inside the lens body, each of the reflecting surfaces, i.e., light reflected from the lower reflective surface and the right and left pair of side but be uniformly emitted from almost the entire emission surface, i.e., a partial region of the reflected light from the lower reflecting surface emitting surface (e.g., the lateral middle region) is emitted from the pair of left and right side surfaces It reflected light, a part region of the mainly emitting surface (e.g., a central region of the left-right direction) is by exiting from the left and right sides of a region of.

The efficiency of capturing light from the light source inside the lens body is dramatically improved, each of the incident surface, i.e., due to the first incident surface and a pair of left and right entrance surface are arranged so as to surround the light source it is.

The invention according to the 48th aspect is the invention according to the 47th aspect, the rear end portion, said as at least one entrance surface, further, on the upper side of the first entrance surface, the first incidence and the light source wherein the upper incident surface which space is arranged to surround the upper side between the surface, the upper incident surface, said top surface, and said exit surface, the incident within said lens body from the upper incident surface by the light from the light source which is internally reflected at the upper surface, it is emitted forward mainly emitted from the said partial region of the emission surface and the left and right sides of the area each of the upper region of the partial region, constituting said predetermined light distribution pattern, characterized in that it constitutes a third optical system which forms a third light distribution pattern that has diffused from the first light distribution pattern.

According to the invention of the 48th aspect, in the first, it is possible to provide a lens body can be maintained even linear luminous appearance changes viewpoint position. Second, it is possible to provide a lens body which can realize the appearance of uniform light emission (or substantially uniform light emission). Third, the efficiency of capturing the light from the light source inside the lens body is dramatically improved.

Can be the viewpoint position is maintained also linear luminous appearance change is one lens body, a plurality of light distribution patterns different degrees of diffusion, i.e., a first light distribution pattern, the second light distribution pattern and a plurality of optical systems for forming the third light distribution pattern, i.e., a first optical system, is by and a second optical system and the third optical system.

Uniform light emission (or substantially uniform light emission) can be realized the appearance of each of the incident surface, i.e., a first entrance surface, from the incident light source from the pair of left and right entrance surface and the upper incident surface inside the lens body a light reflection surface are each, i.e., the lower reflecting surface, the result is reflected by the pair of left and right side surfaces and upper surface, in addition to multi-point emission inside the lens body, each of the reflecting surfaces, i.e., the lower reflecting surface, left and right of the reflected light from the side surface and upper surface, to be uniformly emitted from almost the entire emission surface, i.e., emitted from the partial area of the reflected light exit surface from below the reflection surface (e.g., a central region of the left-right direction) and the reflected light from the pair of left and right side surfaces, some areas of the mainly emitting surface (e.g., a central region of the left-right direction) is emitted from the left and right sides of the region of, the reflected light from the upper surface, mainly emitting surface some of the regions (e.g., a central region of the left-right direction) and a partial region (for example, a central region of the left-right direction) is by exiting from the left and right sides of a region each of the upper regions of.

The invention according to aspect of the 49, in the invention according to the 48th aspect, the pair of left and right side, when viewed, the spacing between the pair of left and right side toward the free rear end from the front end portion There is configured as a surface of a curved surface narrows in a tapered shape, the upper surface, in side view, is formed as a surface of a curved surface which is inclined obliquely downward toward the rear end side from the front end portion it features a.

According to the present invention in accordance with aspects of the 49th, it is possible to achieve the same effect as the invention according to the 48th aspect.

The invention according to the 50th aspect is the invention according to the embodiment of the 49th, the top surface includes a left upper surface and a right upper surface, the upper left side and the right upper surface respective slopes are characterized by mutually different.

According to the invention according to the 50 embodiment of the third light distribution pattern can be made, including the cutoff line of the right and left stepped upper edge.

The invention according to aspect of the 51 present invention, in which the first 45 according to a 50th any aspect of a region where light is not incident from the light source out of the inner surface of the lens body, the inside of the lens body from the front end incident wherein the external light reaching the area is configured as a surface to be emitted from the front end again being internally reflected in various directions.

According to the invention of aspect of the 51, provided in the light source non-lighting time, the when viewed from multiple directions, the lens body inside though lens body becomes appearance with "sparkling feeling" as if it were emitting can do. As a result, the visibility of the light source non-lighting time (the lens body, thus, this is the visibility of the vehicle mounted) can be increased.

This is a result of the area where the light from the light source is not incident of the inner surface of the lens body is configured as described in aspect of the 51, external light incident on the inner lens body from the emission surface (for example, sunlight) There is by emitting again the front portion is internally reflected (total reflection) in different directions in the lens body portion from (emission surface) in various directions.

The invention according to a 52 aspect is a lens body disposed in front of the light source, the rear end, a front end, it arranged a pair of left and right sides between the rear end and the front end portion, the upper surface and includes a lower surface, light from the light source incident on the interior of the lens body, by being irradiated forward emitted from the front end, in the fabricated lens body so as to form a predetermined light distribution pattern, region where light is not incident from the light source out of the inner surface of the lens body, wherein the front end again being internally reflected ambient light in various directions to reach the region enters the interior of the lens body front end characterized in that it is configured as a surface to be emitted from.

According to the invention of the 52 aspect, provided in the light source non-lighting time, the when viewed from multiple directions, the lens body inside though lens body becomes appearance with "sparkling feeling" as if it were emitting can do. As a result, the visibility of the light source non-lighting time (the lens body, thus, this is the visibility of the vehicle mounted) can be increased.

This is a result of the area where the light from the light source is not incident of the inner surface of the lens body is configured as described in the 52nd aspect, external light incident on the inner lens body from the emission surface (for example, sunlight) There is by emitting again the front portion is internally reflected (total reflection) in different directions in the lens body portion from (emission surface) in various directions.

The invention according to a 53 aspect is the invention according to the first 51 or second 52 aspect, said region is an extension region extending forward from the front edge of the lower surface and/or the right and left pair of side and features.

According to the invention of the 53 aspect, it is possible to achieve the same effect as the invention according to the 52nd aspect.

The invention according to aspect of the 54 present invention, in which the first 51 according to a 53rd any aspect of the region, the surface including a plurality of lenses cut pyramid-shaped, embossed surface or cut comprising a plurality of minute irregularities characterized in that it is configured as a plane including the surface.

According to the invention of aspect of the 54, provided in the light source non-lighting time, the when viewed from multiple directions, the lens body inside though lens body becomes appearance with "sparkling feeling" as if it were emitting can do. As a result, the visibility of the light source non-lighting time (the lens body, thus, this is the visibility of the vehicle mounted) can be increased.

This, external light incident to the inner lens body from the emission surface (for example, sunlight) is internally reflected in various directions in (a plurality of lens cut such polygonal pyramid shape) the lens body interior (total reflection) is to it is by emitted in various directions from the output surface again.

The invention according to the 55th aspect of the light source and, a lens body disposed in front of the light source, the rear end, a front end portion, pair disposed between the rear end and the front end portion wherein the side surface, upper surface and a lower surface, light from the light source incident on the interior of the lens body, by being irradiated forward emitted from the front end, which is configured to form a predetermined light distribution pattern lens and body, in the vehicle lamp provided with, the lens body is characterized by being configured to narrow the cone-shaped toward from the front end side to the rear end.

According to the invention of the 55th aspect, the appearance vehicular lamp having a lens body that does not become monotonous, in particular, in the light source non-lighting time, when viewed from multiple directions, the internal though the lens body by luminescence it is possible to provide a "sparkling sensitive" vehicle lamp provided with a made lens body appearance with as dolphin. As a result, the visibility of the light source non-lighting time (vehicle lamp, and thus, this is the visibility of the vehicle mounted) can be increased.

Its appearance that does not become monotonous, the lens body is not a conventional simple plano-convex lens, disposed right and left pair of side between the rear end and the front end portion, the cross section surrounded by top and bottom surfaces rectangle it is by being configured as a lens body shape.

Further, the light source non-lighting time, when viewed from multiple directions, as if the lens body interior is looking with a "sparkling feeling" as if it emits light, the rear end lens body from the front end portion results towards the side is configured to narrow the cone-shaped, external light incident on the inner lens body from the emission surface (for example, sunlight) is repeatedly internally reflected (total reflection) in the lens body portion, most of which is by emitted in various directions from the output surface again.

The invention according to 56th aspect is the invention according to the 55th aspect, the rear end portion includes at least one entrance surface, at least one of said entrance surface, when viewed and/or side view, characterized in that it constitutes a part of a V-shaped or V-shaped opening toward the front end side.

According to the invention of 56th aspect, provided in the light source non-lighting time, when viewed from multiple directions, the lens body whose interior though lens body becomes appearance with "sparkling feeling" as if it were emitting the vehicle lamp can be provided. As a result, the visibility of the light source non-lighting time (vehicle lamp, and thus, this is the visibility of the vehicle mounted) can be increased.

This is at least one of the incident surface, when viewed and/or in side view, the results that are part of a V-shaped or V-shape open towards the front end side, a lens body from the emission surface external light incident on the inside (e.g., sunlight) is internal reflection inside the lens body (the V-shaped portion) repeatedly (total reflection), the majority thereof is emitted in various directions from the output surface again it is due.

The invention according to aspect of the 57 light source and, a lens body disposed in front of the light source, the rear end, a front end portion, pair disposed between the rear end and the front end portion wherein the side surface, upper surface and a lower surface, light from the light source incident on the interior of the lens body, by being irradiated forward emitted from the front end, which is configured to form a predetermined light distribution pattern lens and body, in the vehicle lamp provided with a region where light is not incident from the light source out of the inner surface of the lens body, the external light reaching to the region enters the inside of the lens body from the front end characterized in that it is configured as a surface to be emitted from the exit surface again being internally reflected in various directions.

According to the invention of aspect of the 57, provided in the light source non-lighting time, the when viewed from multiple directions, the lens body inside though lens body becomes appearance with "sparkling feeling" as if it were emitting can do. As a result, the visibility of the light source non-lighting time (vehicle lamp, and thus, this is the visibility of the vehicle mounted) can be increased.

This is a result of the area where the light from the light source is not incident of the inner surface of the lens body is configured as described in aspect of the 57, external light incident from the emitting surface inside the lens body (e.g., sunlight) There is by emitted in various directions from again exit surface is internally reflected in various directions (total reflection) in the lens body portion.

According to the present invention, the lens body that its appearance does not become monotonous (lens conjugate) and vehicle lamp with this, in particular, in the light source non-lighting at the time, when viewed from multiple directions, as if the lens body inside the emission to have one of such appearance to become the lens body (lens coupling body) and it is possible to provide a vehicle lamp having the same.

BRIEF DESCRIPTION OF THE DRAWINGS

FIG. 8 is a diagram depicting functions of the shade 12*c*.

FIG. 9A is a schematic diagram depicting the shade 12*c* when viewed from the light source 14 position, FIG. 9B is an enlarged perspective view of the reflection surface 12*b* (including the shade 12*c*) illustrated in FIG. 2A, and FIG. 9C is a top view of the reflection surface 12*b* (including the shade 12*c*) illustrated in FIG. 2A.

FIG. 10A to FIG. 10C illustrate modifications (side views) of the shade 12*c*.

FIG. 31D is a side view (of major optical surfaces only) of the vehicular lamp fitting 10A of Embodiment 2 to which the camber angle is not added, FIG. 31E is a top view (of major optical surfaces only) thereof, and FIG. 31F is an example of a low beam light distribution pattern formed by the vehicular lamp fitting 10A of Embodiment 2.

FIG. 42A is an example of a low beam light distribution pattern formed by the vehicular lamp fitting 10D of Embodiment 5 (or the vehicular lamp fitting 10F of Embodiment 7), when the camber angle θ1 is 30°, and FIG. 42B is an example of a low beam light distribution pattern formed by the vehicular lamp fitting 10D of Embodiment 5 (or the vehicular lamp fitting 10F of Embodiment 7) when the camber angle θ1 is 45°.

FIG. 43 is a cross-sectional view of the vehicular lamp fitting 10D (of major optical surfaces only) of Embodiment 5.

FIG. 44A is an example, where a partial region 12A2*b*2 of a lower part of the second exit surface 12A2*b* is physically cut-off and the upper region 12A2*b*1 remains.

FIG. 47A is a top view of the vehicular lamp 10 J (lens body 12 J), FIG. 47B is a front view, FIG. 47C is a side view.

FIG. 48A is an example of the vehicle lamp 10J (lens body 12J) light distribution pattern for low beam is formed by the PLO (synthetic light distribution pattern)

FIG. 57A is a top view of a vehicular lamp 10K (lens body 12K), FIG. 57B is a front view, and FIG. 57C is a side view.

FIG. 58A is an example of the vehicle lamp 10K (lens body 12K) light distribution pattern for low beam is formed by the PLO (synthetic light distribution pattern)

DESCRIPTION OF EMBODIMENTS

A vehicular lamp fitting according to Embodiment 1 of the present invention will be described with reference to the drawings.

Figure 1:
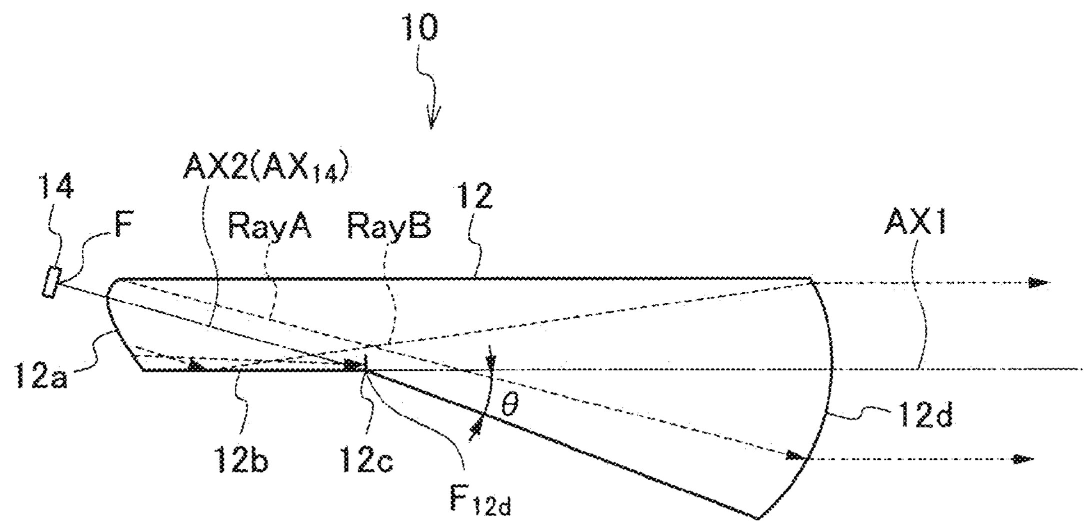
FIG. 1 is a longitudinal cross-sectional view of the vehicular lamp fitting 10 according to Embodiment 1 of the present invention.

FIG. 1 is a longitudinal cross-sectional view of the vehicular lamp fitting 10 according to Embodiment 1 of the present invention.

Figure 11A:
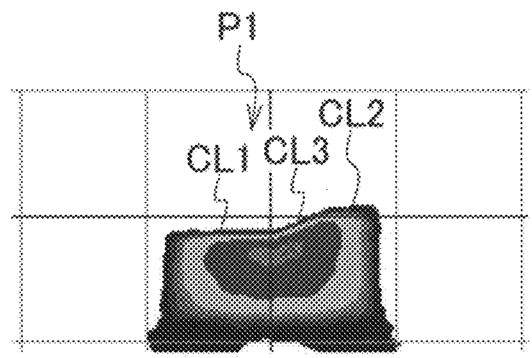
FIG. 11A illustrates the low beam light distribution pattern P1 on virtual vertical screen which faces the front face of the vehicle (disposed at about 25 m in front of the front face of the vehicle)

As illustrated in FIG. 1, the vehicular lamp fitting 10 according to Embodiment 1 includes a lens body 12, and a light source 14 which is disposed in the vicinity of an entry surface 12*a* of the lens body 12, and is configured as a vehicular head light which forms a low beam light distribution pattern P1, which includes cut-off lines CL1 to CL3 on an upper edge illustrated in FIG. 11A on a virtual vertical screen which faces the front face of the vehicle (disposed at about 25 m in front of the front face of the vehicle).

Figure 2A:
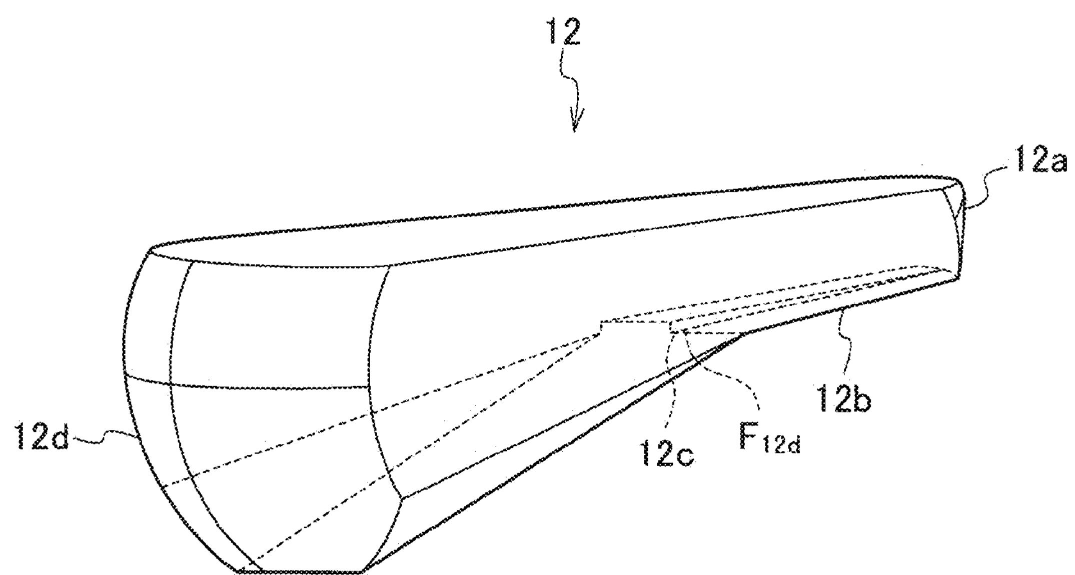
FIG. 2A is a perspective view of the lens body 12 when viewed from the front.
Figure 2B:
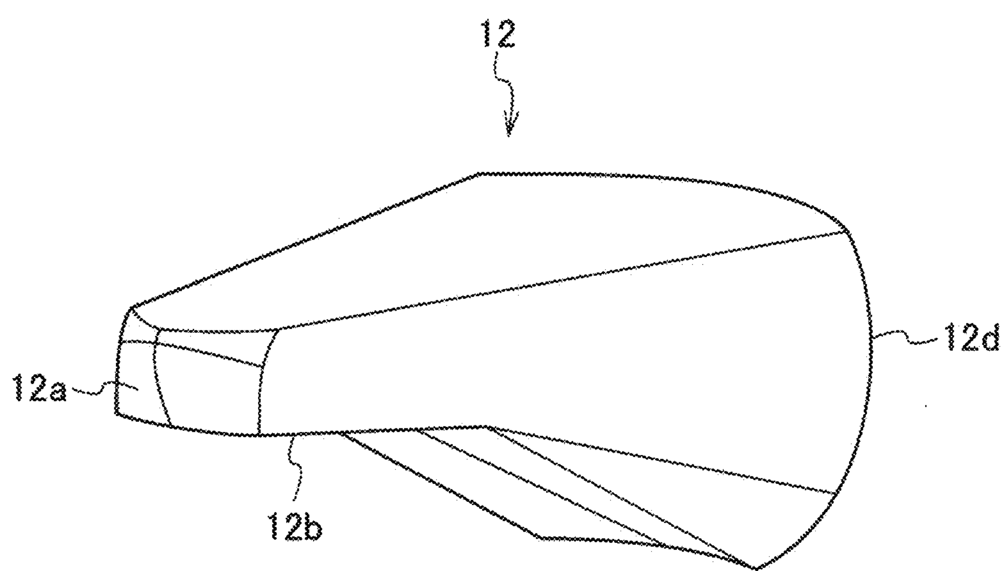
FIG. 2B is a perspective view of the lens body 12 when viewed from the back.
Figure 3A:
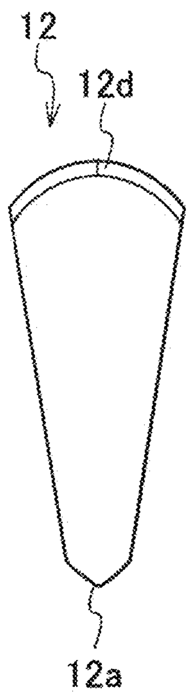
FIG. 3A is a top view.
Figure 3C:
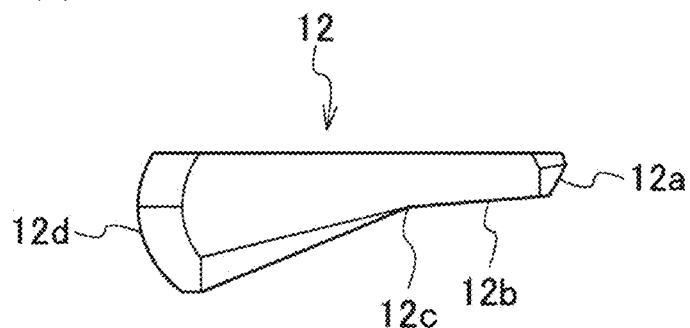
FIG. 3C is a side view of the lens body 12.
Figure 3B:
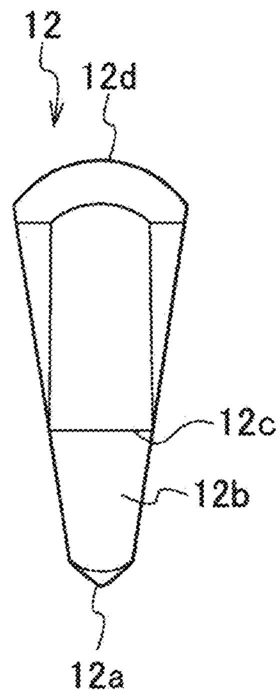
FIG. 3B is a bottom view.

FIG. 2A is a perspective view of the lens body 12 when viewed from the front, FIG. 2B is a perspective view of the lens body 12 when viewed from the back, FIG. 3A is a top view, FIG. 3B is a bottom view, and FIG. 3C is a side view of the lens body 12.

As illustrated in FIG. 1, the lens body 12 is a lens body having a shape along a first reference axis AX1 extending in the horizontal direction, and includes the entry surface 12*a*, a reflection surface 12*b*, a shade 12*c*, an exit surface 12*d*, and a reference point F which is disposed in the vicinity of the entry surface 12*a* in the optical design. The entry surface 12*a*, the reflection surface 12*b*, the shade 12*c* and the exit surface 12*d* are disposed in this order along the first reference axis AX1. The material of the lens body 12 may be polycarbonate, or other transparent resins, such as acrylic or glass.

In FIG. 1, a dotted line with an arrow at the end indicates an optical path of light from the light source 14 (to be more precise, the reference point F) which entered the lens body 12.

The major functions of the lens body 12 are primarily capturing light from the light source 14 in the lens body 12, and secondly forming a low beam light distribution pattern which includes a cut-off line on an upper edge, by inverting and projecting a luminous intensity distribution (light source image) which is formed in the vicinity of a focal point $F_{12d}$ of the exit surface 12*d* (lens unit) by direct light RayA, which travels toward the exit surface 12*d* and reflected light RayB, which is internally reflected on the reflection surface 12*b*, out of the light captured in the lens body 12.

Figure 4A:
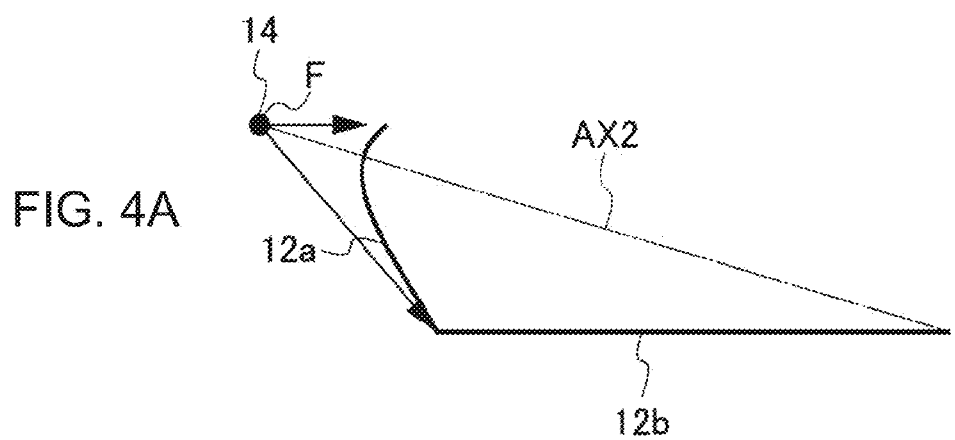
FIG. 4A is a diagram depicting a state when the light from the light source 14 (to be more precise, the reference point F) enters the entry surface 12*a*.
Figure 4B:
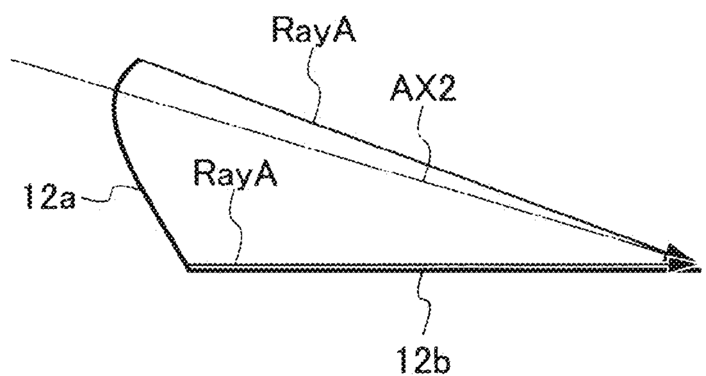
FIG. 4B is a diagram depicting a state when the light from the light source 14, which entered the lens body 12 (direct light RayA), is condensed.

FIG. 4A is a diagram depicting a state when the light from the light source 14 (to be more precise, the reference point F) enters the entry surface 12*a*, and FIG. 4B is a diagram depicting a state when the light from the light source 14, which entered the lens body 12 (direct light RayA), is condensed.

The entry surface 12*a* is formed in the rear end of the lens body 12, and is a surface through which the light from the light source 14 (to be more precise, the reference point F in the optical design), which is disposed in the vicinity of the entry surface 12*a* (see FIG. 4A), is refracted and enters the lens body 12 (e.g. free-form surface that is convex toward the light source 14), and the surface shape thereof is configured such that the light from the light source 14 (direct light RayA), which entered the lens body 12, is condensed toward the shade 12*c* in a direction closer to a second reference axis AX2 with respect to at least the vertical direction (see FIG. 4B). The second reference axis AX2 passes through the center of the light source 14 (to be more precise, reference point F) and a point in the vicinity of the shade 12*c*, and is inclined forward and diagonally downward with respect to the first reference axis AX1 (see FIG. 1).

The light source 14 includes, for example, a metal substrate (not illustrated), and a semiconductor light emitting element (not illustrated), such as a white LED (Light Emitting Diode) light source (or white LD (Laser Diode) light source) mounted on the surface of the substrate. A number of the semiconductor light emitting elements is 1 or more. The light source 14 may be a light source other than the semiconductor light emitting element, such as a white LED light source (or white LD light source). The light source 14 is disposed in the vicinity of the entry surface 12*a* of the lens body 12 (in the vicinity of the reference point F) in an attitude such that the light emitting surface (not illustrated) thereof faces forward and diagonally downward, in other words, in an attitude such that the optical axis $AX_{14}$ of the light source 14 matches the second reference axis AX2. The light source 14 may be disposed in the vicinity of the entry surface 12*a* of the lens body 12 (in the vicinity of the reference point F) in an attitude such that the optical axis $AX_{14}$ of the light source 14 does not match the second reference axis AX2 (e.g. in the attitude such that the optical axis $AX_{14}$ of the light source 14 is disposed in the horizontal direction).

If the light source 14 is a semiconductor light emitting element (e.g. white LED light source), the directional characteristic of the light emitted from the light source 14 (light emitting surface) has Lambertian light distribution, and can be expressed by $I(\theta)=I0\times\cos\theta$. This expresses the diffusion of the light emitted from the light source 14. Here $I(\theta)$ denotes the luminous intensity of the light in the direction that is inclined from the optical axis $AX_{14}$ of the light source 14 by angle θ, and Iθ denotes the luminous intensity on the optical axis $AX_{14}$. In the light source 14, the luminous intensity is the maximum on the optical axis $AX_{14}$ (θ=0).

Figure 5:
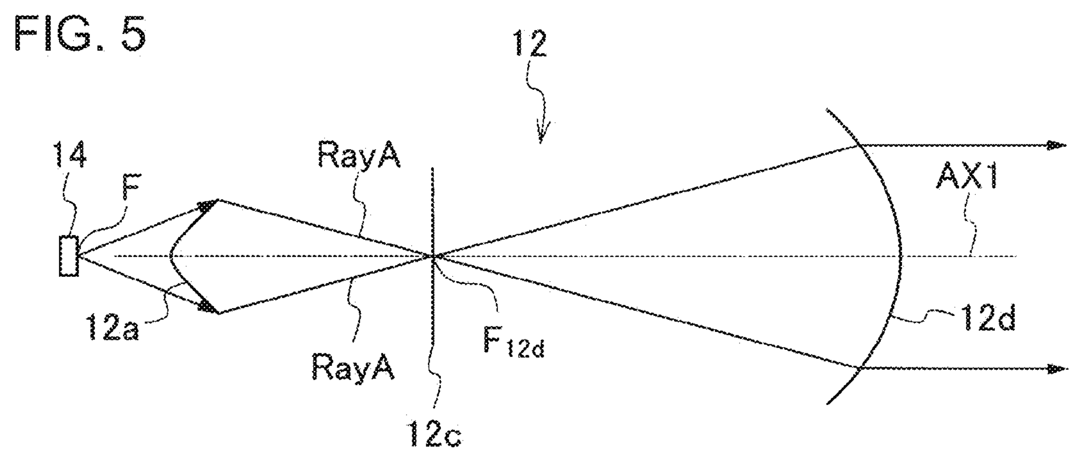
FIG. 5 is an example of the entry surface 12*a* (cross-sectional view).
Figure 6:
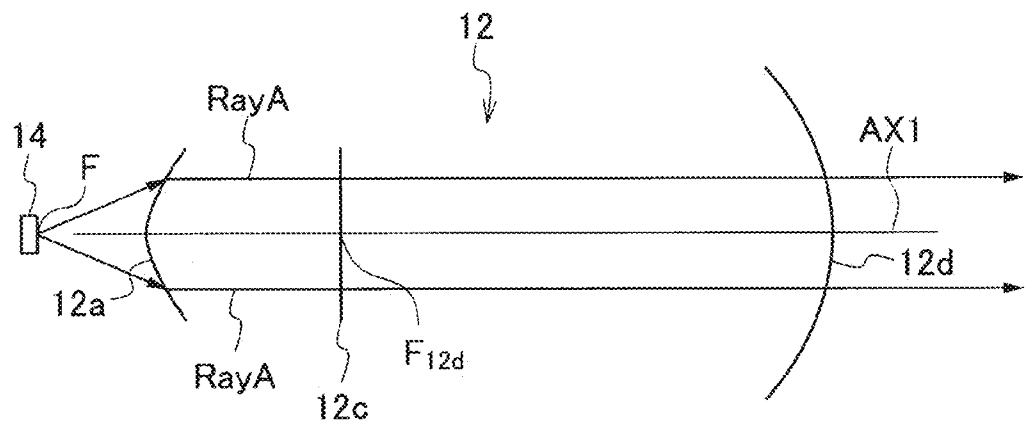
FIG. 6 is another example of the entry surface 12*a* (cross-sectional view).

FIG. 5 is an example of the entry surface 12*a* (cross-sectional view), and FIG. 6 is another example of the entry surface 12*a* (cross-sectional view).

As illustrated in FIG. 5, the surface shape of the entry surface 12*a* is configured such that the light from the light source 14 which entered the lens body 12 (direct light RayA), is condensed toward the shade 12*c* in a direction closer to the first reference axis AX1 with respect to the horizontal direction. The surface shape of the entry surface 12*a* may be configured such that the light from the light source 14 which entered the lens body 12 (direct light RayA), becomes parallel with the reference axis AX1 with respect to the horizontal direction.

The degree of diffusion of the low beam light distribution pattern in the horizontal direction can be freely adjusted by adjusting the surface shape of the entry surface 12*a* (e.g. curvature of the entry surface 12*a* in the horizontal direction).

Figure 7A:
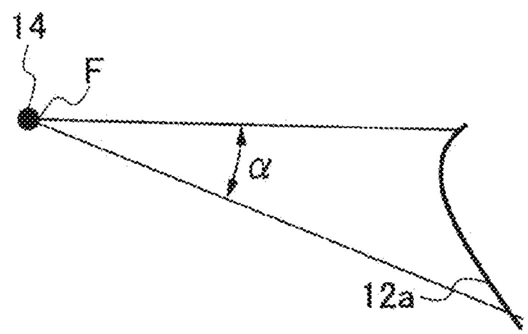
FIG. 7A and FIG. 7B are diagrams depicting the distance between the entry surface 12*a* and the light source 14.
Figure 7B:
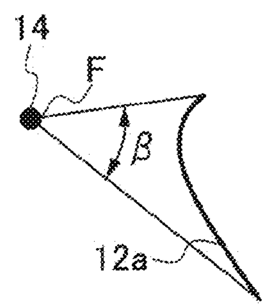

FIG. 7A and FIG. 7B are diagrams depicting the distance between the entry surface 12*a* and the light source 14.

By decreasing the distance between the entry surface 12*a* and the light source 14 (see FIG. 7B), the light source image becomes smaller compared with the case of increasing the distance between the entry surface 12*a* and the light source 14 (see FIG. 7A). As a result, the maximum luminous intensity of the luminous intensity distribution (and the low beam light distribution pattern) that is formed in the vicinity of the focal point $F_{12d}$ of the exit surface 12*d* (lens unit) can be increased even more.

Further, by decreasing the distance between the entry surface 12*a* and the light source 14 (see FIG. 7B), the light from the light source 14 that is captured in the lens body 12 increases, compared with the case of increasing the distance between the entry surface 12*a* and the light source 14 (see FIG. 7A) (β>α). As a result, the efficiency of the lens body improves.

The reflection surface 12*b* is a plane-shaped reflection surface extending forward in the horizontal direction from the lower edge of the entry surface 12*a*. The reflection surface 12*b* is a reflection surface that totally reflects the light emitted onto the reflection surface 12*b*, out of the light from the light source 14 which entered the lens body 12, and metal deposition is not performed on the reflection surface 12*b*. The light emitted onto the reflection surface 12*b*, out of the light from the light source 14 which entered the lens body 12, is internally reflected by the reflection surface 12*b* and is directed to the exit surface 12*d*, is then refracted by the exit surface 12*d*, and finally directed to the road surface. In other words, the reflected light RayB, internally reflected by the reflection surface 12*b*, is returned at the cut-off line, and is superposed onto the light distribution pattern after the cut-off line. As a result, the cut-off line is formed on the upper edge of the low beam light distribution pattern.

Figure 14A:
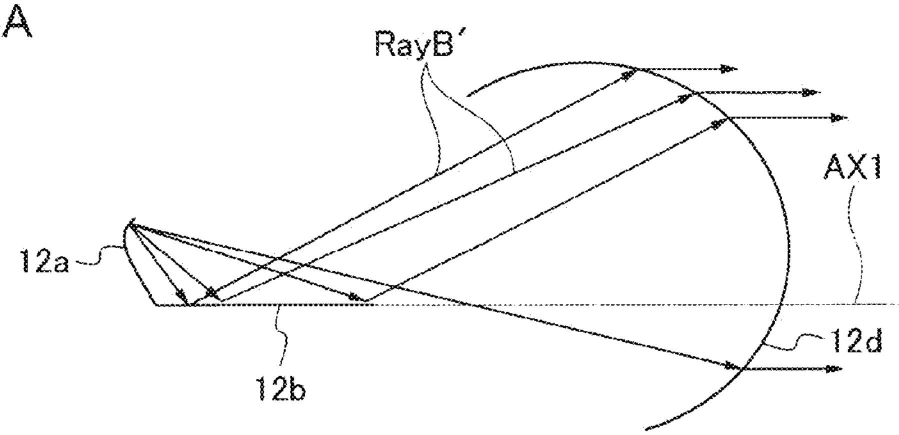
FIG. 14A is a view depicting how the reflected light RayB 'traveling in a direction that does not enter the outgoing surface 12 *d* can be captured by extending the reflecting surface 12 *b* upward when the reflecting surface 12 *b* is arranged in the horizontal direction is there.
Figure 14B:
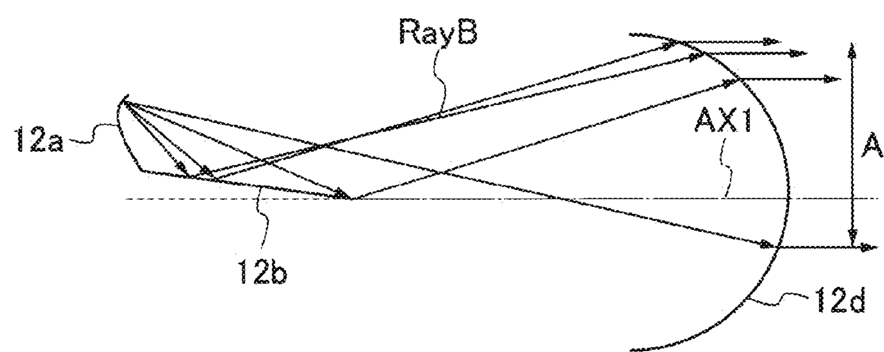
FIG. 14B is a view illustrating a manner in which more light (reflected light RayB internally reflected by the reflecting surface 12 *b*) can be captured without extending the reflecting surface 12 *b* upward, in the case where the reflecting surface 12 *b* is tilted with respect to the first reference axis AX 1.

The reflection surface 12*b* may be a plane-shaped reflection surface inclined forward and diagonally downward from the lower edge of the entry surface 12*a* with respect to the first reference axis AX1 (see FIG. 14B). The advantage of disposing the reflection surface 12*b* to be inclined with respect to the first reference axis AX1 will be described later.

The shade 12*c* extending in the crosswise direction is formed on the front end of the reflection surface 12*b*.

FIG. 8 is a diagram depicting functions of the shade 12*c*.

As illustrated in FIG. 8, a main function of the shade 12*c* is to shield a part of the light from the light source 14 which entered the lens body 12, and to form a luminous intensity distribution (light source image), that includes an edge corresponding to the cut-off line defined on the lower edge by the shade 12*c*, in the vicinity of the focal point $F_{12d}$ of the exit surface 12*d* (lens unit).

FIG. 9A is a schematic diagram depicting the shade 12*c* when viewed from the light source 14 position, FIG. 9B is an enlarged perspective view of the reflection surface 12*b* (including the shade 12*c*) illustrated in FIG. 2A, and FIG. 9C is a top view of the reflection surface 12*b* (including the shade 12*c*) illustrated in FIG. 2A.

As illustrated in FIG. 2A and FIG. 9A to FIG. 9C, the shade 12*c* includes an edge e1 corresponding to a left horizontal cut-off line, an edge e2 corresponding to a right horizontal cut-off line, and an edge e3 corresponding to a diagonal cut-off line connecting the left horizontal cut-off line and the right horizontal cut-off line.

The reflection surface 12*b* includes: a first reflection region 12*b*1 between the lower edge of the entry surface 12*a* and the edge e1 corresponding to the left horizontal cut-off line; a second reflection region 12*b*2 between the lower edge of the entry surface 12*a* and the edge e2 corresponding to the right horizontal cut-off line; and a third reflection region 12*b*3 between the first reflection region 12*b*1 and the second reflection region 12*b*2.

The first reflection region 12*b*1 gradually curves up from the lower edge of the entry surface 12*a* approaching the edge e1 corresponding to the left horizontal cut-off line, and the second reflection region 12*b*2, on the other hand, extends forward from the lower edge of the entry surface 12*a* in the horizontal direction.

As a result, the edge e1 corresponding to the left horizontal cut-off line is disposed in a position that is one step higher in the vertical direction than the edge e2 corresponding to the right horizontal cut-off line (in the case of driving on the right-hand side). For certain, the edge e1 corresponding to the left horizontal cut-offline may be disposed in a position that is one step lower in the vertical direction than the edge e2 corresponding to the right horizontal cut-off line (in the case of driving on the left hand side).

The shade 12*c* may also be created by forming grooves on the front end of the reflection surface 12*b*, including: a groove corresponding to the left horizontal cut-off line, a groove corresponding to the right horizontal cut-off line, and a groove corresponding to the diagonal cut-off line connecting the left horizontal cut-off line and the right horizontal cut-off line.

In FIG. 10A to FIG. 10C, modifications (side views) of the shade 12*c* are depicted. The shade 12*c* may be extended upward from the front end of the reflection surface 12*b* (see FIG. 10A), may be extended forward and diagonally upward in a curved state (see FIG. 10B), or may be extended forward and diagonally upward (see FIG. 10C). The shade 12*c* is not limited to these, but may have any shape as long as a part of the light from the light source 14 that enters the lens body 12 is shielded so that this light does not travel toward the exit surface 12*d*. The shielded light may be used for other light distributions or optical guidings.

As illustrated in FIG. 1, the exit surface 12*d* is a surface (e.g. convex surface which protrudes forward) through which the direct light RayA, which is traveling toward the exit surface 12*d*, and the reflected light RayB, which is internally reflected by the reflection surface 12*b* and traveling toward the exit surface 12*d*, out of the light from the light source 14 which entered the lens body 12, exit, and is configured as a lens unit of which focal point $F_{12d}$ is set in the vicinity of the shade 12_c_ (e.g. in the vicinity of the center of the shade 12_c_ in the crosswise direction). The exit surface 12_d_ reversely projects a luminous intensity distribution (light source image) formed in the vicinity of the focal point $F_{12d}$ of the exit surface 12_d_ (lens unit) by the direct light RayA and the reflected light RayB traveling toward the exit surface 12_d_, and forms a low beam light distribution pattern which includes the cut-off line on the upper edge.

By increasing the distance between the shade 12_c_ and the exit surface 12_d_ (focal length), the light source image becomes smaller compared with a case of decreasing the distance between the shade 12_c_ and the exit surface 12_d_ (focal length). As a result, the maximum luminous intensity of the luminous intensity distribution (and low beam light distribution pattern), which is formed in the vicinity of the focal point $F_{12d}$ of the exit surface 12_d_ (lens unit), can be further increased.

Further, by decreasing the distance between the exit surface 12_d_ and the light source 14 (or the shade 12_c_), the direct light RayA and the reflected light RayB captured in the exit surface increases compared with a case of increasing the distance between the exit surface 12_d_ and the light source 14 (or the shade 12_c_). As a result, efficiency improves.

The degree of diffusion of the low beam light distribution pattern in the horizontal direction and vertical direction can be freely adjusted by adjusting the surface shape of the exit surface 12_d_.

The surface connecting the front edge of the reflection surface 12_b_ and the lower edge of the exit surface 12_d_ is an inclined surface extending forward and diagonally downward from the front edge of the reflection surface 12_b_. The surface connecting the front edge of the reflection surface 12_b_ and the lower edge of the exit surface 12_d_ is not limited to this, but may be any surface as long as the surface does not shield the direct light RayA and the reflected light RayB travelling toward the exit surface 12_d_. In the same manner, the surface connecting the upper edge of the entry surface 12_a_ and the upper edge of the exit surface 12_d_ is a plane surface extending in the horizontal direction between the upper edge of the entry surface 12_a_ and the upper edge of the exit surface 12_d_. However, the surface connecting the upper edge of the entry surface 12_a_ and the upper edge of the exit surface 12_d_ is not limited to this, but may be any surface as long as the surface does not shield the direct light RayA and the reflected light RayB travelling toward the exit surface 12_d_.

In the lens body 12 having the above configuration, light which entered the lens body 12 through the entry surface 12_a_ is condensed toward the shade 12_c_ in a direction closer to the second reference axis AX2 with respect to the vertical direction (e.g. condensed to the center of the shade 12_c_). If the surface shape of the entry surface 12_a_ is configured as illustrated in FIG. 5, the light which entered the lens body through the entry surface 12_a_ is condensed toward the shade 12_c_ in a direction closer to the first reference axis AX1 with respect to the horizontal direction (e.g. condensed to the center of the shade 12_c_).

As described above, the direct light RayA condensed in the vertical direction and the horizontal direction and the reflected light RayB internally reflected by the reflection surface 12_b_ travel toward the exit surface 12_d_, and exit through the exit surface 12_d_. At this time, by the direct light RayA and the reflected light RayB travelling toward the exit surface 12_d_, the luminous intensity distribution (light source image), which includes the edge corresponding to the cut-off line defined on the lower edge by the shade 12_c_, is formed in the vicinity of the focal point $F_{12d}$ of the exit surface 12_d_ (lens unit). The exit surface 12_d_ reversely projects this luminous intensity distribution and forms the low beam light distribution pattern P1, which includes the cut-off line on the upper edge, as illustrated in FIG. 11A on a virtual vertical screen.

This low beam light distribution pattern P1 has a central luminous intensity that is relatively high and excels in long range visibility. This is because the light source 14 is disposed in the vicinity of the entry surface 12_a_ (vicinity of the reference point F) of the lens body 12 in the attitude with which the optical axis $AX_{14}$ of the light source 14 matches with the second reference axis AX2, and because the light on the optical axis $AX_{14}$ having relatively high intensity (luminous intensity) (direct light) is condensed toward the shade 12_c_ in a direction closer to the second reference axis AX2 (e.g. condensed to the center of the shade 12_c_).

Figure 11B:
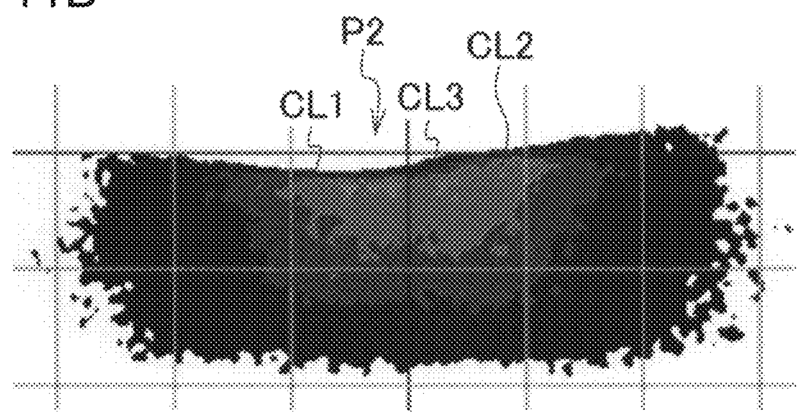
FIG. 11B illustrates a low beam light distribution pattern P2.

A low beam light distribution pattern P2, diffused in the horizontal direction, as illustrated in FIG. 11B, can be formed by adjusting the surface shape (e.g. curvature) of the entry surface 12_a_ and/or the exit surface 12_d_.

Further, the lower edge of the low beam light distribution pattern P1 or P2 can be extended downward by increasing the inclination of the second reference axis AX2 with respect to the first reference axis AX1 (see angle θ indicated in FIG. 1).

If the surface shape of the entry surface 12_a_ is configured as illustrated in FIG. 6, on the other hand, the light which entered the lens body 12 through the entry surface 12_a_ becomes a light parallel with the first reference axis AX1 in the horizontal direction, as illustrated in FIG. 6.

Figure 11C:
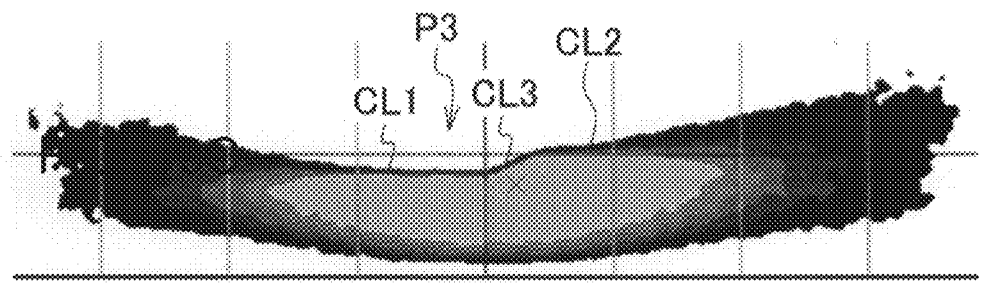
FIG. 11C illustrates a low beam light distribution pattern P3.

As described above, the direct light Ray A which condensed in the vertical direction and becomes parallel in the horizontal direction, and the reflected light RayB which is internally reflected by the reflection surface 12_b_, travel toward the exit surface 12_d_ and exit through the exit surface 12_d_. At this time, by the direct light RayA and the reflected light RayB, travelling toward the exit surface 12_d_, the luminous intensity distribution (light source image), which includes the edges corresponding to the cut-off lines CL1 to CL3, defined on the lower edge of the shade 12_c_, is formed in the vicinity of the focal point $F_{12d}$ of the exit surface 12_d_ (lens unit). The exit surface 12_d_ reversely projects this luminous intensity distribution and forms a low beam light distribution pattern P3, which includes the cut-off lines CL1 to CL3 on the upper edge illustrated in FIG. 11C, on the virtual vertical screen. The low beam light distribution pattern P3 illustrated in FIG. 11C is not condensed in the horizontal direction, therefore the pattern is more diffused in the horizontal direction than the low beam light distribution pattern P1 illustrated in FIG. 11A.

Next, the relationship between the light source image formed by the light from the light source 14, which entered the lens body 12, and the low beam distribution light distribution pattern, will be described.

Figure 12:
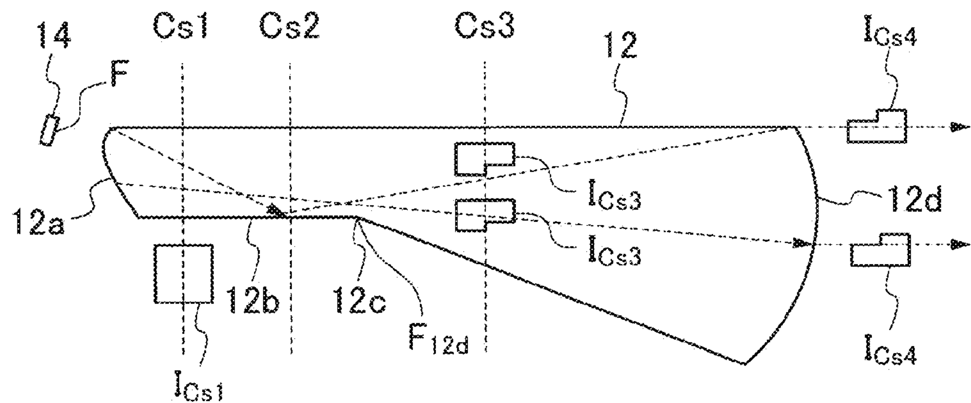
FIG. 12 is a diagram depicting the light source images formed by the light from the light source 14 on each cross-section Cs1 to Cs4.

FIG. 12 is a diagram depicting the light source images formed by the light from the light source 14 on each cross-section Cs1 to Cs3.

As illustrated in FIG. 12, the external shapes of the light source images $I_{Cs1}$ and $I_{Cs2}$ on the cross-sections Cs1 and Cs2 are the same as the external shape of the light source (the external shapes of the light source images are similar to and larger than the external shape of the light source 14).

The external shape of the light source image $I_{Cs3}$ on the cross-section CS3, after passing through the reflection surface 12_b_ and the shade 12_c_, includes the edges e1, e2 and e3 corresponding to the cut-off lines CL1 to CL3 defined on the lower edge by the shade 12*c*. This light source image $I_{Cs3}$ is inverted by the function of the exit surface 12*d* (lens unit), and includes the edges e1, e2 and e3 corresponding to the cut-off lines CL1 to CL3 defined by an upper edge by the shade 12*c*.

The low beam light distribution patterns P1 to P3, illustrated in FIG. 11A to FIG. 11C, are formed based on this light source image which includes the edges e1, e2 and e3 corresponding to the cut-off lines CL1 to CL3 defined on the upper edge by the shade 12*c*, hence the low beam light distribution patterns P1 to P3 include the clear cut-off lines CL1, CL2 and CL3 on the upper edges.

Next, the advantages of disposing the reflection surface 12*b* so as to be inclined with respect to the first reference axis AX1 will be described in comparison with the case of disposing the reflection surface 12*b* in the horizontal direction.

The first advantage is that stray light decreases and efficiency improves compared with the case of disposing the reflection surface 12*b* in the horizontal direction.

Figure 13A:
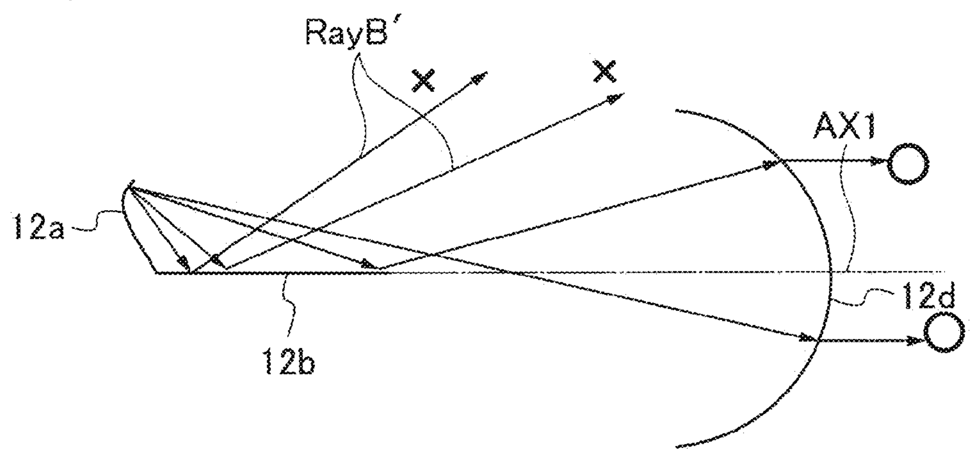
FIG. 13A is a view illustrating how the reflected light Ray B 'reflected internally by the reflecting surface 12 *b* advances in a direction in which the reflected light Ray B' does not enter the emitting surface 12 *d* when the reflecting surface 12 *b* is arranged in the horizontal direction.

In other words, in the case of disposing the reflection surface 12*b* in the horizontal direction, as illustrated in FIG. 13A, the reflected light RayB', which was internally reflected by the reflection surface 12*b*, becomes a stray light RayB' which travels in a direction that does not enter the exit surface 12*d*. As a result, the efficiency drops.

Figure 13B:
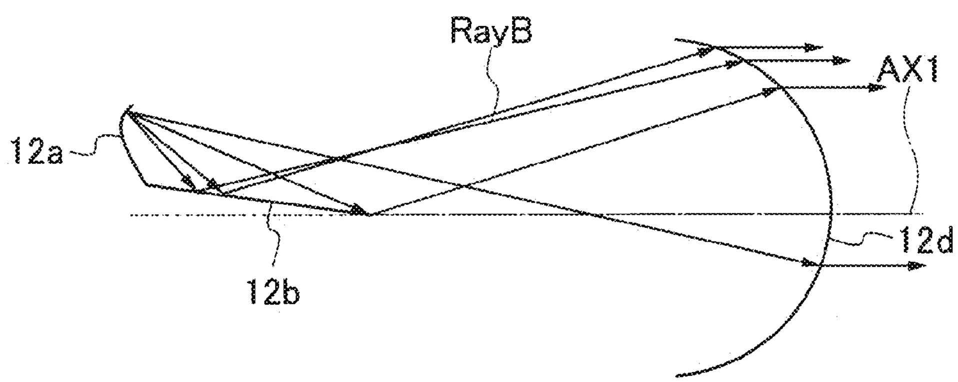
FIG. 13B is a view depicting how the reflected light Ray B, which is internally reflected by the reflecting surface 12 *b*, travels in a direction in which it is incident on the exit surface 12 *d* when the reflecting surface 12 *b* is disposed so as to be inclined with respect to the first reference axis AX 1 is there.

On the other hand, in the case of disposing the reflection surface 12*b* so as to be inclined with respect to the first reference axis AX1, as illustrated in FIG. 13B, the reflected light RayB, which was internally reflected by the reflection surface 12*b* and travels toward the exit surface 12*d*, increases, and light captured in the exit surface 12*d* (reflected light which was internally reflected by the reflection surface 12*b*) increases. As a result, the stray light decreases and the efficiency improves compared with the case of disposing the reflection surface 12*b* in the horizontal direction.

According to the simulation performed by the inventors of the present invention, in the case of disposing the reflection surface 12*b* so as to be inclined with respect to the first reference axis AX1 by 5°, the efficiency increases 33.8%, and in the case of disposing the reflection surface 12*b* so as to be inclined with respect to the first reference axis AX1 by 10°, the efficiency increases 60%.

The second advantage is that the lens body 12 can be downsized compared with the case of disposing the reflection surface 12*b* in the horizontal direction.

In other words, in the case of disposing the reflection surface 12*b* in the horizontal direction, as illustrated in FIG. 13A, the reflected light RayB, which was internally reflected by the reflection surface 12*b*, becomes a stray light RayB' which travels in a direction that does not enter the exit surface 12*d*. By extending the exit surface 12*d* upward, as illustrated in FIG. 14A, the stray light RayB' can be captured, but the size of the exit surface 12*d* increases because of the upward extension.

On the other hand, in the case of disposing the reflection surface 12*b* so as to be inclined with respect to the first reference axis AX1, as illustrated in FIG. 14B, the exit surface 12*d* can capture more light (reflected light RayB internally reflected by the reflection surface 12*b*) without extending the exit surface 12*d* upward. As a result, the exit surface 12*d* (and therefore the lens body 12) can be downsized compared with the case of disposing the reflection surface 12*b* in the horizontal direction.

According to the simulation performed by the inventors of the present invention, in the case of disposing the reflection surface 12*b* so as to be inclined with respect to the first reference axis AX1 by 5°, the height A (height in the vertical direction of the light which exits through the exit surface 12*d*) indicated in FIG. 14B, decreases 8% compared with the case illustrated in FIG. 14A, and if the reflection surface 12*b* is disposed so as to be inclined with respect to the first reference axis AX1 by 10°, the height A indicated in FIG. 14B decreases 18.1% compared with the case illustrated in FIG. 14A.

Now an advantage of disposing the second reference axis AX2 so as to be inclined with respect to the first reference axis AX1, and condensing the light from the light source 14 which entered the lens body 12 toward the shade 12*c* in a direction closer to the second reference axis AX2 at least with respect to the vertical direction, will be described in comparison with the case of disposing the second reference axis AX2 in the horizontal direction and condensing the light from the light source 14 which entered the lens body 12 toward the shade 12*c* in a direction closer to the second reference axis AX2, at least with respect to the vertical direction.

The advantage is that stray light decreases and efficiency improves compared with the case of disposing the second reference axis AX2 in the horizontal direction and condensing the light from the light source 14 which entered the lens body 12 toward the shade 12*c* in a direction closer to the second reference axis AX2, at least with respect to the vertical direction.

Figure 15A:
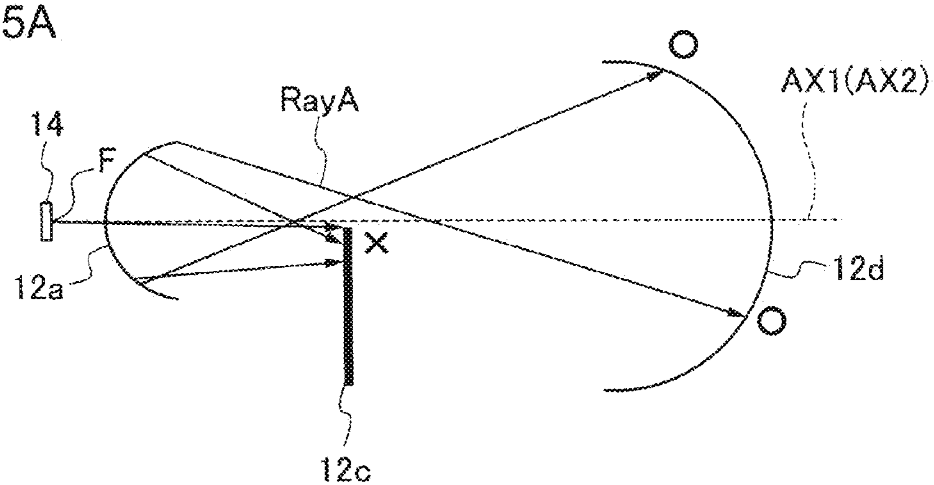
FIG. 15A illustrates most of the light from the light source 14 which entered the lens body 12 is shielded by the shade 12*c*, in the case of disposing the second reference axis AX2 in the horizontal direction and condensing the light from the light source 14 which entered the lens body 12 toward the shade 12*c* in a direction closer to the second reference axis AX2 at least with respect to the vertical direction.

In other words, in the case of disposing the second reference axis AX2 in the horizontal direction and condensing the light from the light source 14 which entered the lens body 12 toward the shade 12*c* in a direction closer to the second reference axis AX2 at least with respect to the vertical direction, as illustrated in FIG. 15A, most of the light from the light source 14 which entered the lens body 12 is shielded by the shade 12*c*. As a result, the efficiency drops considerably. Even if a reflection surface corresponding to the reflection surface 12*b* is added in FIG. 15A, the reflected light internally reflected by this reflection surface becomes stray light which travels in a direction that does not enter the exit surface 12*d*.

Figure 15B:
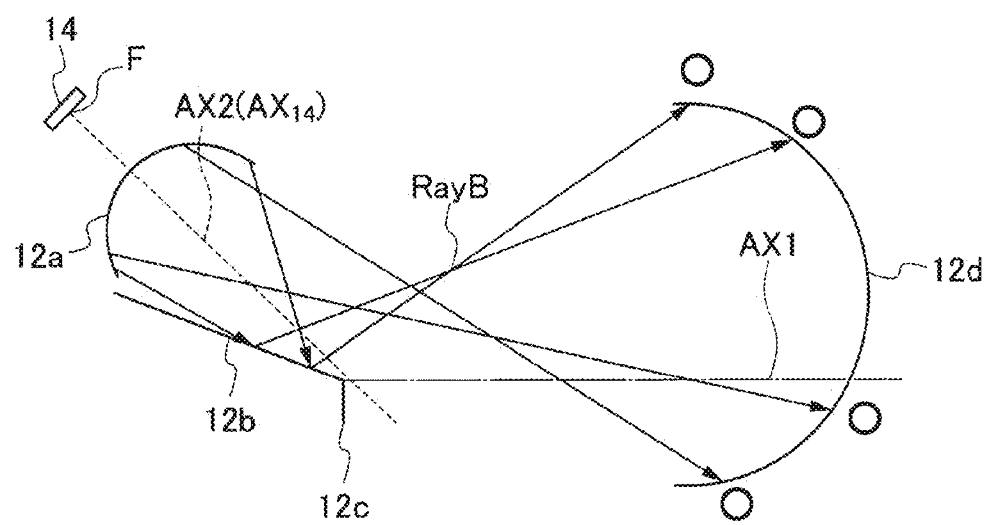
FIG. 15B illustrates the light captured in the exit surface 12*d* (reflected light RayB internally reflected by the reflection surface 12*b*) increases, in the case of disposing the second reference axis AX2 so as to be inclined with respect to the first reference axis AX1 and condensing the light from the light source 14 which entered the lens body 12 toward the shade 12*c* in a direction closer to the second reference axis AX2 at least with respect to the vertical direction.

On the other hand, in the case of disposing the second reference axis AX2 so as to be inclined with respect to the first reference axis AX1 and condensing the light from the light source 14 which entered the lens body 12 toward the shade 12*c* in a direction closer to the second reference axis AX2 at least with respect to the vertical direction, as illustrated in FIG. 15B, the light captured in the exit surface 12*d* (reflected light RayB internally reflected by the reflection surface 12*b*) increases. As a result, the stray light decreases and the efficiency improves compared with the case of disposing the second reference axis AX2 in the horizontal direction and condensing the light from the light source 14 which entered the lens body 12 toward the shade 12*c* in a direction closer to the second reference axis AX2, at least with respect to the vertical direction.

As described above, according to this embodiment, a lens body 12, without including a reflection surface formed by metal deposition, which is a factor that increases cost, and a vehicular lamp fitting 10 equipped with this lens body 12, can be provided. Secondly, a lens body 12 that can suppress melting of the lens body 12 and a drop in the output of the light source 14, caused by the heat generated in the light source 14, and a vehicular lamp fitting 10 equipped with this lens body 12, can be provided.

The reflection surface formed by metal deposition, which is a factor that increases cost, can be omitted, because the light from the light source 14 is controlled not by the reflection surface formed by metal deposition, but by refraction on the entry surface 12*a* and internal reflection on the reflection surface 12*b*.

Melting of the lens body 12 or a drop in the output of the light source 14, caused by the heat generated in the light source 14, can be suppressed, because the entry surface 12*a* is formed on the rear end of the lens body 12, and the light source 14 is disposed outside the lens body 12 (that is, in a position distant from the entry surface 12*a* of the lens body 12).

Next, a vehicular lamp fitting according to Embodiment 2 of the present invention will be described with reference to the drawings.

Figure 16:
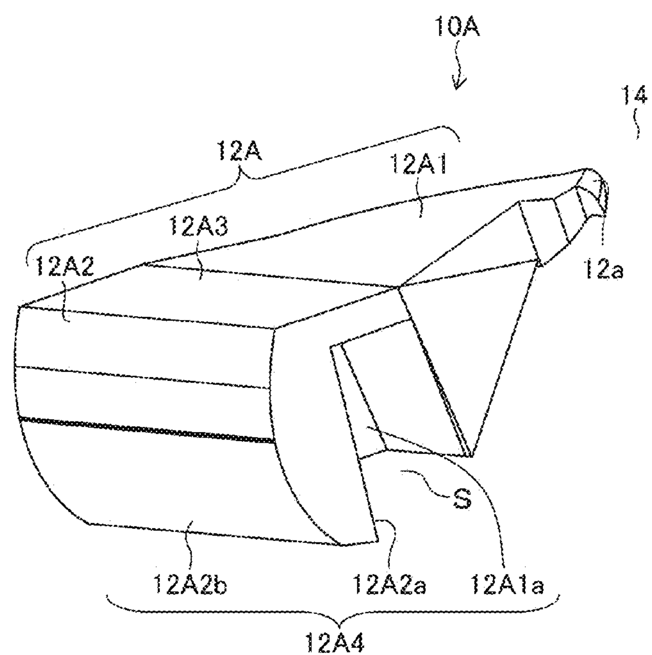
FIG. 16 is a perspective view of the vehicular lamp fitting 10A according to Embodiment 2 of the present invention/
Figure 17A:
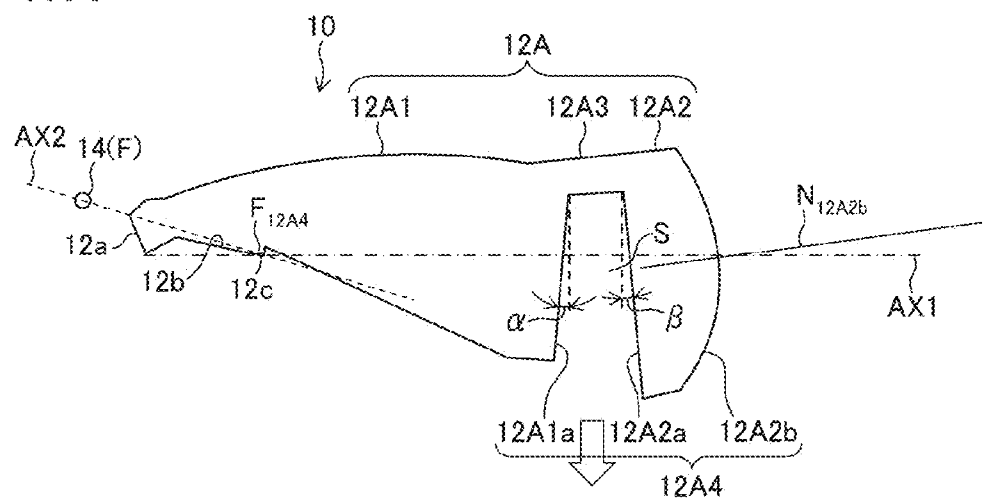
FIG. 17A is a longitudinal cross-sectional view thereof.
Figure 17B:
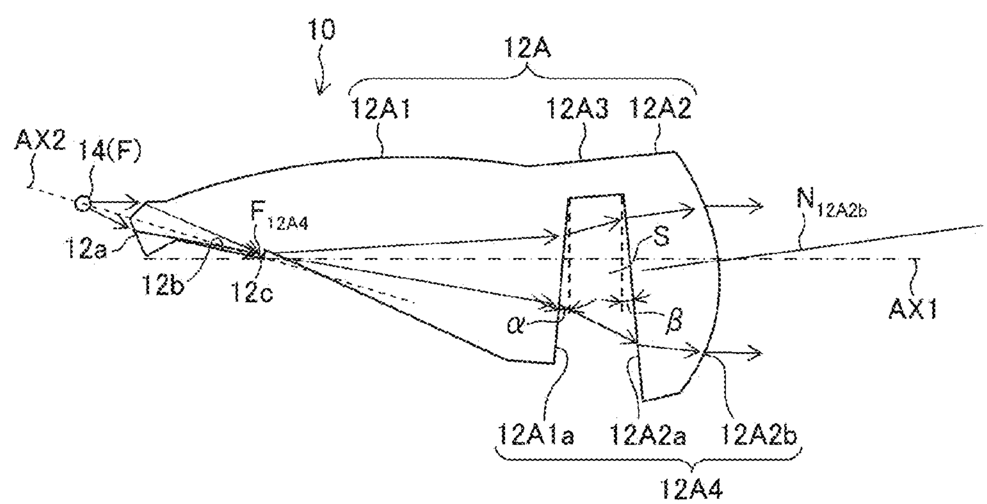
FIG. 17B is a diagram depicting the state of the light from the light source 14 that travels inside a lens body 12A.

FIG. 16 is a perspective view of the vehicular lamp fitting 10A according to Embodiment 2 of the present invention, FIG. 17A is a longitudinal cross-sectional view thereof, and FIG. 17B is a diagram depicting the state of the light from the light source 14 that travels inside a lens body 12A.

The vehicular lamp fitting 10A of Embodiment 2 and the above mentioned vehicular lamp fitting 10 of Embodiment 1 are different mainly in the following aspects.

Firstly, in the vehicular lamp fitting 10 of Embodiment 1, condensing in the horizontal direction and condensing in the vertical direction are mainly performed by the exit surface 12*d*, which is the final exit surface, of the lens body 12, but in the vehicular lamp fitting 10A of Embodiment 2, condensing in the horizontal direction is mainly performed by a first exit surface 12A1*a* of a first lens unit 12A1, and condensing in the vertical direction is mainly performed by a second exit surface 12A2*b* of a second lens unit 12A2, which is the final exit surface of the lens body 12A. In other words, in the vehicular lamp fitting 10A of Embodiment 2, the concept "condensing functions are separated" is applied.

Secondly, in the vehicular lamp fitting 10 of Embodiment 1, the exit surface 12*d*, which is the final exit surface of the lens body 12, is configured as a hemispherical surface (hemispherical refractive surface) in order to perform condensing in the horizontal direction and condensing in the vertical direction (see FIG. 2A), but in the vehicular lamp fitting 10A of Embodiment 2, the first exit surface 12A1*a* of the first lens unit 12A1 is configured as a semicircular cylindrical surface (semicircular cylindrical refractive surface) which extends in the vertical direction (see FIG. 23) in order to perform condensing in the horizontal direction, and the second exit surface 12A2*b* of the second lens unit 12A2, which is the final exit surface of the lens body 12A, is configured as a semicircular cylindrical surface (semicircular cylindrical refractive surface) which extends in the horizontal direction (see FIG. 23) in order to perform condensing in the vertical direction.

Figure 18:
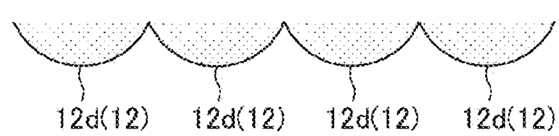
FIG. 18 is a top view depicting a state where a plurality of vehicular lamp fittings 10 (plurality of lens bodies 12) of Embodiment 1 are disposed on a line.

Thirdly, in the vehicular lamp fitting 10 of Embodiment 1, the exit surface 12*d*, which is the final exit surface of the lens body 12, is configured as a hemispherical surface (hemispherical refractive surface), hence when a plurality of vehicular lamp fittings 10 (plurality of lens bodies 12) are disposed on a line (see FIG. 18), dots appear as if lined up, and a vehicular lamp fitting (combined lens body) having an integral appearance linearly extending in a predetermined direction is not able to be implemented, while in the vehicular lamp fitting 10A of Embodiment 2, the second exit surface 12A2*b*, which is the final exit surface of the lens body 12A, is configured as a semicircular cylindrical surface (semicircular cylindrical refractive surface) extending in the horizontal direction, hence by disposing a plurality of vehicular lamp fittings 10A (plurality of lens bodies 12A) on a line (see FIG. 19A and FIG. 19B), a vehicular lamp fitting (combined lens bodies 16), having an integral appearance linearly extending in the horizontal direction, can be configured. FIG. 18 is a top view depicting a state where a plurality of vehicular lamp fittings 10 (plurality of lens bodies 12) of Embodiment 1 are disposed on a line.

The other configuration is the same as the vehicular lamp fitting 10 of Embodiment 1. The vehicular lamp fitting 10A of Embodiment 2 will now be described focusing on the differences from the vehicular lamp fitting 10 of Embodiment 1, and a composing element the same as the vehicular lamp fitting 10 of Embodiment 1 will be denoted with a same reference symbol, and description thereof is omitted.

Figure 20A:
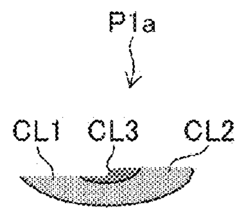
FIG. 20A illustrates the low beam light distribution pattern P1*a* on virtual vertical screen which faces the front face of the vehicle (disposed at about 25 m in front of the front face of the vehicle)

As illustrated in FIG. 16 and FIG. 17B, the vehicular lamp fitting 10A according to Embodiment 2 includes the light source 14, the first lens unit 12A1, and the second lens unit 12A2, and is configured as a vehicular head light equipped with the lens body 12A, such that light from the light source 14 enters the first lens unit 12A1 through a first entry surface 12*a* of the first lens unit 12A1, exits through the first exit surface 12A1*a* of the first lens unit 12A1 after being partially shielded by the shade 12*c* of the first lens unit 12A1, further enters the second lens unit 12A2 through a second entry surface 12A2*a* of the second lens unit 12A2, then exits through a second exit surface 12A2*b* of the second lens unit 12A2, and is irradiated forward, so as to form a low beam light distribution pattern P1*a* or the like (corresponding to the predetermined light distribution pattern of the present invention), which includes cut-off lines CL1 to CL3 defined on an upper edge by the shade 12*c* illustrated in FIG. 20A.

Figure 21A:
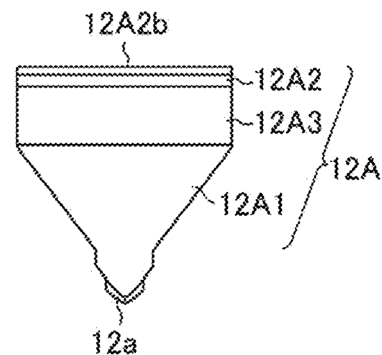
FIG. 21A is a top view.
Figure 21B:
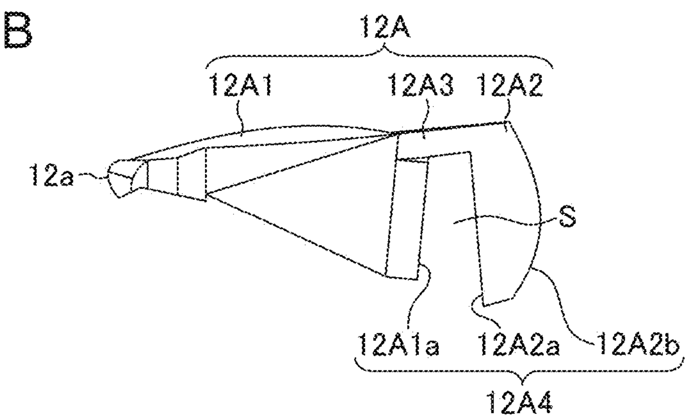
FIG. 21B is a side view.
Figure 21C:
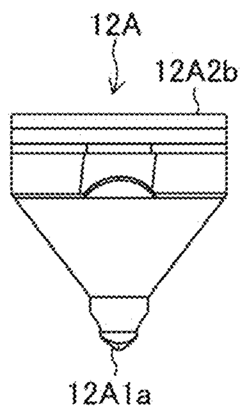
FIG. 21C is a bottom view of the lens body 12A of Embodiment 2.
Figure 22:
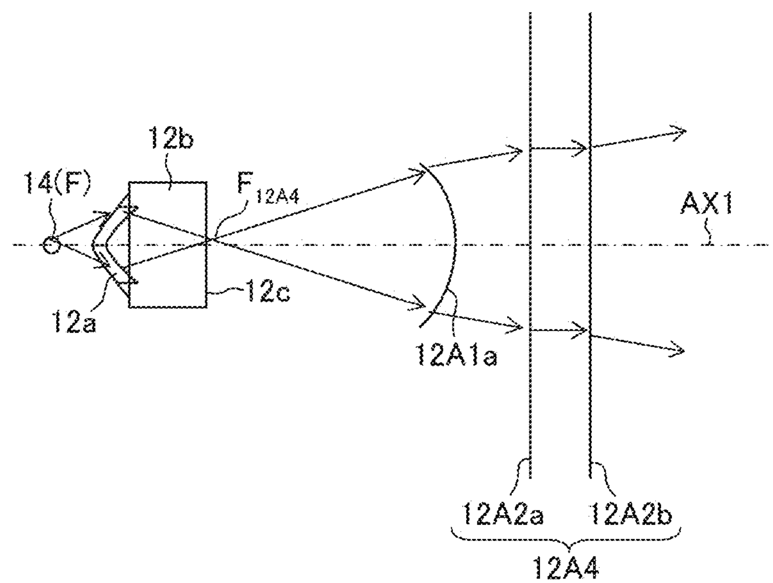
FIG. 22 illustrates an example of the first entry surface 12*a* (cross-sectional view).
Figure 23:
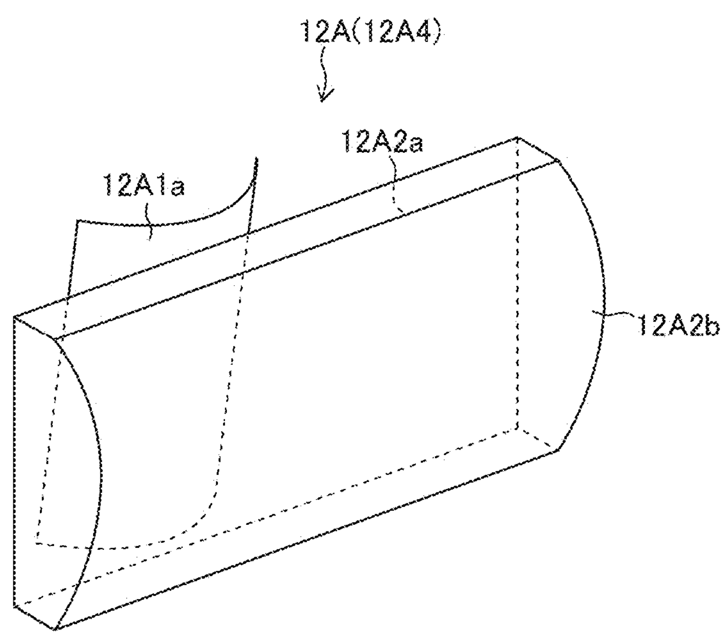
FIG. 23 is a perspective view depicting the lens body 12A (first exit surface 12A1*a*, second entry surface 12A2*a* and second exit surface 12A2*b*) of Embodiment 2.

FIG. 21A is a top view, FIG. 21B is a side view, and FIG. 21C is a bottom view of the lens body 12A of Embodiment 2. FIG. 22 illustrates an example of the first entry surface 12*a* (cross-sectional view), and FIG. 23 is a perspective view depicting the lens body 12A (first exit surface 12A1*a*, second entry surface 12A2*a* and second exit surface 12A2*b*) of Embodiment 2.

As illustrated in FIG. 17A and FIG. 21A to FIG. 21C, the lens body 12A is a lens body having a shape along the first reference axis AX extending in the horizontal direction, and includes the first lens unit 12A1, the second lens unit 12A2, and a connecting unit 12A3 which connects the first lens unit 12A1 and the second lens unit 12A2.

The first lens unit 12A1 includes the first entry surface 12*a*, the reflection surface 12*b*, the shade 12*c*, the first exit surface 12A1*a* and a reference point F that is disposed in the vicinity of the first entry surface 12*a* in the optical design. The second lens unit 12A2 includes the second entry surface 12A2*a* and the second exit surface 12A2*b*. The first entry surface 12*a*, the reflection surface 12*b*, the shade 12*c*, the first exit surface 12A1*a*, the second entry surface 12A2*a*, and the second exit surface 12A2*b* are disposed in this order along the first reference axis AX1.

The first lens unit 12A1 and the second lens unit 12A2 are connected by the connecting unit 12A3.

The connecting unit 12A3 connects the first lens unit 12A1 and the second lens unit 12A2 at the upper portions thereof such that a space S (open area), surrounded by the first exit surface 12A1*a*, the second entry surface 12A2*a* and the connecting unit 12A3, is formed.

The lens body 12A is integrally molded by injecting such transparent resin as polycarbonate and acrylic into a die, and cooling and solidifying the resin (injection molding).

The space S is formed by a die of which the extracting direction is the opposite from the connecting unit 12A3 (see the arrow mark in FIG. 17A). To smoothly extracting the die, extracting angles α and β (also called "drafts", which are preferably 2° or more) are set for the first exit surface 12A1*a* and the second entry surface 12A2*a* respectively. Thereby the die can be vertically extracted during molding, and the lens body 12 (and the later mentioned combined lens body 16) can be manufactured by one extraction operation (without using a slide) at low cost. The material of the lens body 12A may be glass, other than such transparent resins as polycarbonate and acrylic.

The first entry surface 12*a* is a surface which is formed in the rear end of the first lens unit 12A1 (e.g. free-form surface protruding toward the light source 14), and through which the light from the light source 14 (to be more precise, the reference point F in the optical design), disposed in the vicinity of the first entry surface 12*a*, is refracted and enters the first lens unit 12A1, and the surface shape of the first entry surface 12*a* is configured such that the light from the light source 14, which entered the first lens unit 12A1, is condensed toward the shade 12*c* in a direction closer to the second reference axis AX2 with respect to the vertical direction (see FIG. 17B), and the light from the light source 14 is condensed toward the shade 12*c* in a direction closer to the first reference axis AX1 with reference to the horizontal direction (see FIG. 22). The first reference axis AX passes through a point (e.g. focal point $F_{12A4}$) in the vicinity of the shade 12*c*, and extends in the longitudinal direction of the vehicle. The second reference axis AX2 passes through the center (to be more precise, the reference point F) of the light source 14 and a point (e.g. focal point $F_{12A4}$) in the vicinity of the shade 12*c*, and is inclined forward and diagonally downward with respect to the first reference axis AX1. The surface shape of the first entry surface 12*a* may be configured such that the light from the light source 14, which entered the first lens unit 12A1, becomes parallel with the reference axis AX1 (see FIG. 6) with respect to the horizontal direction.

The first exit surface 12A1*a* is a surface configured to condense the light beams from the light source 14 which exited through the first exit surface 12A1*a* (in other words, the direct light which travels toward the first exit surface 12A1*a* and the reflected light which is internally reflected by the reflection surface 12*b* and travels toward the first exit surface 12A1*a*, out of the light beams from the light source 14 which entered the first lens unit 12A1) in the horizontal direction (corresponding to the first direction of the present invention). In concrete terms, the first exit surface 12A1*a* is configured as a semicircular cylindrical surface of which cylindrical axis extends in the vertical direction, as illustrated in FIG. 23. The focal line of the first exit surface 12A1*a* extends in the vicinity of the shade 12*c* in the vertical direction.

The second entry surface 12A2*a* is a surface which is formed on the rear end of the second lens unit 12A2, and through which the light from the light source 14, which exited through the first exit surface 12A1*a*, enters the second lens unit 12A2, and is configured as a plane surface, for example. The surface shape of the second entry surface 12A2*a* is not limited to this, but may be configured as a curved surface.

The second exit surface 12A2*b* is a surface configured to condense the light from the light source 14, which exited through the second exit surface 12A2*b*, in the vertical direction (corresponding to the second direction of the present invention). In concrete terms, the second exit surface 12A2*b* is configured as a semicircular cylindrical surface of which cylindrical axis extends in the horizontal direction, as illustrated in FIG. 23. The focal line of the second exit surface 12A2*b* extends in the vicinity of the shade 12*c* in the horizontal direction.

Similarly to the focal point $F_{12d}$ of the exit surface 12*d* of Embodiment 1, the focal point $F_{12A4}$ of the lens 12A4, constituted by the first exit surface 12A1*a* and the second lens unit 12A2 (the second entry surface 12A2*a* and the second exit surface 12A2*b*) is set in the vicinity of the shade 12*c* (e.g. in the vicinity of the center of the crosswise direction of the shade 12*c*). Similarly to the exit surface 12*d* of Embodiment 1, this lens 12A4 is configured such that light reversely projects the luminous intensity distribution (light source image), which is formed in the vicinity of the focal point $F_{12A4}$ of the lens 12A4 by the light beams from the light source 14 which entered the first lens unit 12A1, (in other words, the direct light which travels toward the first exit surface 12A1*a* and the reflected light which was internally reflected by the reflection surface 12*b* and travels toward the first exit surface 12A1*a*, out of the light beams from the light source 14 which entered the first lens unit 12A1), and forms the low beam light distribution pattern P1*a*, including the cut-off lines CL1 to CL3 defined on an upper edge as illustrated in FIG. 20A on the virtual vertical screen.

The basic surface shape of the second exit surface 12A2*b* is as described above, but is actually adjusted as follows, since the extracting angles α and β are set for the first exit surface 12A1*a* and the second entry surface 12A2*a*.

Figure 24:
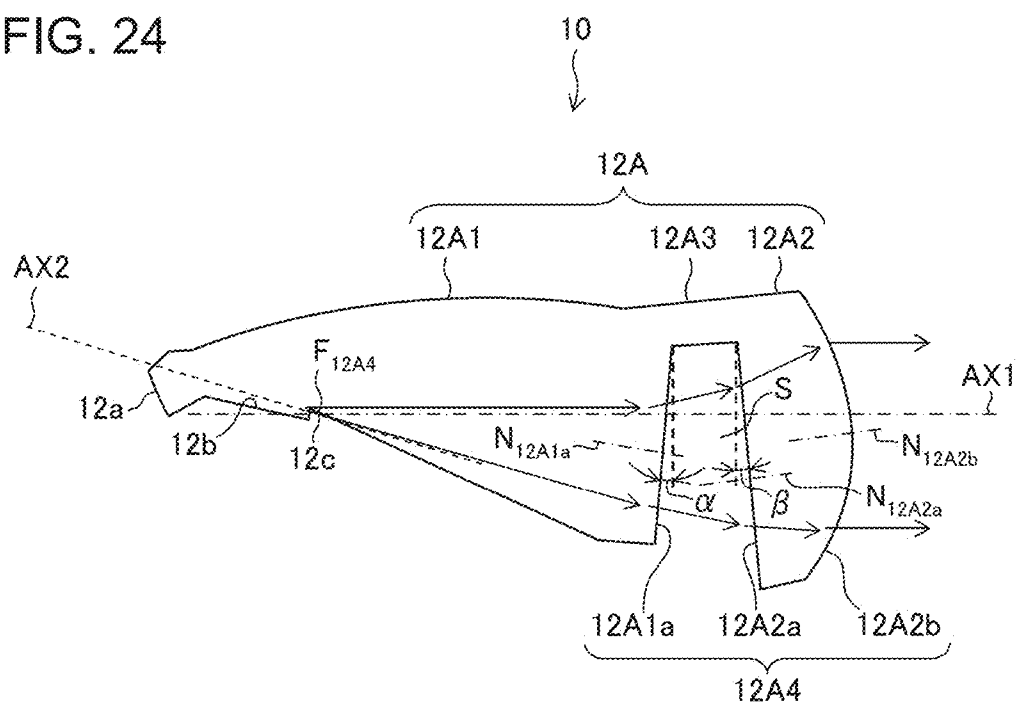
FIG. 24 is a diagram depicting the normal lines of the first exit surface 12A1*a*, the second entry surface 12A2*a*, and the second exit surface 12A2*b* respectively.

FIG. 24 is a diagram depicting the normal lines of the first exit surface 12A1*a*, the second entry surface 12A2*a*, and the second exit surface 12A2*b* respectively.

In other words, in the case when the extracting angles α and β are set for the first exit surface 12A1*a* and the second entry surface 12A2*a*, the normal lines $N_{12A1a}$ and $N_{12A2a}$, which pass through the centers of the first exit surface 12A1*a* and the second entry surface 12A2*a*, incline with respect to the horizontal line respectively, as illustrated in FIG. 24. In this case, if the normal line $N_{12A2b}$, passing through the center of the second exit surface 12A2*b*, extends in the horizontal direction, the light from the light source 14, which exits through the second exit surface 12A2*b*, becomes light traveling diagonally upward with respect to the horizontal line, which may cause glare.

To suppress this, the surface shape of the second exit surface 12A2*b* is adjusted so that the light from the light source 14, which exits through the second exit surface 12A2*b*, becomes parallel light with respect to the first reference axis AX1. For example, the second exit surface 12A2*b* is adjusted to the surface shape of which the normal line $N_{12A2b}$ thereof is inclined forward and diagonally upward, so that the light from the light source 14, which exits through the second exit surface 12A2*b*, becomes parallel light with respect to the first reference axis AX1. This adjustment is performed for matching the focal point $F_{12A4}$ of the lens 12A4 constituted by the first exit surface 12A1*a* and the second lens unit 12A2 (second entry surface 12A2*a* and second exit surface 12A2*b*) to a position in the vicinity of the shade 12*c*. The line with an arrow at the end in FIG. 24 indicates the optical path of the light from the light source 14 (to be more precise, the reference point F) which entered the lens body 12A.

The surface connecting the front edge of the reflection surface 12*b* and the bottom edge of the first exit surface 12A1*a* is an inclined surface extending forward and diagonally downward from the front edge of the reflection surface 12*b*, but the surface is not limited to this, and may be any surface as long as the light from the light source 14 traveling toward the second exit surface 12A2*b* is not shielded. In the same manner, the top surface of the lens body 12A, that is the surface connecting the upper edge of the first entry surface 12*a* and the upper edge of the second exit surface 12A2*b*, is a surface extending approximately in the horizontal direction, but the surface is not limited to this, and may be any surface as long as the light from the light source 14 traveling toward the second exit surface 12A2*b* is not shielded. In the same manner, both side surfaces of the lens body 12A, which are surfaces connecting the left and right edges of the first entry surface 12*a* and the left and right edges of the second exit surface 12A2*b*, are inclined surfaces that are tapered toward the first entry surface 12*a* (see FIG. 21A), but the surfaces are not limited to this, and may be any surfaces as long as the light from the light source 14 traveling toward the second exit surface 12A2*b* is not shielded.

In the vehicular lamp fitting 10A (lens body 12A) having the above mentioned configuration, the light from the light source 14 enters the first lens unit 12A1 through the first entry surface 12*a* of the first lens unit 12A1, and exits through the first exit surface 12A1*a* of the first lens unit 12A1 after being partially shielded by the shade 12*c* of the first lens unit 12A1. At this time, the light from the light source 14, which exits through the first exit surface 12A1*a*, is condensed in the horizontal direction by a function of the first exit surface 12A1*a* (see FIG. 22. The light is not condensed or hardly condensed in the vertical direction). Then the light from the light source 14, which exited through the first exit surface 12A1*a*, passes through the space S, further enters the second lens unit 12A2 through the second entry surface 12A2*a* of the second lens unit 12A2, exits through the second exit surface 12A2*b* of the second lens unit 12A2, and is irradiated forward. At this time, the light from the light source 14, which exits through the second exit surface 12A2*b*, is condensed in the vertical direction by a function of the second exit surface 12A2*b* (see FIG. 17B. The light is not condensed, or hardly condensed in the horizontal direction). Thereby the low beam light distribution pattern P1*a* or the like (corresponding to the predetermined light distribution pattern of the present invention) including the cut-off lines CL1 to CL3 defined on an upper edge by the shade 12*c* as illustrated in FIG. 20A, is formed on the virtual vertical screen.

This low beam light distribution pattern P1*a* or the like has a relatively high central luminous intensity and excellent long range visibility. This is because the light source 14 is disposed in the vicinity of the entry surface 12*a* (in the vicinity of the reference point F) of the lens body 12A in an attitude such that the optical axis $AX_{14}$ of the light source 14 matches the second reference axis AX2, and that light on the optical axis $AX_{14}$ (direct light) having a relatively high intensity (luminous intensity) is condensed toward the shade 12*c* in a direction closer to the second reference axis AX2 (e.g. condensed to the center of the shade 12*c*).

Figure 20B:
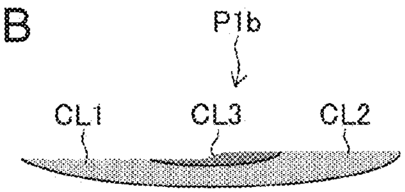
FIG. 20B illustrates a low beam light distribution pattern P1*b*.
Figure 20C:
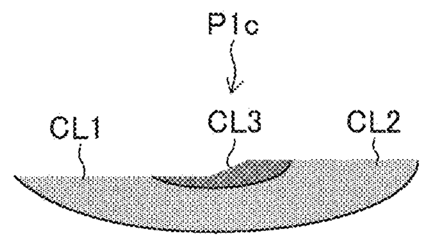
FIG. 20C illustrates a low beam light distribution pattern P1*c*.

The degree of diffusion of the low beam light distribution pattern in the horizontal direction and/or the vertical direction can be freely adjusted as illustrated in FIG. 20A to FIG. 20C by adjusting the surface shape (e.g. curvature) of the first exit surface 12A1*a* and/or the second exit surface 12A2*b*. For example, a degree of the diffusion of the low beam light distribution pattern in the horizontal direction can be freely adjusted by adjusting the surface shape (e.g. curvature) of the first exit surface 12A1*a*. In the same manner, a degree of diffusion of the low beam light distribution pattern in the vertical direction can be freely adjusted by adjusting the surface shape (e.g. curvature) of the second exit surface 12A2*b*.

Figure 19A:
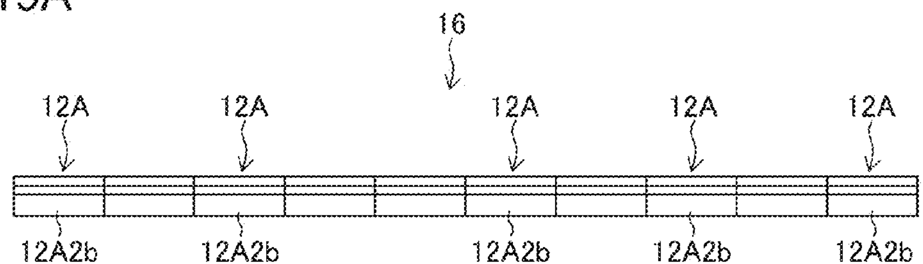
FIG. 19A is a front view depicting the state where a plurality of the vehicular lamp fittings 10A (a plurality of the lens bodies 12A) according to Embodiment 2 are disposed on a line in the horizontal direction.
Figure 19B:
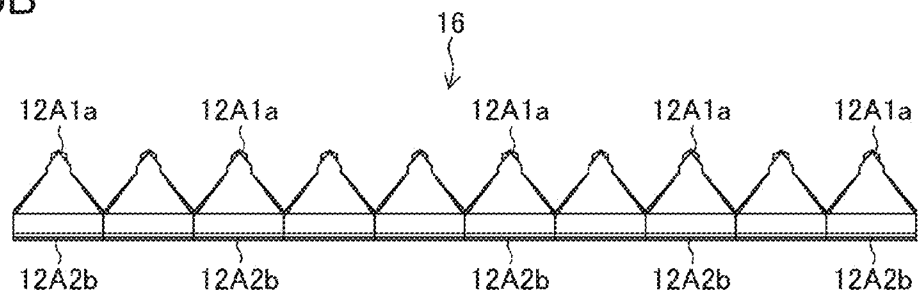
FIG. 19B is a top view thereof.

FIG. 19A is a front view depicting the state where a plurality of the vehicular lamp fittings 10A (a plurality of the lens bodies 12A) according to Embodiment 2 are disposed on a line in the horizontal direction, and FIG. 19B is a top view thereof.

As illustrated in FIG. 19A and FIG. 19B, the combined lens body 16 includes a plurality of the lens bodies 12A. The combined lens body 16 (a plurality of the lens bodies 12A) is integrally molded by injecting such transparent resins as polycarbonate and acrylic into a die, and cooling and solidifying the resin (injection molding). The second exit surface 12A2*b* of each of the plurality of lens bodies 12A is disposed on a line in the horizontal direction so as to be adjacent to each other, and constitutes a semicircular cylindrical exit surface group having an integral appearance linearly extending in the horizontal direction.

By using the combined lens body 16 having the above mentioned configuration, a vehicular lamp fitting having an integral appearance, linearly extending in the horizontal direction, can be configured. The combined lens body 16 may be configured by molding a plurality of lens bodies 12 in a physically separated state, and connecting (holding) the lens bodies 12 using a holding member (not illustrated), such as a lens holder.

As described above, according to Embodiment 2, the following effects can be implemented in addition to the above mentioned effects of Embodiment 1.

Firstly, a lens body 12A (combined lens body 16) having an integral appearance linearly extending in the horizontal direction, and a vehicular lamp fitting 10A equipped with this lens body 12A (combined lens body 16), can be provided. Secondly, a lens body 12A (combined lens body 16) that can form a low beam light distribution pattern P1*a* or the like, condensed in the horizontal direction and the vertical direction, even though the second exit surface 12A2*b*, which is the final exit surface, is a semicircular cylindrical surface (semicircular cylindrical refractive surface extending in the horizontal direction), and a vehicular lamp fitting 10A equipped with this lens body 12A (combined lens body 16), can be provided.

The integral appearance linearly extending in the horizontal direction can be implemented because the second exit surface 12A2*b*, which is the final exit surface, is configured as a semicircular cylindrical surface (semicircular cylindrical refractive surface extending in the horizontal direction).

The low beam light distribution pattern P1*a* or the like, condensed in the horizontal direction and the vertical direction, can be formed even though the second exit surface 12A2*b*, which is the final exit surface, is a semicircular cylindrical surface (semicircular cylindrical refractive surface extending in the horizontal direction), because condensing light in the horizontal direction is mainly performed by the first exit surface 12A1*a* (semicircular cylindrical refractive surface extending in the vertical direction) of the first lens unit 12A1, and condensing light in the vertical direction is mainly performed by the second exit surface 12A2*b* (semicircular cylindrical refractive surface extending in the horizontal direction) of the second lens unit 12A2, which is the final exit surface of the lens body 12A. In other words, the condensing functions are separated.

Further, according to Embodiment 2, a lens body 12A (combined lens body 16) suitable for a vehicular lamp fitting, and a vehicular lamp fitting 10A equipped with the lens body 12A (combined lens body 16), are provided, whereby the light from the light source 14 exited from the second exit surface 12A2*b*, which is the final exit surface, becomes light parallel with the first reference axis AX1, even though the extracting angles α and β are set for the first exit surface 12A1*a* and the second entry surface 12A2*a* respectively.

Next modifications will be described.

Figure 25:
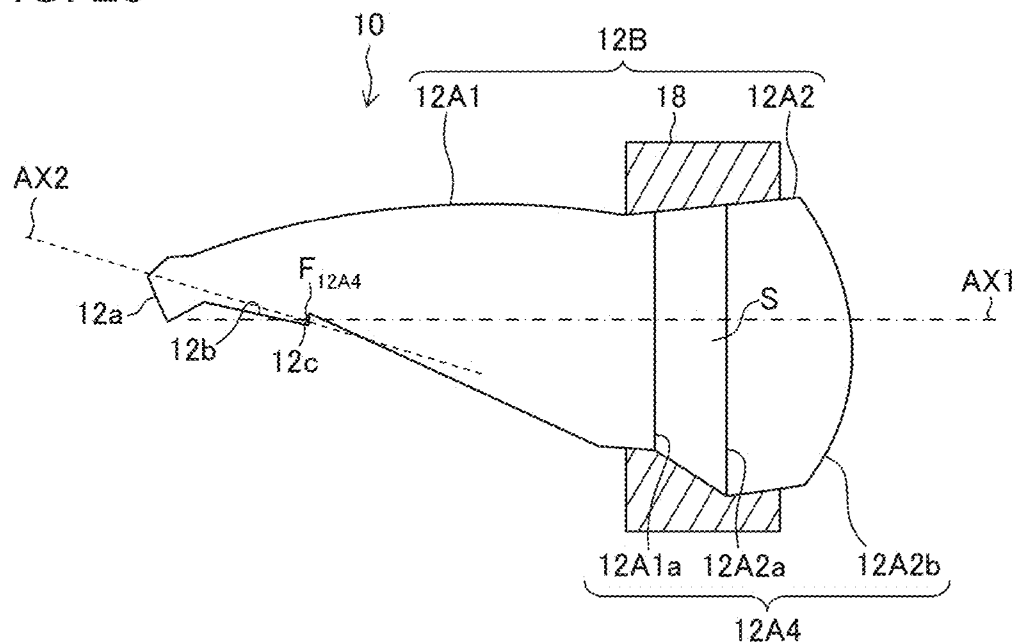
FIG. 25 is a diagram depicting a lens body 12B, which is a first modification of the lens body 12A of Embodiment 2.

FIG. 25 is a diagram depicting a lens body 12B, which is a first modification of the lens body 12A of Embodiment 2.

As illustrated in FIG. 25, the lens body 12B of this modification is configured by molding the first lens unit 12A1 and the second lens unit 12A2 in a physically separated state, and connecting (holding) these lens units by the holding member 18, such as a lens holder. The extracting angles α and β are not set for the first exit surface 12A1*a* and the second entry surface 12A2*a*, and are formed as a plane surface (or curved surface) orthogonal to the reference axis AX1.

According to this modification, the extracting angles α and β are unnecessary, therefore the adjustment of the second exit surface 12A2*b* can be omitted.

Figure 26:
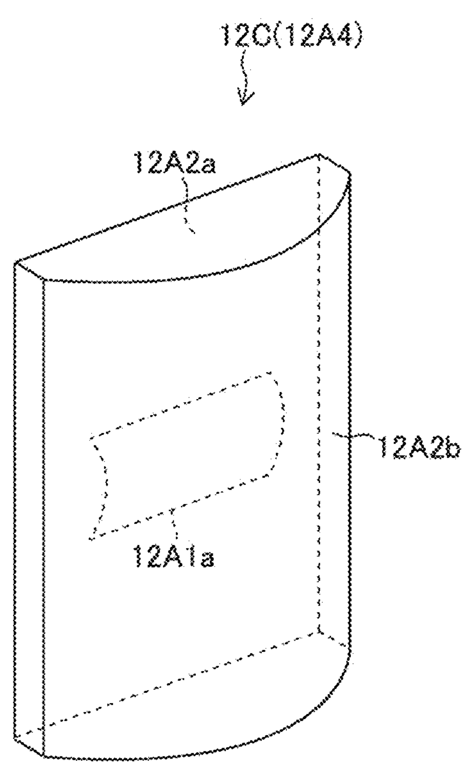
FIG. 26 is a perspective view depicting a lens body 12C (first exit surface 12A1*a*, second entry surface 12A2*a*, second exit surface 12A2*b*), which is a second modification of the lens body 12A of Embodiment 2.

FIG. 26 is a perspective view depicting a lens body 12C (first exit surface 12A1*a*, second entry surface 12A2*a*, second exit surface 12A2*b*), which is a second modification of the lens body 12A of Embodiment 2.

The lens body 12C of this modification corresponds to Embodiment 2, where the first exit surface 12A1*a* and the second exit surface 12A2*b* are reversed.

In other words, the first exit surface 12A1*a* of the lens body 12C of this modification is a surface configured to condense the light from the light source 14 which exits through the first exit surface 12A1*a* in the vertical direction (corresponding to the first direction of the present invention). In concrete terms, as illustrated in FIG. 26, the first exit surface 12A1*a* is a semicircular cylindrical surface of which cylindrical axis extends in the horizontal direction. In this case, the focal line of the first exit surface 12A1*a* extends in the horizontal direction in the vicinity of the shade 12*c*. The second exit surface 12A2*b* of the lens body 12C of this modification is a surface configured to condense the light from the light source 14 which exits through the second exit surface 12A2*b* in the horizontal direction (corresponding to the second direction of the present invention). In concrete terms, as illustrated in FIG. 26, the second exit surface 12A2*b* is a semicircular cylindrical surface of which cylindrical axis extends in the horizontal direction. In this case, the focal line of the second exit surface 12A2*b* extends in the vertical direction in the vicinity of the shade 12*c*.

The focal point $F_{12A4}$ of the lens 12A4, constituted by the first exit surface 12A1*a* and the second lens unit 12A2 (second entry surface 12A2*a* and second exit surface 12A2*b*) of the lens body 12C of this modification, is set in the vicinity of the shade 12*c* (e.g. in the vicinity of the center of the shade 12*c* in the crosswise direction), similarly to Embodiment 2.

Figure 27:
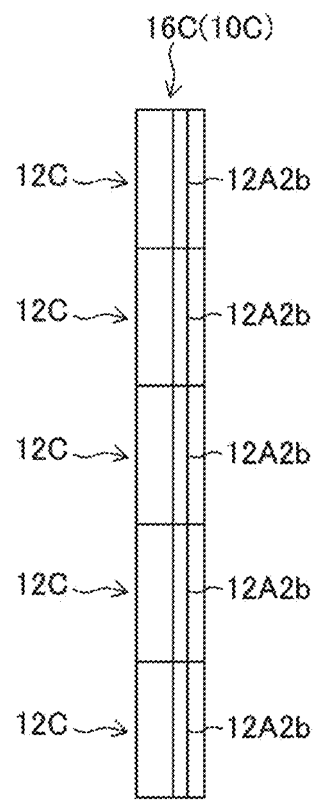
FIG. 27 is a front view depicting a state where a plurality of vehicular lamp fittings 10C (a plurality of lens bodies 12C) are disposed on a line in the vertical direction.

FIG. 27 is a front view depicting a state where a plurality of vehicular lamp fittings 10C (a plurality of lens bodies 12C) are disposed on a line in the vertical direction.

As illustrated in FIG. 27, the combined lens body 16C includes a plurality of lens bodies 12C. The combined lens body 16C (plurality of lens bodies 12C) is integrally molded by injecting such transparent resins as polycarbonate and acrylic into a die, and cooling and solidifying the resin (injection molding). The second exit surface 12A2*b* of the plurality of lens bodies 12C is disposed on a line in the vertical direction so as to be adjacent to each other, and constitutes a semicircular cylindrical exit surface group having an integral appearance linearly extending in the vertical direction.

By using the combined lens body 16C having the above mentioned configuration, a vehicular lamp fitting 10C, having an integral appearance linearly extending in the virtual direction, can be configured. The combined lens body 16C may be configured by molding the plurality of lens bodies 12C in a physically separated state, and connecting (holding) the lens bodies 12C using a holding member (not illustrated), such as a lens holder.

According to this modification, a lens body 12C (combined lens body 16C) having an integral appearance linearly extending in the vertical direction, and a vehicular lamp fitting 10C equipped with this lens body 12C (combined lens body 16C), can be provided. Secondly, a lens body 12C (combined lens body 16C) that can form a low beam light distribution pattern P1*a* or the like condensed in the horizontal direction and the vertical direction, even though the second exit surface 12A2*b*, which is the final exit surface, is a semicircular cylindrical surface (semicircular cylindrical refractive surface extending in the vertical direction), and a vehicular lamp fitting 10C equipped with this lens body 12C (combined lens body 16C), can be provided.

The integral appearance linearly extending in the vertical direction can be implemented because the second exit surface 12A2*b*, which is the final exit surface, is configured as a semicircular cylindrical surface (semicircular cylindrical refractive surface extending in the vertical direction).

The low beam light distribution pattern P1*a* or the like, condensed in the horizontal direction and the vertical direction, can be formed even though the second exit surface 12A2*b*, which is the final exit surface, is a semicircular cylindrical surface (semicircular cylindrical refractive surface extending in the vertical direction), because condensing light in the vertical direction is mainly performed by the first exit surface 12A1*a* (semicircular cylindrical refractive surface extending in the horizontal direction) of the first lens unit 12A1, and condensing light in the horizontal direction is mainly performed by the second exit surface 12A2*b* (semicircular cylindrical refractive surface extending in the vertical direction) of the second lens unit 12A2, which is the final exit surface of the lens body 12A. In other words, the condensing functions are separated.

The concept of "the condensing functions are separated" described in Embodiment 2 is not limited to the vehicular lamp fitting 10 of Embodiment 1, but can be applied to various vehicular lamp fittings (e.g. vehicular lamp fitting according to Japanese Patent Application Laid-Open No. 2005-228502 described in BACKGROUND ART), of which the final exit surface is a hemispherical surface (hemispherical refractive surface). This aspect will be described next in Embodiment 3 and Embodiment 4.

Next, a direct projection type vehicular lamp fitting 20, to which the concept "condensing functions are separated", described in Embodiment 2, is applied, will be described as Embodiment 3. A composing element the same as the vehicular lamp fitting 10A of Embodiment 2 will be denoted with a same reference symbol, and description thereof will be omitted.

Figure 28:
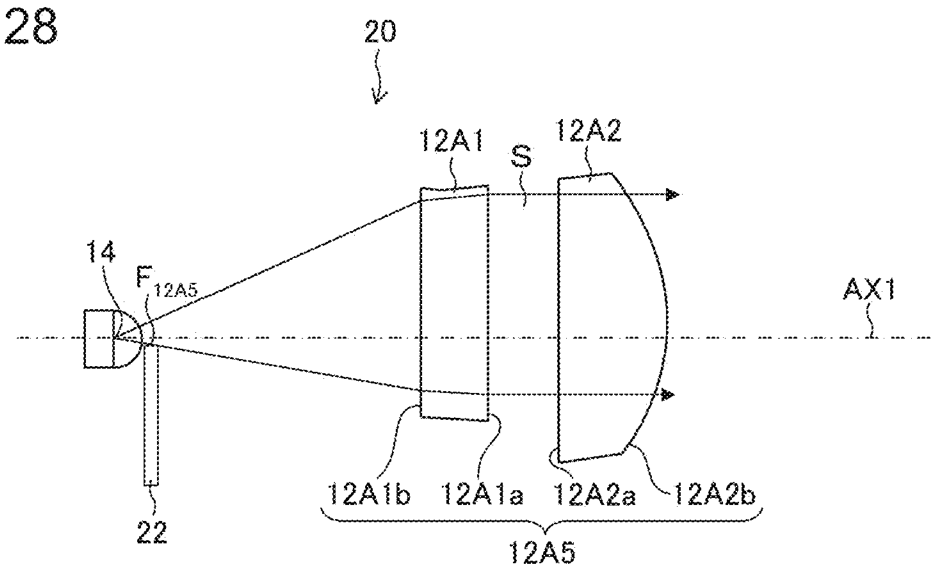
FIG. 28 is a schematic diagram depicting the direct projection type vehicular lamp fitting 20 to which the concept "condensing functions are separated" is applied.

FIG. 28 is a schematic diagram depicting the direct projection type vehicular lamp fitting 20 to which the concept "condensing functions are separated" is applied.

As illustrated in FIG. 28, the direct projection type vehicular lamp fitting 20, according to Embodiment 3, includes the light source 14, the shade, 22, the first lens unit 12A1, and the second lens unit 12A2, and is configured as a vehicular head light equipped with a lens body, such that light from the light source 14 enters the first lens unit 12A1 through a first entry surface 12A1*b* of the first lens unit 12A1 after being partially shielded by the shade 22, exits through a first exit surface 12A1*a* of the first lens unit 12A1, further enters the second lens unit 12A2 through the second entry surface 12A2*a* of the second lens unit 12A2, then exits through the second exit surface 12A2*b* of the second lens unit 12A2, and is irradiated forward, so as to form a low beam light distribution pattern P1*a* or the like (corresponding to the predetermined light distribution pattern of the present invention) which includes cut-off lines CL1 to CL3 defined on an upper edge by the shade 22 illustrated in FIG. 20A, on a virtual vertical screen.

In other words, the direct projection type vehicular lamp fitting 20 of Embodiment 3 corresponds to a standard direct projection type vehicular lamp fitting, in which a convex lens (convex lens of which final exit surface is a spherical surface) is replaced with the first lens unit 12A1 and the second lens unit 12A2. A focal point $F_{12A5}$ of a lens 12A5, constituted by the first lens unit 12A1 and the second lens unit 12A2, is set in the vicinity of the upper edge of the shade 22, which is disposed in front of the light source 14 in a state of covering a part of the light source 14 (light emitting surface). Unlike Embodiment 2, the first entry surface 12A1*b* is a plane-shaped (or curved plane-shaped) surface orthogonal to the reference axis AX1.

In the vehicular lamp fitting 20 having the above mentioned configuration, the light from the light source 14 enters the first lens unit 12A1 through the first entry surface 12A1*b* of the first lens unit 12A1 after being partially shielded by the shade 22, and exits through the first exit surface 12A1*a* of the first lens unit 12A1. At this time, the light from the light source 14, which exits through the first exit surface 12A1*a*, is condensed in the horizontal direction by the function of the first exit surface 12A1*a* (the light is not condensed or hardly condensed in the vertical direction). Then the light from the light source 14, which exited through the first exit surface 12A1*a* passes through the space S, further enters the second lens unit 12A2 through the second entry surface 12A2*a* of the second lens unit 12A2, exits through the second exit surface 12A2*b* of the second lens unit 12A2, and is irradiated forward. At this time, the light from the light source 14, which exits through the second exit surface 12A2*b*, is condensed in the vertical direction by the function of the second exit surface 12A2*b* (the light is not condensed or hardly condensed in the horizontal direction). Thereby, the low beam light distribution pattern P1*a* or the like (corresponding to the predetermined light distribution pattern of the present invention), which includes the cut-off lines CL1 to CL3 defined on the upper edge by the shade 22, as illustrated in FIG. 20A, is formed on a virtual vertical screen.

Figure 29:
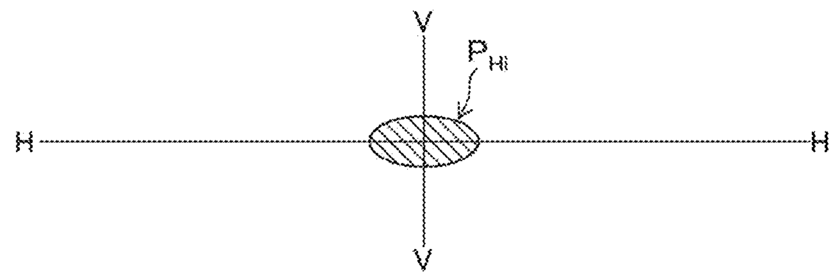
FIG. 29 is an example of the high beam light distribution pattern $P_{Hi}$ that is formed on a virtual vertical screen facing the front surface of the vehicle (disposed about 25 m in front of the front face of the vehicle).

A vehicular lamp fitting, which forms a high beam light distribution pattern $P_{Hi}$ illustrated in FIG. 29 on a virtual vertical screen, can be configured by omitting the shade 22 in the configuration illustrated in FIG. 28, and adjusting each surface 12A1*a*, 12A1*b*, 12A2*a* and 12A2*b*. In this case, the light from the light source 14 enters the first lens unit 12A1 through the first entry surface 12A1*b* of the first lens unit 12A1, and exits through the first exit surface 12A1*a* of the first lens unit 12A1. At this time, the light from the light source 14, which exits through the first exit surface 12A1*a*, is condensed in the horizontal direction by the function of the first exit surface 12A1*a* (the light is not condensed or hardly condensed in the vertical direction). Then the light from the light source 14, which exited through the first exit surface 12A1*a*, passes through the space S, further enters the second lens unit 12A2 through the second entry surface 12A2*a* of the second lens unit 12A2, exits through the second exit surface 12A2*b* of the second lens unit 12A2, and is irradiated forward. At this time, the light from the light source 14, which exits through the second exit surface 12A2*b*, is condensed in the vertical direction by the function of the second exit surface 12A2*b* (the light is not condensed or hardly condensed in the horizontal direction). Thereby, the high beam light distribution pattern $P_{Hi}$, illustrated in FIG. 29, is formed on a virtual vertical screen. FIG. 29 is an example of the high beam light distribution pattern $P_{Hi}$ that is formed on a virtual vertical screen facing the front surface of the vehicle (disposed about 25 m in front of the front face of the vehicle).

Next, a projector type vehicular lamp fitting 30, to which the concept "condensing functions are separated", described in Embodiment 2, is applied, will be described as Embodiment 4. A composing element the same as the vehicular lamp fitting 10A of Embodiment 2 will be denoted with the same reference symbol, and description thereof will be omitted.

Figure 30:
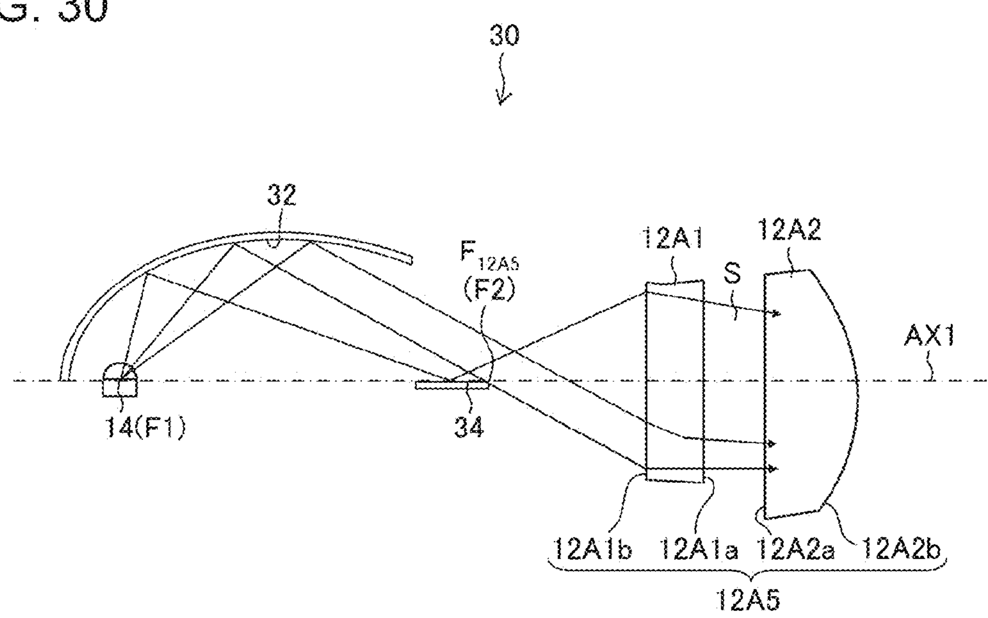
FIG. 30 is a schematic diagram depicting the projector type vehicular lamp fitting 30 to which the concept "condensing functions are separated" is applied.

FIG. 30 is a schematic diagram depicting the projector type vehicular lamp fitting 30 to which the concept "condensing functions are separated" is applied.

As illustrated in FIG. 30, the projector type vehicular lamp fitting 30 according to Embodiment 4 includes the light source 14, the reflector 32 (elliptical reflection surface), the shade 34, the first lens unit 12A1, and a second lens unit 12A2, and is configured as a vehicular head light equipped with a lens body, such that light from the light source 14 is reflected by the reflector 32, enters the first lens unit 12A1 through a first entry surface 12A1*b* of the first lens unit 12A1 after being partially shaded by the shade 34, exits through the first exit surface 12A1*a* of the first lens unit 12A1, further enters the second lens unit 12A2 through the second entry surface 12A2*a* of the second lens unit 12A2, then exits through the second exit surface 12A2*b* of the second lens unit 12A2, and is irradiated forward, so as to form a low beam light distribution pattern P1*a* or the like (corresponding to the predetermined light distribution pattern of the present invention), which includes cut-off lines CL1 to CL3 defined on an upper edge by the shade 34, on a virtual vertical screen.

In other words, the projector type vehicular lamp fitting 30 of Embodiment 4 corresponds to a standard projector type vehicular lamp fitting, in which a convex lens (convex lens of which final exit surface is a spherical surface) is replaced with the first lens unit 12A1 and the second lens unit 12A2. The shade 32 is configured as a mirror surface which extends backward in an approximately horizontal direction from the vicinity of a focal point $F_{12A5}$ of the lens 12A5 constituted by the first lens unit 12A1 and the second lens unit 12A2. The focal point $F_{12A5}$ of the lens 12A5 constituted by the first lens unit 12A1 and the second lens unit 12A2 is set in the vicinity of the front edge of the shade 34. A first focal point F1 of the reflector 32 (elliptical reflection surface) is set in the vicinity of the light source 14, and a second focal point F2 approximately matches with the focal point $F_{12A5}$ of the lens 12A5 constituted by the first lens unit 12A1 and the second lens unit 12A2. Unlike Embodiment 2, the first entry surface 12A1*b* is a plane surface (or curved plane surface) orthogonal to the reference axis AX1.

In the vehicular lamp fitting 30 having the above configuration, the light from the light source 14 is reflected by the reflector 32, enters the first lens unit 12A1 through the first entry surface 12A1*b* of the first lens unit 12A1 after being partially shielded by the shade 34, and exits through the first exit surface 12A1*a* of the first lens unit 12A1. At this time, the light from the light source 14, which exits through the first exit surface 12A1*a*, is condensed in the horizontal direction by the function of the first exit surface 12A1*a* (the light is not condensed or hardly condensed in the vertical direction). The light from the light source 14, which exits through the first exit surface 12A1*a*, passes through the space S, further enters the second lens unit 12A2 through the second entry surface 12A2*a* of the second lens unit 12A2, then exits through the second exit surface 12A2*b* of the second lens unit 12A2, and is irradiated forward. At this time, the light from the light source 14, which exits through the second exit surface 12A2*b*, is condensed in the vertical direction by the function of the second exit surface 12A2*b* (the light is not condensed or hardly condensed in the horizontal direction). Thereby, the low beam light distribution pattern P1*a* or the like (corresponding to the predetermined light distribution pattern of the present invention) illustrated in FIG. 20A, which includes cut-off lines CL1 to CL3 defined on an upper edge by the shade 34, is formed on a virtual vertical screen.

By omitting the shade 34 from the configuration illustrated in FIG. 30 and adjusting the reflector 32 (elliptical reflection surface) and the like, a vehicular head light, which formed a high beam light distribution pattern $P_{Hi}$ illustrated in FIG. 29 on a virtual vertical screen, can be configured. In this case, the light from the light source 14 is reflected by the reflector 32, enters the first lens unit 12A1 through the first entry surface 12A1*b* of the first lens unit 12A1, and exits through the first exit surface 12A1*a* of the first lens unit 12A1. At this time, the light from the light source 14, which exits through the first exit surface 12A1*a*, is condensed in the horizontal direction by the function of the first exit surface 12A1*a* (the light is not condensed or hardly condensed in the vertical direction). The light from the light source 14, which exited through the first exit surface 12A1*a*, passes through the space S, further enters the second lens unit 12A2 through the second entry surface 12A2*a* of the second lens unit 12A2, then exits through the second exit surface 12A2*b* of the second lens unit 12A2, and is irradiated forward. At this time, the light from the light source 14, which exited through the second exit surface 12A2*b*, is condensed in the vertical direction by the function of the second exit surface 12A2*b* (the light is not condensed or hardly condensed in the horizontal direction). Thereby, the high beam light distribution pattern $P_{Hi}$ illustrated in FIG. 29 is formed on a virtual vertical screen.

Next a vehicular lamp fitting 10D, in which a camber angle is added, will be described as Embodiment 5 with reference to the drawings.

Figure 31A:
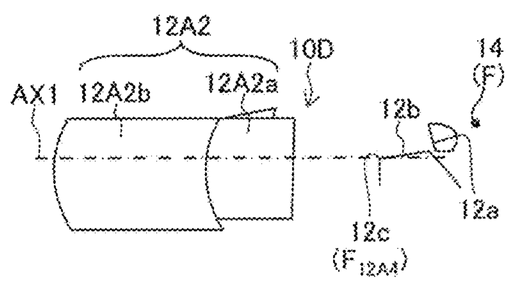
FIG. 31A is a side view (of major optical surfaces only) of the vehicular lamp fitting 10D in which a camber angle is added.
Figure 31D:
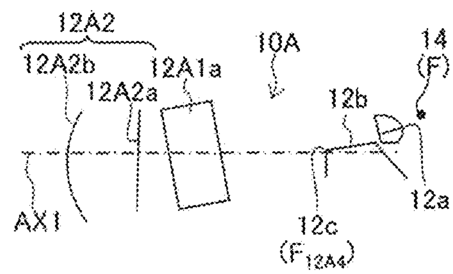
FIG. 31D to FIG. 31F depicting comparative examples, where
Figure 31B:
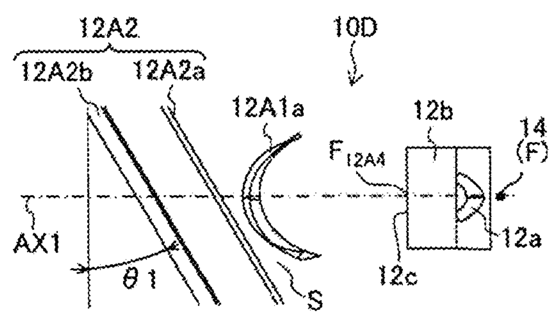
FIG. 31B is a top view (of major optical surfaces only) thereof.
Figure 31E:
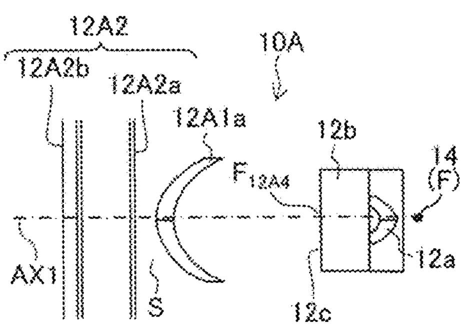
Figure 31C:
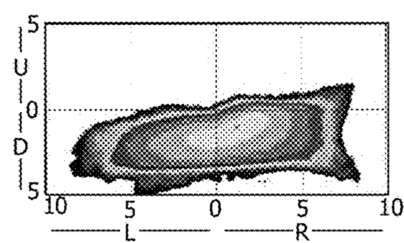
FIG. 31C is an example of a low beam light distribution pattern formed by the vehicular lamp fitting 10D.
Figure 31F:
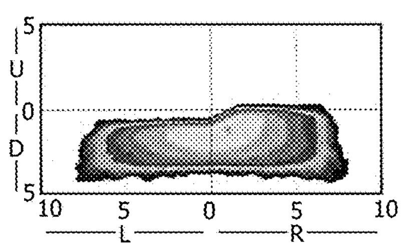
Figure 32:
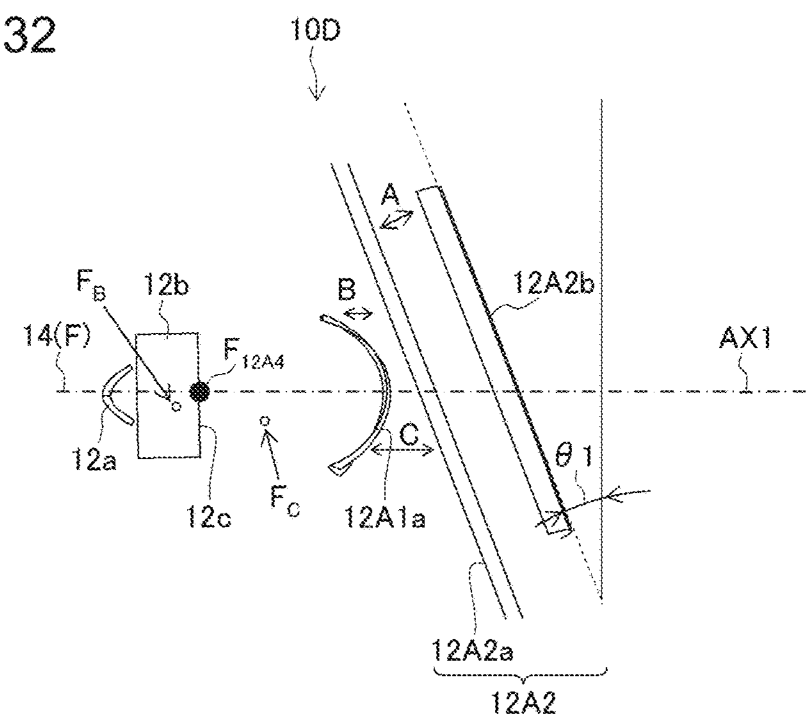
FIG. 32 is a top view (of major optical surfaces only) depicting a problem of the case of adding a camber angle.

FIG. 31A is a side view (of major optical surfaces only) of the vehicular lamp fitting 10D in which a camber angle is added, FIG. 31B is a top view (of major optical surfaces only) thereof, and FIG. 31C is an example of a low beam light distribution pattern formed by the vehicular lamp fitting 10D. FIG. 31D to FIG. 31F depicting comparative examples, where FIG. 31D is a side view (of major optical surfaces only) of the vehicular lamp fitting 10A of Embodiment 2 to which the camber angle is not added, FIG. 31E is a top view (of major optical surfaces only) thereof, and FIG. 31F is an example of a low beam light distribution pattern formed by the vehicular lamp fitting 10A of Embodiment 2. FIG. 32 is a top view (of major optical surfaces only) depicting a problem of the case of adding a camber angle.

As illustrated in FIG. 31B, the vehicular lamp fitting 10D of Embodiment 5 corresponds to the vehicular lamp fitting 10A of Embodiment 2, in which the second lens unit 12A2 is inclined with respect to the first reference axis AX1 when viewed from the top, in other words, the vehicular lamp fitting 10D of Embodiment 5 corresponds to the vehicular lamp fitting 10A of Embodiment 2, in which the second exit surface 12A2*b* is configured as a semicircular cylindrical surface extending in a direction which is inclined with respect to the first reference axis AX1 by a predetermined angle (that is, a camber angle θ1 (e.g. θ1=30°) is added) when viewed from the top.

Figure 33:
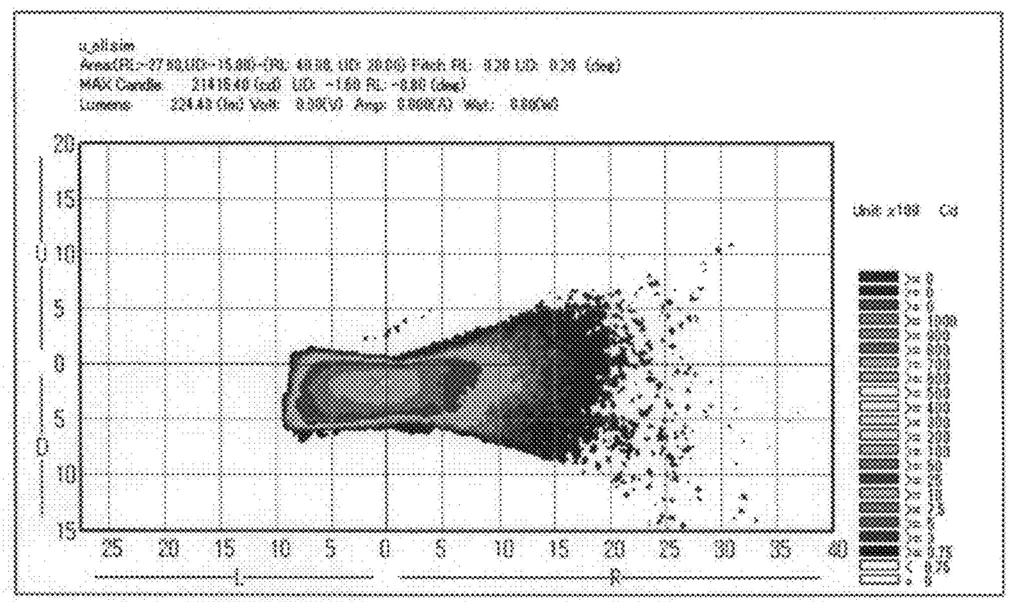
FIG. 33 is a drawing depicting a problem that appears in the low beam light distribution pattern when a camber angle is added.

According to the simulation performed by the inventors of the present invention, if only the camber angle θ1 is added, the distance between the first exit surface 12A1*a* and the second entry surface 12A2*a* is different between each side of the first reference axis AX1 as illustrated in FIG. 32 (see arrow B and arrow C in FIG. 32), and a focal position $F_B$ of the light which exits through a position B of the first exit surface 12A1*a* and a focal position $F_C$ of the light which exits through a position C of the first exit surface 12A1*a* deviate considerably from each other, and as a result, as illustrated in FIG. 33, the light is not condensed on the side where the distance between the first exit surface 12A1*a* and the second entry surface 12A2*a* is wider (right side in FIG. 33), in the low beam light distribution pattern formed on the virtual vertical screen, and the light distribution pattern blurs.

The cause of generating this blur will be described with reference to the drawings.

Figure 34A:
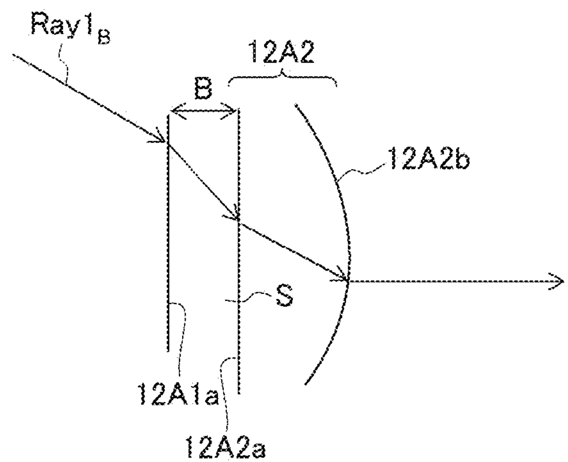
FIG. 34A is a cross-sectional view (of major optical surfaces only) at the position B in FIG. 32.
Figure 34B:
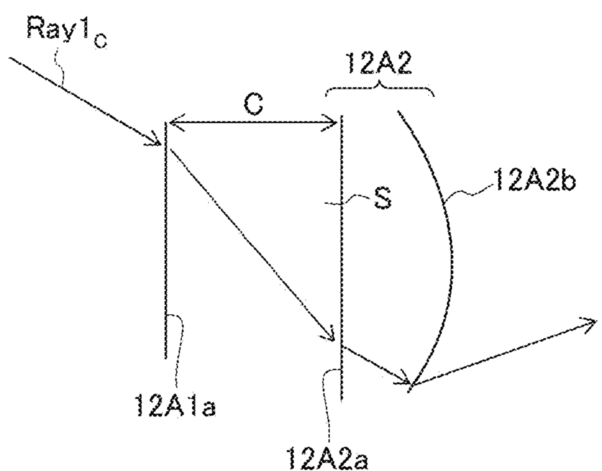
FIG. 34B is a cross-sectional view (of major optical surfaces only) at the position C in FIG. 32

FIG. 34A is a cross-sectional view (of major optical surfaces only) at the position B in FIG. 32, and a line with an arrow at the end in FIG. 34A indicates an optical path of the light Ray1B, which enters the first exit surface 12A1*a* (position B) at a predetermined entry angle. FIG. 34B is a cross-sectional view (of major optical surfaces only) at the position C in FIG. 32, and a line with an arrow at the end in FIG. 34B indicates an optical path of the light Ray1C, which enters the first exit surface 12A1*a* (position C) at a same entry angle as FIG. 34A. To simplify description, the first exit surface 12A1*a* and the second entry surface 12A2*a* are illustrated without setting the extracting angles in FIG. 34A and FIG. 34B, but FIG. 34A and FIG. 34B are applicable to a case of setting the extracting angles.

As illustrated in FIG. 34B, the distance between the first exit surface 12A1*a* and the second entry surface 12A2*a* is wider at the position C, compared with the position B (see FIG. 34A). Therefore the entry position of the light Ray1C to the second entry surface 12A2*a* becomes lower than the entry position of the light Ray1B to the second entry surface 12A2*a* illustrated in FIG. 34A, and the light Ray1C that enters through this lower entry position travels upward, with respect to the horizontal direction, as illustrated in FIG. 34B. As a result, the above mentioned blur is generated.

As a result of keen examination to suppress this blur, the present inventors discovered that this blur is suppressed and the low beam light distribution pattern is generally condensed by adjusting the surface shape of the first exit surface 12A1*a* (see FIG. 31C).

Figure 35A:
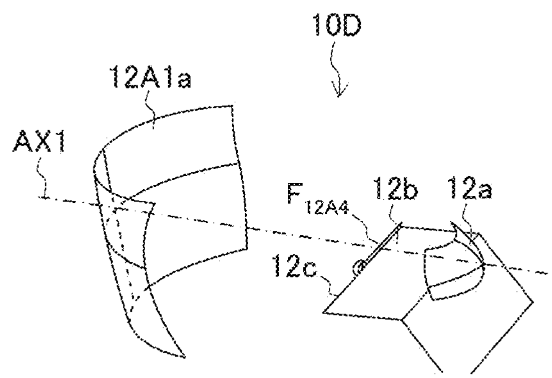
FIG. 35A is a perspective view (of major optical surfaces only) of the vehicular lamp fitting 10D of Embodiment 5.
Figure 35B:
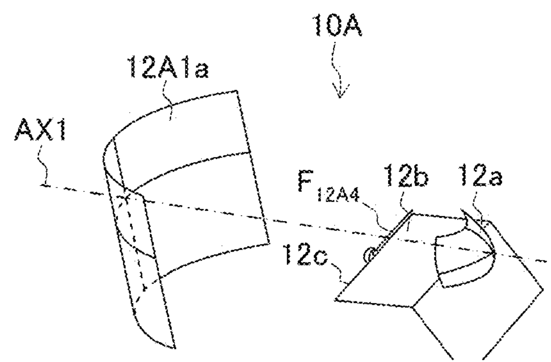
FIG. 35B is a comparative example, that is, a perspective view (of major optical surfaces only) of the vehicular lamp fitting 10A of Embodiment 2.

Based on this knowledge, the first exit surface 12A1*a* of Embodiment 5 is a semicircular cylindrical surface extending in the vertical direction, and the surface shape thereof is adjusted such that the low beam light distribution pattern is generally condensed (see FIG. 31C). This adjustment is for matching the shifted-focal position FB, FC and the like with a position in the vicinity of the shade 12*c*, and is performed using a predetermined simulation software. FIG. 35A is a perspective view (of major optical surfaces only) of the vehicular lamp fitting 10D of Embodiment 5, FIG. 35B is a comparative example, that is, a perspective view (of major optical surfaces only) of the vehicular lamp fitting 10A of Embodiment 2. As illustrated in FIG. 35A, the first exit surface 12A1*a* of Embodiment 5, adjusted as mentioned above, becomes non-symmetric-shaped with respect to the reference axis AX1.

The vehicular lamp fitting 10D of Embodiment 5 is the same as the vehicular lamp fitting 10A of Embodiment 2, except for the above mentioned aspects.

According to Embodiment 5, the following effects can be implemented in addition to the effects of Embodiment 2.

Firstly, a lens body (combined lens body) having a new appearance in which a camber angle is added, and a vehicular lamp fitting equipped with this lend body (combined lens body), can be provided. In other words, a lens body (combined lens body) having an integral appearance linearly extending in a direction inclined with respect to the first reference axis AX1 by a predetermined angle when viewed from the top, and a vehicular lamp fitting equipped with this lens body (combined lens body), can be provided. Secondly, a lens body (combined lens body), which can form a low beam light distribution pattern condensed in the horizontal direction and the vertical direction, even though the second exit surface 12A2*b*, which is the final exit surface, is a semicircular cylindrical surface (semicircular cylindrical refractive surface), and a vehicular lamp fitting equipped with this lens body (combined lens body), can be provided. Thirdly, a lens body (combined lens body) that can generally condense the low beam light distribution pattern, even though a camber angle is added, and a vehicular lamp fitting equipped with this lens body (combined lens body) can be provided.

The integral appearance linearly extending in a direction inclined with respect to the first reference axis AX1 by a predetermined angle can be implemented, because the second exit surface 12A2*b*, which is the final exit surface, is configured as a semicircular cylindrical surface (semicircular cylindrical refractive surface), and this second exit surface 12A2*b* extends in a direction inclined with respect to the first reference axis AX1 when viewed from the top.

The low beam light distribution pattern condensed in the horizontal direction and the vertical direction can be formed even though the second exit surface 12A2*b*, which is the final exit surface, is a semicircular cylindrical surface (semicircular cylindrical refractive surface), because condensing light in the horizontal direction is mainly performed by the first exit surface 12A1*a* (semicircular cylindrical refractive surface) of the first lens unit 12A1, and condensing light in the vertical direction is mainly performed by the second exit surface 12A2*b* (semicircular cylindrical refractive surface) of the second lens unit 12A2, which is the final exit surface of the lens body 12A. In other words, the condensing functions are separated.

The low beam light distribution pattern is generally condensed even though the camber angle is added, because the first exit surface 12A1*a* is a semicircular cylindrical surface extending in the vertical direction, and the surface shape is adjusted such that the low beam light distribution pattern is generally condensed.

The concept"the camber angle is added" described in Embodiment 5 and the concept of suppressing the blur, which is generated by adding the camber angle, as described above, are not limited to the vehicular lamp fitting 10A (lens body 12A) of Embodiment 2, but can be applied to each modification thereof, the vehicular lamp fittings (lens bodies) of Embodiments 3 and 4 and the like. These concepts can also be applied to the vehicular lamp fitting 10J (lens body 12J) of Embodiment 10, which will be described later.

Next, a vehicular lamp fitting 10E, in which a slant angle is added, will be described as Embodiment 6 with reference to the drawings.

Figure 36:
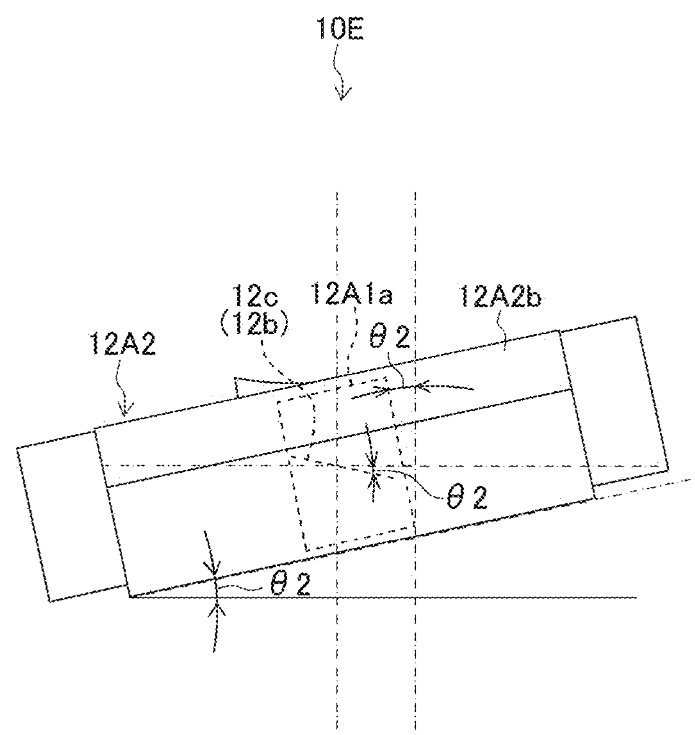
FIG. 36 is a front view of the vehicular lamp fitting 10E in which a slant angle is added.

FIG. 36 is a front view of the vehicular lamp fitting 10E in which a slant angle is added.

As illustrated in FIG. 36, the vehicular lamp fitting 10E of Embodiment 6 corresponds to the vehicular lamp fitting 10A of Embodiment 2, in which the second lens unit 12A2 is inclined with respect to the horizontal direction when viewed from the front, in other words, corresponds to the vehicular lamp fitting 10A of Embodiment 2, in which the second exit surface 12A2*b* is configured as a semicircular cylindrical surface extending in a direction which is inclined with respect to the horizontal direction by a predetermined angle θ2 when viewed from the front (that is, a slant angle θ2 (e.g. θ2=12°) is added). In concrete terms, the second lens unit 12A2 (second exit surface 12A2*b*) of Embodiment 6 corresponds to the second lens unit 12A2 (second exit surface 12A2*b*) of Embodiment 2, which is rotated around the first reference axis AX1 by a predetermined angle θ2.

Figure 37A:
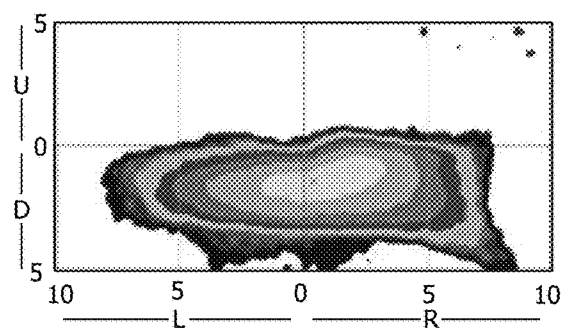
FIG. 37A is a drawing depicting a problem that appears in the low beam light distribution pattern when a slant angle is added.
Figure 37B:
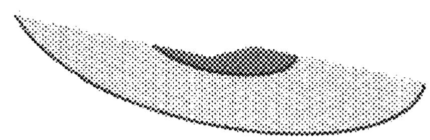
FIG. 37B is a schematic diagram of FIG. 37A.

According to the simulation performed by the inventors of the present invention, if only the slant angle θ2 is added, the focal line of the second lens unit 12A2 inclines with respect to the shade 12*c*, and as a result, the low beam light distribution pattern formed on the virtual vertical screen is rotated (or blurred state), as illustrated in FIG. 37A and FIG. 37B. FIG. 37A is a drawing depicting a problem that appears in the low beam light distribution pattern when a slant angle is added, and FIG. 37B is a schematic diagram of FIG. 37A.

Figure 38A:
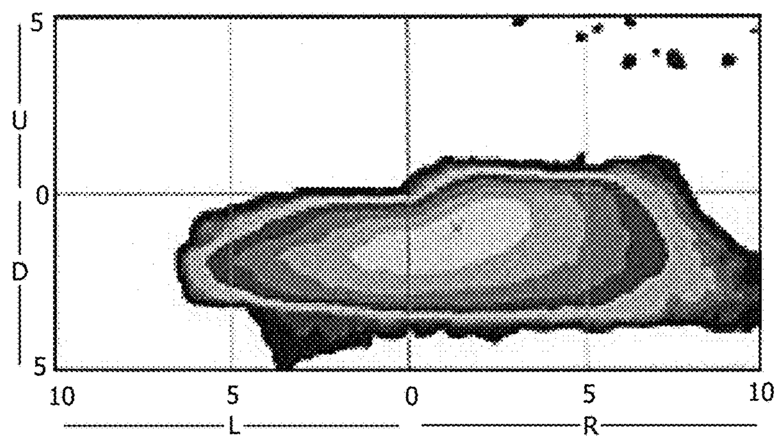
FIG. 38A is a drawing depicting a state when the problem (rotation) which appears in the low beam light distribution pattern was suppressed.
Figure 38B:
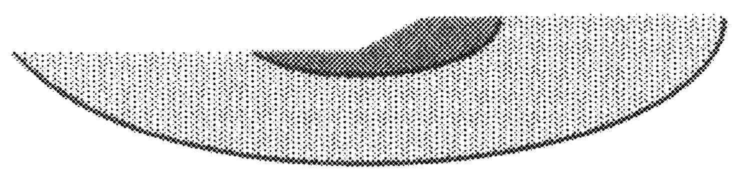
FIG. 38B is a schematic diagram of FIG. 38A.

As a result of keen examination to suppress this rotation (or blurred state), the present inventors discovered that the above mentioned rotation is suppressed (see FIG. 38A and FIG. 38B) by configuring the first exit surface 12A1*a* as a semicircular cylindrical surface extending in a direction which is inclined with respect to the vertical direction by a predetermined angle θ2 when viewed from the front, and disposing the reflection surface 12*b* and the shade 12*c* in an attitude inclined with respect to the horizontal direction by the predetermined angle θ2 in the opposite direction of the second exit surface 12A2*b* and the first exit surface 12A1*a*, as illustrated in FIG. 36. FIG. 38A is a drawing depicting a state when the problem (rotation) which appears in the low beam light distribution pattern was suppressed, and FIG. 38B is a schematic diagram of FIG. 38A.

The reason why the rotation (or blurred state) is suppressed will be described with reference to the drawings.

Figure 52A:
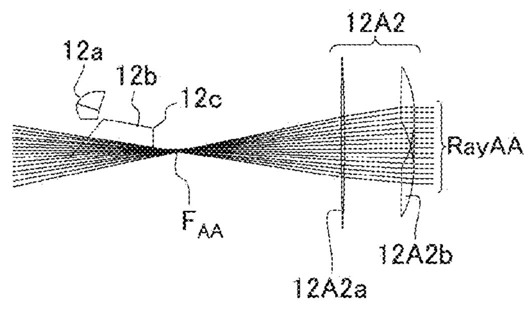
FIG. 52A is first side view of a sixth embodiment of a vehicular lamp 10E (lens body 12A) (primary optical surface is omitted first output surface 12A1*a* only)
Figure 52C:
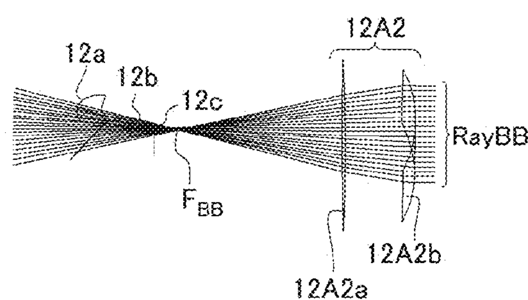
FIG. 52C is side view (main optical surfaces only omitting the first output surface 12A1*a*)
Figure 52B:
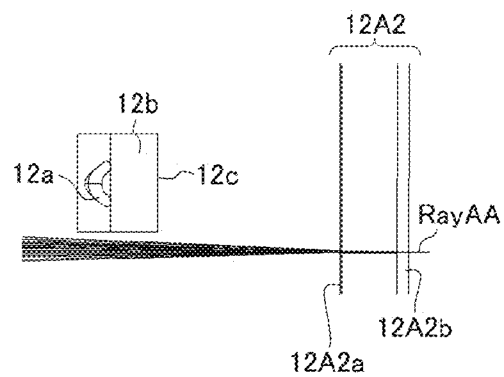
FIG. 52B is top view (first output surface 12A1*a* major omit optical surface only)

FIG. 52A is a side view of the vehicular lamp fitting 10E (lens body 12A) of Embodiment 6 (of only major optical surfaces with omitting the first exit surface 12A1*a*) and FIG. 52B is a top view thereof (of only major optical surfaces with omitting the first exit surface 12A1*a*), and both indicate the optical path of parallel light RayAA, which entered the lens body 12A through the second exit surface 12A2*b* (that is, the result of reverse ray tracing).

Figure 52D:
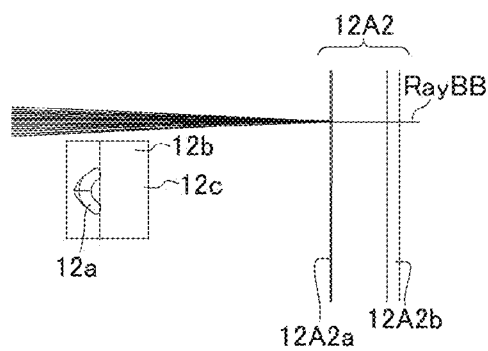
FIG. 52D is a top view (main optical surfaces only omitting the first output surface 12A1*a*).

FIG. 52C is a side view of the vehicular lamp fitting 10E (lens body 12A) of Embodiment 6 (of only major optical surfaces with omitting the first exit surface 12A1*a*), and FIG. 52D is a top view thereof (of only major optical surfaces with omitting the first exit surface 12A1*a*), and both indicate the optical path of parallel light RayBB, which entered the lens body 12A through the second exit surface 12A2*b* (that is, the result of reverse ray tracing).

In FIG. 52A to FIG. 52D, the slant angle θ2 (=10°) is added to the second lens unit 12A2, and the focal line of the second lens unit 12A2 is inclined with respect to the horizontal line by the slant angle θ2. As a result, the focal point FBB in FIG. 52C is positioned higher than the focal point FAA in FIG. 52A.

Figure 53A:
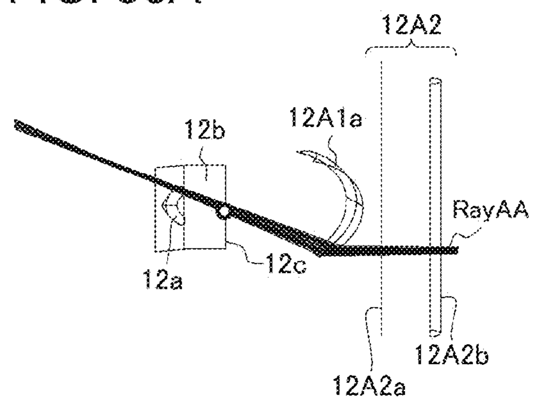
FIG. 53A is top view obtained by adding a first output surface 12A1*a* in FIG. 52B.
Figure 53B:
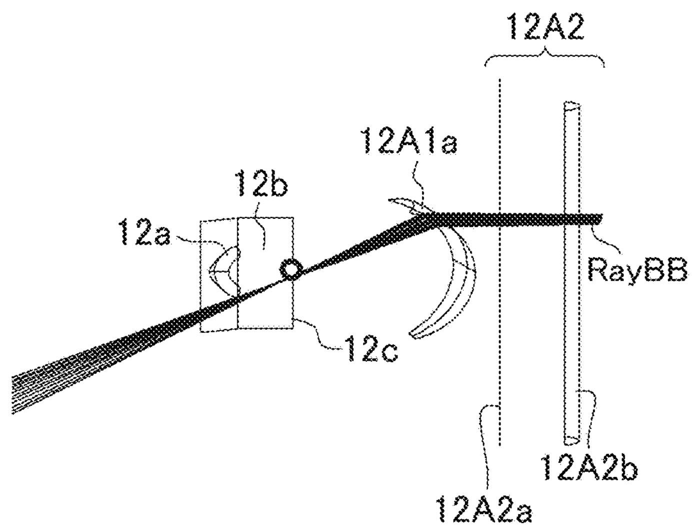
FIG. 53B is top view obtained by adding a first output surface 12A1*a* in FIG. 52D.

The optical paths of the parallel light RayAA and RayBB in the case of disposing the first exit surface 12A1*a*, on the other hand, are illustrated in FIG. 53A and FIG. 53B.

FIG. 53A is a top view when the first exit surface 12A1*a* is added to FIG. 52B, and indicates the optical path of the parallel light RayAA which entered the lens body 12A through the second exit surface 12A2*b* (that is, the result of reverse ray tracing). FIG. 53B is a top view when the first exit surface 12A1*a* is added to FIG. 52D, and indicates the optical path of the parallel light RayBB which entered the lens body 12A through the second exit surface 12A2*b* (that is, the result of reverse ray tracing).

In the case of adding the slant angle θ2 (=10°) to the first exit surface 12A1*a* (that is, the case when the first exit surface 12A1*a* is configured as a semicircular cylindrical surface extending in a direction inclined with respect to the vertical direction by the predetermined angle θ2), the components having a low focal point $F_{AA}$ (that is, RayAA) are refracted because of the function of the first exit surface 12A1*a*, travel in the reverse direction, and are focused, as illustrated in FIG. 53A. The components having a high focal point $F_{BB}$ (that is, RayBB), on the other hand, are refracted because of the function of the first exit surface 12A1*a*, travel in the reverse direction, and are focused, as illustrated in FIG. 53B. As a result, the focal line is inclined in the opposite direction of the slant direction.

In order to match (approximately match) the shade 12*c* with the focal line inclined in the opposite direction of the slant direction, the reflection surface 12*b* and the shade 12*c* are disposed in an attitude inclined with respect to the horizontal line by the predetermined angle θ2 in the opposite direction of the second exit surface 12A2*b* and the first exit surface 12A1*a* when viewed from the front. Thereby, the shade 12*c* matches (approximately matches) with the focal line, which is inclined in the opposite direction of the slant direction, and the above mentioned rotation (or blurred state) can be suppressed.

Based on this knowledge, the first exit surface 12A1*a* of Embodiment 6 is configured as a semicircular cylindrical surface extending in a direction inclined with respect to the vertical direction by the predetermined angle θ2 when viewed from the front. In concrete terms, the first exit surface 12A1*a* of Embodiment 6 corresponds to the first exit surface 12A1*a* of Embodiment 2 that is rotated around the first reference axis AX1 by the predetermined angle θ2 in the same direction as the second exit surface 12A2*b*.

The reflection surface 12*b* and the shade 12*c* are disposed in an attitude inclined with respect to the horizontal direction by the predetermined angle θ2 in the opposite direction of the second exit surface 12A2*b* and the first exit surface 12A1*a* when viewed from the front. In concrete terms, the reflection surface 12*b* and the shade 12*c* of Embodiment 6 correspond to the reflection surface 12*b* and the shade 12*c* of Embodiment 2 that are rotated around the first reference axis AX1 by the predetermined angle θ2 in the opposite direction of the second exit surface 12A2*b* and the first exit surface 12A1*a*.

The vehicular lamp fitting 10E of Embodiment 6 is the same as the vehicular lamp fitting 10A of Embodiment 2, except for the above mentioned aspects.

According to Embodiment 6, the following effects can be implemented in addition to the effects of Embodiment 2.

Firstly, a lens body (combined lens body) having a new appearance in which a slant angle is added, and a vehicular lamp fitting equipped with this lens body (combined lens body), can be provided. In other words, a lens body (combined lens body) having an integral appearance linearly extending in a direction inclined with respect to the horizontal direction by a predetermined angle when viewed from the front, and a vehicular lamp fitting equipped with this lens body (combined lens body), can be provided. Secondly, a lens body (combined lens body) which can form a low beam light distribution pattern condensed in the horizontal direction and the vertical direction, even though the second exit surface 12A2*b*, which is the final exit surface, is a semicircular cylindrical surface (semicircular cylindrical refractive surface), and a vehicular lamp fitting equipped with this lens body (combined lens body), can be provided. Thirdly, a lens body (combined body) that can suppress rotation of the low beam light distribution pattern, even though a slant angle is added, and a vehicular lamp fitting equipped with this lens body (combined lens body), can be provided.

The integral appearance linearly extending in a direction inclined with respect to the horizontal direction by a predetermined angle can be implemented, because the second exit surface 12A2*b*, which is the final exit surface, is configured as a semicircular cylindrical surface (semicircular cylindrical refractive surface), and this second exit surface 12A2*b* extends in a direction inclined with respect to the horizontal direction when viewed from the front.

The low beam light distribution pattern condensed in the horizontal direction and the vertical direction can be formed even though the second exit surface 12A2*b*, which is the final exit surface, is a semicircular cylindrical surface (semicircular cylindrical refractive surface), because condensing light in the horizontal direction is mainly performed by the first exit surface 12A1*a* (semicircular cylindrical refractive surface) of the first lens unit 12A1, and condensing light in the vertical direction is mainly performed by the second exit surface 12A2*b* (semicircular cylindrical refractive surface) of the second lens unit 12A2, which is the final exit surface of the lens body 12A. In other words, the condensing functions are separated.

Rotation of the low beam light distribution pattern is suppressed even though the slant angle is added, because the first exit surface 12A1*a* is a semicircular cylindrical surface extending in a direction inclined with respect to the vertical direction by a predetermined angle, when viewed from the front, and the shade 12*c* (and the reflection surface 12*b*) is disposed in an attitude inclined with respect to the horizontal direction by a predetermined angle in the opposite direction of the second exit surface 12A2*b* and the first exit surface 12A1*a*.

The concept of "the slant angle is added" described in Embodiment 6, and the concept of suppressing the rotation, which is generated by adding the slant angle, as described above, are not limited to the vehicular lamp fitting 10A (lens body 12A) of Embodiment 2, but can be applied to each modification thereof, the vehicular lamp fittings (lens bodies) of Embodiments 3 and 4 and the like. These concepts can also be applied to the vehicular lamp fitting 10J (lens body 12J) of Embodiment 10, which will be described later.

Next a vehicular lamp fitting 10F, in which a camber angle and a slant angle are added, will be described as Embodiment 7 with reference to the drawings.

Figure 39A:
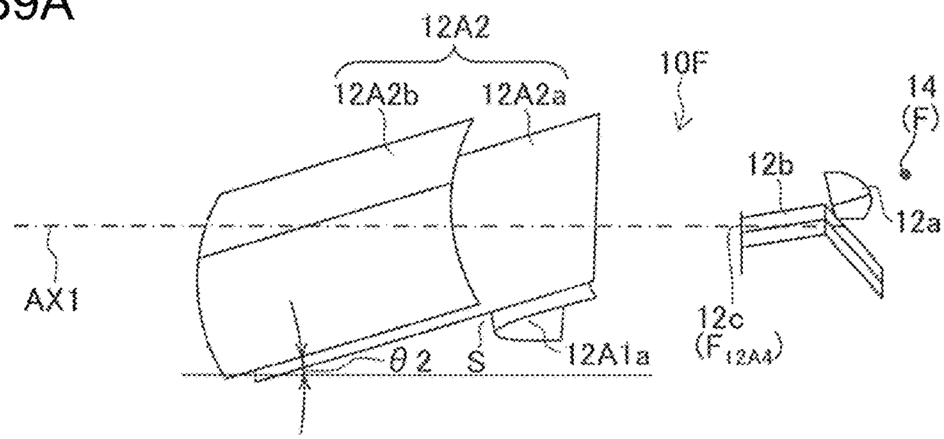
FIG. 39A is a side view (of major optical surfaces only) of the vehicular lamp fitting 10F in which a camber angle and a slant angle are added.
Figure 39B:
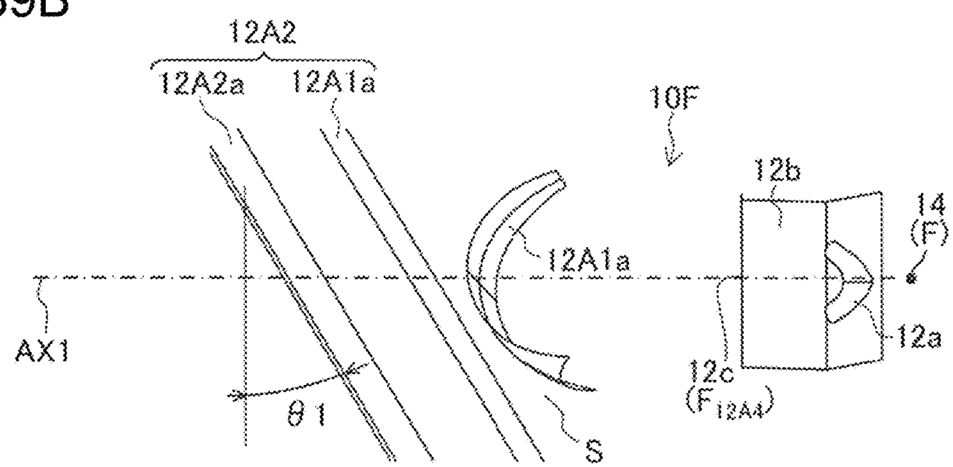
FIG. 39B is a top view (of major optical surfaces only) thereof.
Figure 39C:
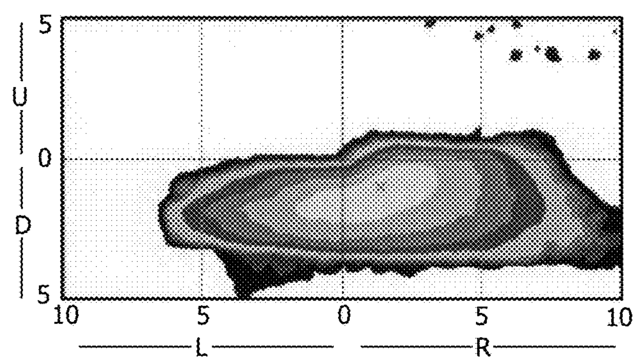
FIG. 39C is an example of a low beam light distribution pattern formed by the vehicular lamp fitting 10F.

FIG. 39A is a side view (of major optical surfaces only) of the vehicular lamp fitting 10F in which a camber angle and a slant angle are added, FIG. 39B is a top view (of major optical surfaces only) thereof, and FIG. 39C is an example of a low beam light distribution pattern formed by the vehicular lamp fitting 10F.

As illustrated in FIG. 39A and FIG. 39B, the vehicular lamp fitting 10F of Embodiment 7 corresponds to the vehicular lamp fitting 10A of Embodiment 2, in which the second lens unit 12A2 is inclined with respect to the first reference axis AX1 (that is, the camber angle θ1 is added) when viewed from the top, and is inclined with respect to the horizontal direction (that is, a slant angle θ2 is added) when viewed from the front, in other words, it corresponds to the combination of Embodiment 5 and Embodiment 6 described above.

In other words, the second exit surface 12A2*b* of Embodiment 7 extends in a direction inclined with respect to the first reference axis AX1 by a predetermined angle when viewed from the top, similarly to Embodiment 5, and is configured as a semicircular cylindrical surface extending in a direction inclined with respect to the horizontal direction by the predetermined angle θ2 when viewed from the front, similarly to Embodiment 6.

Further, the first exit surface 12A1*a* of Embodiment 7 is a semicircular cylindrical surface extending in a direction inclined with respect to the vertical direction by the predetermined angle θ2 when viewed from the front (see FIG. 36), and the surface shape thereof is adjusted so that the low beam light distribution pattern is generally condensed.

Furthermore, the reflection surface 12*b* and the shade 12*c* of Embodiment 7 are disposed in an attitude inclined with respect to the horizontal direction by the predetermined angle θ2 in the opposite direction of the second exit surface 12A2*b* and the first exit surface 12A1*a* when viewed from the front, similarly to Embodiment 6.

According to Embodiment 7, a lens body (combined lens body) having a new appearance in which a camber angle and a slant angle are added, and a vehicular lamp fitting equipped with the lens body (combined lens body), can be provided, and effects the same as Embodiment 5 and Embodiment 6 can be implemented.

The concept "camber angle and the slant angle are added" described in Embodiment 7, and the concept of improving rotation and suppressing blur, which are generated by adding the camber angle and the slant angle, as described above, are not limited to the vehicular lamp fitting 10A (lamp body 12A) of Embodiment 2, but can be applied to each modification thereof, the vehicular lamp fittings (lens bodies) of Embodiments 3 and 4 and the like. These concepts can also be applied to the vehicular lamp fitting 10J (lens body 12J) of Embodiment 10, which will be described later.

Now a vehicular lamp fitting 10G, according to a first comparative example, will be described with reference to the drawings.

Figure 40A:
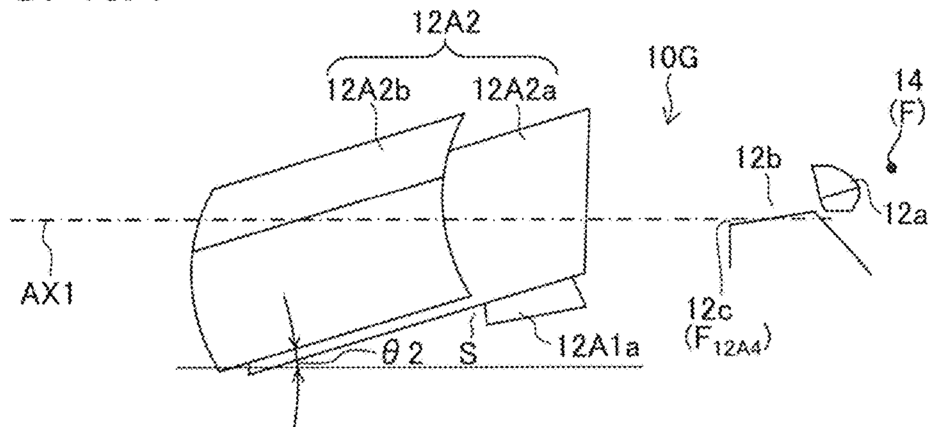
FIG. 40A is a side view (of major optical surfaces only) of the vehicular lamp fitting 10G according to the first comparative example.
Figure 40B:
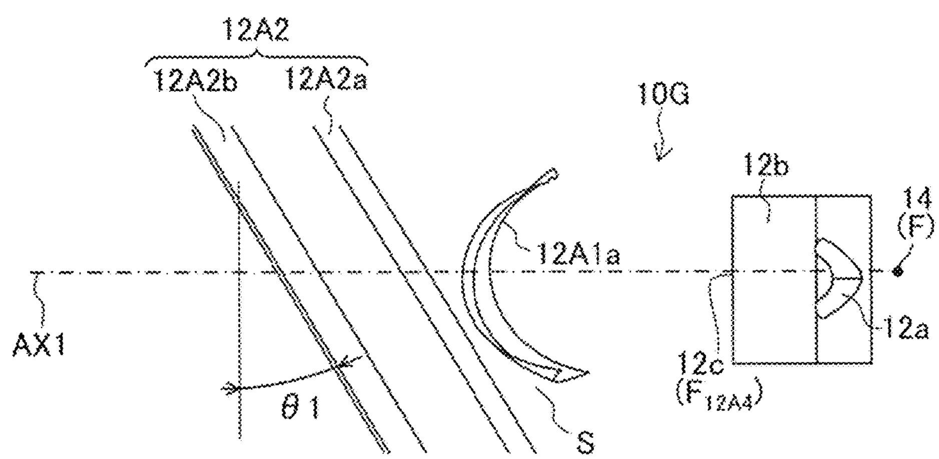
FIG. 40B is a top view (of major optical surfaces only) thereof.
Figure 40C:
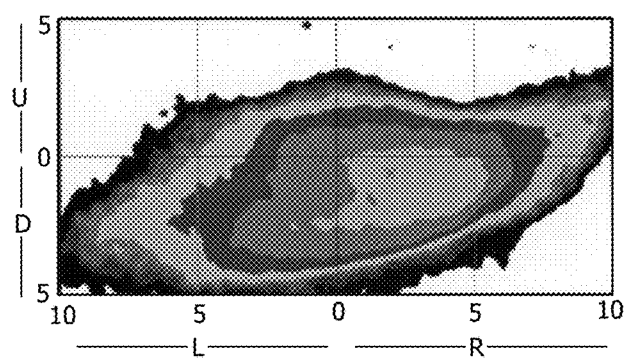
FIG. 40C is an example of a light distribution pattern formed by the vehicular lamp fitting 10G.

FIG. 40A is a side view (of major optical surfaces only) of the vehicular lamp fitting 10G according to the first comparative example, FIG. 40B is a top view (of major optical surfaces only) thereof, and FIG. 40C is an example of a light distribution pattern formed by the vehicular lamp fitting 10G.

As illustrated in FIG. 40A and FIG. 40B, the vehicular lamp fitting 10G according to the first comparative example corresponds to the vehicular lamp fitting 10D of Embodiment 5, in which the second lens unit 12A2 is inclined with respect to the horizontal direction (that is, a slant angle θ2 is added) when viewed from the front.

In other words, the first exit surface 12A1*a* of the first comparative example is configured as a semicircular cylindrical surface extending in the vertical direction when viewed from the front, similarly to Embodiment 5. This means that, unlike Embodiment 6, the first exit surface 12A1*a* of the first comparative example is not configured as a semicircular cylindrical surface extending in a direction inclined with respect to the vertical direction by the predetermined angle θ2 when viewed from the front.

Further, the reflection surface 12*b* and the shade 12*c* of the first comparative example are disposed in a horizontal attitude when viewed from the front, similarly to Embodiment 5. In other words, unlike Embodiment 6, the first exit surface 12A1*a* of the first comparative example is not disposed in an attitude inclined with respect to the horizontal direction by the predetermined angle θ2 in the opposite direction of the second exit surface 12A2*b* and the first exit surface 12A1*a*.

As illustrated in FIG. 40C, the light distribution pattern formed by the vehicular lamp fitting 10G of the first comparative example extends considerably above the horizontal line, which is not suitable for the low beam light distribution pattern.

Now a vehicular lamp fitting 10H according to a second comparative example will be described with reference to the drawings.

Figure 41A:
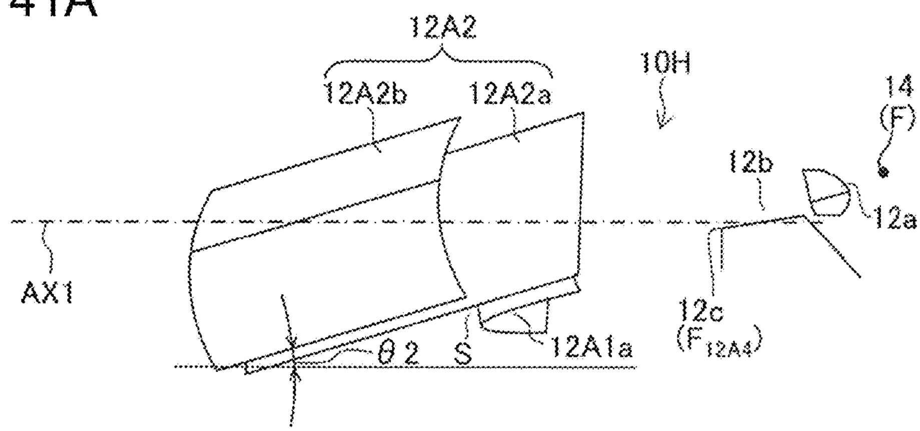
FIG. 41A is a side view (of major optical surfaces only) of the vehicular lamp fitting 10H of a second comparative example.
Figure 41B:
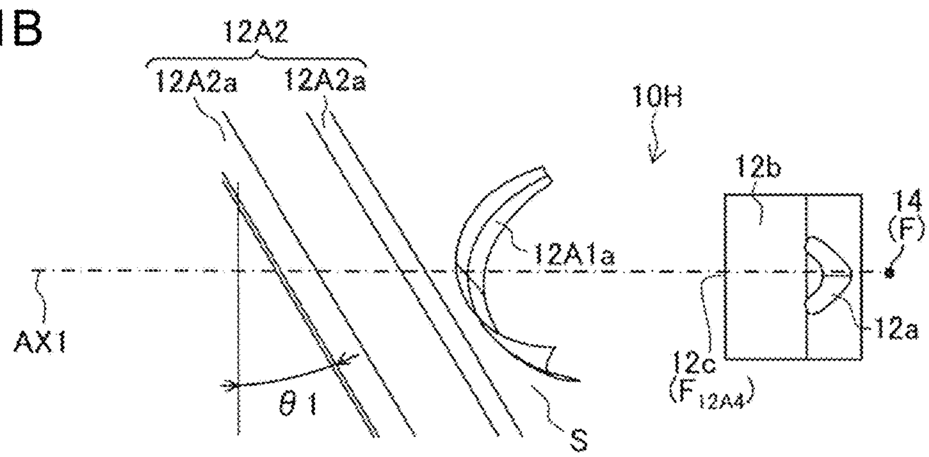
FIG. 41B is a top view (of major optical surfaces only) thereof.
Figure 41C:
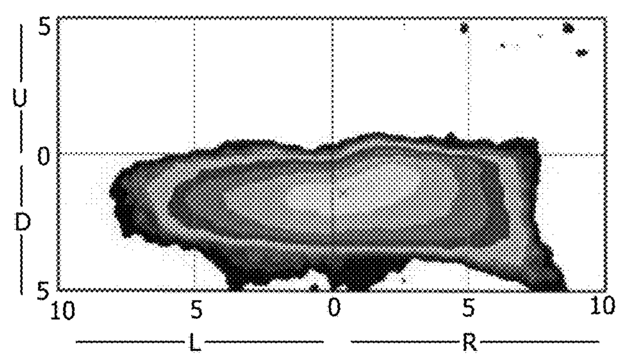
FIG. 41C is an example of a light distribution pattern formed by the vehicular lamp fitting 10H.

FIG. 41A is a side view (of major optical surfaces only) of the vehicular lamp fitting 10H of a second comparative example, FIG. 41B is a top view (of major optical surfaces only) thereof, and FIG. 41C is an example of a light distribution pattern formed by the vehicular lamp fitting 10H.

As illustrated in FIG. 41A and FIG. 41B, the vehicular lamp fitting 10H of the second comparative example corresponds to the vehicular lamp fitting 10G of the first comparative example, in which the first exit surface 12A1*a* is configured as a semicircular cylindrical surface extending in a direction inclined with respect to the vertical direction by a predetermined angle θ2 when viewed from the front, similarly to Embodiment 6.

In other words, the first exit surface 12A1*a* of the second comparative example is configured as a semicircular cylindrical surface extending in a direction inclined with respect to the vertical direction by a predetermined angle θ2 when viewed from the front, similarly to Embodiment 6.

Further, the reflection surface 12*b* and the shade 12*c* of the second comparative example are disposed in a horizontal attitude when viewed from the front, similarly to Embodiment 5. In other words, unlike Embodiment 6, the first exit surface 12A1*a* of the second comparative example is not disposed in an attitude inclined with respect to the horizontal direction by the predetermined angle θ2 in the opposite direction of the second exit surface 12A2*b* and the first exit surface 12A1*a*.

As illustrated in FIG. 41C, the light distribution pattern formed by the vehicular lamp fitting 10H of second comparative example extends considerably above the horizontal line, which is not suitable for the low beam light distribution pattern.

Next a problem in the case of increasing the camber angle θ1 and a method for solving this problem will be described as Embodiment 8.

FIG. 42A is an example of a low beam light distribution pattern formed by the vehicular lamp fitting 10D of Embodiment 5 (or the vehicular lamp fitting 10F of Embodiment 7), when the camber angle θ1 is 30°, and FIG. 42B is an example of a low beam light distribution pattern formed by the vehicular lamp fitting 10D of Embodiment 5 (or the vehicular lamp fitting 10F of Embodiment 7) when the camber angle θ1 is 45°. The hatched region in FIG. 42B indicates that this region is brighter compared with the corresponding region in FIG. 42A.

According to the simulation performed by the inventors of the present invention, if the camber angle θ1 is increased (e.g. θ1=45°) in the vehicular lamp fitting 10D of Embodiment 5 (or the vehicular lamp fitting 10F of Embodiment 7), the area above the cut-off line becomes bright, as illustrated in FIG. 42B.

The cause of this will be described with reference to the drawings.

FIG. 43 is a cross-sectional view of the vehicular lamp fitting 10D (of major optical surfaces only) of Embodiment 5. The line with an arrow at the end in FIG. 43 indicates an optical path of the light Ray2 from the light source 14 which enters the first exit surface 12A1*a* at a certain entry angle.

If the camber angle θ1 is increased (e.g. θ1=45°) in the vehicular lamp fitting 10D of Embodiment 5 (or the vehicular lamp fitting 10F of Embodiment 7), the distance between the first exit surface 12A1*a* and the second entry surface 12A2*a* increases, as illustrated in FIG. 43, compared with the case when the camber angle θ1 is small (e.g. θ1=30°). Therefore the entry position of the light Ray2 to the second entry surface 12A2*a* becomes lower compared with the case when the camber angle θ1 is small (e.g. θ1=30°), and the light Ray2 that enters through the lower entry position becomes the light which travels diagonally upward with respect to the horizontal direction, as illustrated in FIG. 43. As a result, glare is generated, and the cut-off line becomes unclear.

It is known that if the extracting angles α and β, which are set for the first exit surface 12A1*a* and the second entry surface 12A2*a*, are increased, the light Ray2 also becomes light which travels diagonally upward with respect to the horizontal direction, for the same reason as described above.

A method for solving the problem will be described next.

As a result of keen examination to suppress this problem, the present inventors discovered that the above mentioned light Ray2, which travels upward with respect to the horizontal direction, exits from a partial region of a lower part of the second exit surface 12A2*b*, and this problem can be suppressed by physically cutting off this partial region, or by adjusting the surface shape (e.g. curvature) of this partial region so that the light Ray2, which exits this partial region, becomes light traveling in parallel or downward with respect to the first reference axis AX.

FIG. 44A is an example based on this knowledge, where a partial region 12A2*b*2 of a lower part of the second exit surface 12A2*b* is physically cut-off and the upper region 12A2*b*1 remains. By cutting off a partial region through which the light, traveling diagonally upward with respect to the horizontal direction, exits like this, the light which travels diagonally upward can be suppressed. As a result, generation of glare is suppressed, and the cut-off line becomes clear.

Figure 44B:
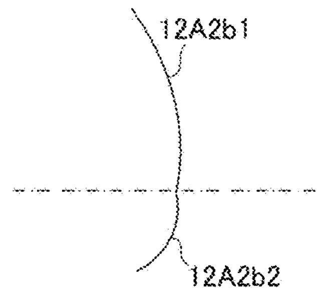
FIG. 44B is an example, where the surface shape (e.g. curvature) of the partial region 12A2*b*2 of a lower part of the second exit surface 12A2*b* is adjusted such that the light Ray1, which exits through the partial region 12A2*b*2, becomes light travelling in a parallel or downward direction with respect to the first reference axis AX, and the second exit surface 12A2*b* is separated into the upper region 12A2*b*1 and the lower region 12A2*b*2.

FIG. 44B is another example based on this knowledge, where the surface shape (e.g. curvature) of the partial region 12A2*b*2 of a lower part of the second exit surface 12A2*b* is adjusted such that the light Ray1, which exits through the partial region 12A2*b*2, becomes light travelling in a parallel or downward direction with respect to the first reference axis AX, and the second exit surface 12A2*b* is separated into the upper region 12A2*b*1 and the lower region 12A2*b*2. By adjusting the partial region through which the light, travelling diagonally upward with respect to the horizontal direction, exits like this, the light which travels diagonally upward can be suppressed. As a result, generation of glare is suppressed, and the cut-off line becomes clear.

The present inventors confirmed through simulation that the above mentioned problem, that is, the area above the cut-off line that becomes bright, can be suppressed by either one of these methods.

Next, a vehicular lamp fitting 10I, in which the second reference axis AX1 is inclined with respect to the first reference axis AX1 when viewed from the top, will be described as Embodiment 9 with reference to the drawings.

Figure 45:
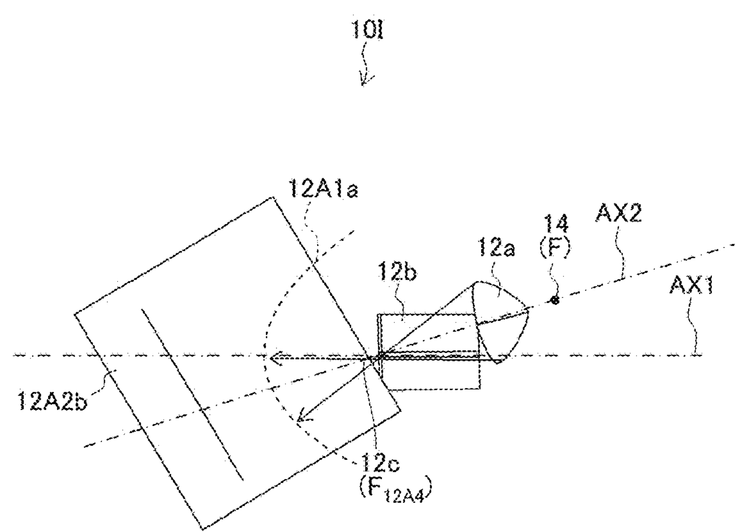
FIG. 45 is a top view (of major optical surfaces only) of the vehicular lamp fitting 10I in which the second reference axis AX2 is inclined with respect to the first reference axis AX1 when viewed from the top.

FIG. 45 is a top view (of major optical surfaces only) of the vehicular lamp fitting 10I in which the second reference axis AX2 is inclined with respect to the first reference axis AX1 when viewed from the top.

As illustrated in FIG. 45, the vehicular lamp fitting 10I of Embodiment 9 corresponds to the vehicular lamp fitting 10D of Embodiment 5 (or the vehicular lamp fitting 10F of Embodiment 7), in which the second reference axis AX2 is rotated with the approximate center of the shade 12*c* in the crosswise direction as the rotation center by a predetermined angle, so as to be inclined with respect to the first reference axis AX1 when viewed from the top.

According to Embodiment 9, in addition to the above mentioned effects of Embodiment 5, the Fresnel reflection loss (in particular, the Fresnel reflection loss in the second exit surface 12A2*b*, to which the camber angle is added, as illustrated in FIG. 45) is suppressed, and as a result, light utilization efficiency improves.

The concept "second reference axis AX2 is inclined with respect to the first reference axis AX1 when viewed from the top" described in Embodiment 9 is not limited to the vehicular lamp fitting 10A (lens body 12A) of Embodiment 5, but can be applied to each modification thereof, the vehicular lamp fittings (lens bodies) of Embodiments 1 to 4, 6 to 8 and the like. This concept can also be applied to the vehicular lamp fitting 10J (lens body 12J) of Embodiment 10, which will be described later.

Next, the vehicle lamp of the tenth exemplary embodiment 10 J (lens body 12 J), will be described with reference to the drawings.

Vehicle lamp 10J of the present embodiment (the lens body 12 J) is constructed as follows.

Figure 46:
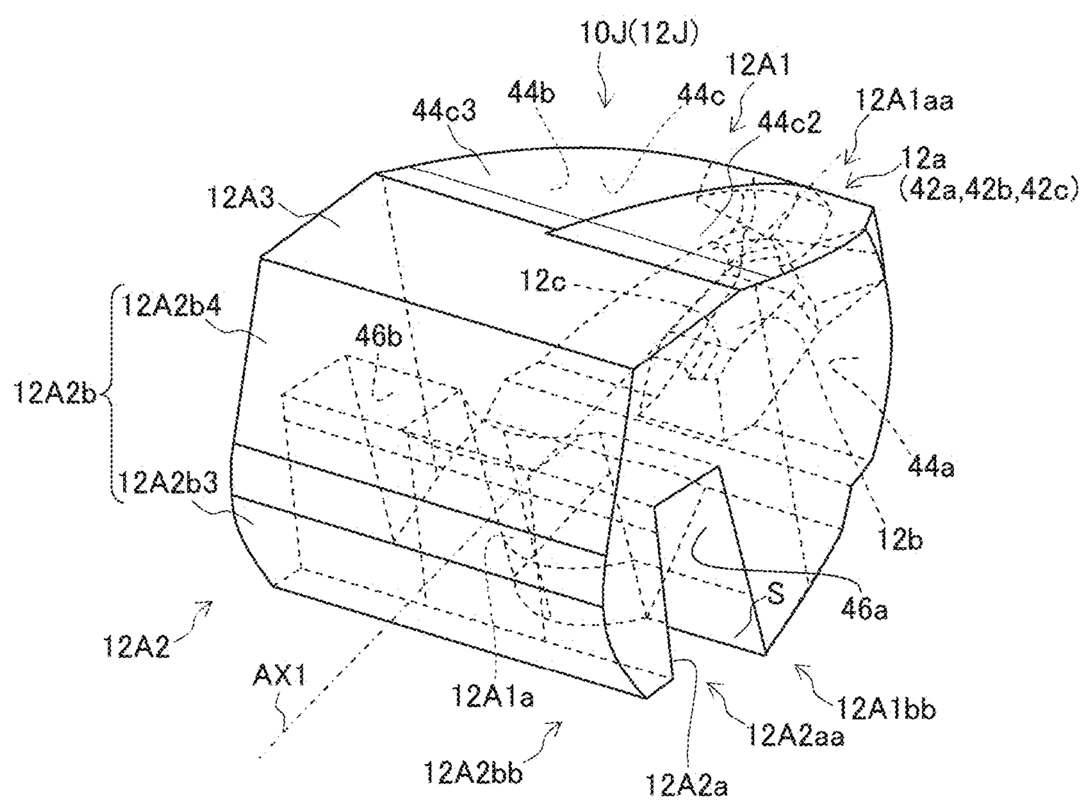
FIG. 46 is a perspective view of the vehicular lamp 10 J (lens body 12 J).
Figure 48B:
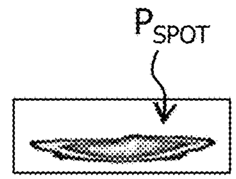
FIGS. 48B to 48D illustrate various parts distribution light pattern PSPOT, PMID, PWIDE.

FIG. 46 is a perspective view of the vehicular lamp 10 J (lens body 12 J), FIG. 47A is a top view, FIG. 47B is a front view, FIG. 47 C is a side view. FIG. 48A is an example of the vehicle lamp 10J (lens body 12J) light distribution pattern for low beam is formed by the PLO (synthetic light distribution pattern), various parts distribution light pattern PSPOT shown in FIG. 48B to FIG. 48D, PMID, PWIDE superposition It is formed in which it is.

Figure 48C:
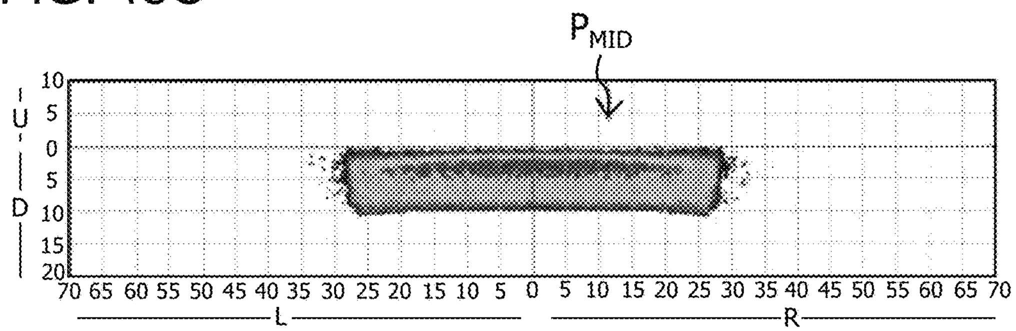
Figure 48D:
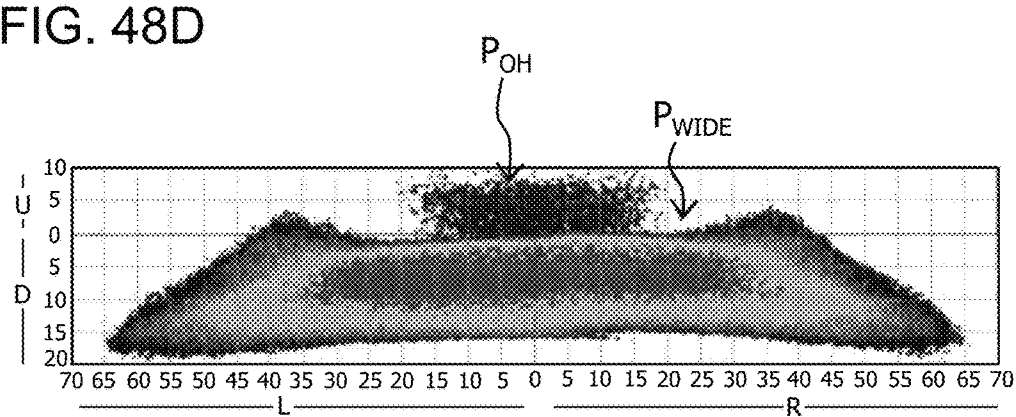
Figure 49A:
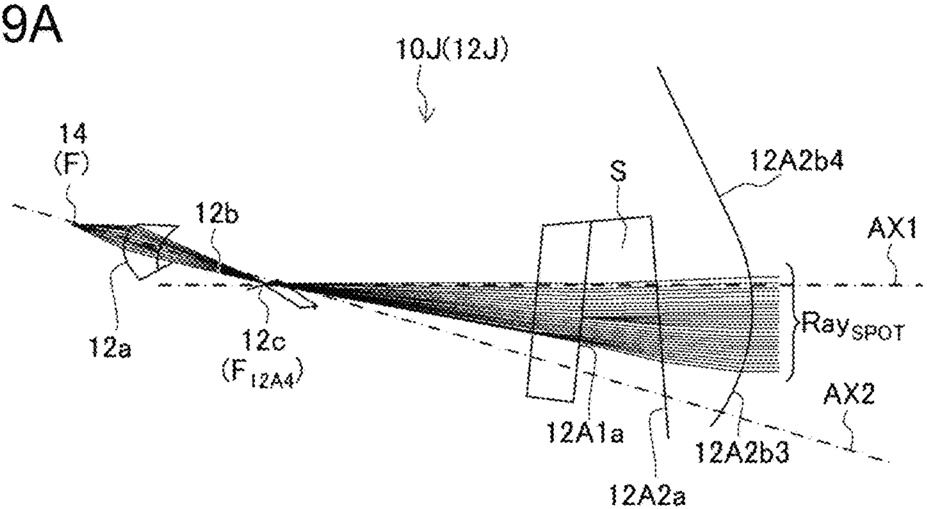
FIG. 49A is a side view of the first optical system (primary optical surfaces only).
Figure 49B:
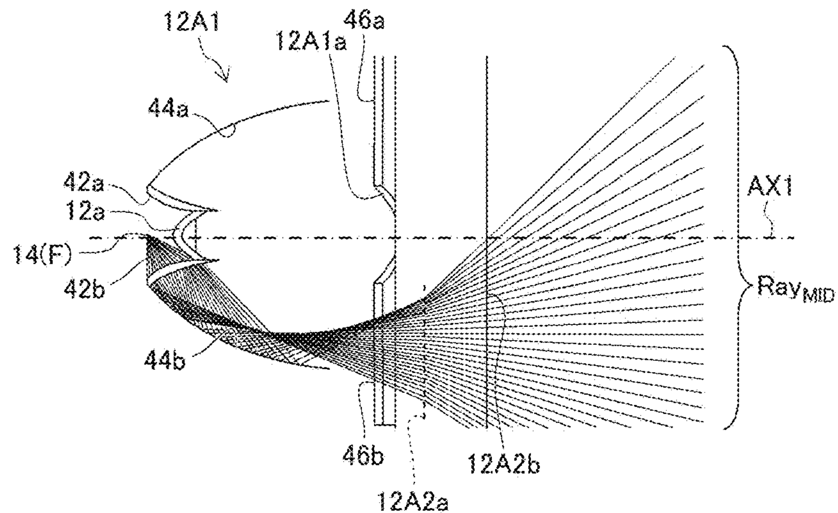
FIG. 49B is a top view of the second optical system (primary optical surfaces only).
Figure 49C:
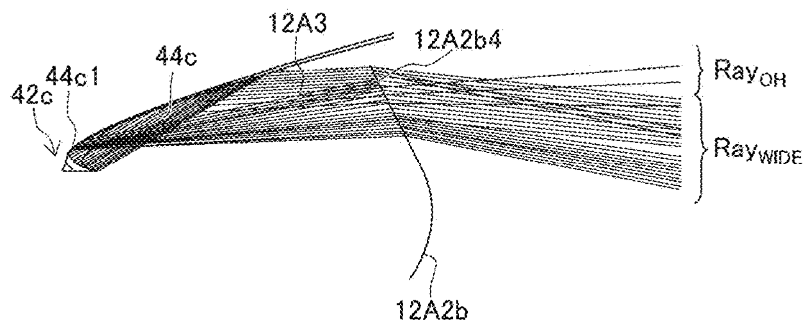
FIG. 49C is a side view of the third optical system (primary optical surfaces only).

Lens body 12J of the present embodiment, in addition to forming a spot light distribution pattern PSPOT (see FIG. 48B), the lens body 12A similar to the first optical system of the second embodiment (see FIG. 49A), further, the second optical system for forming a spot light distribution pattern PSPOT than diffuse mid light distribution pattern PMID (see FIG. 48C) (see FIG. 49B), and, the wide light distribution pattern PWIDE diffused from mid light distribution pattern PMID and a third optical system for forming a (see FIG. 48D) (see FIG. 49C).

Hereinafter, the second focuses on the differences from the vehicle lighting device 10A of embodiment (lens body 12A), the same configuration as the second embodiment of the vehicle lamp 10A (lens body 12A) is the same description thereof is omitted a reference numeral.

FIG. 46, as shown in FIG. 47, the lens body 12J of the present embodiment, the same configuration as the lens body 12A of the second embodiment, the first rear end portion 12A1*aa*, the front end portion 12A1*bb*, first rear end portion 12A1*aa* When placed right and left pair of side 44*a* between the first front end 12A1*bb*, 44*b*, and, the first comprising a first rear end portion 12A1*aa* and the lower reflecting surface 12*b* disposed between the first front end 12A1*bb* a lens portion 12A1, is disposed in front of the first lens portion 12A1, the second rear end portion 12A2*aa*, a second lens portion 12A2 including a second front end 12A2*bb*, a first lens unit 12A1 and a second lens portion 12A2 wherein the connecting portion 12A3 linked, further configured as a lens body comprising a first rear end portion of the first lens portion 12A1 12A1*aa* and the placed top surface 44*c* between the first front end 12A1*bb*.

Lens body 12J of the present embodiment, similarly to the above embodiments, injecting a polycarbonate or a transparent resin such as acrylic, cooling, (by injection molding) by solidifying are integrally formed.

Figure 50A:
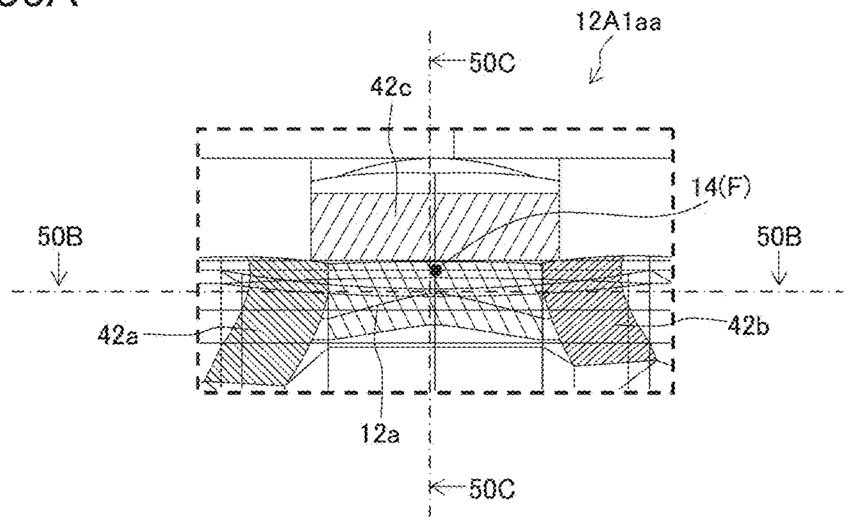
FIG. 50A is a front view of a first rear end portion 12A1*aa* of the first lens unit 12A1.
Figure 50B:
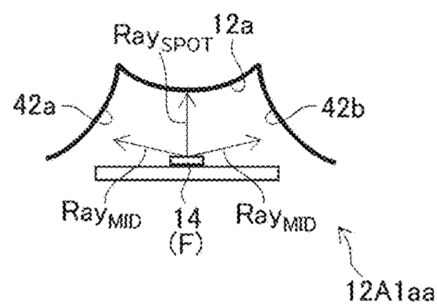
FIG. 50B is 50B-50B sectional view of FIG. 50A (schematic diagram)
Figure 50C:
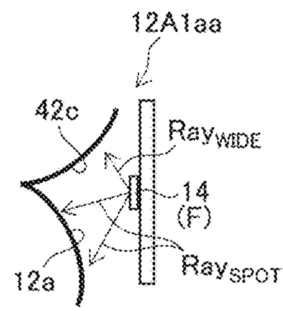
FIG. 50C is 50C-50C sectional view of FIG. 50A (schematic diagrams).

FIG. 50A is a front view of a first rear end portion 12A1*aa* of the first lens unit 12A1, FIG. 50B is 50B-50B sectional view of FIG. 50A (schematic diagram), and FIG. 50C is 50C-50C sectional view of FIG. 50A (schematic diagrams) it is.

FIG. 50A, as shown in FIG. 50 B, the first rear end portion 12A1*aa* of the first lens unit 12A1 includes a first entrance surface 12*a*, and, on both left and right sides of the first entrance surface 12*a*, disposed near the first entrance surface 12*a* is that the light source 14 and the spatial arrangement so as to surround the left and right sides are pair of left and right entrance surface 42*a* between the first incidence plane 12*a*, contains 42*b*. The first rear end 12A1*aa*, as shown in FIG. 50A, FIG. 50C, further, on the upper side of the first incident face 12*a*, is arranged so as to surround the space from the upper side between the light source 14 and the first entrance surface 12*a* contains on the entrance surface 42*c* was.

Tip of the lower reflecting surface 12*b* includes a shade 12*c*.

The first front end 12A1*bb* of the first lens unit 12A1, as shown in FIG. 46, semicylindrical first output surface 12A1*a* extending in the vertical direction, and left and right pair are disposed on both left and right sides of the first output surface 12A1*a* of the emission surface 46*a*, and it includes a 46*b*.

The second rear end portion 12A2*aa* of the second lens unit 12A2 includes a second entrance surface 12A2*a*, the second front end 12A2*bb* of the second lens unit 12A2 includes a second output surface 12A2*b*.

Second output surface 12A2*b* includes a semicylindrical region 12A2*b*3 extending in a horizontal direction, contains, an extension region 12A2*b*4 that extend upward obliquely rearward from the upper edge of the semi-cylindrical region 12A2*b*3.

Connecting portion 12A3 includes a first lens portion 12A1 and the second lens portion 12A2, in each of the upper, first forward end of the first lens unit 12A1 12A1*bb*, second rear end portion of the second lens portion 12A2 12A2*aa* and consolidated are connected in a state enclosed space S is formed in parts 12A3.

FIG. 49A is a side view of the first optical system (primary optical surfaces only).

As shown in FIG. 49A, a first entrance surface 12*a*, the lower reflection surface 12 *b* (and shade 12*c*), first output surface 12A1*a*, second entrance surface 12A2*a*, and, second output surface 12A2*b* (semicylindrical region 12A2*b*3), the light was shielded in part by the shade 12*c* of the light RaySPOT from the light source 14 incident from the first incident surface 12*a* inside the first lens portion 12A1, and, the light is internally reflected under the reflection surface 12 *b*, the 1 is emitted from the emitting surface 12A1*a*, further, the second partial region of from the incident surface 12A2*a* enters inside the second lens portion 12A2 second output surface 12A2*b* (semicylindrical region 12A2*b*3) A1 (FIG. 47 (*b*) by being irradiated forward emitted from the reference), as shown in FIG. 48B, a first light distribution pattern of a light distribution pattern PSPOT (present invention for spot comprising a cut-off line defined by the shade 12*c* to the upper edge constitute a first optical system for forming an equivalent) to.

FIG. 49B is a top view of a second optical system (primary optical surfaces only).

As shown in FIG. 49B, left and right of the entrance surface 42*a*, 42*b*, a pair of left and right side faces 44*a*, 44*b*, a pair of left and right exit surface 46*a*, 46*b*, second incident surface 12A2*a*, and, second output surface 12A2*b* (semicylindrical region 12A2*b*3) is a pair of left and right entrance surface 42*a*, the first lens portion 12A1 enters the inside right and left pair of side 44*a* from 42*b*, the light RayMID from the light source 14 which is internally reflected at 44*b*, a pair of left and right output surface 46*a*, emitted from 46*b*, further, of the left and right sides of the part of the region A1 out of the main incident from the second incident surface 12A2*a* inside the second lens unit 12A2 the second exit surface 12A2*b* (semi-cylindrical area 12A2*b*3) by being irradiated forward emitted from the region A2, A3 (see FIG. 47B), as shown in FIG. 48C, is superposed on the spot light distribution pattern PSPOT, diffused from the light distribution pattern PSPOT for spot It was to constitute a second optical system for forming a light distribution pattern PMID for mid.

A pair of left and right entrance surface 42*a*, 42*b*, of the light from the light source 14 does not enter the first entrance surface 12*a* of light (mainly, the light RayMID extending in the lateral direction. A plane see FIG. 50 B) is incident on the inside the first lens portion 12A1 is refracted, as shown in FIG. 50 B, the surface of the curved convex toward the light source 14 (for example, is configured as a free-form surface).

A pair of left and right side faces 44*a*, 44*b*, as shown in FIG. 47A, when viewed from left and right pair of side accordance from the first front end 12A1*bb* side of the first lens portion 12A1 toward the first rear end portion 12A1*aa* side 44*a*, the spacing between 44*b* is configured as a surface of a convex curved surface shape toward the outside, which narrows in a tapered shape (e.g., free-form surface). Further, a pair of left and right side faces 44*a*, 44*b*, as shown in FIG. 47 C, in side view, on which in accordance with the first front end 12A1*bb* side of the first lens portion 12A1 toward the first rear end portion 12A1*aa* side and lower edges is formed as a surface having a shape narrowing tapered.

Incidentally, a pair of left and right sides 44*a*, 44*b* are a pair of left and right entrance surface 42*a*, the light RayMID pair of left and right exit surface 46*a* of the first lens unit 12A1 light source 14 which enters the inside through 42*b*, internal reflection towards the 46 *b* (in reflecting surface total reflection) to, metal deposition is not used.

A pair of left and right exit surface 46*a*, 46*b* is configured as a surface of a planar shape. Of course, not limited to this, it may be configured as a surface of a curved surface.

The second optical system configured as described above, on a virtual vertical screen, the light distribution pattern PMID for mid shown in FIG. 48C is formed.

Vertical dimension of the mid-beam light distribution pattern PMID is about 10 degrees in FIG. 48C, not limited to this, for example, adjusting a pair of left and right entrance surface 42*a*, 42*b* of the surface shape (e.g., the vertical curvature) it can be freely adjusted by.

The position of the upper edge of the mid-beam light distribution pattern PMID is a somewhat of a horizontal line in FIG. 48C, not limited thereto, a pair of left and right entrance surface 42*a*, 42*b* of the surface shape (e.g., a pair of left and right entrance surface 42*a*, the inclination of 42*b*) can be adjusted freely by adjusting the.

Further, the right end and left end of the mid-beam light distribution pattern PMID is extends to the right to about 30 degrees and the left about 30 degrees in FIG. 48C, not limited to this, for example, a pair of left and right entrance surface 42*a*, 42*b* and/or a pair of left and right side faces 44*a*, 44*b* (for example, each of the horizontal curvature) can be adjusted freely by adjusting the.

FIG. 49C is a side view of a third optical system (primary optical surfaces only).

As shown in FIG. 49C, the upper incident surface 42*c*, the upper surface 44*c*, the coupling portion 12A3, and the second emission surface 12A2*b* (extension regions 12A2*b*4) is a top incident from the upper incident surface 42*c* inside the first lens portion 12A1 44*c* in the internal reflection, the connecting portion 12A3 light RayWIDE from the light source 14, which travels through the inside, above the area A4 of the second emission surface 12A2*b* (each of the regions A1 to A3. That is, by being irradiated forward emitted from the extended area 12A2*b*4), as shown in FIG. 48D, are superimposed on the spot light distribution pattern PSPOT and mid light distribution pattern PMID, from mid-light distribution pattern PMID constitute a third optical system for forming a diffused light distribution pattern PWIDE for wide.

The upper incident surface 42*c*, the light (mainly not enter the first entrance surface 12*a* of the light from the light source 14 extends upward light RayWIDE. A plane see FIG. 50C) enters the inside the first lens portion 12A1 is refracted, as shown in FIG. 50C, the surface of the curved convex toward the light source 14 (for example, is configured as a free-form surface).

The upper surface 44*c* is 46, as shown in FIG. 49C, in a side view, outwardly inclined obliquely downward from the first front end 12A1*bb* side of the first lens portion 12A1 to the first rear end portion 12A1*aa* side It is formed as a surface curved convex. The upper surface 44*c*, as shown in FIG. 47A, when viewed, has its left edge and right edge according to the first front end 12A1*bb* side of the first lens portion 12A1 toward the first rear end portion 12A1*aa* side It is configured as a surface of a shape that narrows in a tapered shape. Specifically, the upper surface 44*c* is (to be exact, the reference point F) a light source 14 which is incident from the upper incident surface 42*c* inside the first lens portion 12A1 light RayWIDE from the vertical direction, so as to be parallel light its surface shape is formed. The upper surface 44*c* is directed to a horizontal direction, in the drawing 49C, and extends in a direction perpendicular to the paper surface.

It should be noted that the top surface 44*c* is a reflection surface for internal reflection (total internal reflection) towards the light RayWIDE from the light source 14 incident from above the entrance surface 42*c* inside the first lens unit 12A1 the second exit surface 12A2*b* (extension area 12A2*b*4), metal deposition is not used.

Extension region 12A2*b*4 is configured as a surface of the extended planar shape from the upper edge of the second output surface 12A2*b* (semicylindrical region 12A2*b*3) upward obliquely rearward. Of course, not limited to this, it may be configured as a surface of a curved surface. It should be noted that, with the semi-cylindrical area 12A2*b*3 the extension area 12A2*b*4 has been stepped without smoothly connected.

The upper surface 44*c*, as shown in FIG. 49C, includes a reflecting surface for overhead sign 44*c*1 for forming a light distribution pattern POH for overhead sign irradiating the cutoff line above the road signs or the like. Reflecting surface for overhead sign 44C1 is incident from the upper incident surface 42*c* inside the first lens portion 12A1, is reflected by the reflecting surface for overhead sign 44C1, the light RayOH from the light source 14 travels through internal connection portion 12A3 is, the second by being emitted forward obliquely upward emitted from the exit surface 12A2*b* (extension regions 12A2*b*4), as shown in FIG. 48D, its surface shape so as to form a light distribution pattern POH for overhead sign the cutoff line upward configuration It is. It should be noted that, for the overhead sign reflecting surface 44*c*1 can be omitted as appropriate.

As the third optical system, in place of the upper incident surface 42*c*, connecting portion 12A3, and includes a second output surface 12A2*b* (extension regions 12A2*b*4), from the upper incident surface 42*c* inside the first lens portion 12A1 by light RayWIDE from the incident light source 14 travels through connecting portion 12A3 interior without being internally reflected and irradiated forward emitted directly from the second output surface 12A2*b* (extension regions 12A2*b*4), shown in FIG. 48D as described above, it may be used as an optical system for forming a light distribution pattern PWIDE for wide.

The third optical system having the above structure, on a virtual vertical screen, wide light distribution pattern PWIDE and overhead sign light distribution pattern POH shown in FIG. 48D is formed.

Vertical dimension of the light distribution pattern PWIDE for wide is about 15 degrees in FIG. 48D, not limited to this, for example, freely by adjusting the surface shape of the upper incident surface 42*c* (e.g., the vertical curvature) it can be adjusted to.

The position of the upper edge of the wide light distribution pattern PWIDE, although along a horizontal line in FIG. 48D, not limited to this, it is possible to freely adjust by adjusting the inclination of the upper surface 44*c*.

In the present embodiment, the upper surface 44*c*, as shown in FIG. 46, the vertical plane including the reference axis AX1 includes a left upper surface 44*c*2 and the right upper surface 44*c*3, which is divided into right and left, upper left surface 44*c*2 and the right upper surface 44*c*3 of each inclination are different from each other. More specifically, it is inclined to below the right upper surface 44*c*3 the upper left surface 44*c*2. Thus, as shown in FIG. 48D, the light distribution pattern PWIDE for wide, the upper edge, the upper edge of the left side with respect to the vertical line can be made, including the cutoff line of the lower left and right stepped than the right upper edge (in the case of right-hand traffic). Of course, on the contrary, it may be inclined to the upper left surface 44*c*2 above the right top surface 44*c*3. Thus, a light distribution pattern PWIDE for wide, upper edge of the left side with respect to the vertical line can be made, including the cutoff line of the higher lateral stepped than the right upper edge (the case of left-hand traffic).

Further, the right end and left end of the wide light distribution pattern PWIDE is extends to the right to about 65 degrees and the left about 65 degrees in FIG. 48D, not limited to this, for example, on the entrance surface 42*c* (e.g., its horizontal it can be freely adjusted by adjusting the curvature).

According to this embodiment, in addition to the effects of the second embodiment, furthermore, it can achieve the following effects.

That is, the first, it is possible to provide a lens body 12J and the vehicle lighting device 10J having the same can be maintained even linear luminous appearance changes viewpoint position. Second, it is possible to provide a uniform light emission (or substantially uniform light emission) lens body appearance can be realized in 12J and vehicle lamp 10J having the same. Third, the efficiency of capturing light from the light source 14 inside the lens body 12J is dramatically improved. Fourth, it is possible to provide a lens body 12J and the vehicle lighting device 10J having the same of appearance with a sense of unity, which extends linearly in a predetermined direction. Fifth, even though the second emission surface 12A2*b* the ultimate exit surface is a semi-cylindrical surface 12A2*b*3 (refracting surface of the semi-cylindrical), arrangement for spots focused in the horizontal and vertical directions it is possible to provide a lens body 12J and vehicle lamp 10J with this it is possible to form the light pattern PSPOT.

Can be the viewpoint position is maintained also linear luminous appearance change is one of the lens body 12J is, the plurality of light distribution patterns that degree of diffusion are different, i.e., a spot light distribution pattern PSPOT (of the present invention corresponds to a first light distribution pattern), a plurality of forming the second corresponds to the light distribution pattern) and a wide light distribution pattern PWIDE mid light distribution pattern PMID (present invention (corresponding to the third light distribution pattern of the present invention) of the optical system, i.e., a first optical system (see FIG. 49A), is by that it comprises a second optical system (see FIG. 49B) and a third optical system (see FIG. 49C). Note that exhibit this effect, a minimum, a first optical system (see FIG. 49A) and a second optical system need only comprise (see FIG. 49B), the third optical system (see FIG. 49C) is omitted as appropriate can do.

Figure 51:
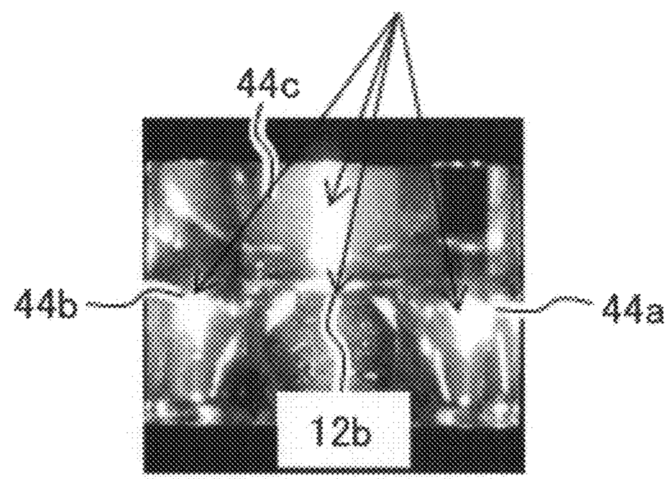
FIG. 51 is a front view (photo) of the vehicle lamp 10J (lens body 12J) emitting multi-point light.

Uniform light emission (or substantially uniform light emission) can be realized the appearance of each of the incident surface, i.e., a first entrance surface 12*a*, a pair of left and right entrance surface 42*a*, the first lens unit from 42*b* and the upper incident surface 42*c* a light reflection surface are each from 12A1 light source 14 incident on the inside, i.e., lower reflection surface 12 *b*, a pair of left and right side faces 44*a*, is reflected by 44*b* and upper surface 44*c* result, the multipoint emission within lens body 12 J (FIG. 51 reference) especially added, each of the reflecting surfaces, i.e., the lower reflection surface 12 *b*, a pair of left and right side faces 44*a*, the reflected light from 44*b* and upper surface 44*c*, substantially the entire area of second output surface 12A2*b* is the final output surface be uniformly emitted from, i.e., partial area A1 (FIG. 47 of the second output surface 12A2*b* light reflected from the lower reflective surface 12*b* is the final output surface (semicylindrical region 12A2*b*3) (b) emitted from the reference), a pair of left and right side faces 44*a*, the reflected light from 44*b*, primarily the left and right partial region A1 of the second output surface 12A2*b* is the final output surface (semicylindrical region 12A2*b*3) both sides of the region A2, A3 emitted (FIG. 47B refer), the reflected light from the upper surface 44*c* is mainly the region above the final emitting surface and a second output surface 12A2*b* (the regions A1 to A3 A4. That is by exiting the extension region 12A2*b*4). Note that exhibit this effect, a minimum, a first optical system (see FIG. 49A) and a second optical system need only comprise (see FIG. 49B), the third optical system (see FIG. 49C) is omitted as appropriate can do.

The efficiency of capturing light from the light source 14 inside the lens body 12J is dramatically improved, each of the incident surface, i.e., a first entrance surface 12*a*, a pair of left and right entrance surface 42*a*, 42*b* and the upper incident surface 42*c* is a light source 14 is by being arranged so as to surround (see FIG. 50A to FIG. 50C). Note that exhibit this effect, a minimum, the first incident surface 12*a* and the pair of entrance surface 42*a*, it is sufficient comprises a 42*b*, on the entrance surface 42*c* can be omitted suitably.

Vehicle lamp 10J of the present embodiment (the lens body 12 J) is the above concept, but correspond to those applied to the vehicle lamp 10A of the second embodiment includes a first output surface 12A1*a* and second output surface 12A2*b*, not limited to this. That is, the above concept, other than vehicle lighting device 10A of the second embodiment includes a first output surface 12A1*a* and second output surface 12A2*b*, for example, to the vehicle lamp 10 of the first embodiment with one exit surface it is also possible to apply.

Can be an appearance with a sense of unity, which extends linearly in a predetermined direction, the second emission surface 12A2*b* the ultimate exit surface is configured as a semi-cylindrical surface 12A2*b*3 (refracting surface of the semi-cylindrical) it is due to have.

Despite second output surface 12A2*b* the ultimate exit surface is a semicylindrical surface 12A2*b*3 (refracting surface of the semi-cylindrical), the light distribution pattern PSPOT forming spots focused in the horizontal and vertical directions can be the horizontal light collecting predominantly first output surface of the first lens portion 12A1 12A1*a* (refracting surface of the semi-cylindrical) is in charge, the vertical condenser mainly of lens body 12J the final exit surface at a second output surface of the second lens portion 12A2 12A2*b* (refracting surface of the semi-cylindrical) is due to charge. That is due to the decomposed light collecting function.

Incidentally, the first to ninth embodiments and concepts described in the modified examples, for example, concept of "camber angle" described in the fifth embodiment, and generated with the application of the camber angle the idea of improving the above-mentioned blur as described above that, the idea of a sixth "to grant the slant angle" was described in the embodiment, and, the above-mentioned rotation that occurs due to the grant of this slant angle in the manner described above idea of suppressing, the idea of the first 7, "camber angle and slant angle" was described in the embodiment, and, above blur and the rotation will occur due to the grant of this camber angle and slant angle, as described above the idea of improving and inhibiting, are of course can be applied to the vehicle lamp 10J of the present embodiment (the lens body 12 J).

Further, in the tenth embodiment, the second optical system (see FIG. 49B) is configured to form a light distribution pattern PMID for mid, the third optical system (see FIG. 49C) is a light distribution pattern PWIDE for wide example was described that is configured to form, but the present invention is not limited thereto.

For example, on the contrary, the second optical system (see FIG. 49B) is configured to form a light distribution pattern PWIDE for wide, the third optical system (see FIG. 49C) is formed a light distribution pattern PMID for Mid it may be configured such that.

Figure 54A:
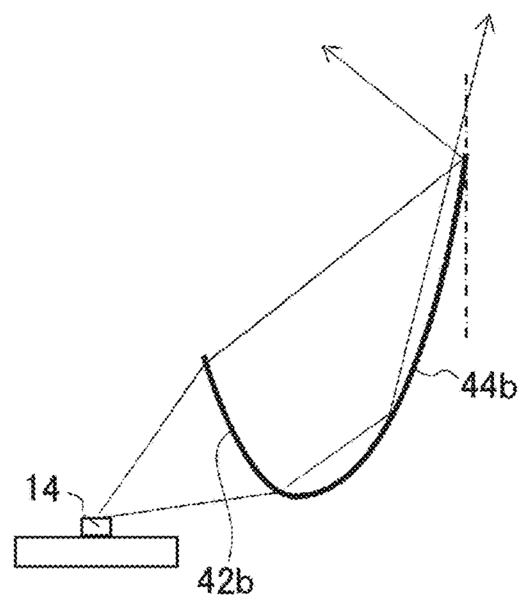
FIG. 54A is pair of the incident surface 42*a* constituting the second optical system, 42*b* and/or the right and left pair of side 44*a*, an adjustment example of a surface shape of 44*b*.
Figure 54B:
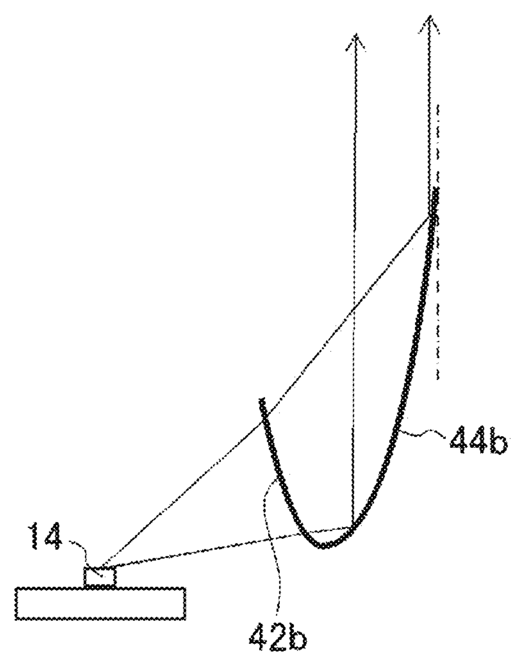
FIG. 54B is pair of the incident surface 42*a* constituting the second optical system, 42*b* and/or the right and left pair of side 44*a*, an adjustment example of a surface shape of 44*b*.

For example, a pair of left and right entrance surface 42*a* constituting the second optical system, 42*b* and/or the right and left pair of side 44*a*, 44*b* of the surface shape (e.g., the horizontal direction of curvature) by adjusting the as shown in FIG. 54A, a light distribution pattern can be expanded (e.g., horizontally), by adjusting, as shown in FIG. 54B, a light distribution pattern can be (e.g., horizontally) to narrow. Accordingly, the pair of left and right entrance surface 42*a* constituting the second optical system, 42*b* and/or the right and left pair of side 44*a*, 44*b* of the surface shape (e.g., the horizontal direction of curvature) by adjusting the, the light distribution pattern for mid not limited, it is also possible to form a light distribution pattern wide.

Figure 55A:
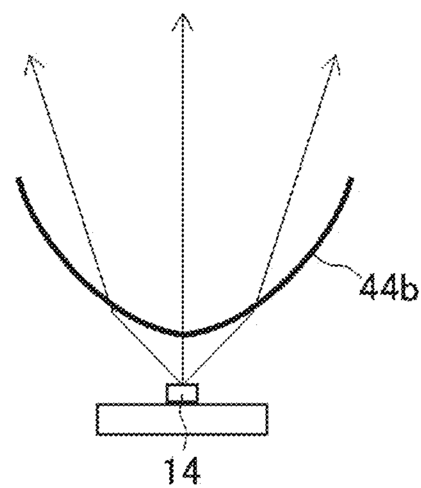
FIG. 55A is an example of adjusting the surface shape of the incident surface 42*c* on which constitute the third optical system.
Figure 55B:
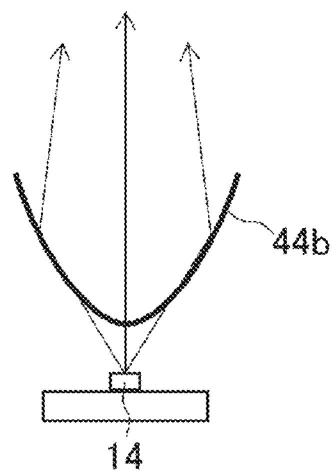
FIG. 55B is an example of adjusting the surface shape of the incident surface 42*c* on which constitute the third optical system.

Similarly, the surface shape of the upper incident surface 42*c* constituting the third optical system (e.g., the horizontal direction of curvature) by adjusting the as shown in FIG. 55A, a light distribution pattern (e.g., horizontally) spread that can be, by adjusting, as shown in FIG. 55B, a light distribution pattern can be (e.g., horizontally) to narrow. Accordingly, the surface shape of the upper incident surface 42*b* constituting the third optical system (e.g., the horizontal direction of curvature) by adjusting the, not only the light distribution pattern for wide, can be formed a light distribution pattern for mid.

Of course, the second optical system (see FIG. 49B) and a third optical system (see FIG. 49C) are both may be configured so as to form a light distribution pattern PWIDE for wide. Conversely, the second optical system (see FIG. 49B) and a third optical system (see FIG. 49C) are both may be configured so as to form a light distribution pattern PMID for mid.

Next, the vehicle lighting device of the eleventh embodiment 10K (lens body 12K), will be described with reference to the drawings.

Vehicle lamp 10K of the present embodiment (the lens body 12K) is constructed as follows.

Figure 56:
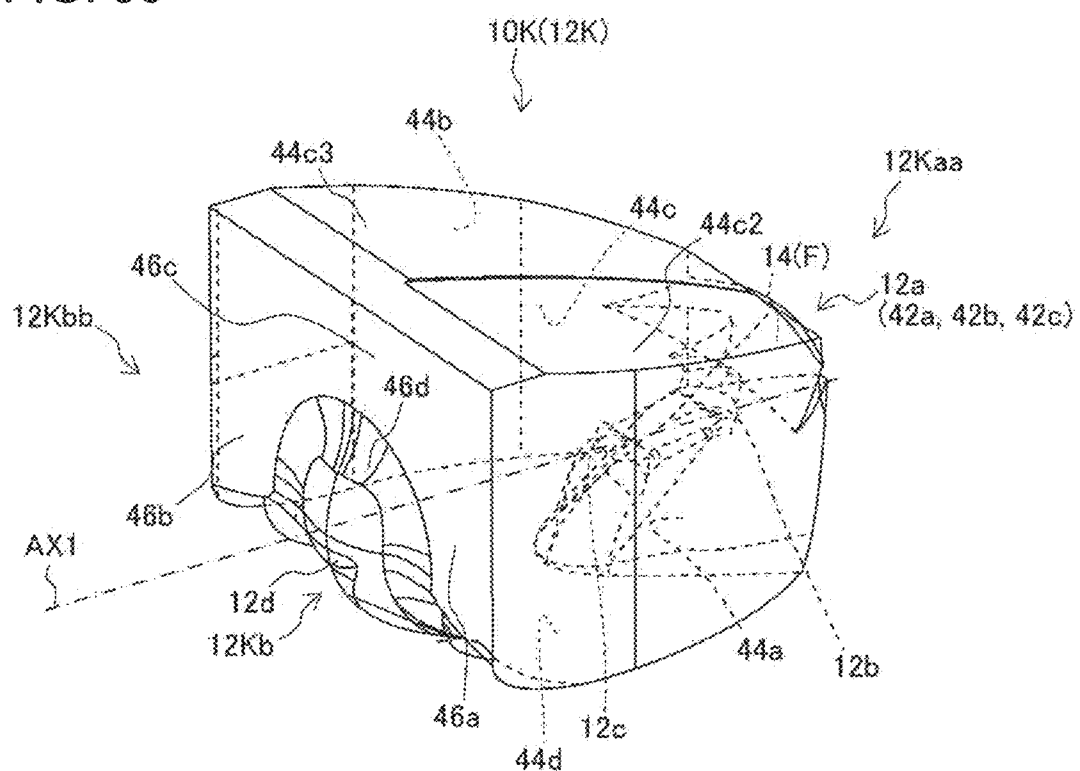
FIG. 56 is a perspective view of the vehicular lamp 10K (lens body 12K) of the eleventh embodiment.
Figure 58B:
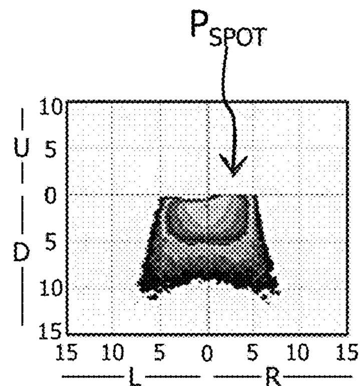
FIGS. 58B to 58D illustrate various parts distribution light pattern PSPOT, PMID, PWIDE.

FIG. 56 is a perspective view of the vehicular lamp 10K (lens body 12K), FIG. 57A is a top view, FIG. 57B is a front view, FIG. 57 C is a side view. FIG. 58A is an example of the vehicle lamp 10K (lens body 12K) light distribution pattern for low beam is formed by the PLO (synthetic light distribution pattern), various parts distribution light pattern PSPOT shown in FIG. 58B to FIG. 58D, PMID, PWIDE superposition It is formed in which it is.

Lens body 12K of the present embodiment, similarly to the tenth embodiment, a first optical system for forming a spot light distribution pattern PSPOT (see FIG. 58B) (FIG. 59A, see FIG. 59B), from the light distribution pattern PSPOT for spot diffused second optical system for forming a mid-light distribution pattern for PMID (see FIG. 58C) (see FIG. 60A), and, forming a wide light distribution pattern PWIDE (see FIG. 58D) diffused from the mid-light distribution pattern PMID the third is equipped with an optical system (see FIG. 60B) to be.

Hereinafter, the tenth focuses on the differences from the vehicle lighting device 10J embodiment (the lens body 12 J), the same configuration as the vehicle lamp of the tenth embodiment 10J (lens body 12 J) is the same description thereof is omitted a reference numeral.

FIG. 56, as shown in FIG. 57, the lens body 12K of the present embodiment is a lens body disposed in front of the light source 14, a rear end portion 12Kaa, front end 12Kbb, rear end 12Kaa a front end portion 12Kbb disposed right and left pair of side 44*a* between, 44*b*, includes a top surface 44*c* and a lower surface 44*d*, (to be exact, the reference point F) a light source 14 which enters the inner lens member 12K light from the front end 12Kbb (by being irradiated forward emitted from the exit surface 12Kb), it is constructed as a lens body forming a light distribution pattern PLo low beam (corresponding to a predetermined light distribution pattern of the present invention) shown in FIG. 58A. Lens body 12K includes a lower reflecting surface 12*b* disposed between the rear end portion 12Kaa a front end portion 12Kbb, lens body of bell-shaped narrowed cone shape toward the rear end portion 12Kaa side from the front end 12Kbb side It is configured as a.

Lens body 12K of the present embodiment, similarly to the above embodiments, injecting a polycarbonate or a transparent resin such as acrylic, cooling, (by injection molding) by solidifying are integrally formed.

Figure 61A:
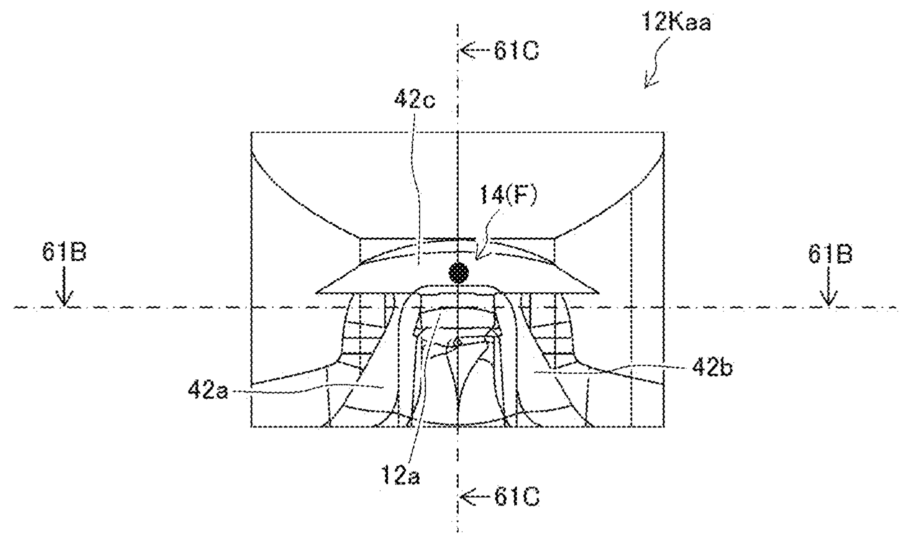
FIG. 61A is a front view of the rear end portion 12Kaa of the lens body 12K.
Figure 61B:
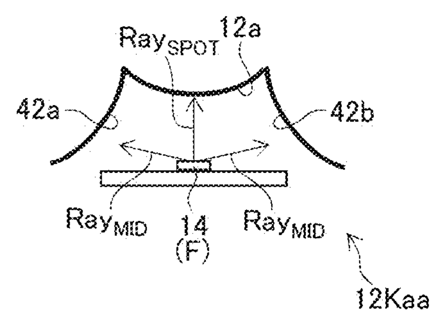
FIG. 61B is 61B-61B sectional view of FIG. 61A (schematic diagrams).
Figure 61C:
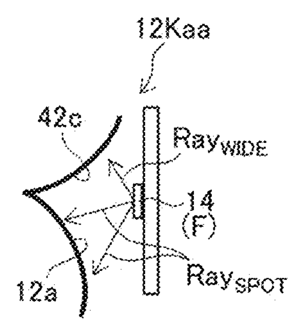
FIG. 61C is 61C-61C sectional view of FIG. 61A (schematic diagrams).

FIG. 61A is a front view of the rear end portion 12Kaa of lens body 12K, FIG. 61B is 61B-61B sectional view of FIG. 61A (schematic diagram), and FIG. 61C is a 61C-61C sectional view of FIG. 61A (schematic diagrams).

As shown in FIG. 61A, FIG. 61B, the rear end 12Kaa of the lens body 12K, the first entrance surface 12*a*, and, on both left and right sides of the first entrance surface 12*a*, between the light source 14 and the first entrance surface 12*a* a pair of left and right entrance surface 42*a* which is arranged so as to surround the space from the left and right sides, includes 42*b*. The rear end portion 12Kaa the FIG. 61A, as shown in FIG. 61C, further, on the upper side of the first entrance surface 12*a*, the light source 14 and on the space between the first entrance surface 12*a* is disposed so as to surround the upper side It contains the incident surface 42*c*.

Tip of the lower reflecting surface 12*b* includes a shade 12*c*.

Front end 12Kbb of the lens body 12K includes an exit surface 12Kb, the exit surface 12Kb, as shown in FIG. 56, the same exit surface 12*d* of the first embodiment (convex towards the front convex surface), the arranged pair of exit surface 46*a* on the right and left sides of the exit face 12*d*, 46 *b*, and includes an emitting surface 12*d* and the pair of output surface 46*a*, outgoing surface 46*c* disposed above the 46*b*. Emitting surface 12*d* and the pair of left and right exit surface 46*a*, 46 *b* (and the exit surface 46*c*) and via the connecting surface 46*d* surrounding the exit face 12*d* (surface optical function is not intended) step without smoothly It is connected.

Figure 59A:
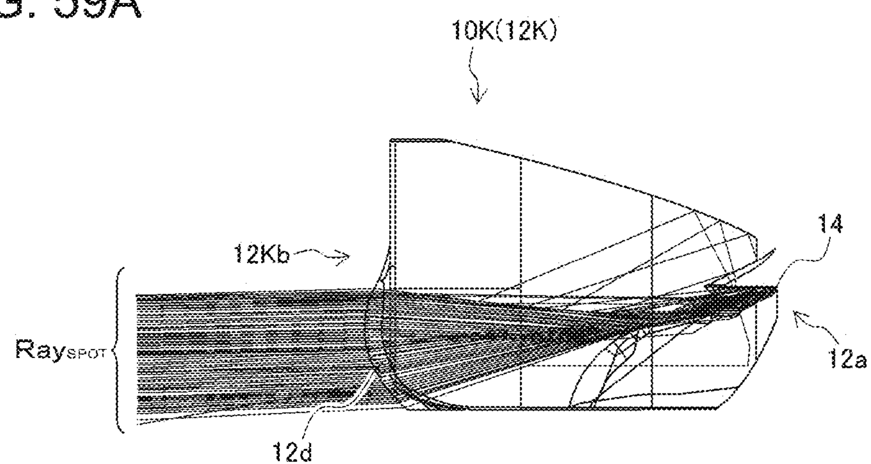
FIG. 59A is a side view of the first optical system.
Figure 59B:
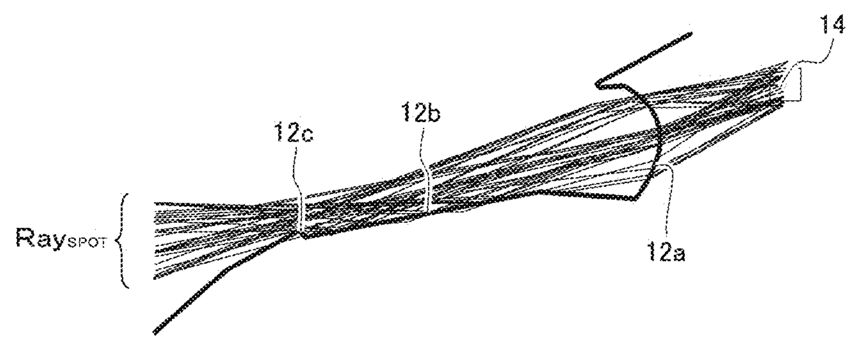
FIG. 59B is an enlarged side view of the first optical system.

FIG. 59A is a side view of the first optical system, FIG. 59B is an enlarged side view.

FIG. 59A, as shown in FIG. 59B, a first entrance surface 12*a*, the lower reflection surface 12 *b* (and shade 12*c*) and the exit surface 12Kb, the light RaySPOT from the light source 14 incident from the first incident surface 12*a* to the inner lens member 12K light has been shielded in part by the shade 12*c* of the, and, the light is internally reflected under the reflective surface 12*b* is, a part of the exit surface 12Kb area A1 (the exit surface 12*d*. By being irradiated forward emitted from FIG. 57B refer), as shown in FIG. 58B, the light distribution pattern PSPOT (present invention for spot comprising a cut-off line defined by the shade 12*c* to the upper edge constitute a first optical system for forming an equivalent) in 1 light distribution pattern.

Figure 60A:
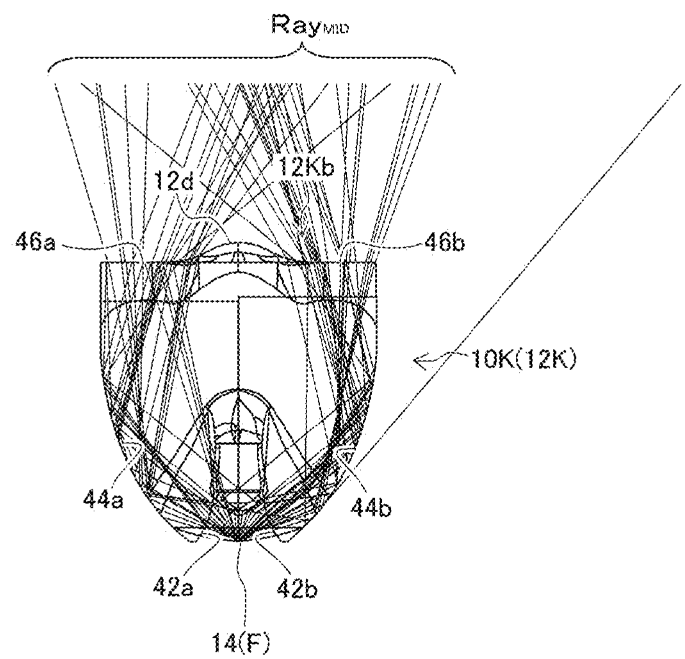
FIG. 60A is a top view of a second optical system.

FIG. 60A is a top view of a second optical system.

Figure 58C:
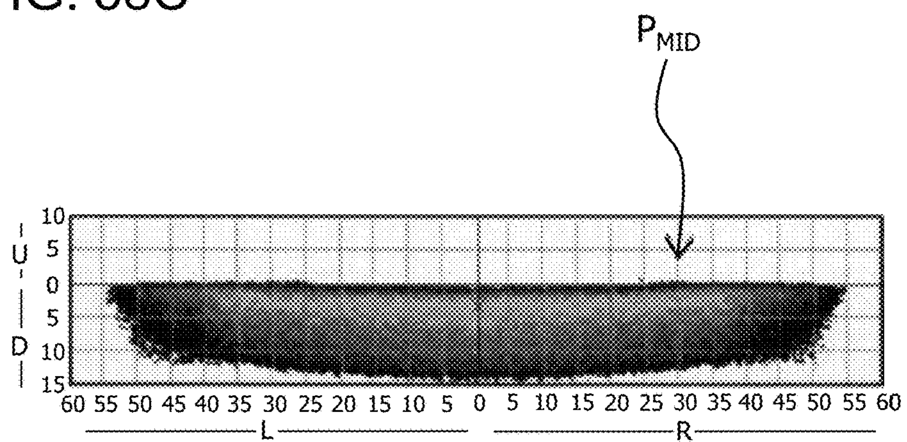

As shown in FIG. 60A, a pair of left and right entrance surface 42*a*, 42*b*, a pair of left and right side faces 44*a*, 44*b*, and the exit surface 12Kb pair of left and right entrance surface 42*a*, left and right incident from 42*b* inside the lens body 12K side 44*a*, light RayMID from the light source 14, which is internally reflected in 44*b* is, mainly the left and right sides of the area A2, A3 (left and right pair of the exit surface 46*a* of the part of the outgoing surface 12Kb area A1, 46*b*. By being irradiated forward emitted from FIG. 57B refer), as shown in FIG. 58C, is superposed on the spot light distribution pattern PSPOT, mid-beam light distribution that has diffused from the light distribution pattern PSPOT for spot constitute a second optical system for forming a pattern PMID.

A pair of left and right entrance surface 42*a*, 42*b*, of the light from the light source 14 does not enter the first entrance surface 12*a* of light (mainly, the light RayMID extending in the lateral direction. A plane see FIG. 61B) is incident on the inner lens member 12K is refracted, as shown in FIG. 61B, the surface of the curved convex toward the light source 14 (for example, is configured as a free-form surface).

A pair of left and right side faces 44*a*, 44*b*, as shown in FIG. 57A, when viewed from left and right pair of side 44*a* toward the rear end portion 12Kaa side from the front end 12Kbb side, the spacing between 44*b* is tapered surface of the convex curved surface shape toward the outside narrowed (for example, free-form surface) is constructed as a. Shape also, the pair of left and right side surfaces 44*a*, 44*b*, as shown in FIG. 57 C, which in side view, its upper and lower edges towards the rear end portion 12Kaa side from the front end 12Kbb side narrows in a tapered shape It is configured as a surface.

Incidentally, a pair of left and right sides 44*a*, 44*b* are a pair of left and right entrance surface 42*a*, the light RayMID pair from the light source 14 incident on the inner lens member 12K from 42*b* exit surface 46*a*, toward the 46*b* internal reflection (total internal reflection) a reflective surface for, not used in metal deposition.

A pair of left and right exit surface 46*a*, 46*b* is configured as a surface of a planar shape. Of course, not limited to this, it may be configured as a surface of a curved surface.

The second optical system configured as described above, on a virtual vertical screen, the light distribution pattern PMID for mid shown in FIG. 58C is formed.

Vertical dimension of the mid-beam light distribution pattern PMID is approximately 15 degrees in FIG. 58C, not limited to this, for example, adjusting a pair of left and right entrance surface 42*a*, 42*b* of the surface shape (e.g., the vertical curvature) it can be freely adjusted by.

The position of the upper edge of the mid-beam light distribution pattern PMID is along the horizontal line in FIG. 58C, not limited thereto, a pair of left and right entrance surface 42*a*, 42*b* of the surface shape (e.g., a pair of left and right entrance surface 42*a*, it can be freely adjusted by adjusting the 42*b* slope of).

Further, the right end and left end of the mid-beam light distribution pattern PMID is extends to the right to about 55 degrees and the left about 55 degrees in FIG. 58C, not limited to this, for example, a pair of left and right entrance surface 42*a*, 42*b* and/or a pair of left and right side faces 44*a*, 44*b* (for example, each of the horizontal curvature) can be adjusted freely by adjusting the.

Figure 60B:
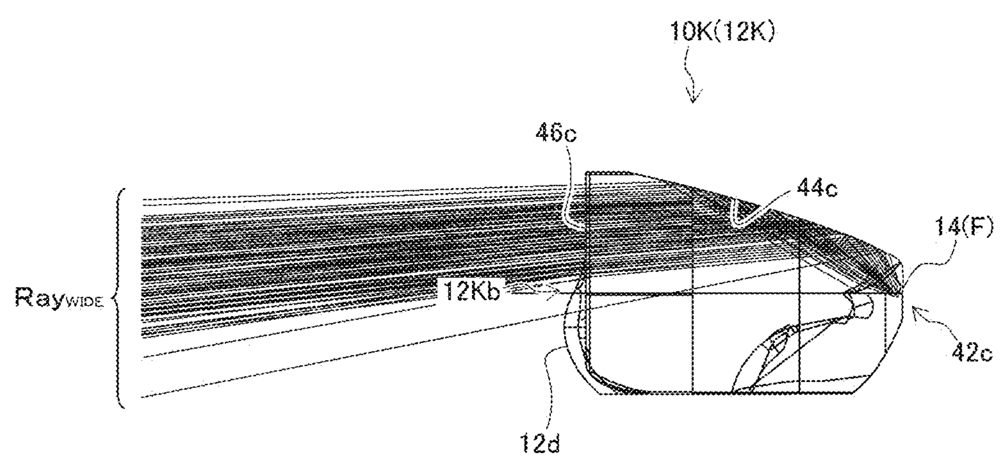
FIG. 60B is a side view of a third optical system.

FIG. 60B is a side view of a third optical system.

Figure 58D:
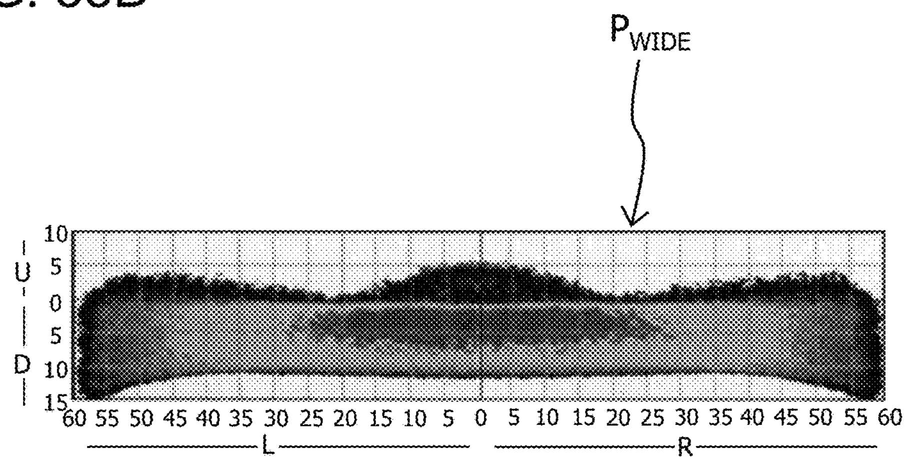

As shown in FIG. 60B, the upper incident surface 42*c*, the upper surface 44*c*, and the exit surface 12Kb, the light RayWIDE from the light source 14 which is internally reflected at the upper surface 44*c* is incident from the upper incident surface 42*c* inside the lens body 12K, mainly emitting surface area of the left and right sides of the part of the region A1 and some area A1 of the 12Kb A2, A3 each of the upper side of the area A4 (exit surface 46*c*. By being irradiated forward emitted from FIG. 57B refer), as shown in FIG. 58D, are superimposed on the spot light distribution pattern PSPOT and mid light distribution pattern PMID, the light distribution pattern PMID for Mid constitute a third optical system to form a more diffuse light distribution pattern PWIDE for wide.

The upper incident surface 42*c*, the light (mainly not enter the first entrance surface 12*a* of the light from the light source 14 extends upward light RayWIDE. A plane see FIG. 61C) is incident on the inner lens member 12K is refracted, as shown in FIG. 61C, the surface of the curved convex toward the light source 14 (for example, is configured as a free-form surface).

The upper surface 44*c* is 56, as shown in FIG. 57 C, in side view, from the front end 12Kbb side of the lens body 12K convex outwardly inclined obliquely downward toward the rear end portion 12Kaa side surfaces. It is configured as a surface shape. The upper surface 44*c*, as shown in FIG. 57A, when viewed from the front end 12Kbb side of the lens body 12K is the left edge and right edge toward the rear end portion 12Kaa side shape narrows in a tapered shape It is configured as a surface. Specifically, the upper surface 44*c* is (to be exact, the reference point F) a light source 14 which is incident from the upper incident surface 42*c* in the inner lens member 12K that surface so that light RayWIDE is relates to the vertical direction, the collimated light from shape is formed. The upper surface 44*c* is directed to a horizontal direction, in FIG. 57 C, and extends in a direction perpendicular to the paper surface.

Incidentally, the upper surface 44*c* is a reflecting surface for internal reflection towards the light RayWIDE from the light source 14 which is incident from the upper incident surface 42*c* in the inner lens member 12K to the exit surface 46*c* (total reflection), metal deposition is not used.

Exit surface 46*c* is configured as a surface of a planar shape. Of course, not limited to this, it may be configured as a surface of a curved surface.

As the third optical system, in place of the upper incident surface 42*c*, and includes an emitting surface 46*c*, the light RayWIDE from the light source 14 which is incident from the upper incident surface 42*c* inside the lens body 12K is internally reflected by being irradiated forward emitted directly from without exit surface 46*c* that, as shown in FIG. 58D, may be used an optical system for forming a light distribution pattern PWIDE for wide.

The third optical system having the above structure, on a virtual vertical screen, the light distribution pattern PWIDE for wide shown in FIG. 58D is formed.

Vertical dimension of the light distribution pattern PWIDE for wide is about 15 degrees in FIG. 58D, not limited to this, for example, freely by adjusting the surface shape of the upper incident surface 42*c* (e.g., the vertical curvature) it can be adjusted to.

The position of the upper edge of the wide light distribution pattern PWIDE, although substantially along a horizontal line in FIG. 58D, not limited to this, it is possible to freely adjust by adjusting the inclination of the upper surface 44*c*.

In the present embodiment, the upper surface 44*c*, as shown in FIG. 56, the vertical plane including the reference axis AX1 includes a left upper surface 44*c*2 and the right upper surface 44*c*3, which is divided into right and left, upper left surface 44*c*2 and the right upper surface 44*c*3 of each inclination are different from each other. More specifically, it is inclined to below the right upper surface 44*c*3 the upper left surface 44*c*2. Thus, as shown in FIG. 58D, the light distribution pattern PWIDE for wide, the upper edge, the upper edge of the left side with respect to the vertical line can be made, including the cutoff line of the lower left and right stepped than the right upper edge (in the case of right-hand traffic). Of course, on the contrary, it may be inclined to the upper left surface 44*c*2 above the right top surface 44*c*3. Thus, a light distribution pattern PWIDE for wide, upper edge of the left side with respect to the vertical line can be made, including the cutoff line of the higher lateral stepped than the right upper edge (the case of left-hand traffic).

Further, the right end and left end of the wide light distribution pattern PWIDE is extends to the right to about 60 degrees and the left about 60 degrees in FIG. 58D, not limited to this, for example, on the entrance surface 42*c* (e.g., the curvature in the horizontal direction) can be freely adjusted by adjusting the.

Next, a description will be given of the appearance of the light source 14 non-lighting at the time of the lens body 12K.

Lens body 12K of the present embodiment, the light source 14 non-lit, when viewed from multiple directions, the inside though lens body becomes appearance with "sparkling feeling" as if they were emitted.

Figure 62A:
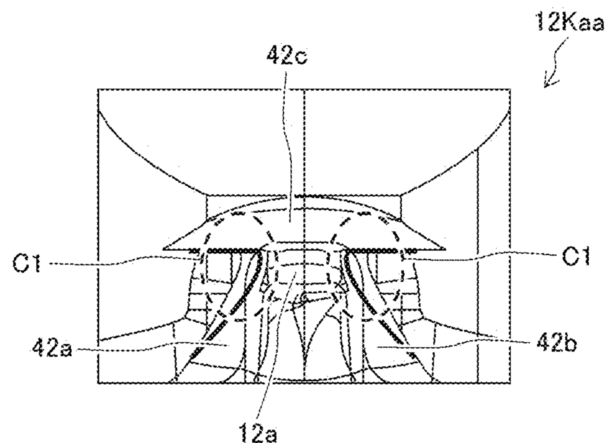
FIG. 62A to FIG. 62C illustrate the entrance surface 12*a*, 42*a*, 42*b*, 42*c* are, in top view and/or side view, the V-shaped (or V-shape open towards the front end portion 12Kbb side one it is a diagram that represents the thing that make up the part).
Figure 62B:
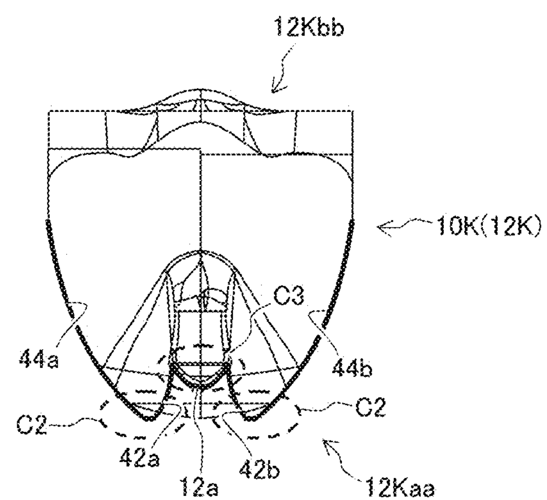
Figure 62C:
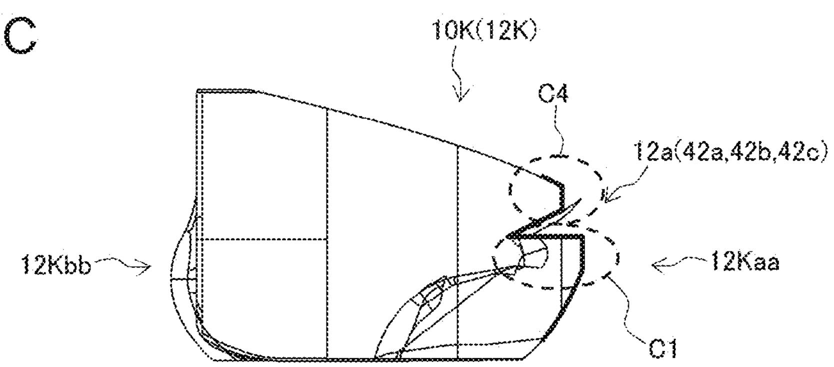

This, external light incident from the emission surface 12Kb inside the lens body 12K (e.g., sunlight) that is in the internal reflection (total internal reflection) easily satisfies the condition that constitutes inside the lens body 12K, specifically a lens body 12K is configured as a lens body of bell-shaped narrowed cone shape toward the rear end portion 12Kaa side from the front end 12Kbb side (FIG. 57A, FIG. 57 C refer to) the (in addition to the first condition), the incident surface 12*a*, 42*a*, 42*b*, at least one of 42*c*, when viewed and/or side view, V-shape open towards the front end portion 12Kbb side (or the V-shaped some) is due to constitute a reference (FIG. 62A to FIG. 62C in the code C1 to C4 is shown in a dashed circle (bold line)) the (second condition). Note that the first condition, but if they meet at least one of the conditions in the second condition.

For example, a pair of left and right entrance surface 42*a*, 42*b* is a side view, constitute a V-shape open towards the front end portion 12Kbb side (FIG. 62A, the code C1 in FIG. 62C within the circle of the dotted line shown (thick line) reference). Further, a pair of left and right entrance surface 42*a*, 42*b* is a top view, constitutes a part of a V-shape open towards the front end portion 12Kbb side (dotted line indicated by the reference numeral C2 in FIG. 62B within the circle (thick line) reference). The first entrance surface 12*a* is a top view, constitute a V-shape open towards the front end portion 12Kbb side (FIG. 62B in the code C3 is shown in a dashed circle (bold line) see). The upper incident surface 42*c* is a side view, a front end 12Kbb constitutes a part of a V-shape open towards the side (FIG. 62C the dotted line in the circle indicated by the reference numeral C4 in (thick line) reference).

Above as in, in addition to the lens body 12K is configured as a lens body of bell shape narrowed on the rear end portion 12Kaa side conical towards the front end 12Kbb side, the incident surface 12*a*, 42*a*, 42*b*, at least one of the 42*c*, when viewed and/or side view, the result constituting the V-shape open towards the front end portion 12Kbb side (or a portion of the V-shape), the lens body from the emission surface 12Kb external light incident inside 12K (e.g., sunlight) repeats internal reflection (total internal reflection) inside the lens body 12K (the V-shaped portion, etc.), most of which various directions again from the exit surface 12Kb emitted to.

Figure 63A:
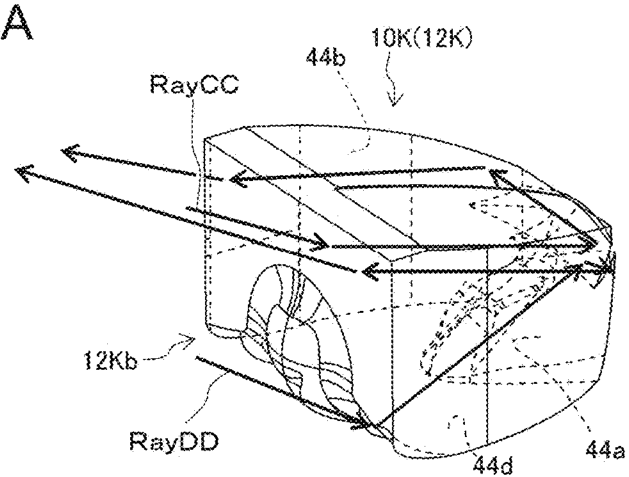
FIG. 63A is incident from the exit surface 12Kb inside the lens body 12K external light RayCC, RayDD (e.g., sunlight) is a diagram showing an optical path to follow.
Figure 63B:
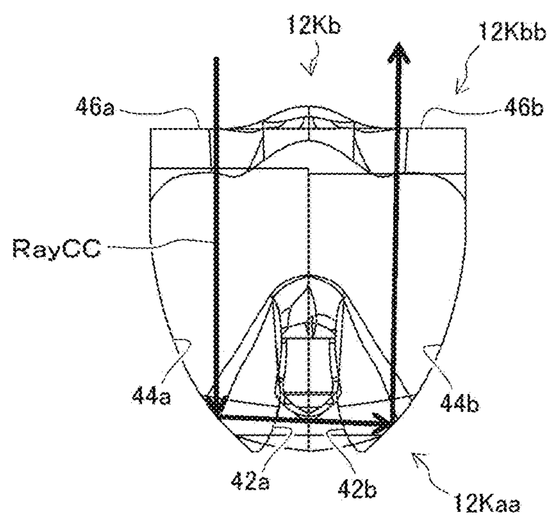
FIG. 63B is incident from the exit surface 12Kb inside the lens body 12K external light RayCC, RayDD (e.g., sunlight) is a diagram showing an optical path to follow.
Figure 63C:
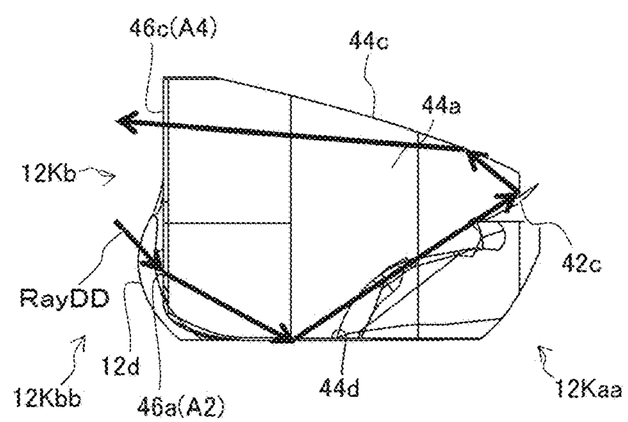
FIG. 63C is incident from the exit surface 12Kb inside the lens body 12K external light RayCC, RayDD (e.g., sunlight) is a diagram showing an optical path to follow.

For example, the external light RayCC shown in FIG. 63A, FIG. 63B is incident from the exit surface 12Kb inside the lens body 12K, the left side 44*a*, after being internally reflected (total reflection) in this order on the right side 44*b*, again emitted It is emitted from the surface 12Kb. Further, for example, external light RayDD shown in FIG. 63A, FIG. 63C is incident from the exit surface 12Kb inside the lens body 12K, the lower surface 44*d*, the upper incident surface 42*c*, after being internally reflected in this order on the upper surface 44*c* (total reflection), it is emitted again from the exit surface 12Kb.

Figure 64:
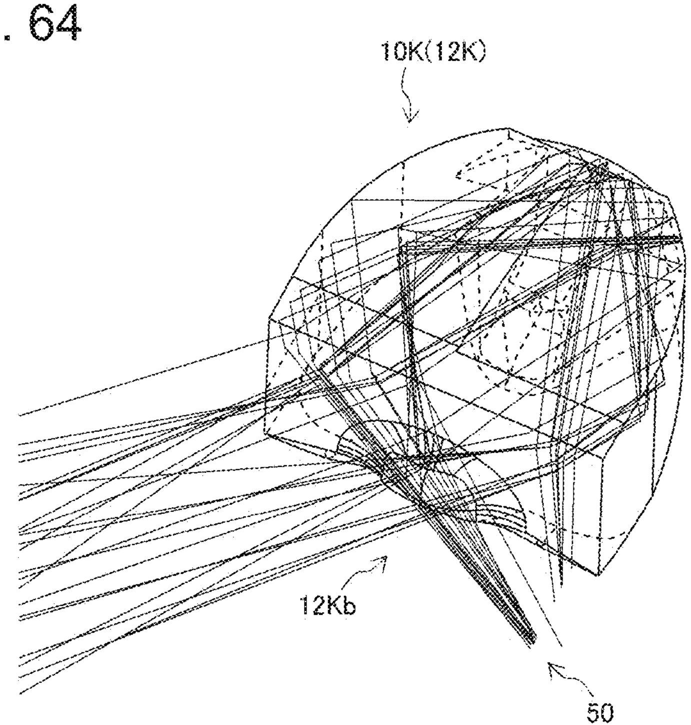
FIG. 64 illustrates in front of the lens body 12K arranged light source 50 likened to external light, a diagram representing the optical path where light traced from the light source 50 which enters the inner lens member 12K from the emission surface 12Kb.

Actual driving environment (for example, running under the environment in broad daylight), the above-mentioned external light RayCC, not limited to RayDD, outside light from any direction (for example, sunlight) is incident on the internal lens body 12K, the lens internal reflection in the body 12K internal (the V-shaped portion, etc.) repeatedly (total reflection), most of which is emitted in various directions from again exit surface 12Kb (see FIG. 64). As a result, the lens member 12K is in the light source 14 non-lit, when viewed from multiple directions, the inside though lens body becomes appearance with "sparkling feeling" as if they were emitted. FIG. 64 is a light source 50 which resemble the ambient light in front of the lens body 12K are arranged, represent the exit surface 12Kb optical path where light is traced from the light source 50 which enters the inner lens member 12K (the simulation result).

According to this embodiment, in addition to the effects of the tenth embodiment, further, it can achieve the following effects.

That is, the appearance does not become monotonous lens body 12K and the vehicle lighting device 10K provided with the same, in particular, in the light source 14 non-lit, when viewed from multiple directions, such as if as if the lens body interior is emitting light it is possible to provide a vehicle lamp 10K that "glitter feeling" with a lens body 12K and this becomes a great looking. As a result, the visibility of the light source 14 non-lit (vehicular lamp 10K, thus, this is the visibility of the vehicle mounted) can be increased.

Its appearance that does not become monotonous, the lens body 12K is not a conventional simple plano-convex lens, the rear end portion 12Kaa the front end portion and a pair of side surfaces 44*a* disposed between 12*bb*, 44*b*, upper face 44*c* and the lower surface enclosed cross section 44*d* is due be configured as a lens having a rectangular shape.

In addition, in the light source 14 non-lighting at the time, when viewed from multiple directions, as if the lens body inside becomes the appearance that "glitter feeling" as if they emit light, lens body 12K is from the front end 12Kbb side in addition to towards the rear end portion 12Kaa side it is configured to narrow the cone-like, at least one of the incident surface, when viewed and/or side view, open towards the front end 12Kbb side results that are part of a V-shaped or V-shaped, external light incident from the emission surface 12Kb inside the lens body 12K (e.g., sunlight) is, the lens body 12K internal (the V-shaped portion or the like) repeated internal reflection (total internal reflection) in the most part is by emitted in various directions from the re-emitting surface 12Kb.

Note that the first to tenth embodiments and concepts described in the modified examples, for example, concept of "decomposing a condensing function" described in the second embodiment, "camber described in the fifth embodiment idea of imparting angular", and the concept of the blurring which occurs due to the application of the camber angle to improve as described above, the idea described in the sixth embodiment, "imparting slant angle", and, idea the rotation that occurs due to the application of the slant angle of suppressing as described above, the idea described in the seventh embodiment, "imparting camber angle and slant angle", and, the camber angle and slant the blur and the rotation along with occur on the grant of the corner, the idea of improvement and to suppress in the manner described above, it is of course can be applied to the vehicle lamp 10K of the present embodiment (lens body 12K).

Next, the lens bodies 12L which is a first modification of the lens body 12K of the eleventh embodiment will be described with reference to the drawings.

Figure 65A:
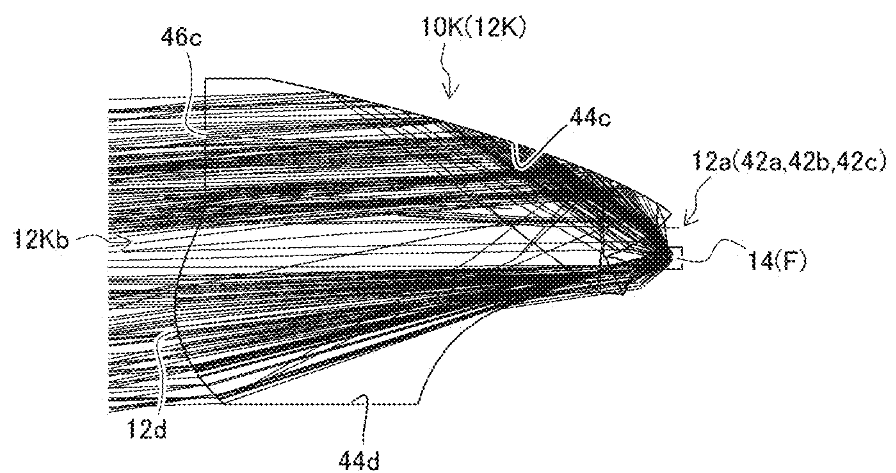
FIG. 65A is a longitudinal sectional view showing an optical path in which light is traced from a light source 14 which enters the inner lens member 12K of the eleventh embodiment.
Figure 65B:
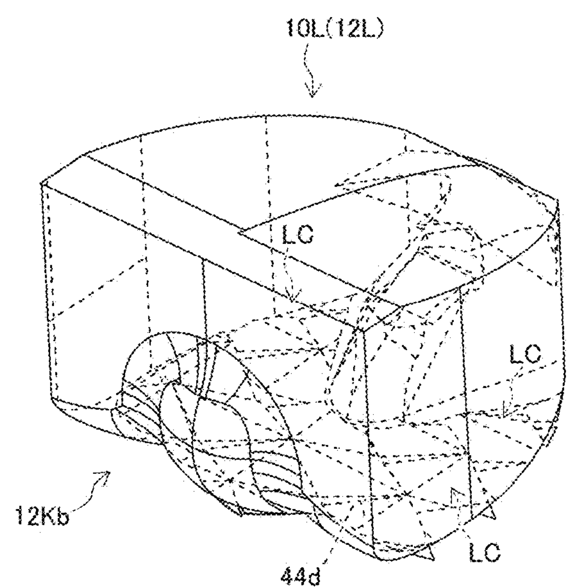
FIG. 65B is a perspective view of the lens body 12L (Modification).

FIG. 65A is a longitudinal sectional view showing an optical path in which light is traced from a light source 14 which enters the inner lens member 12K of the eleventh embodiment, FIG. 65B is a perspective view of a lens body 12L of the present modification.

The present inventors have confirmed by simulation, as shown in FIG. 65A, in the above-described lens body 12K of the eleventh embodiment, the light source is incident respective incident surfaces 12*a*, 42*a*, 42*b*, from 42*c* inside the lens body 12K 14 light from should not be incident on the lower surface 44*d*, i.e., lower surface 44*d* each light distribution pattern PSPOT, PMID, be a region that is not used in formation of PWIDE was found.

Lens body 12L of this modification, as shown in FIG. 65B, the respective light distribution patterns PSPOT, PMID, a plurality of lens cut LC square pyramid shape on the lower surface 44*d* not used for formation of PWIDE (e.g., elevation plane angle 30°, which corresponds to that imparted pitch 5 mm, the mountain height 3 mm). Otherwise, the same configuration as the lens body 12K of the eleventh embodiment. Incidentally, each of the lens cut LC is the same size, may be identical in shape, a different size may be different shapes. Further, it may be arranged aligned with, or may be randomly arranged.

According to this modification, in addition to the effects of the eleventh embodiment, further, it can achieve the following effects.

That is, in the light source 14 non-lit, when viewed from multiple directions, as if the lens body interior is looking with a "sparkling feeling" as if they were light-emitting lens body 12L and the vehicle lighting device equipped with this 10L it can be provided. As a result, the visibility of the light source 14 non-lit (vehicle lamp 10L, and hence, this is the visibility of the vehicle mounted) can be increased.

This, external light incident from the emission surface 12Kb inside the lens body 12L (e.g., sunlight) is various inside the lens body 12L (more lenses of quadrangular pyramid granted to the lower surface 44*d* cut LC, etc.) is by emitted in various directions from the re-emitting surface 12Kb is internally reflected in the direction (total reflection).

The present inventors have found that in order to confirm this effect, the lens body of the lens body 12L and Comparative Examples of the present modified example (lens body 12K of the eleventh embodiment) was actually manufactured, each of the emission surface 12Kb, luminance total (trade name: Prometric) was used.

Figure 66A:
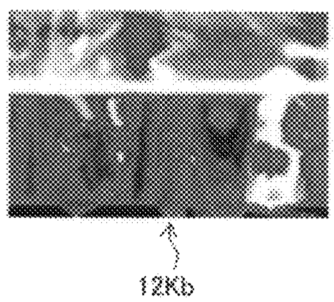
FIG. 66A to FIG. 66C illustrate diagram showing the lens body 12L (the modified example) measurement results of the emission surface 12Kb of (luminance distribution), FIG. 66D to FIG. 66F Comparative Example lens body (Eleventh Embodiment form of the lens body 12K) of the exit surface 12Kb of measurement results (which is a diagram showing the luminance distribution).
Figure 66B:
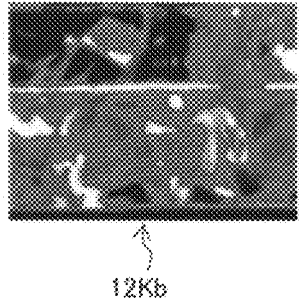
Figure 66C:
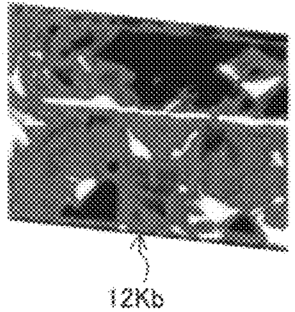
Figure 66D:
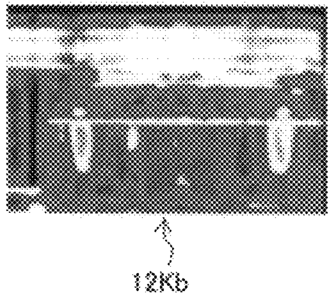
Figure 66E:
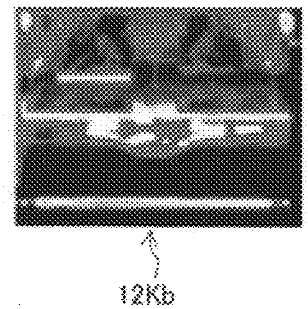
Figure 66F:
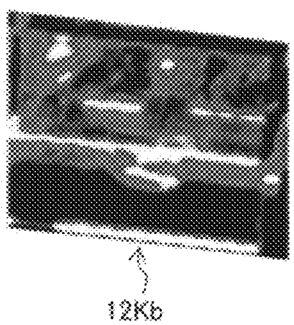

FIG. 66A to FIG. 66C are diagrams showing the measurement result of the emission surface 12Kb of the lens body 12L of the present modified example (luminance distribution), FIG. 66D to FIG. 66F are comparative examples lens body (eleventh lens body 12K embodiment) of the exit surface 12Kb measurements is a diagram representing the (luminance distribution). The numerical values in the figures represents a measurement position. For example, the left and right in FIG. 66A 0°, the upper and lower 0°, the left and right 0° measurement position of the measurement results shown in the figure (luminance distribution) with respect to the center of the exit surface 12Kb, the upper and lower 0° (i.e., It represents that it is a position directly in front). The same applies to other figures. Then, in each figure, black parts indicate that a relatively low luminance, the white portion represents that a relatively high brightness.

FIG. 66A With reference to-FIG. 66F, toward the lens body 12L of this modification having the lower surface 44*d* having a plurality of lens cut LC is applied in a quadrangular pyramid shape, compared with a flat lower surface 44*d* examples lens body of than (lens body 12K of the eleventh embodiment), that the white portion and the black portion over the exit surface 12Kb whole area is divided clearly, that is, is more of the lens body 12L of the present modification, comparative example from body of the lens (lens body 12K of the eleventh embodiment), in the light source 14 non-lit, when viewed from multiple directions, it is seen that a great looking though a as if it emits light "sparkling sensitive".

Incidentally, the lower surface 44*d* are four not limited to the plane including the plurality of lens cut LC pyramidal, internal reflection is incident from the exit surface 12Kb inside the lens body 12L in the external light various directions to reach the lower surface 44*d* (only needs to be configured as a surface which is again emitted from the emission surface 12Kb is totally reflected). For example, the lower face 44*d* is four to pyramid may be configured as a surface including a plurality of lens cut of polygonal pyramid shape other than the shape, constructed as a plane including the embossed surface or cut surface comprising a plurality of minute irregularities otherwise it may be.

Next, a second modified example in which lens body 12M of the lens body 12K of the eleventh embodiment will be described with reference to the drawings.

Figure 67A:
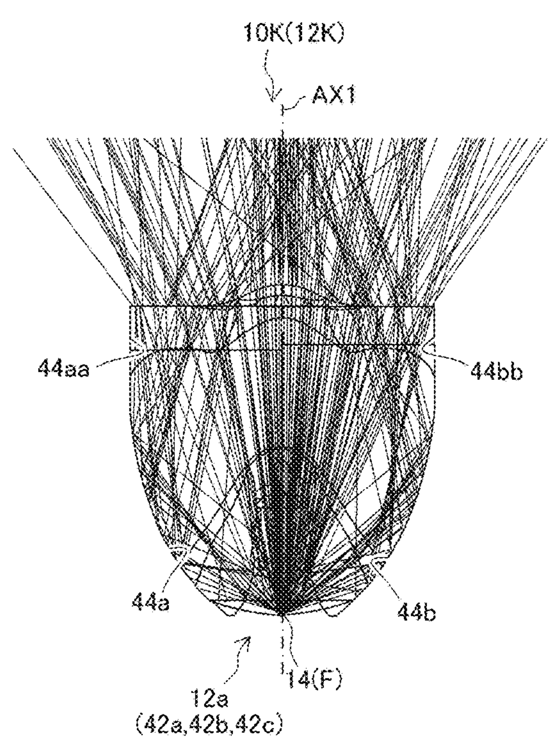
FIG. 67A is a cross-sectional view showing an optical path in which light is traced from a light source 14 which enters the inner lens member 12K of the eleventh embodiment.
Figure 67B:
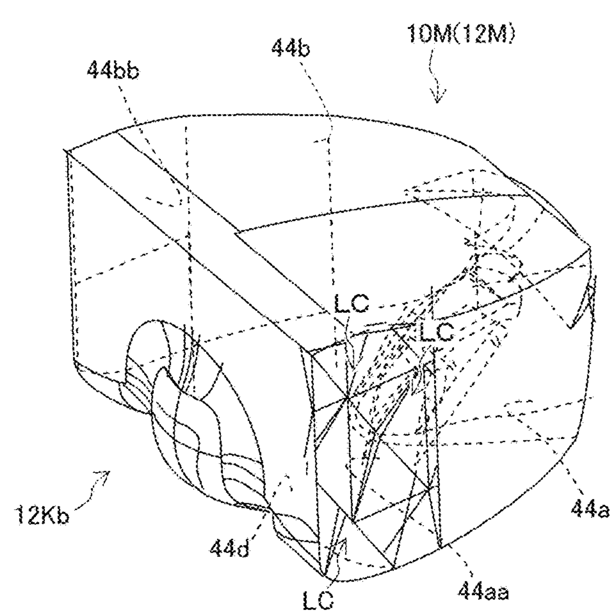
FIG. 67B is a perspective view of the lens body 12M (this modification).

FIG. 67A is transverse cross-sectional view showing an optical path in which light is traced from a light source 14 which enters the inner lens member 12K of the eleventh embodiment, FIG. 67B is a perspective view of a lens body 12M of this modification.

The present inventors have confirmed by simulation, as shown in FIG. 67A, in the above-described lens body 12K of the eleventh embodiment, the light source is incident respective incident surfaces 12*a*, 42*a*, 42*b*, from 42*c* inside the lens body 12K 14 light pair of left and right side faces 44*a* from, extends from the front edge of 44*b* forward (e.g., extending in a direction parallel to the reference axis AX 1) has been extended areas 44Aa, it does not enter the 44*bb*, i.e., the extension area 44Aa, 44*bb* each light distribution pattern PSPOT, PMID, be a region that is not used in formation of PWIDE was found.

Lens body 12M of this modification, as shown in FIG. 67B, the respective light distribution patterns PSPOT, PMID, not used in forming the PWIDE extension region 44*aa* and/or 44*bb* in a quadrangular pyramid shape of the plurality of lens cut LC (for example, elevation plane angle 30°, which corresponds to that imparted pitch 5 mm, the mountain height 3 mm). Otherwise, the same configuration as the lens body 12K of the eleventh embodiment. Incidentally, each of the lens cut LC is the same size, may be identical in shape, a different size may be different shapes. Further, it may be arranged aligned with, or may be randomly arranged.

According to this modification, in addition to the effects of the eleventh embodiment, further, it can achieve the following effects.

That is, in the light source 14 non-lit, when viewed from multiple directions, as if the lens body interior is looking with a "sparkling feeling" as if they were light-emitting lens body 12M and a vehicular lamp provided with the same 10M it can be provided. As a result, the visibility of the light source 14 non-lit (vehicular lamp 10M, in turn, this is the visibility of the vehicle mounted) can be increased.

This, external light incident from the emission surface 12Kb inside the lens body 12M (e.g., sunlight) is the lens body 12M internal (extension area 44Aa, a plurality of lens cut LC like quadrangular pyramid, issued to 44*bb*) is by emitted in various directions from the re-emitting surface 12Kb is internally reflected (total reflection) in various directions in.

Incidentally, the extension region 44Aa, 44*bb* are four not limited to the plane including the plurality of lens cut LC pyramidal, the extension region 44Aa is incident from the exit surface 12Kb inside the lens body 12M, various external light reaching the 44*bb* only needs to be configured as a surface which is again emitted from the emission surface 12Kb is the direction on the inner surface reflections (total internal reflection). For example, the extension region 44Aa, 44*bb* includes four to pyramid may be configured as a surface including a plurality of lens cut of polygonal pyramid shape other than the shape, embossed surface or cut surface comprising a plurality of minute irregularities otherwise it may be configured as a surface.

Figure 68A:
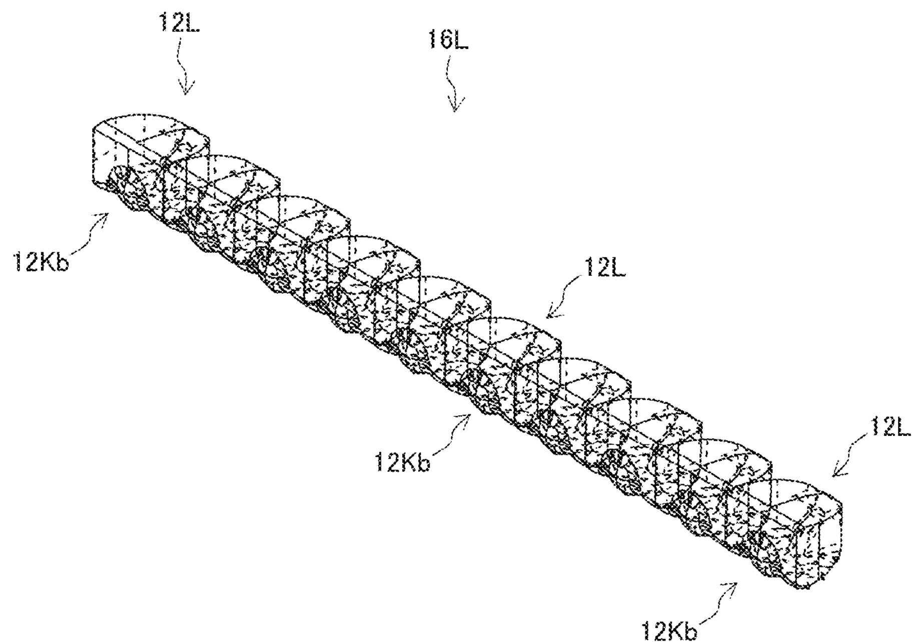
FIG. 68A is a perspective view of a lens conjugate 16L which a plurality of lens bodies 12L which is a first modification of the connection of the lens body 12K of the eleventh embodiment.

FIG. 68A is a perspective view of a lens conjugate 16L linked a plurality of lens body 12L is a first modification of the lens body 12K of the eleventh embodiment.

As shown in FIG. 68A, a lens conjugate 16L includes a plurality of lens body 12L. Lens conjugate 16L (plurality of lens bodies 12L) is in a mold, injecting a polycarbonate or a transparent resin such as acrylic, cooling, are integrally molded (injection molding) by solidifying. A plurality of lens body 12L each exit surface 12Kb is disposed in a line in the horizontal direction in a state adjacent to each other, constitute the exit surface groups of looking with a sense of unity extending horizontally in a line.

By using the lens conjugate 16L having the above structure, it is possible to construct a vehicle lamp appearance with a sense of unity extending horizontally in a line. The lens conjugate 16L is molded in a state of physical separation of a plurality of lens body 12L, it may be constructed by concatenating (held) by a holding member such as a lens holder (not shown).

Figure 68B:
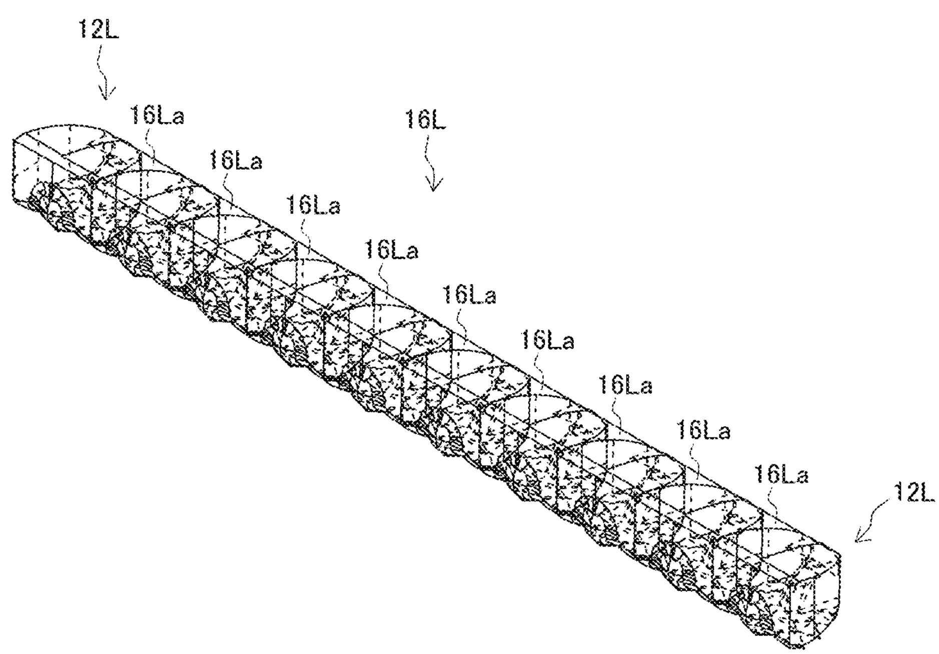
FIG. 68B is a perspective view of the lens conjugate 16L linked a plurality of lens body 12L is a first modification of the lens body 12K of the eleventh embodiment.

As shown in FIG. 68B, it may be pressurized meat 16La the gaps between each of the lens body 12L. For example, the lower surface 44*d* may block the gap between the lens body 12L each extend, or in the gaps between each of the lens body 12L, physically shaped additional lens unit as a separate member (the lower surface 44*d* similar additional lens part including the lower surface) may be arranged. Thus, even external light incident from this, the lens bodies 12L inside the bottom surface 44*d* (i.e., a plurality of lens cut LC) again from the exit surface 12Kb is internally reflected (total reflection) in different directions by the action of the results so that the emitted, it is possible to further enhance the above-mentioned “sparkling feeling”.

Next, the twelfth embodiment, the vehicle lamp 10R which camber angle is applied will be described with reference to the drawings.

Figure 69:
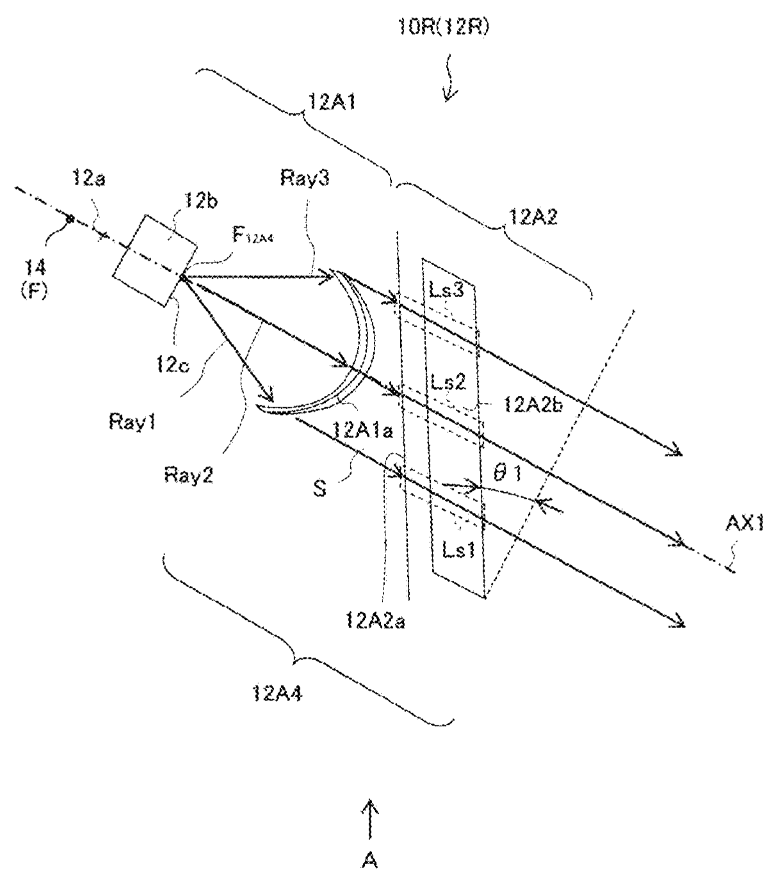
FIG. 69 is a top view of a camber angle vehicle lamp 10R granted the (primary optical surfaces only).
Figure 70A:
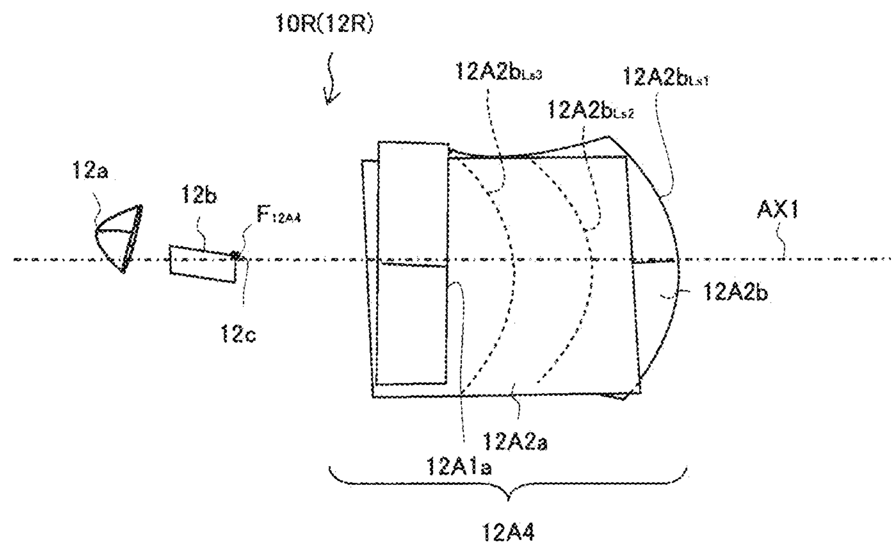
FIG. 70A is an arrow view of the vehicle lamp 10R (primary optical surfaces only), FIG. 70B illustrate vehicle lamp 10R (lens body 12R) from the direction of arrow A in FIG. 69.

FIG. 69 is a top view of a vehicle lamp 10R which camber angle is imparted (the main optical surfaces only), FIG. 70A is a side view (main optical surfaces only).

Vehicle lamp 10R of this embodiment, FIG. 69, as shown in FIG. 70A, the second lens portion 12A2 of the vehicle lamp 10A of the second embodiment, when viewed from the first reference axis AX1 those inclined to, i.e., correspond to those camber angle .theta.1 (e.g., θ1=30°) is applied.

Vehicle lamp 10R of the present embodiment (the lens body 12R), except the surface shape of the final exit plane 12A2*b* are different, the second lens portion 12A2 of the vehicle lamp 10A of the second embodiment, when viewed, first the same configuration as those inclined to the first reference axis AX 1.

In other words, the lens body 12R of the present embodiment includes a first lens portion 12A1 disposed in front of the light source 14, a second lens portion 12A2 disposed in front of the first lens portion 12A1, and the light source 14 forming light by being irradiated forward through the first lens portion 12A1 and the second lens portion 12A2 in this order, a predetermined light distribution pattern including a cutoff line on an upper edge (for example a light distribution pattern for low beam) of is constructed lens body so as to.

A first lens unit 12A1 and the second lens portion 12A2, as shown in FIG. 16, may be connected by a connecting portion 12A3, as shown in FIG. 25, molded in a state of being physically separated, it may be composed by concatenating the two (retained) by the holding member 18 such as a lens holder.

The first lens unit 12A1 includes a first lower reflecting surface 12*b* disposed between the rear end and the front end.

The distal end of the first lower reflection surface 12*b* includes a shade 12*c*.

The rear end portion of the first lens unit 12A1 includes a first entrance surface 12*a*.

The front end portion of the first lens unit 12A1 includes a first semi-cylindrical intermediate exit face 12A1*a* the cylinder axis extending in the vertical direction or substantially vertical direction (first exit surface).

The rear end portion of the second lens unit 12A2 includes a middle entrance surface 12A2*a* (second incidence plane).

The front end portion of the second lens portion 12A2 is, to the plane of the semicircular columnar cylinder axis extends in the horizontal direction (it can be said that the reference surface or the reference cylindrical surface), the camber angle .theta.1 (or, camber angle and slant angle) it includes a granted second semicylindrical end exit surface 12A2*b* (second output surface).

The first entrance surface 12*a*, the first lower reflection surface 12 *b*, the intermediate exit face 12A1*a*, intermediate the entrance surface 12A2*a* and final output surface 12A2*b* from the first entrance surface 12*a* from the light source 14 incident on the inside the first lens portion 12A1 light is internally reflected by the partial blocking light and the first lower reflection surface 12*b* by the shade 12*c* of the first lower reflection surface 12*b* of the light is emitted from the middle exit surface 12A1*a* the first lens portion 12A1 outside, further, emitted from the final exit surface 12A2*b* from the intermediate incident surface 12A2*a* enters inside the second lens portion 12A2, by being irradiated forward, cut-off line defined by the shade 12*c* of the first lower reflection surface 12*b* on the upper edge constitute a first optical system for forming a predetermined light distribution pattern, including.

Figure 72A:
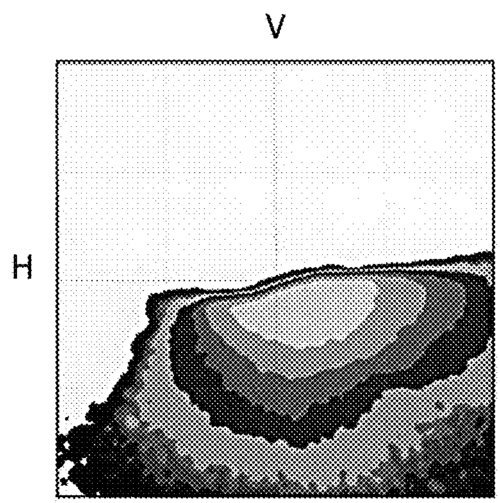
FIG. 72A is an example of a predetermined light distribution pattern formed on a virtual vertical screen by the vehicle lamp 10R (light distribution pattern for low beam)
Figure 72B:
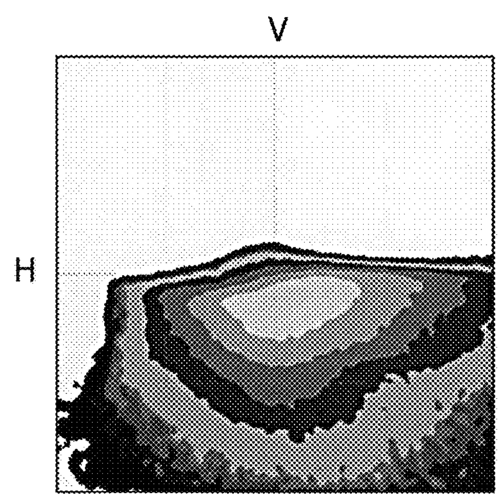
FIG. 72B is an example of a predetermined light distribution pattern formed on a virtual vertical screen (light distribution pattern for low beam) by the vehicle lighting device 10D of the fifth embodiment (Comparative Example).

The present inventors have confirmed by simulation, only the camber angle .theta.1, as shown in FIG. 72B, at least a portion (e.g., Fig light distribution pattern for low beam formed on a virtual vertical screen 72 near an intersection between the H line and the V line in FIG. 72B) was found to blurred it without condensing.

In order to improve this blur, intermediate exit surface 12A1*a*, intermediate plane of incidence 12A2*a* and final exit surface 12A2*b* constitutes a lens 12A4 focus F12A4 is set in the vicinity of shade 12*c*.

Therefore the focus F12A4 realize the lens 12A4 which is set near the shade 12*c*, the second lens unit 12A2 is configured as follows.

The second lens unit 12A2, of the plurality of light beams extending radially from the focal point F12A4, and includes a plurality of lens sectional light rays group included in each of the plurality of vertical surfaces is transmitted.

Figure 71A:
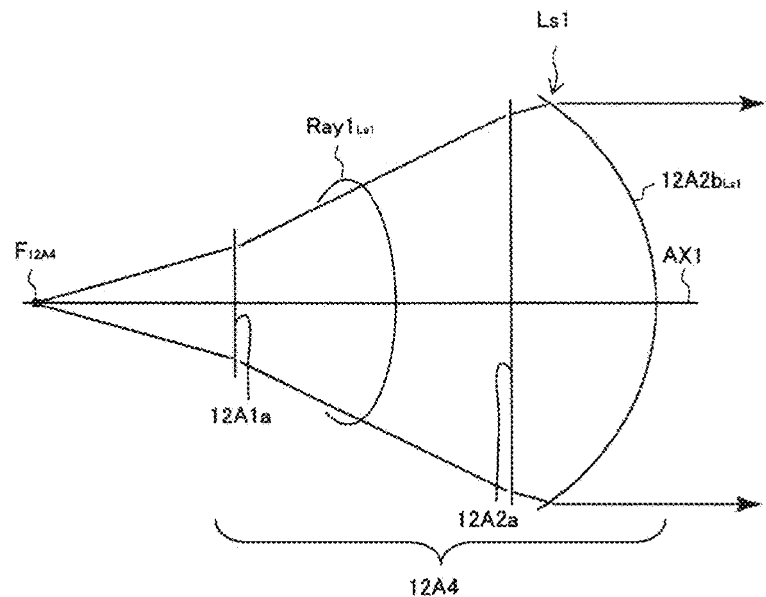
FIG. 71A is a lens sectional Ls1, longitudinal sectional view showing a state in which light beams Ray1Ls1 is transmitted contained in a vertical plane including the light RAY1.
Figure 71B:
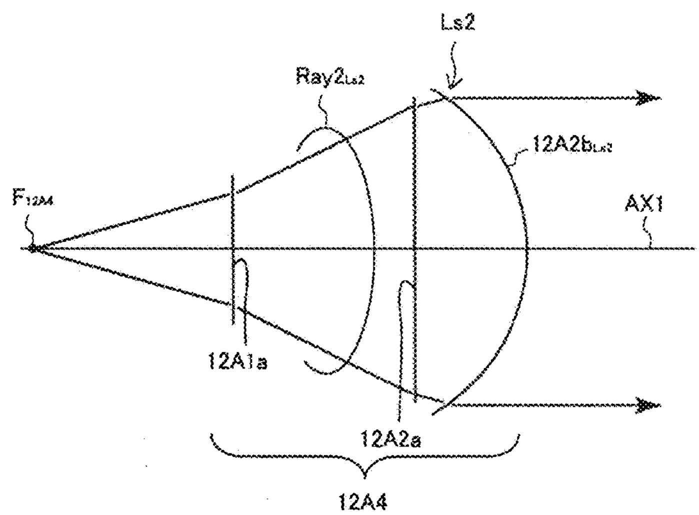
FIG. 71B is a lens sectional Ls2, vertical plane including the light Ray1 it is a longitudinal sectional view showing a state in which light beams Ray2Ls2 is transmitted contained.

For example, the second lens unit 12A2 includes a lens sectional Ls1 (see FIG. 69 and FIG. 71A) that transmits the light beams Ray1Ls1 contained in a vertical plane including the light RAY1, light beams included in the vertical plane including the light Ray2 Ray2Ls2 contains a lens sectional Ls2 which transmits (see FIG. 69 and FIG. 71B), the lens sectional Ls3 the light beams included in the vertical plane including the light beam Ray3 is transmitted (see FIG. 69). Of course, between the rays Ray1 and ray Ray2, and, because of the presence of an infinite number of light rays (not shown) between the light beam Ray2 and the ray Ray3, the second lens unit 12A2 is, other than the lens sectional Ls1 to Ls3 and it includes a plurality of (countless) lens sectional. FIG. 71A is a lens sectional Ls1, longitudinal sectional view showing a state in which light beams Ray1Ls1 is transmitted contained in a vertical plane including the light RAY1, FIG. 71B is a lens sectional Ls2, vertical plane including the light Ray1 it is a longitudinal sectional view showing a state in which light beams Ray2Ls2 is transmitted contained.

The plurality of lenses cross-section, respectively, light beams transmitted through the lens cross-section relates to a vertical direction, collimated ray group (i.e., parallel light beams with respect to the first reference axis AX 1) such that, the shape of the final exit plane 12A2*b* of the lens cross-section is adjusted.

For example, the lens section Ls1, as shown in FIG. 71A, ray group Ray1Ls1 transmitted through the lens section Ls1 is relates to the vertical direction, such that the collimated light beams, the final exit of the lens section Ls1 shape of the surface 12A2*b*Ls1 is adjusted. Similarly, lens sectional Ls2, as shown in FIG. 71B, light ray group Ray2Ls2 transmitted through the lens sectional Ls2 is relates to the vertical direction, such that the collimated light beams, the last of the lens section Ls2 shape of the emission surface 12A2*b*Ls2 is adjusted. Lens sectional Ls3, The same is true for multiple (countless) lens cross-section of the non-lens sectional Ls1 to Ls3.

The above configuration of the lens 12A4 (final emission surface 12A2*b*) can be designed by using a predetermined simulation software.

The final exit surface 12A2*b* a result of being adjusted as described above, rather than the face of the sectional shape uniform semicylindrical (perfect cylindrical surface), semi-cylindrical surface sectional shape is varied, specifically thereof include, the surface of the semicylindrical whose cross section varies according to the distance between the intermediate exit face 12A1*a* intermediate incidence surface 12A2*a* (or optical path length) (it can be said that the cylindrical-shaped surface).

Figure 70B:
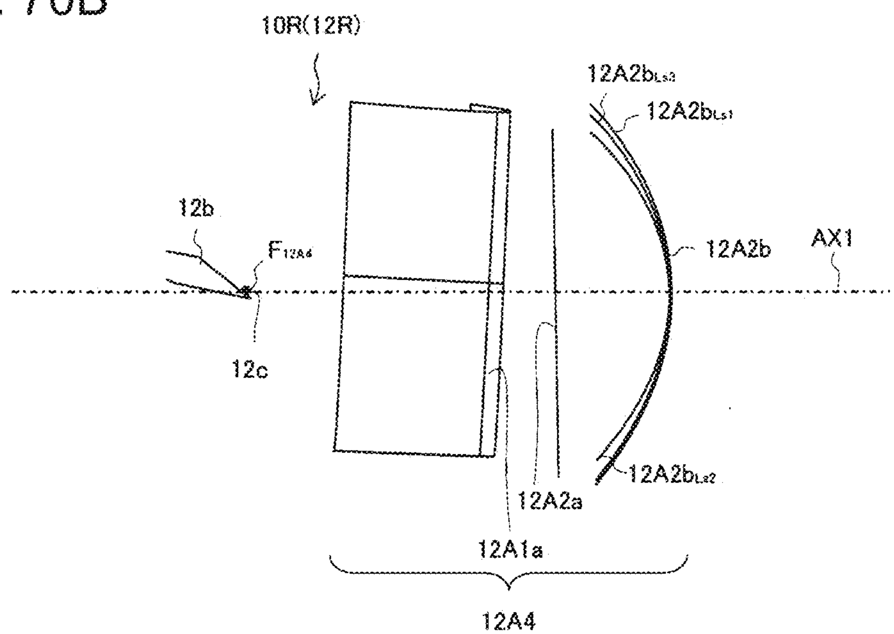

As described above, the final exit face 12A2*b*, not in terms of its sectional shape uniform semicylindrical, is a surface of a semicylindrical whose cross section varies, as shown in FIG. 70B, the variation width of the cross section because it is very small, the cross section is viewed as a plane of uniform semi-cylindrical. FIG. 70B is an arrow view as viewed vehicle lamp 10R (the lens body 12R) from the direction of arrow A in FIG. 69, the variation width of the cross-sectional shape of the lens body 12R (approximately vertical dimension is 20 mm) is It indicates that there is very little.

Then, the vehicle lamp 10R of the present embodiment (the lens body 12R) will be described that the above blur is improved.

FIG. 72A is a vehicle lamp 10R of the present embodiment (final emission surface 12A2*b* the semicylindrical surface on which the cross section varies) predetermined light distribution pattern (low-beam light distribution formed on a virtual vertical screen by examples of the pattern), FIG. 72B is a comparative example, the second lens portion 12A2 of the vehicle lighting device 10A of the second embodiment, in top view, which is inclined with respect to the first reference axis AX 1 (final emitting surface 12A2*b* is an example of a predetermined light distribution pattern formed on a virtual vertical screen (light distribution pattern for low beam) by cross-sectional surface shape uniform semi-cylindrical). Incidentally, both surface shape of the final exit plane 12A2*b* are the same except different points.

FIG. 72A and from a comparison between FIG. 72B, a predetermined light distribution pattern cross-sectional shape of the final exit plane 12A2*b* is formed by the vehicle lamp 10R of the present embodiment is a face of the semi-cylindrical varying (Write in FIG. 72A refer) is the final output surface sectional shape uniform semicylindrical surface of 12A2*b* (i.e., a predetermined light distribution pattern (Fig formed by Comparative example a complete cylindrical surface)) FIG. 72B refer) than sharp cutoff line (i.e., the center of the step portion becomes a cut-off line) appearing clearly, i.e., it can be seen that the above blur is improved.

The intermediate exit face 12A1*a* etc., group of rays emitted from the final exit surface 12A2*b* found (see FIG. 69) as collimated relates horizontally to the surface shape may be adjusted relates horizontally spreading as to (see FIG. 73), the surface shape may be adjusted. In the former case, the focused predetermined light distribution pattern (e.g., FIG. 72A see) can form, in the latter case, diffused predetermined light distribution pattern (e.g., FIG. 11B, the 11 (*c*)) can be formed. Of course, not limited to this, also by adjusting the surface shape of the first incidence plane 12*a*, it is possible to form a predetermined light distribution pattern or diffused predetermined light distribution pattern condensed.

Concept of the present embodiment, i.e., the blurring generated with the application of camber angle .theta.1, "a plurality of lenses cross-section, respectively, light beams transmitted through the lens cross-section relates to a vertical direction, collimated light beams (i.e., parallel light beams with respect to the first reference axis AX 1) so that the shape of the final exit plane 12A2*b* of the lens cross-section is adjusted. Idea of improving by applying "is not limited to the vehicle lamp 10A of the second embodiment (lens body 12A), every vehicle lamp having a lens body comprising a final exit surface 12A2*b* of semicylindrical it is possible to apply. For example, it can be applied to FIG. 28 vehicle lamp 20 shown in the vehicle lighting device 30 shown in FIG. 30, a vehicular lamp 10E shown in FIG. 36, a vehicle lamp 10J like shown in FIG. 46.

According to this embodiment, the intermediate exit face 12A1*a* (semicircular columnar shape extending in or substantially vertical direction cylindrical axis vertical plane), and a final output surface 12A2*b* the camber angle is imparted (the cylindrical axis in the horizontal direction in the lens body 12R comprising a semicylindrical surface) extending, to suppress the predetermined light distribution pattern formed on a virtual vertical screen (e.g., a light distribution pattern for low beam) is blurred to without condensing it can.

This intermediate exit face 12A1*a*, intermediate the entrance surface 12A2*a* and final output surface 12A2*b* is, constitutes a lens 12A4 focus F12A4 is set near the shade 12*c*, the second lens portion 12A2, extending radially from the focal point F12A4 of the plurality of light beams includes a plurality of lens sectional (such as Ls1 to Ls3) for transmitting the group of rays included in each of the plurality of vertical surfaces, a plurality of lenses cross-section, respectively, light beams transmitted through the lens cross-section relates to the vertical direction, so that the collimated light beams, is by the shape of the final exit plane 12A2*b* of the lens cross-section is adjusted.

Incidentally, the final emitting surface 12A2*b* a result of being adjusted as described above, the sectional shape uniform semicylindrical surface (perfect cylindrical surface), rather than semi-cylindrical surface whose cross section varies specifically, although the surface of the semicylindrical whose cross section varies according to the distance between the intermediate exit face 12A1*a* intermediate incidence surface 12A2*a* (or optical path length) (it can be said that the cylindrical-shaped surface), the variation width of the cross section because it is very small, the cross section is viewed as a plane of uniform semi-cylindrical.

Next, the thirteenth embodiment, the vehicle lamp 10S camber angle is applied will be described with reference to the drawings.

Figure 74:
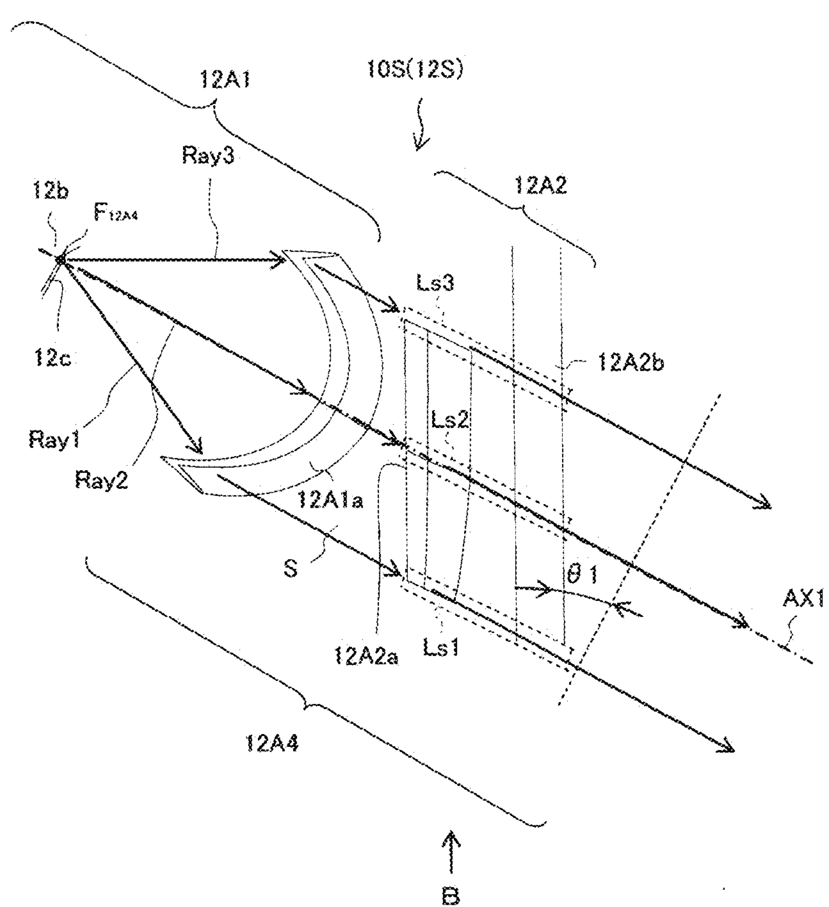
FIG. 74 is a top view of a camber angle vehicular lamp 10S granted the (primary optical surfaces only).
Figure 75A:
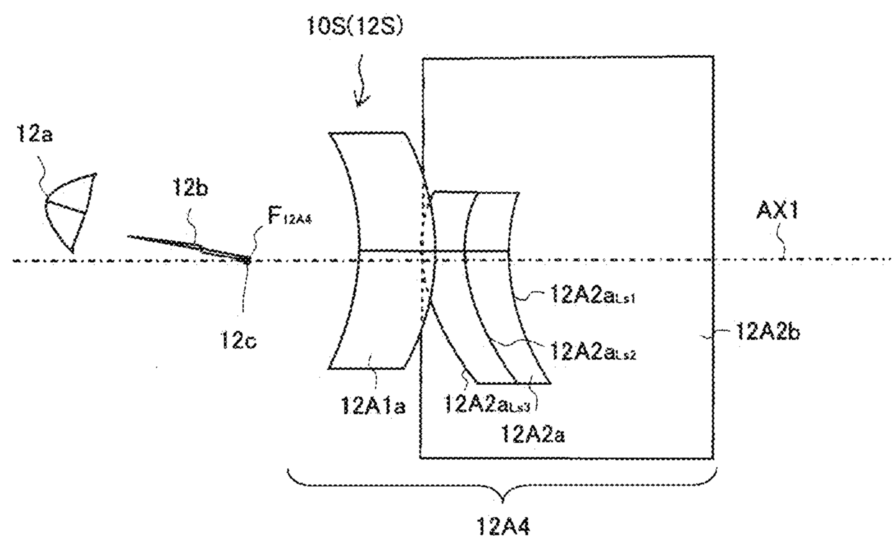
FIG. 75A is an arrow view of the side view of the vehicle lamp 10S (primary optical surfaces only)

FIG. 74 is a top view of a vehicle lamp 10S camber angle is imparted (the main optical surfaces only), FIG. 75A is a side view (main optical surfaces only).

Vehicle lamp 10S of the embodiment (the lens body 12S) is 74, as shown in FIG. 75A, although the same configuration as the vehicle lamp 10R of the twenty-third embodiment (lens body 12R), surface shape of the surface shape and the final exit surface 12A2*b* of the intermediate plane of incidence 12A2*a* is different.

In other words, the lens body 12S of the present embodiment includes a first lens portion 12A1 disposed in front of the light source 14, a second lens portion 12A2 disposed in front of the first lens portion 12A1, and the light source 14 forming light by being irradiated forward through the first lens portion 12A1 and the second lens portion 12A2 in this order, a predetermined light distribution pattern including a cutoff line on an upper edge (for example a light distribution pattern for low beam) of is constructed lens body so as to.

A first lens unit 12A1 and the second lens portion 12A2, as shown in FIG. 16, may be connected by a connecting portion 12A3, as shown in FIG. 25, molded in a state of being physically separated, it may be composed by concatenating the two (retained) by the holding member 18 such as a lens holder.

The first lens unit 12A1 includes a first lower reflecting surface 12*b* disposed between the rear end and the front end.

The distal end of the first lower reflection surface 12*b* includes a shade 12*c*.

The rear end portion of the first lens unit 12A1 includes a first entrance surface 12*a*.

The front end portion of the first lens unit 12A1 includes a first semi-cylindrical intermediate exit face 12A1*a* the cylinder axis extending in the vertical direction or substantially vertical direction (first exit surface).

The rear end portion of the second lens portion 12A2 is different from the above-described twenty-third embodiment, the plane of the semicircular columnar cylinder axis extends in the horizontal direction (it can be said that the reference surface or the reference cylindrical surface), the camber angle .theta.1 (or includes a second semi-cylindrical intermediate entrance surface 12A2*a* the camber angle and slant angle) is applied (second incident surface).

The front end portion of the second lens portion 12A2 is different from the above-described twenty-third embodiment, the camber angle .theta.1 (or, camber angle and slant angle) include the last exit surface 12A2*b* planar shape is attached (second output surface) there.

The first entrance surface 12*a*, the first lower reflection surface 12 *b*, the intermediate exit face 12A1*a*, intermediate the entrance surface 12A2*a* and final output surface 12A2*b* is, as in the twenty-third embodiment, the first lens unit from the first incident surface 12*a* 12A1 light is internally reflected by the partial blocking light and the first lower reflection surface 12*b* by the shade 12*c* of the first lower reflection surface 12*b* of the light from the light source 14 which enters the interior, the first lens from the middle exit surface 12A1*a* part emitted into 12A1 outside, further, emitted from the final exit surface 12A2*b* from the intermediate incident surface 12A2*a* enters inside the second lens portion 12A2, by being irradiated forward, the first lower reflection surface 12*b* on the upper edge constitute a first optical system for forming a predetermined light distribution pattern including a cutoff line that is defined by the shade 12*c*.

The present inventors have confirmed by simulation, only the camber angle .theta.1, similarly to the twenty-third embodiment, at least a portion of the light distribution pattern for low beam formed on a virtual vertical screen (e.g., same as FIG. 72B, near an intersection of the H line and the V line) it was found to be blurred without condensing.

To improve this blurring, the intermediate exit face 12A1*a*, intermediate the entrance surface 12A2*a* and final output surface 12A2*b* is, as in the twenty-third embodiment, constitutes a lens 12A4 focus F12A4 is set near the shade 12*c*.

Therefore the focus F12A4 realize the lens 12A4 which is set near the shade 12*c*, the second lens unit 12A2 is configured as follows.

The second lens unit 12A2, of the plurality of light beams extending radially from the focal point F12A4, and includes a plurality of lens sectional light rays group included in each of the plurality of vertical surfaces is transmitted.

Figure 76A:
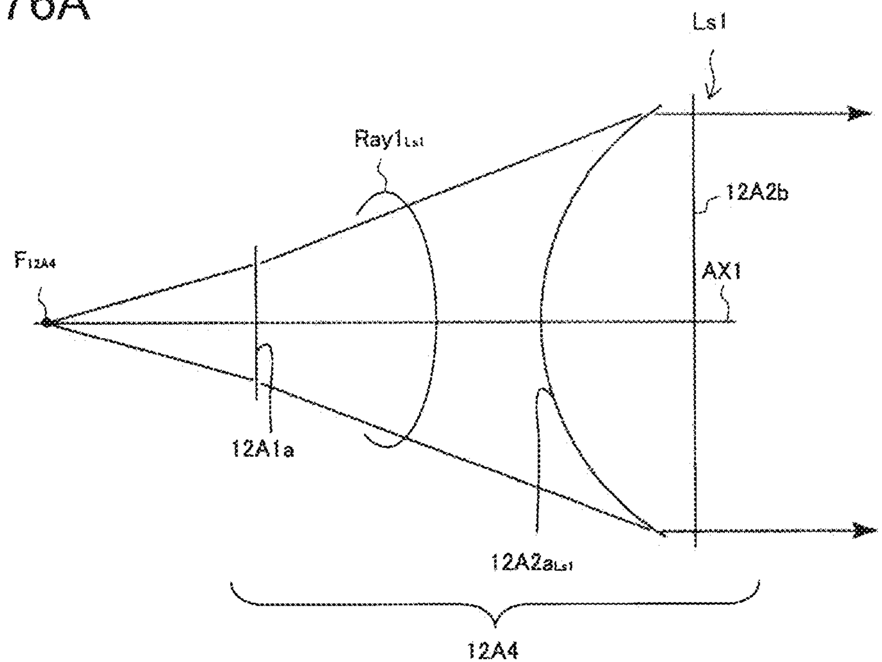
FIG. 76A is a lens sectional Ls1, light ray group RAY1 contained in a vertical plane including the light RAY1 Ls1 longitudinal sectional view showing a state in which is transmitted.
Figure 76B:
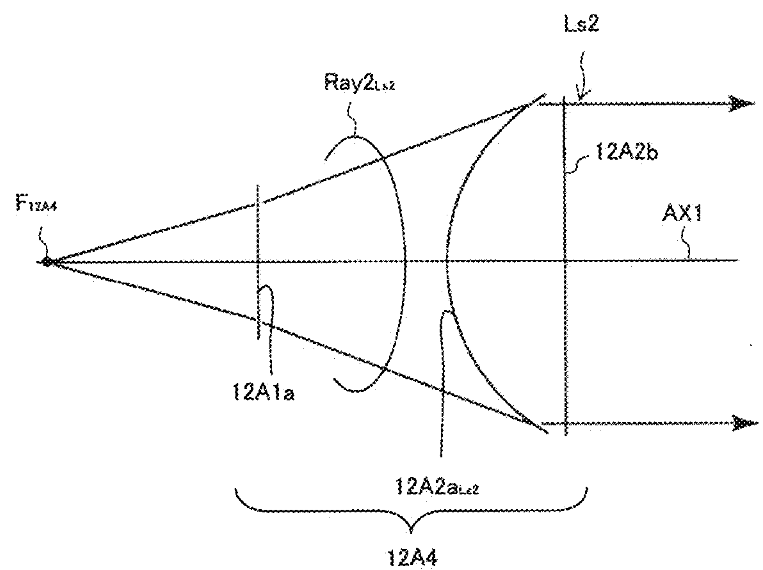
FIG. 76B is a lens sectional Ls2, the vertical plane including the light Ray2 ray group Ray2 containing Ls2 is a longitudinal sectional view showing a state of transmission.
Figure 77:
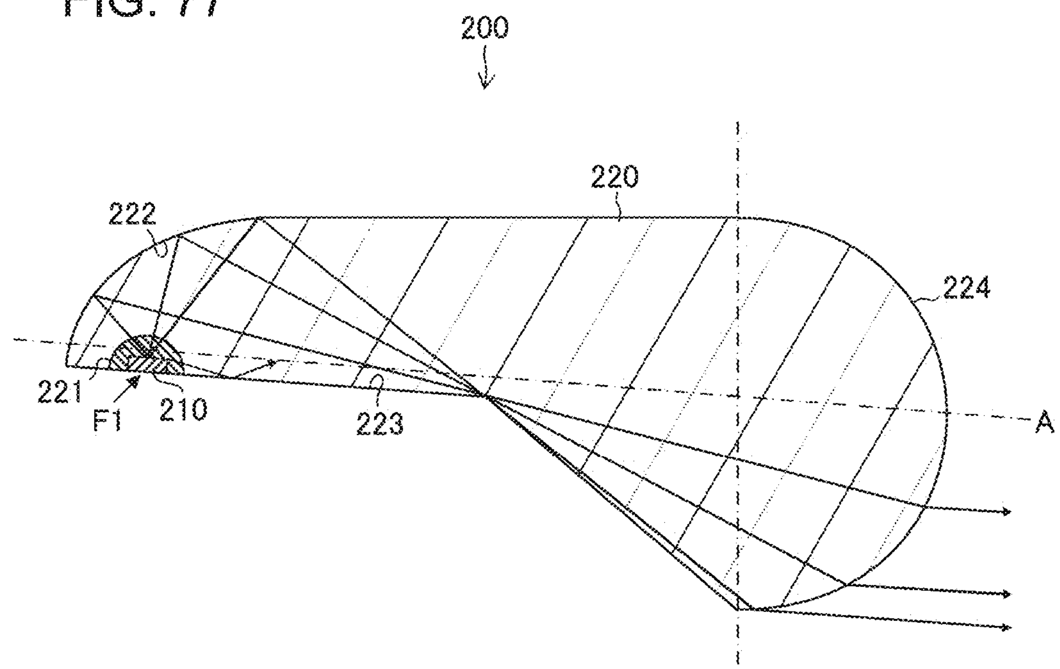
FIG. 77 is a longitudinal sectional view of the vehicular lamp 200 described in Patent Document 1.
Figure 78:
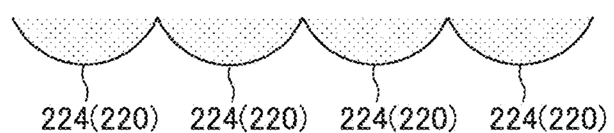
FIG. 78 is a top view showing a state arranged in a row to a plurality of the vehicle lamp 200 (the plurality of lens body 220).
Figure 79:
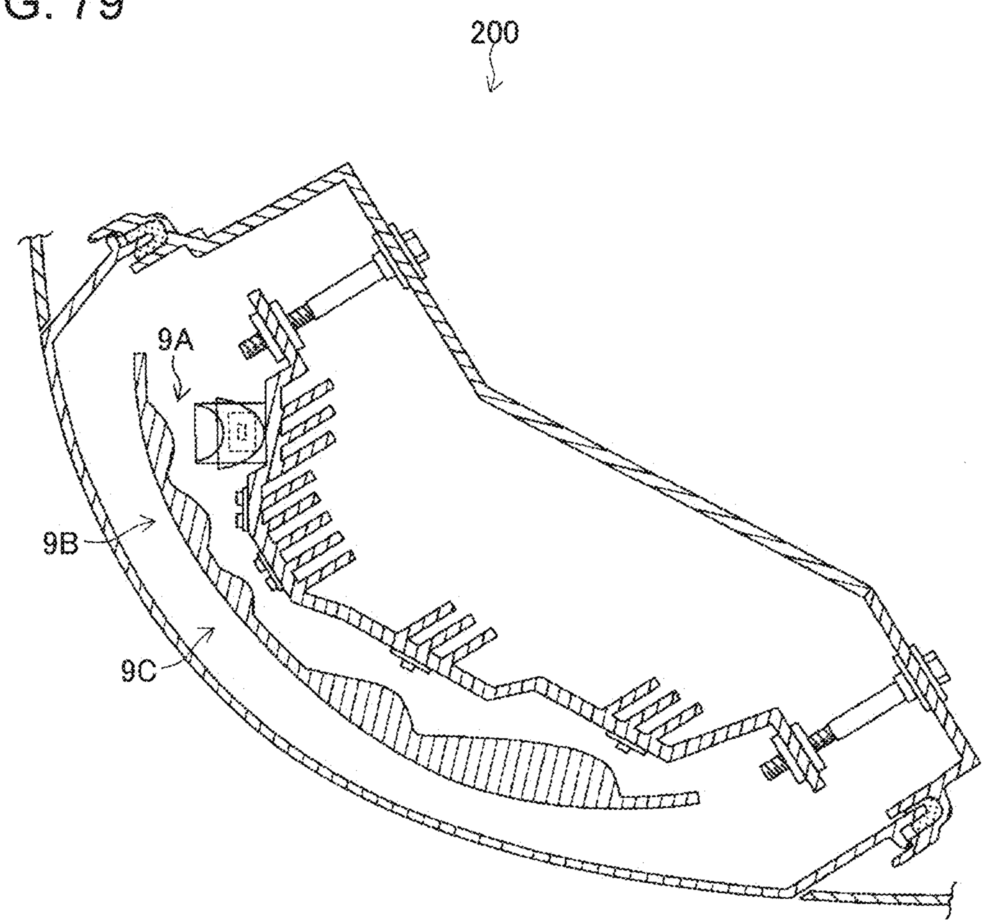
FIG. 79 is a top view of the vehicular lamp 200 described in Patent Document 2.
Figure 80A:
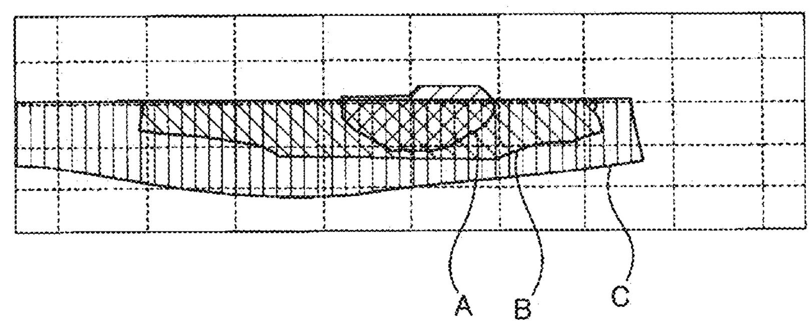
FIG. 80A is an example of light distribution pattern for low beam formed by the vehicle lamp 20 (combined light distribution pattern).
Figure 80B:
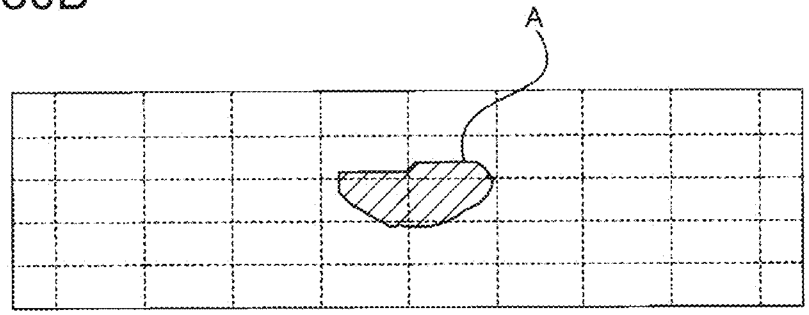
FIG. 80B is an example of a partial light distribution pattern A constituting FIG. 80A.
Figure 80C:
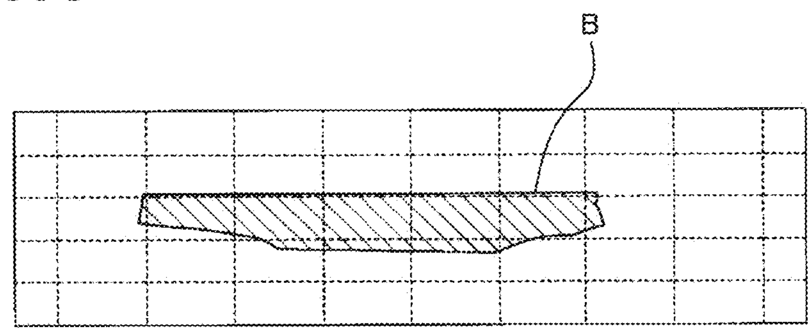
FIG. 80C is an example of a partial light distribution pattern B constituting FIG. 80A.
Figure 80D:
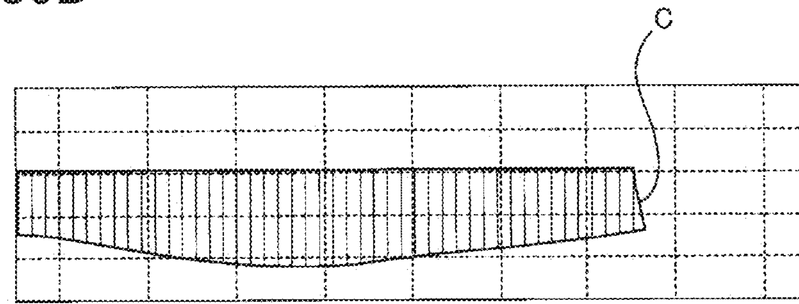
FIG. 80D is an example of a partial light distribution pattern C that make up FIG. 80A.
Figure 81:
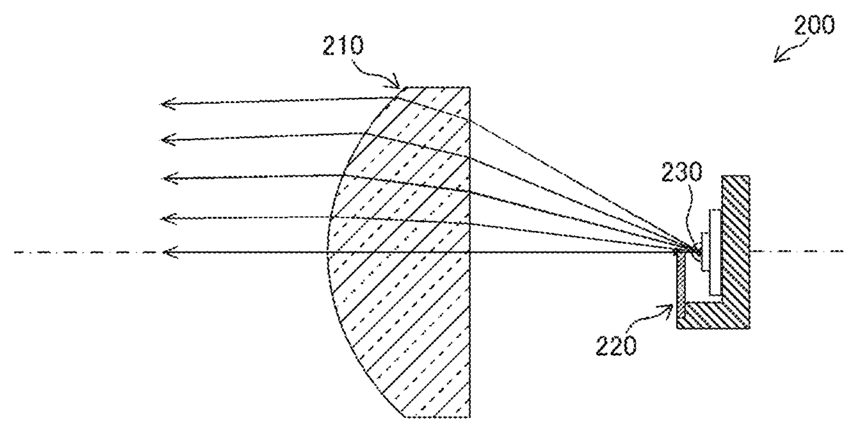
FIG. 81 is a side view of the vehicular lamp 200 described in Patent Document 3.
Figure 82:
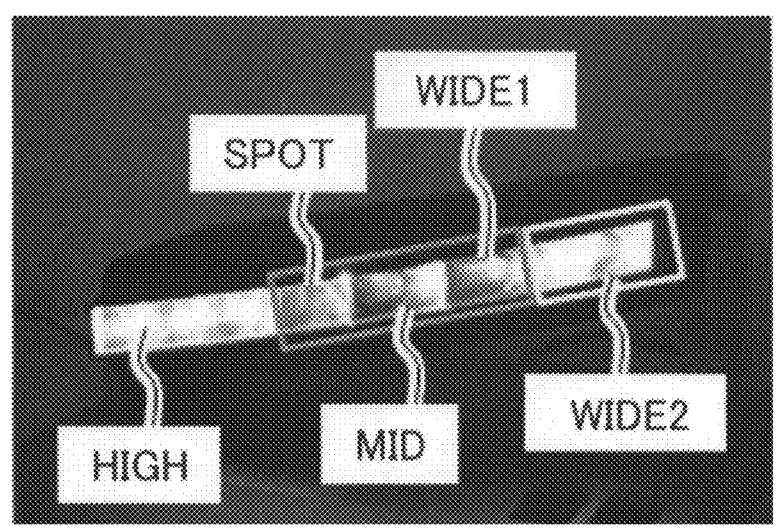
FIG. 82 is a in a line (linearly) arranged each lamp unit SPOT, MID, WIDE1, WIDE2 view showing a state occurring with a bright portion and dark portion in the (each lens body) (photograph).
Figure 83:
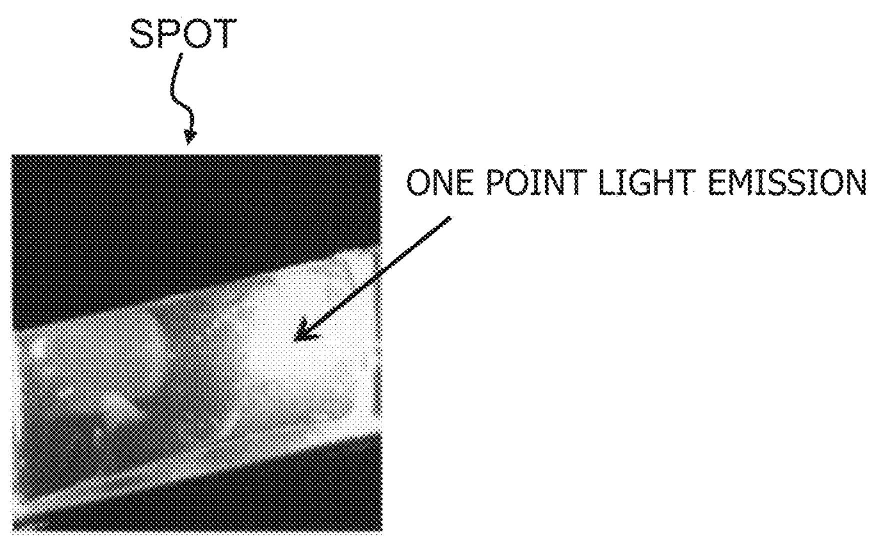
FIG. 83 is front view of the lamp unit SPOT representing a state in which the one point light emitting (light point) (lens body) (photo).

For example, the second lens unit 12A2 includes a lens sectional Ls1 (see FIGS. 74 and 76A) that transmits the light beams Ray1Ls1 contained in a vertical plane including the light RAY1, light beams included in the vertical plane including the light Ray2 Ray2Ls2 contains a lens sectional Ls2 for transmitting (see FIGS. 74 and 76B), the lens sectional Ls3 the light beams included in the vertical plane including the light beam Ray3 is transmitted (see FIG. 74). Of course, between the rays Ray1 and ray Ray2, and, because of the presence of an infinite number of light rays (not shown) between the light beam Ray2 and the ray Ray3, the second lens unit 12A2 is, other than the lens sectional Ls1 to Ls3 and it includes a plurality of (countless) lens sectional. FIG. 76A is a lens sectional Ls1, longitudinal sectional view showing a state in which light beams Ray1Ls1 is transmitted contained in a vertical plane including the light RAY1, FIG. 76B is a lens sectional Ls2, vertical plane including the light Ray2 it is a longitudinal sectional view showing a state in which light beams Ray2Ls2 is transmitted contained.

The plurality of lenses cross-section, respectively, light beams transmitted through the lens cross-section relates to a vertical direction, collimated ray group (i.e., parallel light beams with respect to the first reference axis AX 1) such that the shape of the intermediate incident surface 12A2*a* of the lens cross-section is adjusted.

For example, the lens section Ls1, as shown in FIG. 76A, ray group Ray1Ls1 transmitted through the lens section Ls1 is relates to the vertical direction, such that the collimated light beams, the intermediate incidence of the lens section Ls1 shape of the surface 12A2*a*Ls1 is adjusted. Similarly, lens sectional Ls2, as shown in FIG. 76B, light ray group Ray2Ls2 transmitted through the lens sectional Ls2 is relates to the vertical direction, such that the collimated light beams, the intermediate of the lens section Ls2 the shape of the incident surface 12A2*a*Ls2 is adjusted. Lens sectional Ls3, The same is true for multiple (countless) lens cross-section of the non-lens sectional Ls1 to Ls3.

The above configuration of the lens 12A4 (intermediate incident surface 12A2*a*) can be designed by using a predetermined simulation software.

Intermediate incident surface 12A2*a* a result of being adjusted as described above, rather than the face of the sectional shape uniform semicylindrical (perfect cylindrical surface), semicylindrical surface sectional shape is varied, specifically thereof include, the surface of the semicylindrical whose cross section varies according to the distance between the intermediate exit face 12A1*a* intermediate incidence surface 12A2*a* (or optical path length) (it can be said that the cylindrical-shaped surface).

Figure 75B:
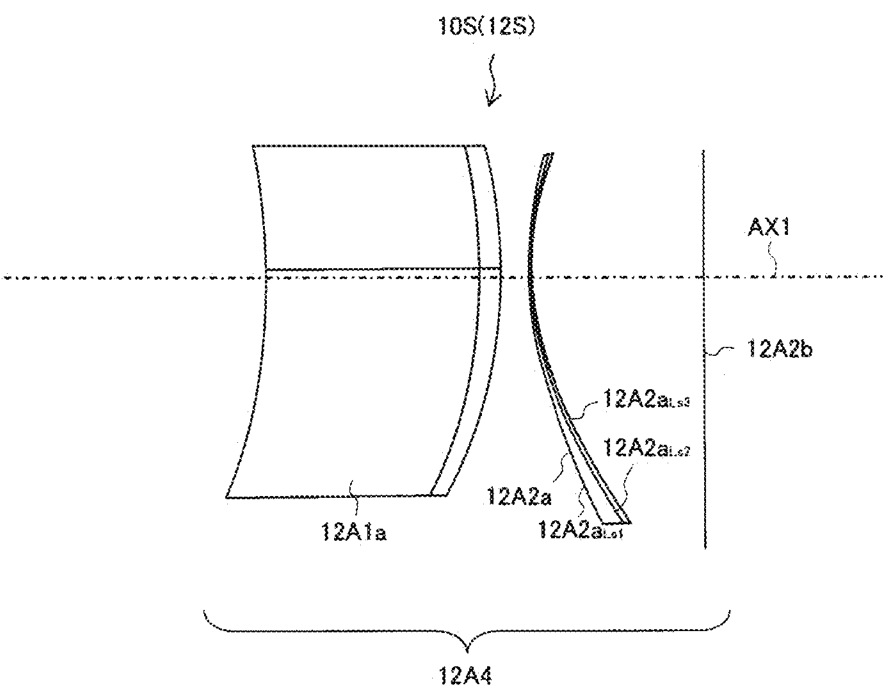
FIG. 75B illustrates vehicle lamp 10S (lens body 12S) from an arrow B direction in FIG. 74.

As described above, the intermediate incident surface 12A2*a*, not in terms of its sectional shape uniform semicylindrical, is a surface of a semicylindrical whose cross section varies, as shown in FIG. 75B, the variation width of the cross section because it is very small, the cross section is viewed as a plane of uniform semi-cylindrical. FIG. 75B is an arrow view as viewed vehicular lamp 10S (the lens body 12S) from an arrow B direction in FIG. 74, the variation width of the cross-sectional shape of the lens body 12S (approximately vertical dimension is 20 mm) is It indicates that there is very little.

By vehicle lamp 10S of the embodiment (the lens body 12S), as in the twelfth embodiment, the blur is improved.

Figure 73:
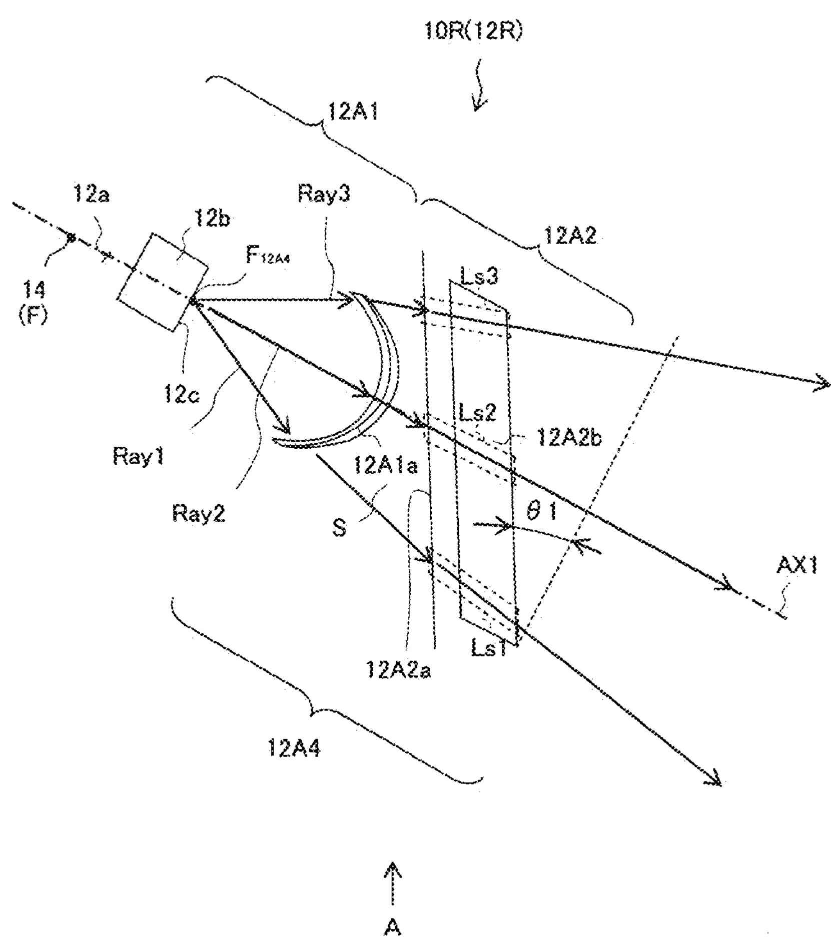
FIG. 73 is a top view of a camber angle vehicle lamp 10R is granted (Modification) (main optical surfaces only).

The intermediate exit face 12A1*a* etc., group of rays emitted from the final exit surface 12A2*b* found (see FIG. 74) as collimated relates horizontally to the surface shape may be adjusted, similar to FIG. 73 horizontal direction so as to diffuse relates, may be the surface shape is adjusted. In the former case, the focused predetermined light distribution pattern (e.g., FIG. 72A see) can form, in the latter case, diffused predetermined light distribution pattern (e.g., FIG. 11B, the 11 (*c*)) can be formed. Of course, not limited to this, also by adjusting the surface shape of the first incidence plane 12*a*, it is possible to form a predetermined light distribution pattern or diffused predetermined light distribution pattern condensed.

Concept of the present embodiment, i.e., the blurring generated with the application of camber angle .theta.1, "a plurality of lenses cross-section, respectively, light beams transmitted through the lens cross-section relates to a vertical direction, collimated light beams (i.e., parallel light beams with respect to the first reference axis AX 1) so that the shape of the intermediate incident surface 12A2*a* of the lens cross-section is adjusted. Idea of improving by applying "may be applied to any vehicle lamp having a lens body comprising a final exit surface 12A2*b* planar shape.

According to this embodiment, the intermediate exit face 12A1*a* (surface of the semicircular columnar cylinder axis extending in the vertical direction or substantially vertical direction), and a final output surface 12A2*b* the camber angle is applied to (the plane of the planar shape) in the lens body 12S including a predetermined light distribution pattern formed on a virtual vertical screen (e.g., a light distribution pattern for low beam) can be prevented from blurring without condensing.

This intermediate exit face 12A1*a*, intermediate the entrance surface 12A2*a* and final output surface 12A2*b* is, constitutes a lens 12A4 focus F12A4 is set near the shade 12*c*, the second lens portion 12A2, extending radially from the focal point F12A4 of the plurality of light beams includes a plurality of lens sectional (such as Ls1 to Ls3) for transmitting the group of rays included in each of the plurality of vertical surfaces, a plurality of lenses cross-section, respectively, light beams transmitted through the lens cross-section relates to the vertical direction, so that the collimated light beams, is by the shape of the intermediate incident surface 12A2*a* of the lens cross-section is adjusted.

The intermediate incident surface 12A2*a* a result of being adjusted as described above, the sectional shape uniform semicylindrical surface (perfect cylindrical surface), rather than semi-cylindrical surface whose cross section varies specifically, although the surface of the semicylindrical whose cross section varies according to the distance between the intermediate exit face 12A1*a* intermediate incidence surface 12A2*a* (or optical path length) (it can be said that the cylindrical-shaped surface), the variation width of the cross section because it is very small, the cross section is viewed as a plane of uniform semi-cylindrical. (Note 1) To achieve the above object, it comprises a first lens unit disposed in front of the light source, and a second lens unit which is disposed in front of said first lens portion, light from the light source, the first by being irradiated forward through the lens unit and the second lens unit in this order, in the fabricated lens body so as to form a predetermined light distribution pattern including a cutoff line on an upper edge, said first lens unit of which comprises a first lower reflective surface disposed between the rear end and the front end portion, the distal end portion of the first lower reflection surface includes a shade, the rear end portion of the first lens unit, comprises a first entrance surface, the front end portion of the first lens unit includes a middle exit surface of the first semicircular columnar cylinder axis extending in the vertical direction or substantially vertical direction, a rear end of said second lens unit parts comprises an intermediate incident surface, a front end portion of the second lens unit, to the plane of the semicircular columnar cylinder axis extends in the horizontal direction, the camber angle or camber angle and slant angle is applied includes a final exit surface of the second semi-cylindrical, said first entrance surface, the first lower reflection surface, said intermediate exit surface, said intermediate incident surface and the final exit surface, wherein from said first entrance surface and the 1 lens unit light internally reflected by the partial blocking light and the first lower reflection surface by the shade of the first lower reflection surface of the light from the light source incident on the inside, said from the intermediate output surface the first lens unit is emitted to the outside, further from said intermediate incident surface incident within said second lens portion is emitted from said final exit surface, by being irradiated forward, the first lower reflector the upper edge constitute a first optical system for forming a predetermined light distribution pattern including a cutoff line that is defined by the shade of a surface, said intermediate exit surface, said intermediate incident surface and the final exit surface, around the focal point is the shade set the lens constitutes the said second lens unit, the one of the plurality of light beams extending radially from the focal point, comprising a plurality of lens sectional light rays group included in each of the plurality of vertical surfaces is transmitted It said plurality of lens sectional, respectively the light beams transmitted through the lens sectional relates vertical direction, so that the collimated light beams, that shape of the final exit surface of the lens section is adjusted and features.

According to the invention described in Appendix 1, (the plane of the semicircular columnar cylinder axis extending in the vertical direction or substantially vertical direction) middle exit surface, and the final exit surface camber angle is imparted (cylinder axis horizontal in the lens body comprising a semi-cylindrical surface) that extends in a predetermined light distribution pattern formed on a virtual vertical screen can be prevented from blurring without condensing.

This intermediate output surface, intermediate the entrance surface and the final exit surface, focus constitute the set lens shade near the second lens unit, among the plurality of light beams extending radially from the focal point, a plurality includes a plurality of lenses cross-section light beams is transmitted contained in a vertical plane respective plurality of lenses cross-section, so that each light ray group of transmitted through the lens sectional relates vertical direction, the collimated light beams, is by the shape of the final exit surface of the lens section is adjusted.

Incidentally, the final exit surface, the results have been adjusted as described above, rather than the face of the sectional shape uniform semicylindrical (perfect cylindrical surface), semicylindrical surface sectional shape is varied, specifically, although the surface of the semicylindrical whose cross section varies according to the distance between the intermediate exit face and the intermediate incident surface (or optical path length) (it can be said that the cylindrical-shaped surface), the cross-section since the fluctuation width of the shape is negligible, their cross section is viewed as a semi-cylindrical surface of uniform. (Note 2) A first lens unit disposed in front of the light source, the second lens unit which is disposed in front of the first lens unit, provided with light from said light source, said first lens unit and said second lens by being emitted forward pass through the parts in this order, in the fabricated lens body so as to form a predetermined light distribution pattern including a cutoff line on an upper edge, a rear end portion of said first lens portion and the front portion the first has a lower reflecting surface, the distal end portion of the first lower reflecting surface arranged between the includes a shade, the rear end portion of the first lens unit includes a first entrance surface, the front end portion of the first lens unit includes a middle exit surface of the first semicircular columnar cylinder axis extending in the vertical direction or substantially vertical direction, a rear end portion of the second lens unit, the cylindrical axis is horizontal for semi-cylindrical surface extending in the direction, the camber angle, or includes an intermediate incident surface of the second semi-cylindrical camber angle and slant angle is applied, the front end portion of the second lens unit, camber angle, or comprises a final exit surface of the planar shape of the camber angle and slant angle is applied, the first incident surface, wherein the first lower reflection surface, said intermediate exit surface, said intermediate incident surface and said final output surface is internally reflected by the light shielding light and the first lower reflection surface part by the shade of the first lower reflection surface of the light from the light source incident on the inside of the first lens unit from said first entrance surface light is, the emitted from the middle exit surface in the first lens unit outside, further, the incident from the intermediate incident surface inside the second lens portion is emitted from said final exit surface, to be emitted forward Accordingly, constitute a first optical system for forming a predetermined light distribution pattern including a cutoff line that is defined by the shade of the upper edge first lower reflecting surface, said intermediate exit surface, said intermediate entrance surface and the final exit surface constitutes a lens focal point is set in the shade near the second lens unit, of the plurality of light beams extending radially from the focal point, light rays included in each of the plurality of vertical plane includes a plurality of lenses cross section group is transmitted, the plurality of lenses cross-section, respectively, light beams transmitted through the lens cross-section relates to a vertical direction, such that the collimated light beams, the intermediate incidence of the lens section wherein the shape of the surface is adjusted.

According to the invention according to Appendix 2, (semicylindrical surface extending cylinder axis in the vertical direction or substantially vertical direction) middle exit surface, and the final exit surface camber angle is applied (the surface of the planar shape) in the lens comprising a predetermined light distribution pattern formed on a virtual vertical screen can be prevented from blurring without condensing.

This intermediate output surface, intermediate the entrance surface and the final exit surface, focus constitute the set lens shade near the second lens unit, among the plurality of light beams extending radially from the focal point, a plurality includes a plurality of lenses cross-section light beams is transmitted contained in a vertical plane respective plurality of lenses cross-section, so that each light ray group of transmitted through the lens sectional relates vertical direction, the collimated light beams, is by the shape of the intermediate entrance surface of the lens section is adjusted.

The intermediate plane of incidence, the results have been adjusted as described above, rather than the face of the sectional shape uniform semicylindrical (perfect cylindrical surface), semicylindrical surface sectional shape is varied, specifically, although the surface of the semicylindrical whose cross section varies according to the distance between the intermediate exit face 12A1*a* intermediate incidence surface 12A2*a* (or optical path length) (it can be said that the cylindrical-shaped surface), since the variation width of the cross section is very small, the cross section is viewed as a plane of uniform semi-cylindrical.

The present invention may also be specified as follows. (Note 3) Note 1 or 2 lens body and the vehicle lighting device provided with a light source according to.

Each numerical values shown in the above embodiments and modifications are merely examples all can be used and different appropriate values.

The above-described embodiments are merely illustrative in all respects. The present invention by these descriptions is not intended to be interpreted restrictively. The present invention may be embodied in other various forms without departing from its spirit or essential characteristics.

The invention claimed is:

1. A vehicular headlamp comprising:

a light source;

a lens body comprising a first lens unit and a second lens unit, the lens body being configured such that light from the light source enters the first lens unit through a first entry surface of the first lens unit, exits through a first exit surface of the first lens unit, further enters the second lens unit through a second entry surface of the second lens unit, then exits through a second exit surface of the second lens unit, and is irradiated forward, so as to form a predetermined light distribution pattern, the first exit surface being a surface configured to condense the light from the light source, which exits through the first exit surface, in a first direction, and being configured as a semicircular cylindrical surface, and the second exit surface being a surface configured to condense the light from the light source, which exits through the second exit surface, in a second direction which is orthogonal to the first direction, and being configured as a semicircular cylindrical surface, wherein the predetermined light distribution pattern which includes a cut-off line defined on an upper edge by a shade is formed by light from the light source entering the first lens unit through a first entry surface of the first lens unit, exiting through a first exit surface of the first lens unit after being partially shielded by the shade of the first lens unit, further entering the second lens unit through a second entry surface of the second lens unit, then exiting through a second exit surface of the second lens unit, and being irradiated forward.

2. The vehicular headlamp according to claim 1, wherein the lens body is a lens body which has a shape along a first reference axis extending in the horizontal direction, the first lens unit includes the first entry surface, a reflection surface, the shade and the first exit surface, the second lens unit includes the second entry surface and the second exit surface, the first entry surface, the reflection surface, the shade, the first exit surface, the second entry surface and the second exit surface are disposed in this order along the first reference axis, the first entry surface is a surface through which the light from the light source, disposed in the vicinity of the first entry surface, is refracted and enters the first lens unit, and which is configured such that the light from the light source, which entered the first lens unit, is condensed in a direction closer to a second reference axis at least in the vertical direction, the second reference axis passing through the center of the light source and a point in the vicinity of the shade and inclined forward and diagonally downward with respect to the first reference axis, the reflection surface extends forward from the lower edge of the first entry surface, and the shade is formed in a front end of the reflection surface.

3. The vehicular headlamp according to claim 2, wherein the lens body includes the first lens unit, the second lens unit, and a connecting unit which connects the first lens unit and the second lens unit, and the connecting unit connects the first lens unit and the second lens unit in a state of forming a space surrounded by the first exit surface, the second entry surface and the connecting unit.

4. The vehicular headlamp according to claim 3, wherein the lens body is a lens body integrally molded by injection molding using a die, the space is formed by a die of which extracting direction is opposite from the connecting unit, an extracting angle is set for the first exit surface and the second entry surface respectively so as to extract the die smoothly, and a surface shape of the second exit surface is adjusted such that the light from the light source, which exits from the second exit surface, becomes light parallel with the first reference axis.

5. The vehicular headlamp to claim 1, wherein the first direction is the horizontal direction, the first exit surface is configured as a semicircular cylindrical surface extending in the vertical direction, the second direction is the vertical direction, and the second exit surface is configured as a semicircular cylindrical surface extending in the horizontal direction.

6. The vehicular headlamp to claim 1, wherein the first direction is the vertical direction, the first exit surface is configured as a semicircular cylindrical surface extending in the horizontal direction, the second direction is the horizontal direction, and the second exit surface is configured as a semicircular cylindrical surface extending in the vertical direction.

7. The vehicular headlamp according to claim 1 further comprising:

a combined lens body comprising a plurality of the lens bodies, and being integrally molded, wherein the second exit surface of each lens body of the plurality of the lens bodies being arranged on a line in a state of being adjacent to each other, so as to constitute a semicircular cylindrical exit surface group, linearly extending in a predetermined direction.

8. The vehicular headlamp according to claim 1, wherein the shade is arranged between the first entry surface of the first lens unit and the first exit surface of the first lens unit.

9. The vehicular headlamp according to claim 1, wherein light from the light source that entered the first lens unit is focused towards the shade.

10. A vehicular headlamp comprising:

a light source;

a lens body comprising a first lens unit and a second lens unit which are disposed along a first reference axis extending in the horizontal direction, the lens body being configured such that light from the light source enters the first lens unit through a first entry surface of the first lens unit, exits through a first exit surface of the first lens unit after being partially shielded by a shade of the first lens unit, further enters the second lens unit through a second entry surface of the second lens unit, then exits through a second exit surface of the second lens unit, and is irradiated forward, so as to form a predetermined light distribution pattern which includes a cut-off line defined on an upper edge by the shade, the second exit surface being a semicircular cylindrical surface extending in a direction inclined with respect to the first reference axis when viewed from the top, and the first exit surface being a semicircular cylindrical surface extending in the vertical direction and a surface shape thereof being adjusted such that the predetermined light distribution pattern is generally condensed.

11. The vehicular headlamp according to claim 10, wherein the lens body is a lens body which has a shape extending along the first reference axis, the first lens unit includes the first entry surface, a reflection surface, the shade and the first exit surface, the second lens unit includes the second entry surface and the second exit surface, the first entry surface, the reflection surface, the shade, the first exit surface, the second entry surface and the second exit surface are disposed in this order along the first reference axis, the first entry surface is a surface through which the light from the light source, disposed in the vicinity of the first entry surface, is refracted and enters the first lens unit, and which is configured such that the light from the light source, which entered the first lens unit, is condensed in a direction closer to a second reference axis at least in the vertical direction, the second reference axis passing through the center of the light source and a point in the vicinity of the shade and inclined forward and diagonally downward with respect to the first reference axis, the reflection surface extends forward from the lower edge of the first entry surface, and the shade is formed in a front end of the reflection surface.

12. The vehicular headlamp according to claim 10, wherein the shade is arranged between the first entry surface of the first lens unit and the first exit surface of the first lens unit.

13. The vehicular headlamp according to claim 10, wherein light from the light source that entered the first lens unit is focused towards the shade.

14. A vehicular headlamp comprising:

a light source;

a lens body comprising a first lens unit and a second lens unit disposed along a first reference axis extending in the horizontal direction, the lens body being configured such that light from the light source enters the first lens unit through a first entry surface of the first lens unit, exits through a first exit surface of the first lens unit after being partially shielded by a shade of the first lens unit, further enters the second lens unit through a second entry surface of the second lens unit, then exits through a second exit surface of the second lens unit, and is irradiated forward, so as to form a predetermined light distribution pattern which includes a cut-off line defined on an upper edge by the shade, the second exit surface being a semicircular cylindrical surface extending in a direction inclined with respect to the horizontal direction by a predetermined angle when viewed from the front, the first exit surface being a semicircular cylindrical surface extending in a direction inclined with respect to the vertical direction by the predetermined angle when viewed from the front, and the shade being disposed in an angle inclined with respect to the horizontal direction by the predetermined angle in the opposite direction of the second exit surface and the first exit surface when viewed from the front.

15. The vehicular headlamp according to claim 14, wherein the second exit surface extends in a direction inclined with respect to the first reference axis when viewed from the top, and a surface shape of the first exit surface is adjusted such that the predetermined light distribution pattern is generally condensed.

16. The vehicular headlamp according to claim 14, wherein the lens body is a lens body which has a shape extending along the first reference axis, the first lens unit includes the first entry surface, a reflection surface, the shade and the first exit surface, the second lens unit includes the second entry surface and the second exit surface, the first entry surface, the reflection surface, the shade, the first exit surface, the second entry surface and the second exit surface are disposed in this order along the first reference axis, the first entry surface is a surface through which the light from the light source, disposed in the vicinity of the first entry surface, is refracted and enters the first lens unit, and which is configured such that the light from the light source, which entered the first lens unit, is condensed in a direction closer to a second reference axis at least in the vertical direction, the second reference axis passing through the center of the light source and a point in the vicinity of the shade and inclined forward and diagonally downward with respect to the first reference axis, the reflection surface extends forward from the lower edge of the first entry surface, and is disposed in an attitude inclined with respect to the horizontal direction by the predetermined angle in the opposite direction of the second exit surface and the first exit surface when viewed from the front, and the shade is formed in a front end of the reflection surface.

17. The vehicular headlamp according to claim 14, wherein the shade is arranged between the first entry surface of the first lens unit and the first exit surface of the first lens unit.

18. The vehicular headlamp according to claim 14, wherein light from the light source that entered the first lens unit is focused towards the shade.

* * * * *